US012677489B2

(12) United States Patent
Sato et al.

(10) Patent No.: US 12,677,489 B2
(45) Date of Patent: Jul. 7, 2026

(54) SOLID-STATE IMAGING DEVICE, ELECTRONIC DEVICE, AND DISTANCE MEASUREMENT SYSTEM

(71) Applicant: SONY SEMICONDUCTOR SOLUTIONS CORPORATION, Kanagawa (JP)

(72) Inventors: Yusuke Sato, Kanagawa (JP); Masahiro Tsukamoto, Kanagawa (JP); Kanae Ohi, Tokyo (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 18/715,896

(22) PCT Filed: Dec. 2, 2022

(86) PCT No.: PCT/JP2022/044569
§ 371 (c)(1),
(2) Date: Jun. 3, 2024

(87) PCT Pub. No.: WO2023/106232
PCT Pub. Date: Jun. 15, 2023

(65) Prior Publication Data
US 2024/0363651 A1      Oct. 31, 2024

(30) Foreign Application Priority Data
Dec. 10, 2021    (JP) ................................. 2021-200951

(51) Int. Cl.
*H10F 39/00* (2025.01)
*G01S 7/481* (2006.01)
(Continued)

(52) U.S. Cl.
CPC ........ *H10F 39/8023* (2025.01); *G01S 7/4816* (2013.01); *G01S 17/89* (2013.01);
(Continued)

(58) Field of Classification Search
CPC .............. H10F 39/8023; H10F 39/182; H10F 39/8053; H10F 39/12; H10F 39/802;
(Continued)

(56) References Cited

U.S. PATENT DOCUMENTS

2007/0165117 A1*   7/2007   Toya ................... H04N 25/627
                                                348/241
2014/0009648 A1   1/2014   Kim
(Continued)

FOREIGN PATENT DOCUMENTS

JP        2020-068483        4/2020
JP        2020-161992        10/2020
(Continued)

OTHER PUBLICATIONS

English Translation of International Search Report prepared by the Japan Patent Office on Feb. 7, 2023, for International Application No. PCT/JP2022/044569, 2 pgs.

*Primary Examiner* — Michael E Teitelbaum
(74) *Attorney, Agent, or Firm* — SHERIDAN ROSS P.C.

(57) ABSTRACT

A solid-state imaging device, an electronic device, and a distance measurement system for miniaturization of pixels in a device that outputs a luminance signal and an event signal. A device includes: a pixel array unit in which an event pixel that detects that a luminance change exceeds a predetermined threshold and a gradation pixel that outputs a luminance signal of a gradation level according to a light amount of incident light are mixed, in which a color filter of the same color is formed in units of two or more pixels in the gradation pixel, and the event pixel is disposed with a region size in which at least two of the gradation pixels are arranged in a row direction or a column direction. The present disclosure can be applied to, for example, a distance mea-
(Continued)

surement system or the like that generates image information and distance measurement information.

59 Claims, 99 Drawing Sheets

(51) Int. Cl.

| | |
|---|---|
| *G01S 17/89* | (2020.01) |
| *H04N 25/131* | (2023.01) |
| *H04N 25/47* | (2023.01) |
| *H04N 25/707* | (2023.01) |
| *H04N 25/77* | (2023.01) |
| *H10F 39/18* | (2025.01) |

(52) U.S. Cl.
CPC .......... *H04N 25/131* (2023.01); *H04N 25/47* (2023.01); *H04N 25/707* (2023.01); *H04N 25/77* (2023.01); *H10F 39/182* (2025.01); *H10F 39/8053* (2025.01)

(58) Field of Classification Search
CPC .... H10F 39/803; H10F 39/811; H10F 39/813; G01S 7/4816; G01S 17/89; H04N 25/131; H04N 25/47; H04N 25/707; H04N 25/77; H04N 25/133; H04N 25/778; H04N 25/706; H04N 25/709
See application file for complete search history.

(56) References Cited

U.S. PATENT DOCUMENTS

| | | | | |
|---|---|---|---|---|
| 2018/0167575 A1* | 6/2018 | Watanabe | .............. | H04N 25/78 |
| 2018/0278877 A1* | 9/2018 | Yamahira | .............. | H10F 39/803 |
| 2021/0168314 A1 | 6/2021 | Mehta | | |
| 2021/0400223 A1 | 12/2021 | Kitano et al. | | |
| 2022/0014689 A1* | 1/2022 | Zahnert | ................ | G06F 3/0304 |
| 2022/0166958 A1 | 5/2022 | Hoshino et al. | | |

FOREIGN PATENT DOCUMENTS

| | | |
|---|---|---|
| JP | 2021-093610 | 6/2021 |
| WO | WO-2020110537 A1 | 6/2020 |

* cited by examiner

SOLID-STATE IMAGING DEVICE, ELECTRONIC DEVICE, AND DISTANCE MEASUREMENT SYSTEM

CROSS REFERENCE TO RELATED APPLICATIONS

This application is a national stage application under 35 U.S.C. 371 and claims the benefit of PCT Application No. PCT/JP2022/044569, having an international filing date of 2 Dec. 2022, which designated the United States, which PCT application claimed the benefit of Japanese Patent Application No. 2021-200951, filed 10 Dec. 2021, the entire disclosures of each of which are incorporated herein by reference.

TECHNICAL FIELD

The present disclosure relates to a solid-state imaging device, an electronic device, and a distance measurement system, and particularly relates to a solid-state imaging device, an electronic device, and a distance measurement system suitable for miniaturization of pixels in a solid-state imaging device that outputs a luminance signal and an event signal.

BACKGROUND ART

There has been proposed a solid-state imaging device including, in a unit pixel, a pixel signal generation unit that generates an analog voltage signal according to a light amount of incident light as a luminance signal, and an event detection unit that detects, as an event, that a luminance change of the incident light exceeds a predetermined threshold and outputs an event signal (See, for example, Patent Document 1.).

CITATION LIST

Patent Document

Patent Document 1: Japanese Patent Application Laid-Open No. 2020-68483

SUMMARY OF THE INVENTION

Problems to be Solved by the Invention

In a solid-state imaging device that outputs a luminance signal and an event signal, a situation is assumed in which a necessary element cannot be completely accommodated in one pixel due to future miniaturization of the pixel. Therefore, a pixel layout suitable for miniaturization of the pixel is desired.

The present disclosure has been made in view of such a situation, and an object thereof is to realize a pixel layout suitable for miniaturization of pixels in a solid-state imaging device that outputs a luminance signal and an event signal.

Solutions to Problems

A solid-state imaging device according to a first aspect of the present disclosure includes a pixel array unit in which an event pixel that detects that a luminance change exceeds a predetermined threshold as an event and a gradation pixel that outputs a luminance signal of a gradation level according to a light amount of incident light are mixed, in which a color filter of the same color is formed in units of two or more pixels in the gradation pixel, and the event pixel is disposed with a region size in which at least two of the gradation pixels are disposed in a row direction or a column direction.

An electronic device according to a second aspect of the present disclosure includes a solid-state imaging device including a pixel array unit in which an event pixel that detects that a luminance change exceeds a predetermined threshold as an event and a gradation pixel that outputs a luminance signal of a gradation level according to a light amount of incident light are mixed, in which a color filter of the same color is formed in units of two or more pixels in the gradation pixel, and the event pixel is disposed with a region size in which at least two of the gradation pixels are disposed in a row direction or a column direction.

A distance measurement system according to a third aspect of the present disclosure includes: a light source device that irradiates a subject with irradiation light; and a solid-state imaging device that receives reflected light of the irradiation light reflected by the subject, in which the solid-state imaging device includes a pixel array unit in which an event pixel that detects that a luminance change exceeds a predetermined threshold as an event and a gradation pixel that outputs a luminance signal of a gradation level according to a light amount of incident light are mixed, a color filter of the same color is formed in units of two or more pixels in the gradation pixel, and the event pixel is disposed with a region size in which at least two of the gradation pixels are disposed in a row direction or a column direction.

In the first to third aspects of the present disclosure, there is provided a pixel array unit in which an event pixel that detects that a luminance change exceeds a predetermined threshold as an event and a gradation pixel that outputs a luminance signal of a gradation level according to a light amount of incident light are mixed, a color filter of the same color is formed in units of two or more pixels in the gradation pixel, and the event pixel is disposed with a region size in which at least two of the gradation pixels are disposed in a row direction or a column direction.

A solid-state imaging device according to a fourth aspect of the present disclosure includes a pixel array unit in which an event pixel that detects that a luminance change exceeds a predetermined threshold as an event and a gradation pixel that outputs a luminance signal of a gradation level according to a light amount of incident light are mixed, in which the event pixel includes, in two unit regions in a diagonal direction of four unit regions of 2×2, at least: a photodiode that photoelectrically convert incident light to generate a photocurrent; a first logarithmic transistor that converts into an optical voltage corresponding to a logarithmic value of the photocurrent; and a first amplification transistor that amplifies the optical voltage, among first and second diffusion layers connected to a gate of the first amplification transistor, the first diffusion layer is formed in a first unit region of the two unit regions, and the second diffusion layer is formed in a second unit region in the diagonal direction with respect to the first unit region, and the first diffusion layer and the second diffusion layer are disposed nearby.

An electronic device according to a fifth aspect of the present disclosure includes a solid-state imaging device including a pixel array unit in which an event pixel that detects that a luminance change exceeds a predetermined threshold as an event and a gradation pixel that outputs a luminance signal of a gradation level according to a light amount of incident light are mixed, in which the event pixel includes, in two unit regions in a diagonal direction of four unit regions of 2×2, at least: a photodiode that photoelectrically convert incident light to generate a photocurrent; a first logarithmic transistor that converts into an optical voltage corresponding to a logarithmic value of the photocurrent; and a first amplification transistor that amplifies the optical voltage, among first and second diffusion layers connected to a gate of the first amplification transistor, the first diffusion layer is formed in a first unit region of the two unit regions, and the second diffusion layer is formed in a second unit region in the diagonal direction with respect to the first unit region, and the first diffusion layer and the second diffusion layer are disposed nearby.

A distance measurement system according to a sixth aspect of the present disclosure includes: a light source device that irradiates a subject with irradiation light; and a solid-state imaging device that receives reflected light of the irradiation light reflected by the subject, in which the solid-state imaging device includes a pixel array unit in which an event pixel that detects that a luminance change exceeds a predetermined threshold as an event and a gradation pixel that outputs a luminance signal of a gradation level according to a light amount of incident light are mixed, the event pixel includes, in two unit regions in a diagonal direction of four unit regions of 2×2, at least: a photodiode that photoelectrically convert incident light to generate a photocurrent; a first logarithmic transistor that converts into an optical voltage corresponding to a logarithmic value of the photocurrent; and a first amplification transistor that amplifies the optical voltage, among first and second diffusion layers connected to a gate of the first amplification transistor, the first diffusion layer is formed in a first unit region of the two unit regions, and the second diffusion layer is formed in a second unit region in the diagonal direction with respect to the first unit region, and the first diffusion layer and the second diffusion layer are disposed nearby.

In the fourth to sixth aspects of the present disclosure, there is provided a pixel array unit in which an event pixel that detects that a luminance change exceeds a predetermined threshold as an event and a gradation pixel that outputs a luminance signal of a gradation level according to a light amount of incident light are mixed, in the event pixel, there are provided, in two unit regions in a diagonal direction of four unit regions of 2×2, at least: a photodiode that photoelectrically convert incident light to generate a photocurrent; a first logarithmic transistor that converts into an optical voltage corresponding to a logarithmic value of the photocurrent; and a first amplification transistor that amplifies the optical voltage, among first and second diffusion layers connected to a gate of the first amplification transistor, the first diffusion layer is formed in a first unit region of the two unit regions, and the second diffusion layer is formed in a second unit region in the diagonal direction with respect to the first unit region, and the first diffusion layer and the second diffusion layer are disposed nearby.

A solid-state imaging device according to a seventh aspect of the present disclosure includes a pixel array unit in which an event pixel that detects that a luminance change exceeds a predetermined threshold as an event and a gradation pixel that outputs a luminance signal of a gradation level according to a light amount of incident light are mixed, in which the event pixel includes a current-voltage conversion circuit that outputs a voltage signal corresponding to a logarithmic value of a photocurrent generated by photoelectrically converting incident light, and at least two transistors connected to an output wiring of the current-voltage conversion circuit are disposed in any one of two unit regions in which the event pixel is disposed.

An electronic device according to an eighth aspect of the present disclosure includes a solid-state imaging device including a pixel array unit in which an event pixel that detects that a luminance change exceeds a predetermined threshold as an event and a gradation pixel that outputs a luminance signal of a gradation level according to a light amount of incident light are mixed, in which the event pixel includes a current-voltage conversion circuit that outputs a voltage signal corresponding to a logarithmic value of a photocurrent generated by photoelectrically converting incident light, and at least two transistors connected to an output wiring of the current-voltage conversion circuit are disposed in any one of two unit regions in which the event pixel is disposed.

A distance measurement system according to a ninth aspect of the present disclosure includes: a light source device that irradiates a subject with irradiation light; and a solid-state imaging device that receives reflected light of the irradiation light reflected by the subject, in which the solid-state imaging device includes a pixel array unit in which an event pixel that detects that a luminance change exceeds a predetermined threshold as an event and a gradation pixel that outputs a luminance signal of a gradation level according to a light amount of incident light are mixed, the event pixel includes a current-voltage conversion circuit that outputs a voltage signal corresponding to a logarithmic value of a photocurrent generated by photoelectrically converting incident light, and at least two transistors connected to an output wiring of the current-voltage conversion circuit are disposed in any one of two unit regions in which the event pixel is disposed.

In the seventh to ninth aspects of the present disclosure, there is provided a pixel array unit in which an event pixel that detects that a luminance change exceeds a predetermined threshold as an event and a gradation pixel that outputs a luminance signal of a gradation level according to a light amount of incident light are mixed, in the event pixel, there is provided a current-voltage conversion circuit that outputs a voltage signal corresponding to a logarithmic value of a photocurrent generated by photoelectrically converting incident light, and at least two transistors connected to an output wiring of the current-voltage conversion circuit are disposed in any one of two unit regions in which the event pixel is disposed.

The solid-state imaging device, the electronic device, and the distance measurement system may be independent devices or modules incorporated in another device.

BRIEF DESCRIPTION OF DRAWINGS

FIG. 1 is a block diagram illustrating a configuration example of an imaging device according to an embodiment of the present disclosure.

FIG. 2 is a block diagram illustrating a schematic configuration example of the solid-state imaging device in FIG. 1.

FIG. 8 is a diagram illustrating a circuit configuration example of 32 pixels described in FIG. 3.

FIG. 12 is a diagram illustrating a second circuit configuration example of the third pixel layout.

FIG. 13 is a diagram illustrating a third circuit configuration example of the third pixel layout.

FIG. 14 is a diagram illustrating a fourth circuit configuration example of the third pixel layout.

FIG. 17 is a cross-sectional view illustrating a cross-sectional configuration example of an event pixel.

FIG. 22 is a diagram illustrating an example of arrangement variations of event pixels.

FIG. 24 is a diagram illustrating an example of arrangement variations of event pixels.

FIG. 26 is a diagram illustrating an example of arrangement variations of event pixels.

FIG. 27 is a plan view for explaining a sixth pixel layout in the pixel array unit.

FIG. 52 is a diagram illustrating an example of transistor wiring of a 4Tr-type event pixel.

FIG. 53 is a diagram illustrating an example of transistor wiring of a 4Tr-type event pixel.

FIG. 54 is a diagram illustrating an example of transistor wiring of a 4Tr-type event pixel.

FIG. 55 is a diagram illustrating an example of transistor wiring of a 4Tr-type event pixel.

FIG. 71 is a diagram illustrating a circuit configuration example of an event pixel without an addition transistor.

FIG. 72 is a diagram illustrating a circuit configuration example of a 2Tr-type event pixel.

FIG. 73 is a diagram illustrating a circuit configuration example of a one-stage diode type event pixel.

FIG. 74 is a diagram illustrating a circuit configuration example of a two-stage diode type event pixel.

MODE FOR CARRYING OUT THE INVENTION

Figure 3:
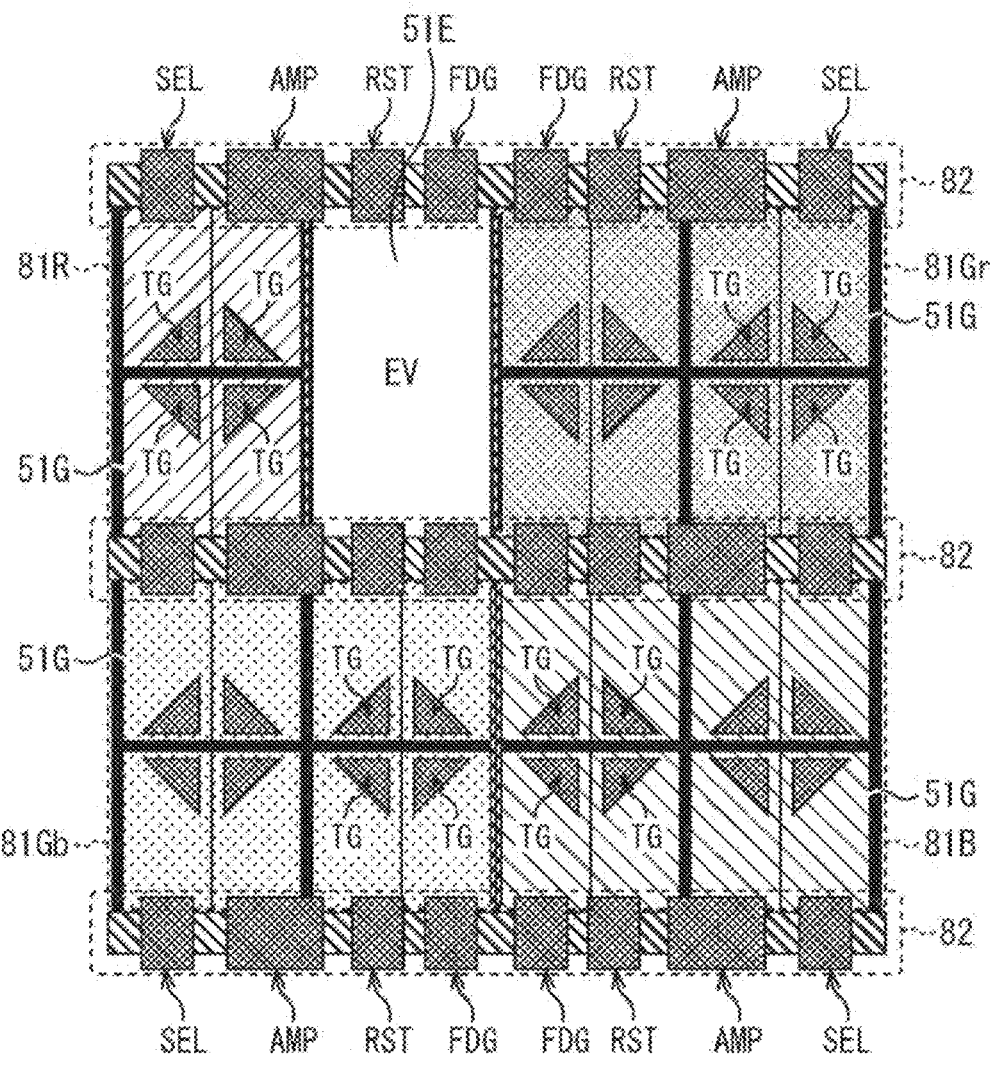
FIG. 3 is a plan view for explaining a first pixel layout in the pixel array unit.

Hereinafter, modes for carrying out the technique of the present disclosure (hereinafter, referred to as embodiments) will be described with reference to the accompanying drawings. The description will be given in the following order.

1. Configuration example of imaging device
2. Configuration example of solid-state imaging device
3. First pixel layout example
4. Circuit configuration example of same color region
5. Configuration example of address event detection circuit
6. Second to fourth pixel layout examples
7. Cross-sectional view of event pixels
8. Fifth pixel layout example
9. Example of arrangement variation of event pixels
10. Sixth pixel layout example
11. Application example to RGB-W pixel
12. Application example to RGB-IR pixel
13. Example of event pixel for detection IR light
14. Configuration example of distance measurement system
15. Another example of use of addition transistor
16. Problem of wiring capacitance connected to gate of first amplification transistor
17. Transistor arrangement for reducing capacitance of gate wiring of first amplification transistor
18. Arrangement rule of first amplification transistor for wiring capacitance reduction
19. Example of transistor wiring of event pixel
20. Problem of wiring capacitance connected to gate of second amplification transistor
21. Transistor arrangement for reducing capacitance of gate wiring of second amplification transistor
22. Transistor arrangement example of event pixel for reducing capacitance of gate wiring of first and second amplification transistors
23. Circuit configuration example of event pixel without addition transistor
24. Circuit configuration example of 2Tr-type event pixel
25. Circuit configuration example of one-stage diode type event pixel
26. Circuit configuration example of two-stage diode type event pixel
27. Problem of coupling between output wiring and floating diffusion region
28. Transistor arrangement of 4Tr-type event pixel
29. Summary of 4Tr-type event pixels
30. Transistor arrangement of 4Tr-type event pixel with addition
31. Summary of 4Tr-type event pixels with addition
32. Transistor arrangement of one-stage diode type event pixels 33. Summary of one-stage diode type event pixels 34. Transistor arrangement of two-stage diode type event pixels 35. Summary of two-stage diode type event pixels 36. Structure example of solid-state imaging device Note that, in the drawings referred to in the following description, the same or similar parts are denoted by the same or similar reference signs, and redundant description will be omitted as appropriate. The drawings are schematic, and the relationship between the thickness and the plane dimension, the ratio of the thickness of each layer, and the like are different from the actual ones. Furthermore, the drawings may include portions having different dimensional relationships and ratios.

Furthermore, definition of directions such as upward and downward directions, and the like in the following description is merely the definition for convenience of description, and does not limit the technical idea of the present disclosure. For example, when an object is rotated by 90° to be observed, the upper and lower sides are changed as the left and right sides, and when the object is rotated by 180°, the upper and lower sides are reversed.

<1. Configuration Example of Imaging Device>

Figure 1:
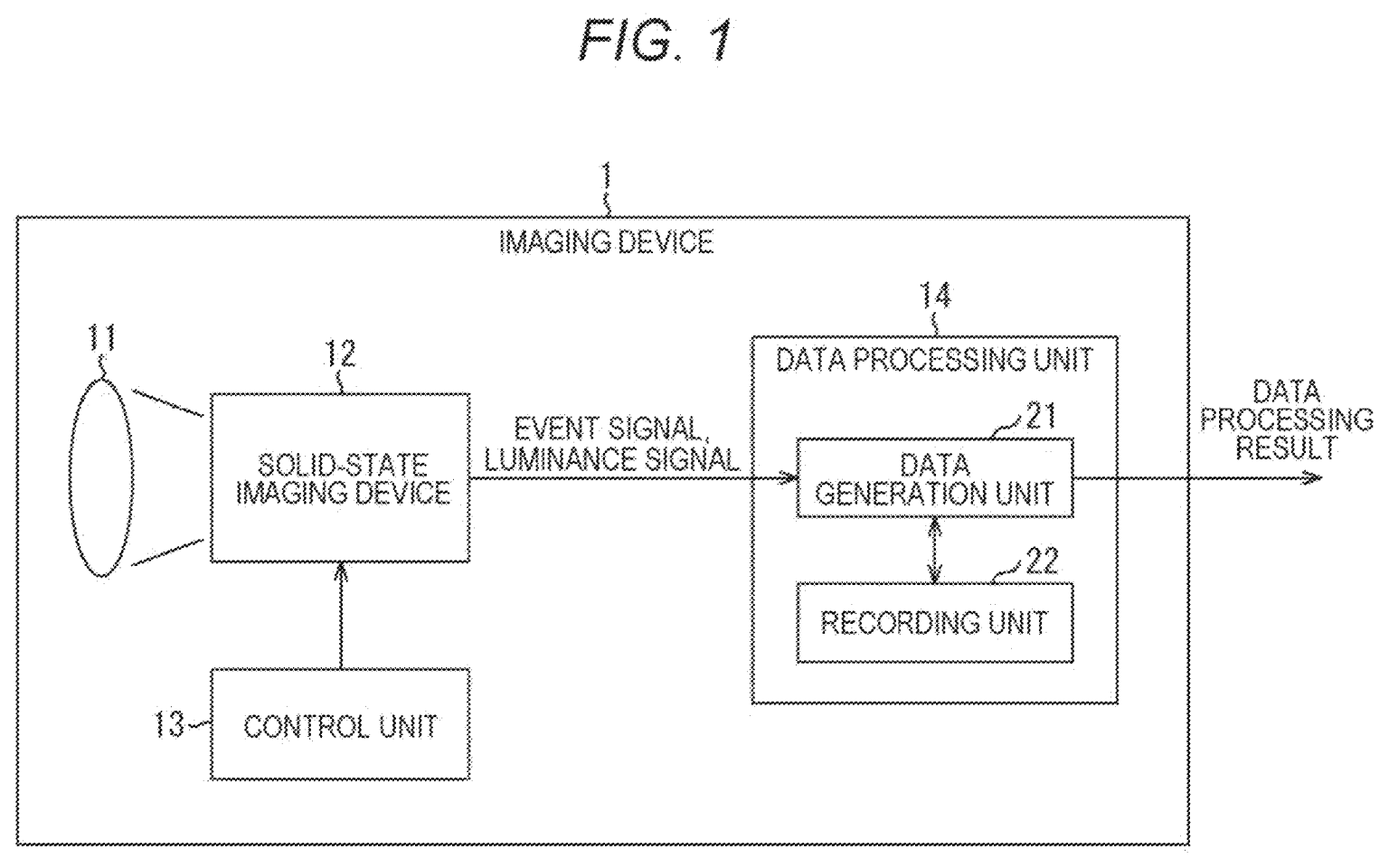

FIG. 1 is a block diagram illustrating a configuration example of an imaging device according to an embodiment of the present disclosure.

An imaging device 1 in FIG. 1 includes an optical system 11, a solid-state imaging device 12, a control unit 13, and a data processing unit 14. As the imaging device 1, for example, a camera mounted on an industrial robot, an in-vehicle camera, or the like is assumed.

The optical system 11 condenses light from a subject and causes the light to enter the solid-state imaging device 12. The solid-state imaging device 12 generates a luminance signal at a gradation level according to the amount of incident light incident through the optical system 11, and outputs the luminance signal to the data processing unit 14. Furthermore, the solid-state imaging device 12 detects, as an event, that a luminance change exceeds a predetermined threshold due to incident light, generates an event signal, and outputs the event signal to the data processing unit 14. More specifically, the solid-state imaging device 12 detects, as an event, whether or not a change exceeding a predetermined threshold has occurred in the photocurrent according to the luminance of the incident light. Note that, in the following description, the event signal may be referred to as event data.

The control unit 13 includes, for example, a central processing unit (CPU) or the like, and controls the solid-state imaging device 12. For example, the control unit 13 instructs the solid-state imaging device 12 on an operation mode and start and end of imaging.

The data processing unit 14 includes, for example, a field programmable gate array (FPGA), a digital signal processor (DSP), a microprocessor, and the like, and includes a data generation unit 21 and a recording unit 22. The data generation unit 21 performs predetermined data processing using a luminance signal supplied from the solid-state imaging device 12, predetermined data processing using an event signal supplied from the solid-state imaging device 12, and the like. The data generation unit 21 outputs processed data that is a data processing result to an external device. Furthermore, the data generation unit 21 may directly output the luminance signal and the event signal supplied from the solid-state imaging device 12 to an external device.

The recording unit 22 includes, for example, a flash memory, a dynamic random access memory (DRAM), a static random access memory (SRAM), or the like. The recording unit 22 records the luminance signal, the event signal, or the processed data supplied from the data generation unit 21.

Note that the data processing unit 14 may be incorporated as a part of the solid-state imaging device 12.

<2. Configuration Example of Solid-State Imaging Device>

Figure 2:
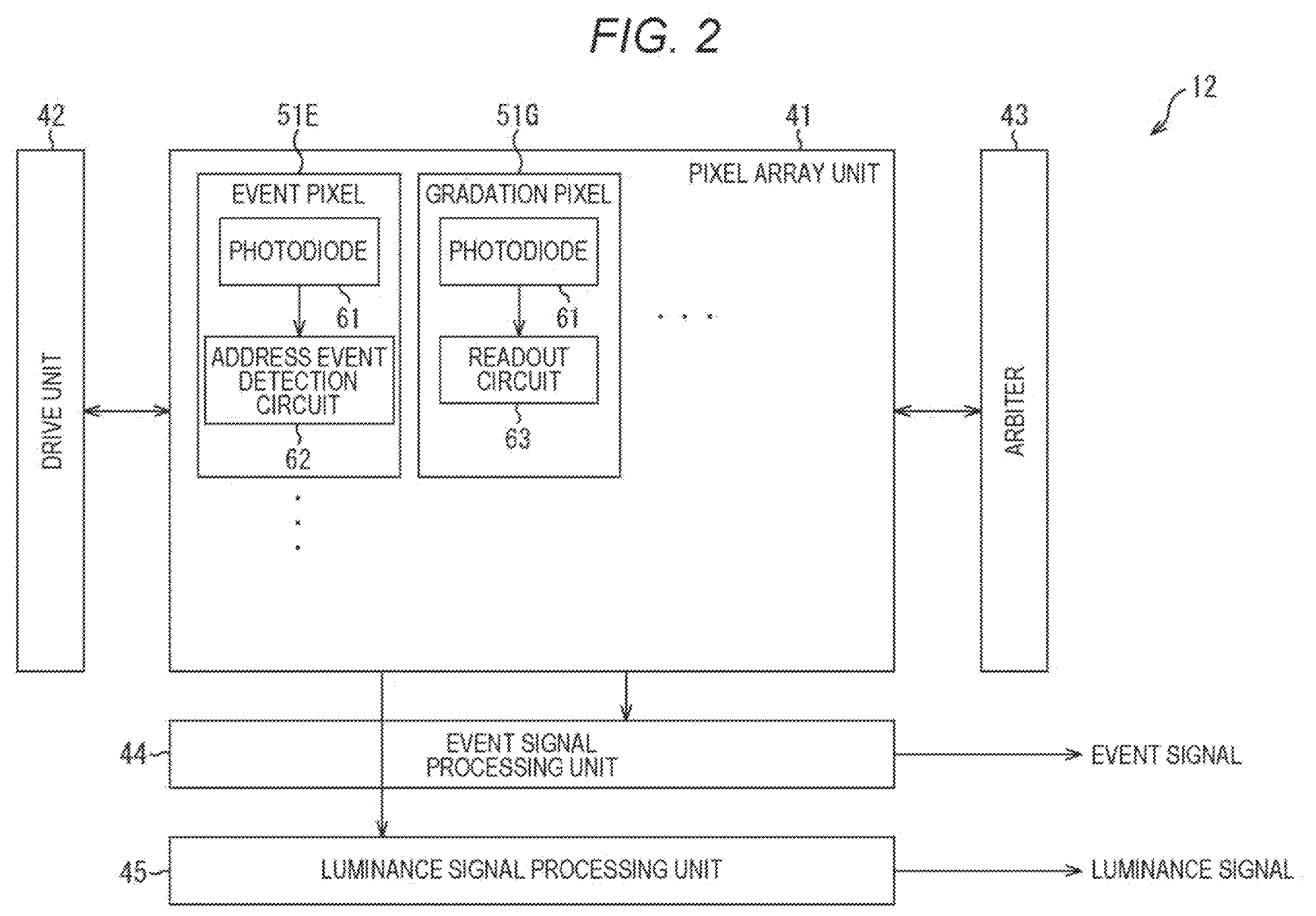

FIG. 2 is a block diagram illustrating a schematic configuration example of the solid-state imaging device 12.

The solid-state imaging device 12 includes a pixel array unit 41, a drive unit 42, an arbiter (arbitration unit) 43, an event signal processing unit 44, and a luminance signal processing unit 45.

In the pixel array unit 41, a plurality of pixels 51 is arranged in a two-dimensional lattice pattern. Here, the horizontal direction of the pixel array unit 41 in which the plurality of pixels 51 is arranged in a two-dimensional lattice shape is referred to as "row", and the vertical direction is referred to as "column".

The pixels 51 arranged in a two-dimensional lattice pattern in the pixel array unit 41 include an event pixel 51E that detects a luminance change of incident light as an event and generates an event signal, and a gradation pixel 51G that generates a luminance signal of a gradation level according to the amount of incident light. In other words, in the pixel array unit 41, as the pixels 51, the event pixels 51E and the gradation pixels 51G are mixedly arranged in a two-dimensional lattice pattern.

The event pixel 51E includes a photodiode 61 as a photoelectric conversion element and an address event detection circuit 62. The photodiode 61 causes a photocurrent as an electric signal to flow by photoelectrically converting incident light. In a case where a change exceeding a predetermined threshold occurs in the photocurrent generated by the photoelectric conversion of the photodiode 61, the address event detection circuit 62 detects the change in the photocurrent as an event. In a case where an event is detected, the address event detection circuit 62 outputs a request for requesting the output of an event signal indicating the occurrence of the event to the arbiter 43. When a response indicating permission of the output of the event signal is obtained as a result of the arbitration by the arbiter 43, the address event detection circuit 62 supplies the event signal to the event signal processing unit 44.

The gradation pixel 51G includes a photodiode 61 as a photoelectric conversion element and a readout circuit 63. The readout circuit 63 reads an analog luminance signal generated by photoelectric conversion of the photodiode 61 under the control of the drive unit 42, and supplies the analog luminance signal to the luminance signal processing unit 45.

Note that the readout circuit 63 may be provided for each pixel, or a part of the readout circuit 63 may be disposed so as to be shared by the plurality of gradation pixels 51G. Although a specific circuit configuration will be described later with reference to FIG. 4, in the present embodiment, a configuration in which a floating diffusion region (floating diffusion), a reset transistor, an amplification transistor, a switching transistor, and a selection transistor constituting the readout circuit 63 are shared by a plurality of pixels such as 4 pixels and 8 pixels is adopted.

The drive unit 42 drives each gradation pixel 51G by supplying a control signal to each gradation pixel 51G of the pixel array unit 41.

The arbiter 43 arbitrates the request from the event pixel 51E in the pixel array unit 41 and returns a response indicating permission or non-permission of the output of the event signal to the event pixel 51E that has transmitted the request. The event pixel 51E to which the permission response is returned from the arbiter 43 can output an event signal to the event signal processing unit 44. The event signal is transferred to the event signal processing unit 44 in units of rows, and the event signal of the event pixel 51E in which no event has occurred among the plurality of event pixels 51E in the same row is discarded by the event signal processing unit 44. The arbiter 43 supplies a reset signal for resetting the event detection to the event pixel 51E.

The event signal processing unit 44 performs necessary processing on the event signal output from each event pixel 51E of the pixel array unit 41, and supplies the processed event signal to the data processing unit 14 (FIG. 1).

Here, since the change in the photocurrent generated in the event pixel 51E can also be regarded as a change in the light amount of the light incident on the event pixel 51E, the event can also be said to be a change in the light amount of the event pixel 51E (change in the light amount exceeding the threshold).

In the event data (event data), at least position information (coordinates or the like) indicating the position of the event pixel 51E where the light amount change as the event has occurred can be specified. In addition, in the event data, the polarity (positive or negative) of the light quantity change can be specified.

For the series of event data output at the timing when the event occurs by the event pixel 51E, time information indicating the (relative) time when the event has occurred can be specified as long as the interval between the event data is maintained at the time when the event occurs. However, when the interval between the event data is not maintained as it is at the time of occurrence of the event due to the event data being stored in the memory or the like, the time information is lost. Therefore, for the event data, before the interval between the pieces of event data is not maintained as it is at the time of occurrence of the event, time information indicating the (relative) time at which the event has occurred, such as a time stamp, is added to the event data. The processing of adding the time information to the event data may be performed by the address event detection circuit 62 or may be performed by the event signal processing unit 44 or the data processing unit 14 as long as the interval between the event data is not maintained as it is at the time of occurrence of the event.

The luminance signal processing unit 45 includes, for example, a single-slope AD converter (ADC) (not illustrated) corresponding to a column of the gradation pixels 51G. In each ADC, the luminance signal processing unit 45 performs AD conversion on the analog luminance signal of the gradation pixel 51G of the corresponding column, and supplies the analog luminance signal to the data processing unit 14 (FIG. 1). Note that the luminance signal processing unit 45 can perform correlated double sampling (CDS) together with AD conversion of the luminance signal.

<3. First Pixel Layout Example>

FIG. 3 is a plan view for explaining a first pixel layout which is a layout example of each pixel 51 in the pixel array unit 41.

The first pixel layout illustrated in FIG. 3 is a layout in which a region of four pixels in which two vertically long gradation pixels 51G are arrayed in the row direction (horizontal direction) and two vertically long gradation pixels 51G are arrayed in the column direction (vertical direction) is set as a unit region, and the unit regions are arrayed in 4×2, that is, four in the row direction and two in the column direction. However, one of the 8 unit regions of 4×2 is the event pixel 51E. Therefore, the pixel region of one event pixel 51E has a region size of 4 pixels in which gradation pixels 51G are arranged in 2×2. Note that, in the present exemplary embodiment, in a case where the number of pixels in the row direction and the column direction is counted, a value counted as a pixel (pixel size) of gradation pixel 51G is used.

Each gradation pixel 51G of 2×2 constituting the unit region is arranged line-symmetrically with respect to the center line of each of the row direction and the column direction in the unit region. Specifically, the floating diffusion region FD (not illustrated in FIG. 3) is disposed at the center portion of the unit region, and the transfer transistor TG provided for each gradation pixel 51G is disposed adjacent to the floating diffusion region FD at the center portion of the unit region and in the vicinity of the center portion of the unit region in a line-symmetric arrangement with other transfer transistors TG in the unit region.

Moreover, a color filter of red (R), green (G), or blue (B) is formed in a unit region of the gradation pixel 51G other than the event pixel 51E. The same color region 81Gr on the upper right side is a region where a green (Gr) color filter is formed, the same color region 81B on the lower right side is a region where a blue (B) color filter is formed, the same color region 81R on the upper left side is a region where a red (R) color filter is formed, and the same color region 81Gb on the lower left side is a region where a green (Gb) color filter is formed.

Hereinafter, in order to facilitate understanding, the same color region 81Gr in which the Gr color filter is formed is referred to as a Gr same color region 81Gr, the same color region 81B in which the B color filter is formed is referred to as a B same color region 81B, the same color region 81R in which the R color filter is formed is referred to as an R same color region 81R, and the same color region 81Gb in which the Gb color filter is formed is referred to as a Gb same color region 81Gb. In a case where the color (wavelength) of the color filter is not particularly distinguished, it is simply referred to as the same color region 81.

Each of the Gr same color region 81Gr, the B same color region 81B, and the Gb same color region 81Gb is configured by two unit regions disposed in the row direction, but the R same color region 81R is configured by one unit region since the event pixel 51E is disposed. In other words, in a case where not the event pixel 51E but the gradation pixel 51G is disposed, the event pixel 51E is disposed in the region where the R color filter is formed.

As in the event pixel 51E in FIG. 3, in a case where the event pixel 51E is not the event pixel 51E but the gradation pixel 51G, arrangement of the event pixel 51E in the region where the R color filter is formed according to the color filter array will be simply referred to as "Event pixels 51E are arranged at R color filter positions." below. However, as described above, no color filter is disposed in the event pixel 51E. A case where the event pixel 51E is disposed not in the region where the R color filter is formed but in the region where the Gr, Gb, or B color filter is formed will be similarly described.

The shared pixel transistor region 82 is provided between the unit regions repeatedly arranged in the column direction. The shared pixel transistor region 82 is a region in which a pixel transistor shared by the plurality of gradation pixels 51G, specifically, the selection transistor SEL, the amplification transistor AMP, the reset transistor RST, and the switching transistor FDG are disposed. The sharing unit in which the selection transistor SEL, the amplification transistor AMP, the reset transistor RST, and the switching transistor FDG are shared is the same color region 81 in which color filters of the same color are formed.

Specifically, the four gradation pixels 51G of 2×2 in the R same color region 81R share and use the selection transistor SEL, the amplification transistor AMP, the reset transistor RST, and the switching transistor FDG of the shared pixel transistor region 82 adjacent in the column direction (for example, lower side). The eight gradation pixels 51G of 4×2 in the Gr same color region 81Gr share and use the selection transistor SEL, the amplification transistor AMP, the reset transistor RST, and the switching transistor FDG of the shared pixel transistor region 82 adjacent in the column direction (for example, lower side). The eight gradation pixels 51G of 4×2 in the B same color region 81B share and use the selection transistor SEL, the amplification transistor AMP, the reset transistor RST, and the switching transistor FDG of the shared pixel transistor region 82 adjacent in the column direction (for example, lower side). The eight gradation pixels 51G of 4×2 in the Gb same color region 81Gb share and use the selection transistor SEL, the amplification transistor AMP, the reset transistor RST, and the switching transistor FDG of the shared pixel transistor region 82 adjacent in the column direction (for example, lower side).

The pixel array unit 41 of the solid-state imaging device 12 has a layout in which a pixel region (including the shared pixel transistor region 82) of 32 pixels including eight pixels in the row direction and four pixels (8×4) in the column direction described in FIG. 3 is set as a basic pattern of a repeating unit, and the basic pattern is repeatedly arrayed in the row direction and the column direction. This basic pattern includes color filters of a plurality of colors including R, Gr, Gb, and B, and since the event pixel 51E is disposed at the R color filter position, the array of the color filters is a so-called Bayer array.

Note that the pixel array unit 41 may repeatedly arrange the basic pattern of the repeating unit in FIG. 3 at predetermined intervals, for example, at a pitch of 8×N pixels (N>1) in the row direction and at a pitch of 4×M pixels (M>1) in the column direction. In the other regions, the event pixels 51E are not arranged, and only the gradation pixels 51G are arranged in 8×4.

In other words, the event pixels 51E can be regularly arranged at predetermined intervals in the pixel array unit 41, or can be randomly arranged in the pixel array unit 41.

<4. Circuit Configuration Example of Same Color Region>

Figure 4:
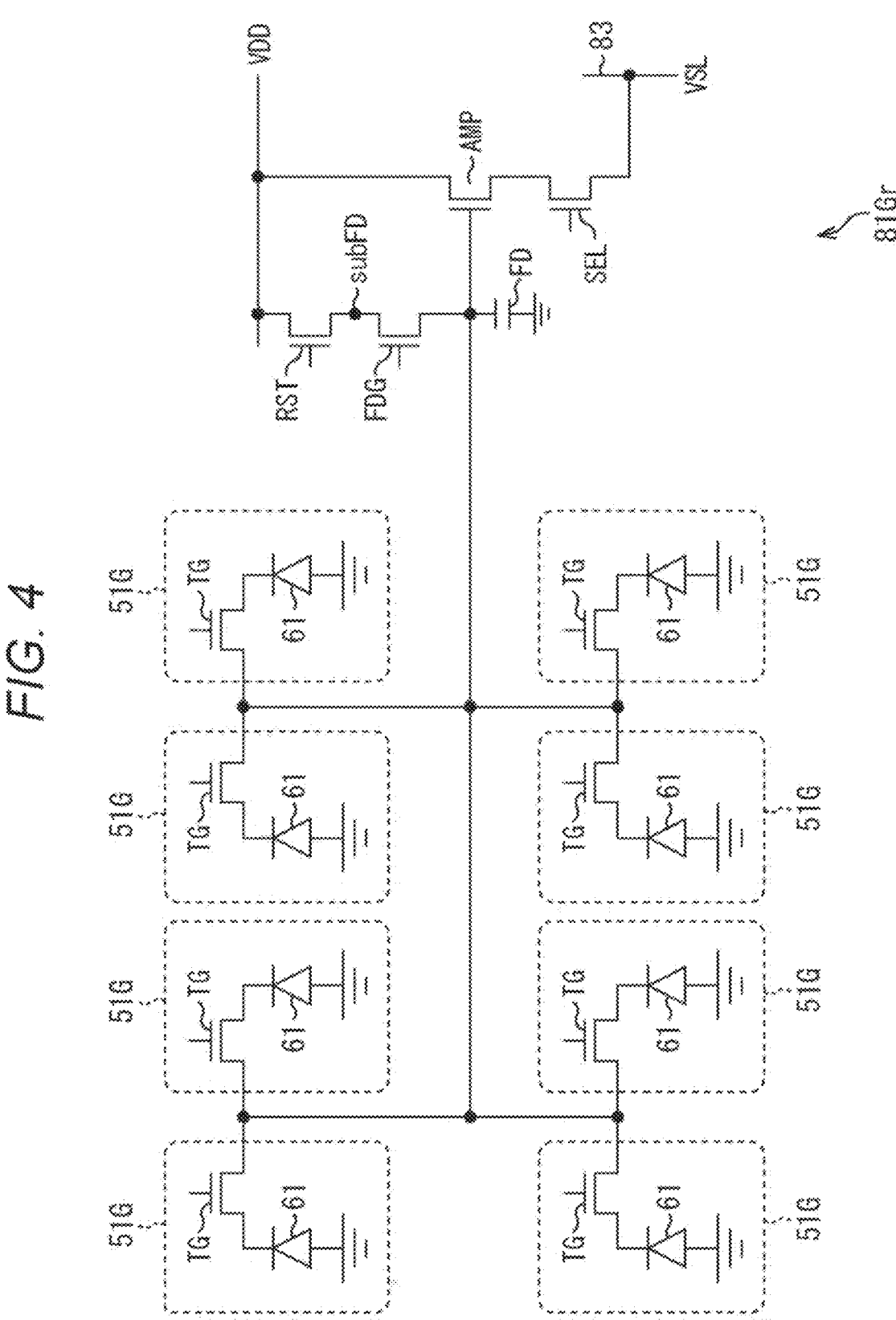
FIG. 4 is a diagram illustrating a circuit configuration example of a Gr same color region.

FIG. 4 illustrates a circuit configuration example of the Gr same color region 81Gr.

The Gr same color region 81Gr is a sharing unit that shares and uses a plurality of pixel transistors disposed in the shared pixel transistor region 82. The Gr same color region 81Gr holds the photodiode 61 and the transfer transistor TG for each gradation pixel 51G, and the floating diffusion region FD, the additional capacitance subFD, the switching transistor FDG, the reset transistor RST, the amplification transistor AMP, and the selection transistor SEL are shared and used by 8 pixels in the Gr same color region 81Gr. Each pixel transistor of the transfer transistor TG, the switching transistor FDG, the reset transistor RST, the amplification transistor AMP, and the selection transistor SEL is constituted by an N-type MOS transistor (MOS FET), and constitutes the readout circuit 63 in FIG. 2.

The photodiode 61 generates and accumulates a charge (signal charge) according to the amount of received light. The photodiode 61 has an anode terminal grounded and a cathode terminal connected to the floating diffusion region FD via the transfer transistor TG.

When turned on by a transfer drive signal supplied to the gate electrode, the transfer transistor TG reads out the charge generated by the transfer transistor TG and transfers the charge to the floating diffusion region FD. The floating diffusion region FD holds the charge read from at least one of the eight photodiodes 61.

The switching transistor FDG turns on and off the connection between the floating diffusion region FD and the additional capacitance subFD according to the capacitance switching signal supplied to the gate electrode, and switches the conversion efficiency. Specifically, for example, when the amount of incident light is high illuminance, the drive unit 42 turns on the switching transistor FDG and connects the floating diffusion region FD and the additional capacitance subFD. It is therefore possible to accumulate more electric charges when luminous intensity is high. On the other hand, when the light amount of the incident light is low illuminance, the drive unit 42 turns off the switching transistor FDG and separates the additional capacitance subFD from the floating diffusion region FD. It is therefore possible to increase conversion efficiency.

When the reset transistor RST is turned on by a reset drive signal supplied to the gate electrode, the charge accumulated in the floating diffusion region FD is discharged to the drain (power supply VDD), and the potential of the floating diffusion region FD is reset. Note that when the reset transistor RST is turned on, the switching transistor FDG is also turned on at the same time, and the additional capacitance subFD is also reset. The additional capacitance subFD includes a diffusion layer (high-concentration N-type semiconductor region) that also serves as the drain region of the switching transistor FDG and the source region of the reset transistor RST.

The amplification transistor AMP outputs a pixel signal corresponding to the potential of the floating diffusion region FD. That is, the amplification transistor AMP constitutes a source follower circuit with a load MOS transistor (not illustrated) as a constant current source connected via the vertical signal line 83, and the pixel signal VSL indicating a level corresponding to the charge accumulated in the floating diffusion region FD is output from the amplification transistor AMP to the luminance signal processing unit 45 (FIG. 2) via the selection transistor SEL.

The selection transistor SEL is turned on when the Gr same color region 81Gr is selected by the selection drive signal supplied to the gate electrode, and outputs the signal generated in the Gr same color region 81Gr to the luminance signal processing unit 45 via the vertical signal line 83 as the pixel signal VSL. Each signal line through which the transfer drive signal, the capacitance switching signal, the selection drive signal, and the reset drive signal are transmitted is connected to the drive unit 42 in FIG. 2.

As described above, the eight gradation pixels 51G of 4×2 in the Gr same color region 81Gr share and use the pixel transistors of the switching transistor FDG, the reset transistor RST, the amplification transistor AMP, and the selection transistor SEL disposed in the shared pixel transistor region 82.

For example, the solid-state imaging device 12 can appropriately select and perform the following driving according to the operation mode.

For example, as the first operation mode, the solid-state imaging device 12 can have a mode in which the transfer transistors TG of the eight gradation pixels 51G in the sharing unit are sequentially turned on in units of one pixel, charges generated in the photodiodes 61 of one pixel are transferred to the floating diffusion region FD, and are sequentially output as the pixel signal VSL to the luminance signal processing unit 45 via the vertical signal line 83.

For example, as the second operation mode, the solid-state imaging device 12 can perform a mode in which the transfer transistors TG of the eight gradation pixels 51G in the sharing unit are turned on in units of two pixels adjacent in the row direction or the column direction, charges generated in the photodiodes 61 of the two pixels are simultaneously transferred to the floating diffusion region FD, and are sequentially output as the pixel signal VSL to the luminance signal processing unit 45 via the vertical signal line 83.

For example, as the third operation mode, the solid-state imaging device 12 can be in a mode in which the transfer transistors TG of the eight gradation pixels 51G in the sharing unit are turned on in units of 4 pixels of 2×2, charges generated in the photodiodes 61 of 4 pixels are simultaneously transferred to the floating diffusion region FD, and are sequentially output as the pixel signal VSL to the luminance signal processing unit 45 via the vertical signal line 83.

For example, as the fourth operation mode, the solid-state imaging device 12 can be in a mode in which all the transfer transistors TG of the eight gradation pixels 51G in the sharing unit are simultaneously turned on, charges generated in the photodiodes 61 of the eight pixels are simultaneously transferred to the floating diffusion region FD, and are output as the pixel signal VSL to the luminance signal processing unit 45 via the vertical signal line 83.

Note that a circuit configuration example of the Gb same color region 81Gb and the B same color region 81B in which the pixel transistors are shared and used by the 8 gradation pixels 51G of 4×2 is also similar to the Gr same color region 81Gr of FIG. 4.

Furthermore, although not illustrated, the circuit configuration example of the R same color region 81R in which the pixel transistors are shared and used by the four gradation pixels 51G of 2×2 has a configuration in which the eight photodiodes 61 and the eight transfer transistors TG in FIG. 4 are changed to the four photodiodes 61 and the four transfer transistors TG. The operation mode of the R same color region 81R is similar to that of the Gr same color region 81Gr except that a fourth operation mode in which charges generated in the photodiodes 61 of eight pixels are simultaneously output as the pixel signal VSL cannot be used.

<5. Configuration Example of Address Event Detection Circuit>

Figure 5:
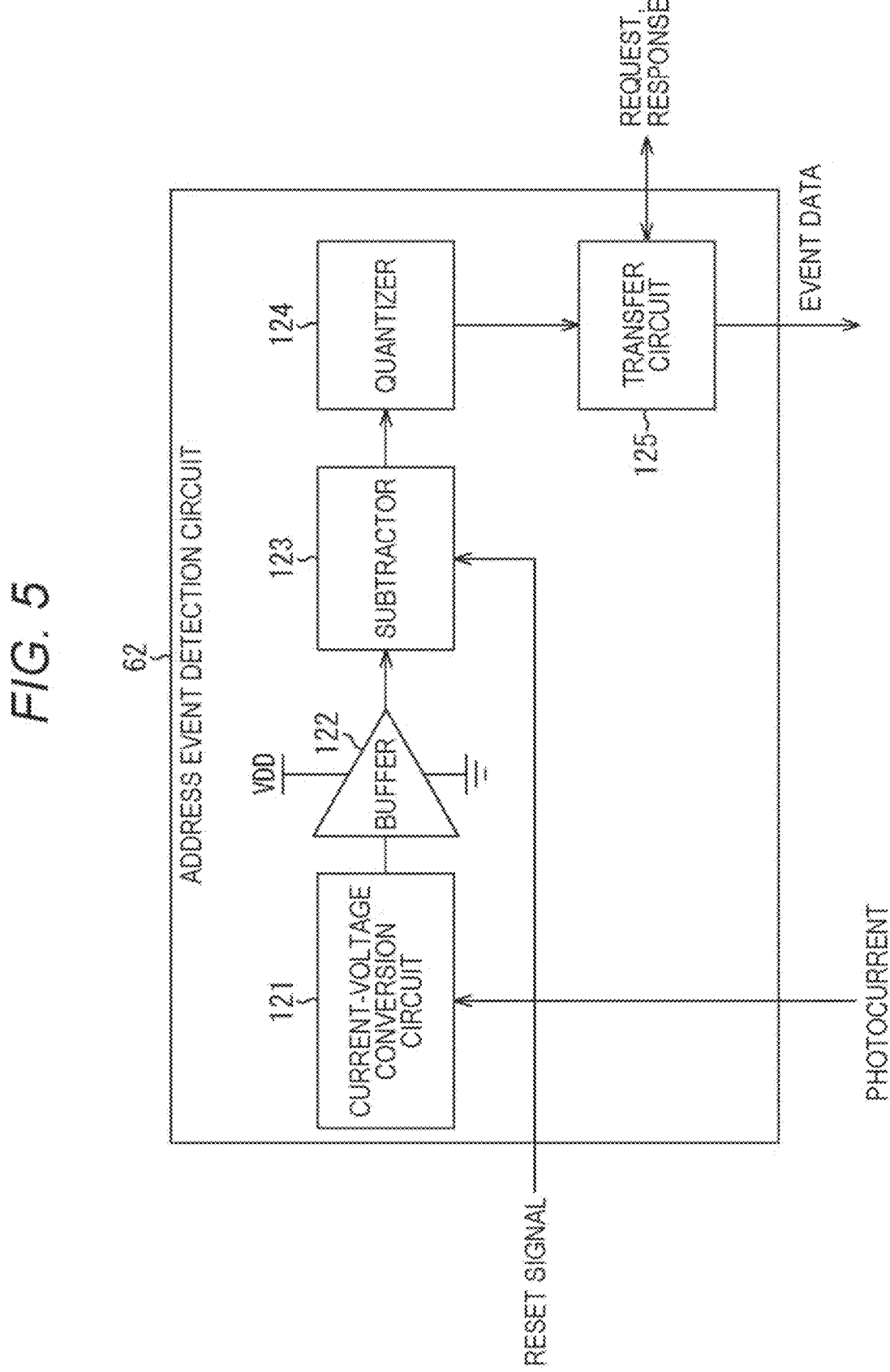
FIG. 5 is a block diagram illustrating a configuration example of an address event detection circuit.

FIG. 5 is a block diagram illustrating a configuration example of the address event detection circuit 62.

The address event detection circuit 62 includes a current-voltage conversion circuit 121, a buffer 122, a subtractor 123, a quantizer 124, and a transfer circuit 125.

The current-voltage conversion circuit 121 converts the photocurrent from the corresponding photodiode 61 into a voltage signal. The current-voltage conversion circuit 121 generates a voltage signal (Hereinafter, it is also appropriately referred to as a logarithmic conversion voltage signal.) corresponding to the logarithmic value of the photocurrent and outputs the voltage signal to the buffer 122.

The buffer 122 buffers the voltage signal from the current-voltage conversion circuit 121 and outputs the voltage signal to the subtractor 123. With the buffer 122, it is possible to secure the isolation of noise accompanying the switching operation in the subsequent stage and to improve the driving force for driving the subsequent stage. Note that the buffer 122 can be omitted.

The subtractor 123 lowers the level of the voltage signal from the buffer 122 in accordance with the reset signal from the arbiter 43. The subtractor 123 outputs the reduced voltage signal to the quantizer 124.

The quantizer 124 quantizes the voltage signal from the subtractor 123 into a digital signal and supplies the digital signal to the transfer circuit 125 as event data. The transfer circuit 125 transfers (outputs) the event data to the event signal processing unit 44. That is, the transfer circuit 125 supplies a request for requesting the output of the event data to the arbiter 43. Then, when receiving a response indicating that the output of the event data is permitted in response to the request from the arbiter 43, the transfer circuit 125 transfers the event data to the event signal processing unit 44.

<Detailed Configuration Example of Address Event Detection Circuit>

Figure 6:
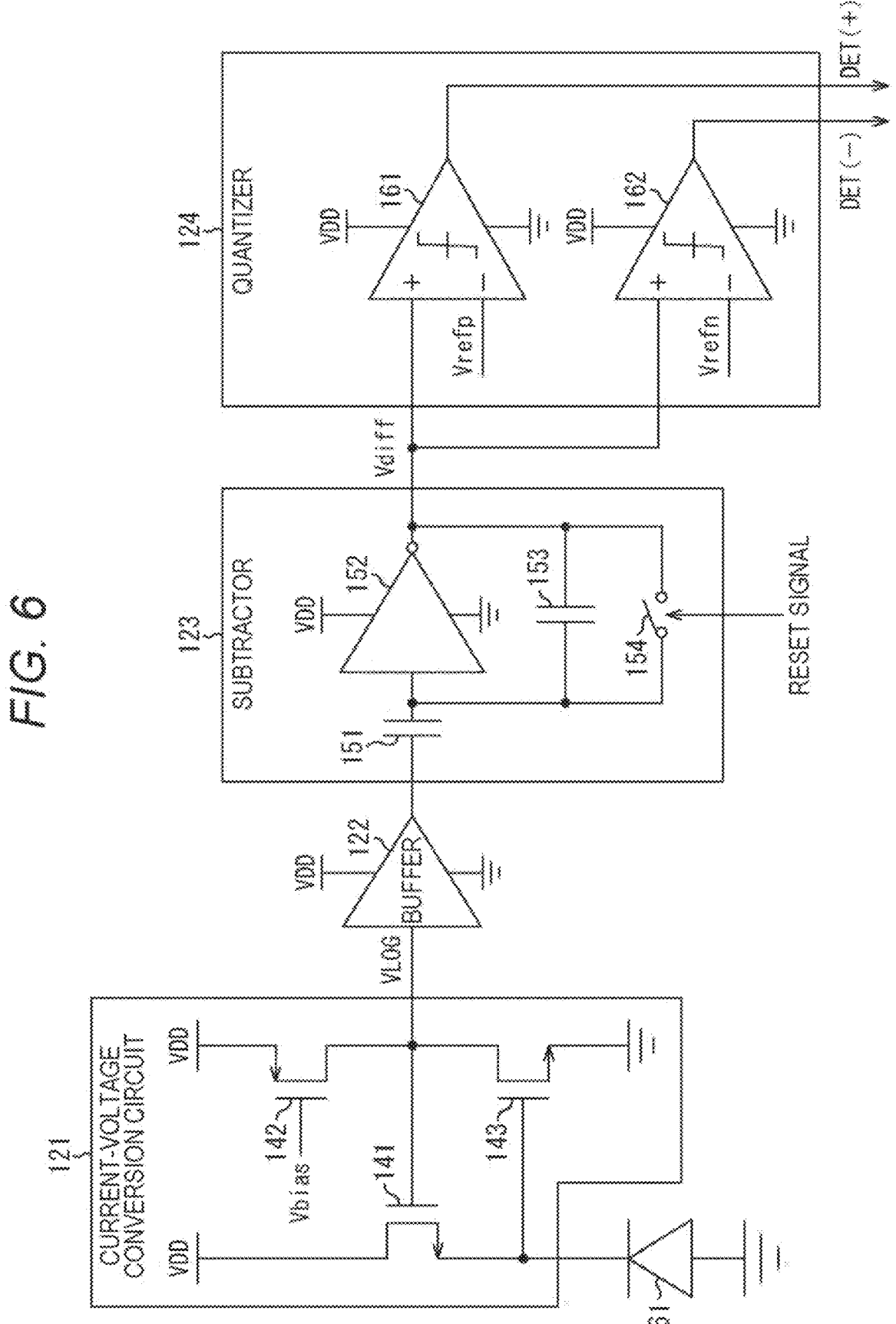
FIG. 6 is a diagram illustrating a detailed circuit configuration example of an address event detection circuit.

FIG. 6 is a circuit illustrating detailed configurations of the current-voltage conversion circuit 121, the subtractor 123, and the quantizer 124. In FIG. 6, the photodiode 61 connected to the current-voltage conversion circuit 121 is also illustrated.

The current-voltage conversion circuit 121 includes transistors 141 to 143. As the transistors 141 and 143, for example, an N-type MOS transistor (MOS FET) can be adopted, and as the transistor 142, for example, a P-type MOS transistor (MOS FET) can be adopted.

The photodiode 61 receives incident light, performs photoelectric conversion, and generates and flows a photocurrent as an electric signal. The current-voltage conversion circuit 121 converts the photocurrent from the photodiode 61 into a voltage (Hereinafter, also referred to as an optical voltage.) VLOG corresponding to the logarithm of the photocurrent, and outputs the converted voltage to the buffer 122.

A source of the transistor 141 is connected to a gate of the transistor 143, and a photocurrent by the photodiode 61 flows through a connection point between the source of the transistor 141 and the gate of the transistor 143. The drain of the transistor 141 is connected to the power supply VDD, and the gate thereof is connected to the drain of the transistor 143. The source of the transistor 142 is connected to the power supply VDD, and the drain thereof is connected to a connection point between the gate of the transistor 141 and the drain of the transistor 143. A predetermined bias voltage Vbias is applied to the gate of the transistor 142. The source of the transistor 143 is grounded.

The drain of the transistor 141 is connected to the power supply VDD side and is a source follower. The photodiode 61 is connected to the source of the source follower transistor 141, so that a photocurrent due to a charge generated by photoelectric conversion of the photodiode 61 flows through (the drain to the source of) the transistor 141. The transistor 141 operates in the subthreshold region, and the optical voltage VLOG corresponding to the logarithm of the photocurrent flowing through the transistor 141 appears at the gate of the transistor 141.

As described above, the current-voltage conversion circuit 121 includes the transistor 141 as the logarithmic transistor (LOG transistor) that converts the photocurrent into an optical voltage corresponding to the logarithm of the photocurrent flowing through the photodiode 61, the transistor 142 as the constant current source, and the transistor 143 as the amplification transistor that amplifies the optical voltage.

The optical voltage VLOG is output from the connection point between the gate of the transistor 141 and the drain of the transistor 143 to the subtractor 123 via the buffer 122.

For the optical voltage VLOG from the current-voltage conversion circuit 121, the subtractor 123 calculates a difference between the current optical voltage and an optical voltage at a timing different from the current timing by a minute time, and outputs a difference signal Vdiff corresponding to the difference.

The subtractor 123 includes a capacitor 151, an operational amplifier 152, a capacitor 153, and a switch 154. The quantizer 124 includes comparators 161 and 162.

One end of the capacitor 151 is connected to the output of the buffer 122, and the other end is connected to the input terminal of the operational amplifier 152. Therefore, the optical voltage VLOG is input to the (inverted) input terminal of the operational amplifier 152 via the capacitor 151.

The output terminal of the operational amplifier 152 is connected to the non-inverting input terminals (+) of the comparators 161 and 162 of the quantizer 124.

One end of the capacitor 153 is connected to an input terminal of the operational amplifier 152, and the other end is connected to an output terminal of the operational amplifier 152.

The switch 154 is connected to the capacitor 153 so as to turn on/off the connection between both ends of the capacitor 153. The switch 154 is turned on/off according to the reset signal from the arbiter 43 to turn on/off the connection between both ends of the capacitor 153.

The capacitor 153 and the switch 154 constitute a switched capacitor. When the switch 154 that has been turned off is temporarily turned on and turned off again, the capacitor 153 is reset to a state in which electric charges are discharged and electric charges can be newly accumulated.

The optical voltage VLOG of the capacitor 151 on the side of the photodiode 61 when the switch 154 is turned on is denoted by Vinit, and the capacitance (electrostatic capacitance) of the capacitor 151 is denoted by C1. The input terminal of the operational amplifier 152 is virtually grounded, and the charge Qinit accumulated in the capacitor 151 in a case where the switch 154 is turned on is expressed by Formula (1).

$$Qinit = C1 \times Vinit \tag{1}$$

Furthermore, in a case where the switch 154 is on, both ends of the capacitor 153 are short-circuited, so that the charge accumulated in the capacitor 153 becomes 0.

Thereafter, when the optical voltage VLOG of the capacitor 151 on the side of the photodiode 61 in a case where the switch 154 is turned off is represented as Vafter, the charge Qafter accumulated in the capacitor 151 in a case where the switch 154 is turned off is represented by Formula (2).

$$Qafter = C1 \times Vafter \tag{2}$$

When the capacitance of the capacitor 153 is represented as C2, the charge Q2 accumulated in the capacitor 153 is represented by Formula (3) using the difference signal Vdiff which is the output voltage of the operational amplifier 152.

$$Q2 = -C2 \times Vdiff \tag{3}$$

18

Before and after the switch 154 is turned off, the total charge amount of the charge of the capacitor 151 and the charge of the capacitor 153 does not change, so that Formula (4) is established.

$$Qinit = Qafter + Q2 \tag{4}$$

When Formulas (1) to (3) are substituted into Formula (4), Formula (5) is obtained.

$$Vdiff = -(C1/C2) \times (Vafter - Vinit) \tag{5}$$

According to Formula (5), the subtractor 123 subtracts the optical voltages Vafter and Vinit, that is, calculates the difference signal Vdiff corresponding to the difference (Vafter-Vinit) between the optical voltages Vafter and Vinit. According to Formula (5), the gain of subtraction by the subtractor 123 is C1/C2. Therefore, the subtractor 123 outputs a voltage obtained by multiplying the change in the optical voltage VLOG after resetting of the capacitor 153 by C1/C2 as the difference signal Vdiff.

The subtractor 123 outputs the difference signal Vdiff by turning on and off the switch 154 by the reset signal output from the arbiter 43.

The difference signal Vdiff output from the subtractor 123 is supplied to the non-inverting input terminals (+) of the comparators 161 and 162 of the quantizer 124.

The comparator 161 compares the difference signal Vdiff from the subtractor 123 with a positive side threshold Vrefp input to the inverting input terminal (−). The comparator 161 outputs the detection signal DET (+) at the H (High) level or the L (Low) level indicating whether or not the difference signal Vdiff exceeds the positive side threshold value Vrefp to the transfer circuit 125 as event data obtained by quantizing the difference signal Vdiff.

The comparator 162 compares the difference signal Vdiff from the subtractor 123 with a negative side threshold Vrefn input to the inverting input terminal (−). The comparator 162 outputs the detection signal DET (−) at the H (High) level or the L (Low) level indicating whether or not the negative side threshold Vrefn is exceeded to the transfer circuit 125 as the quantized event data of the difference signal Vdiff.

<Another Detailed Configuration Example of Current-Voltage Conversion Circuit>

In the current-voltage conversion circuit 121 of FIG. 6, one loop circuit including the transistor 141 which is a logarithmic transistor and the transistor 143 which is an amplification transistor is provided, but there is a possibility that a conversion gain when converting a current into a voltage is insufficient with only one loop circuit. Therefore, a configuration example of the current-voltage conversion circuit 121 provided with a two-stage loop circuit will be described.

Figure 7:
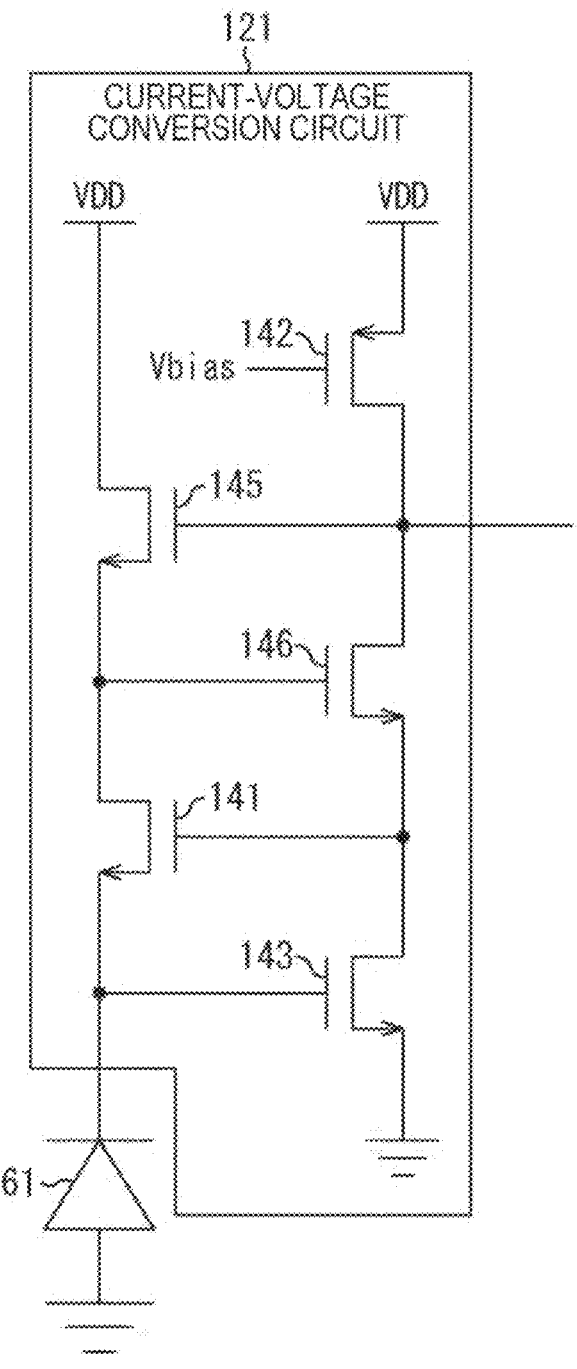
FIG. 7 is a diagram illustrating a configuration example of a current-voltage conversion circuit provided with a two-stage loop circuit.

That is, FIG. 7 is a circuit diagram illustrating another configuration example of the current-voltage conversion circuit 121.

The current-voltage conversion circuit 121 in FIG. 7 is different from the current-voltage conversion circuit 121 in FIG. 6 in that transistors 145 and 146 are further provided. The transistors 145 and 146 include, for example, N-type MOS transistors (MOS FETs).

The transistors 145 and 141 are connected in series between the power supply VDD and the photodiode 61, and the transistor 142 and the transistors 146 and 143 are connected in series between the power supply VDD and the ground terminal. Furthermore, a gate of the transistor 141 is connected to a connection point between the transistor 146 and the transistor 143, and a gate of the transistor 145 is connected to a connection point between the transistor 142 and the transistor 146.

On the other hand, a gate of the transistor 143 is connected to a connection point between the photodiode 61 and the transistor 141, similarly to the current-voltage conversion circuit 121 in FIG. 6. A gate of the transistor 146 is connected to a connection point between the transistor 141 and the transistor 145. Furthermore, the connection point between the transistor 142 and the transistor 146 is connected to the buffer 122 in FIG. 5.

As described above, since the loop circuit including the transistor 141 as the logarithmic transistor and the transistor 143 as the amplification transistor and the loop circuit including the transistor 145 as the logarithmic transistor and the transistor 146 as the amplification transistor are connected in two stages, the conversion gain can be doubled as compared with the case where the loop circuit is only in one stage.

Figure 8:
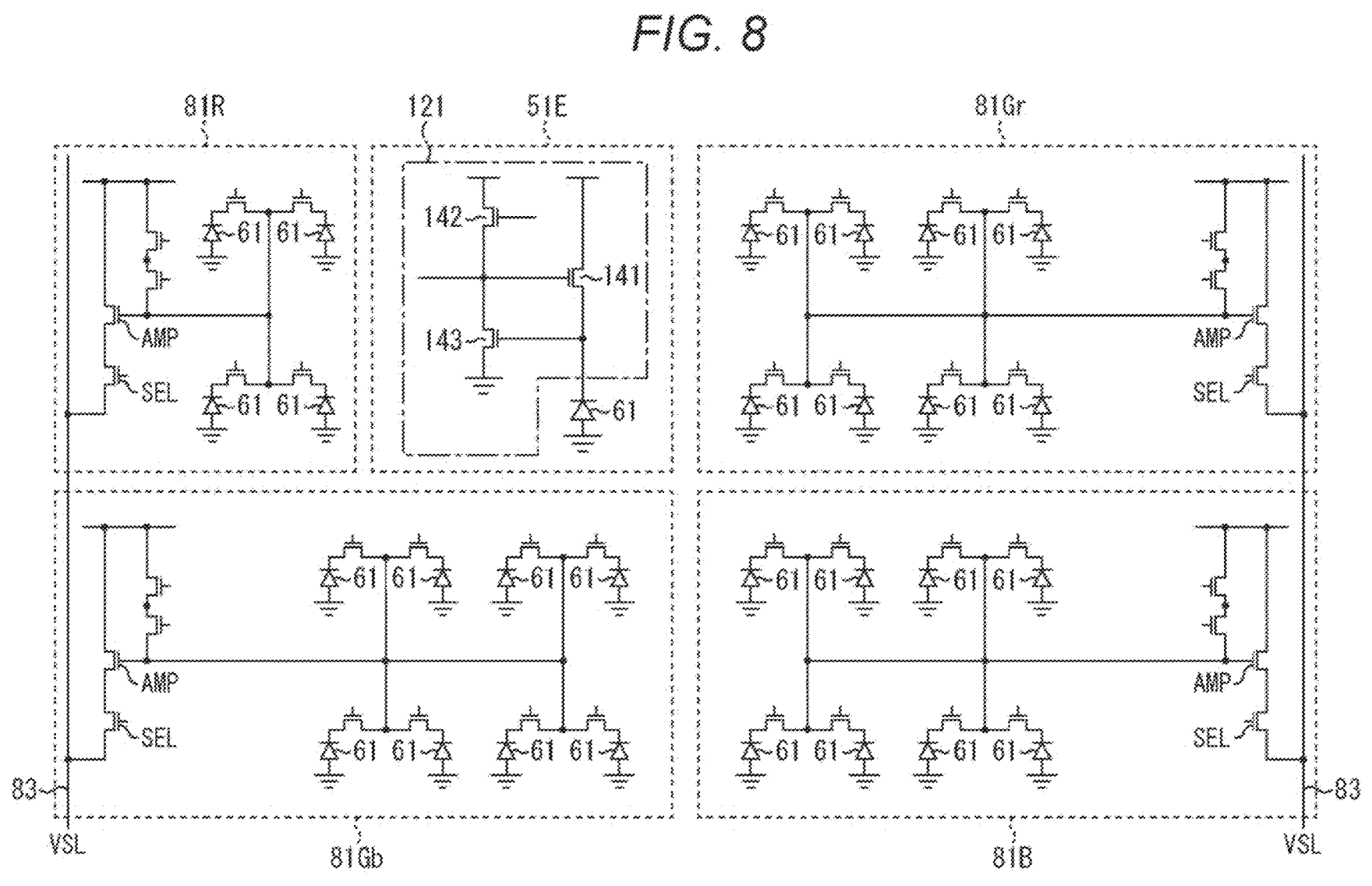

FIG. 8 illustrates a circuit configuration example in which the circuit configuration described in FIGS. 4 and 6 is applied to the first pixel layout described in FIG. 3, specifically, a 32 pixel region including one event pixel 51E and each gradation pixel 51G of the R same color region 81R, the Gr same color region 81Gr, the Gb same color region 81Gb, and the B same color region 81B. Note that, for convenience of space in the drawings, some reference signs are omitted, and for the event pixel 51E, only the current-voltage conversion circuit 121 that is a part of the address event detection circuit 62 is illustrated.

<6. Second to Fourth Pixel Layout Examples>

Figure 9:
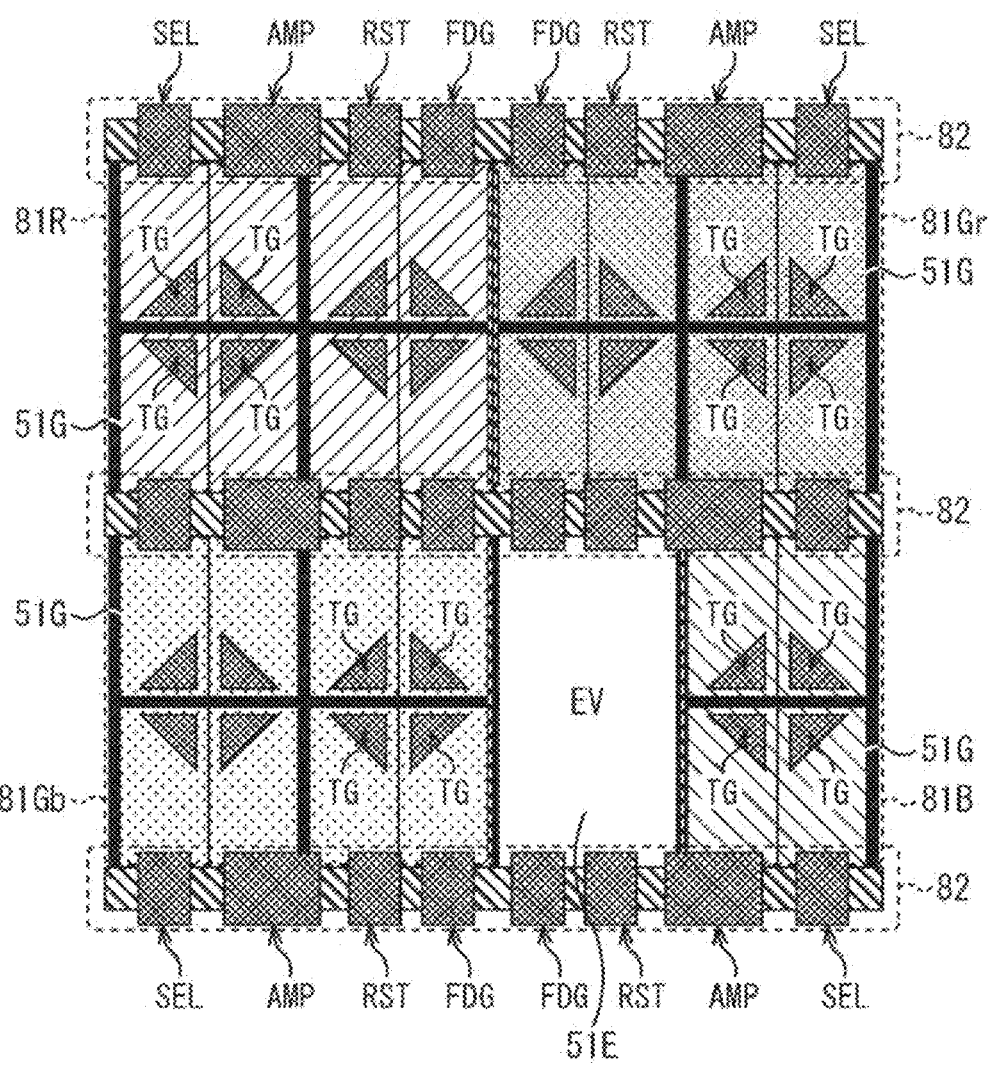
FIG. 9 is a plan view for explaining a second pixel layout in the pixel array unit.

FIG. 9 is a plan view of a second pixel layout illustrating another arrangement example of the event pixels 51E.

In the first pixel layout illustrated in FIG. 3, the event pixel 51E is disposed at the R color filter position, but in the second pixel layout of FIG. 9, the event pixel 51E is disposed at the B color filter position. As described above, the arrangement of the event pixels 51E is not limited to the R color filter positions.

As illustrated in FIG. 9, in a case where the event pixel 51E is disposed at the B color filter position, the R same color region 81R includes eight gradation pixels 51G of 4×2, and the B same color region 81B includes four gradation pixels 51G of 2×2.

Alternatively, although not illustrated, the event pixel 51E may be disposed at a color filter position of Gr or Gb. In this case, the R same color region 81R includes eight gradation pixels 51G of 4×2, and the Gr same color region 81Gr or Gb same color region 81Gb in which the event pixels 51E are arranged includes four gradation pixels 51G of 2×2.

Note that, in a general imaging image sensor including only the gradation pixels 51G, it is known that in a case where G pixels are reduced among an R pixel in which an R color filter is disposed, a G pixel in which a G (Gr, Gb) color filter is disposed, and a B pixel in which a B color filter is disposed, the influence of resolution reduction of a captured image is large due to human sensitivity characteristics and the like. Therefore, in a case where the event pixel 51E is disposed, it is preferable to dispose the event pixel at the R color filter position or the B color filter position rather than the Gr or Gb color filter position.

Figure 10:
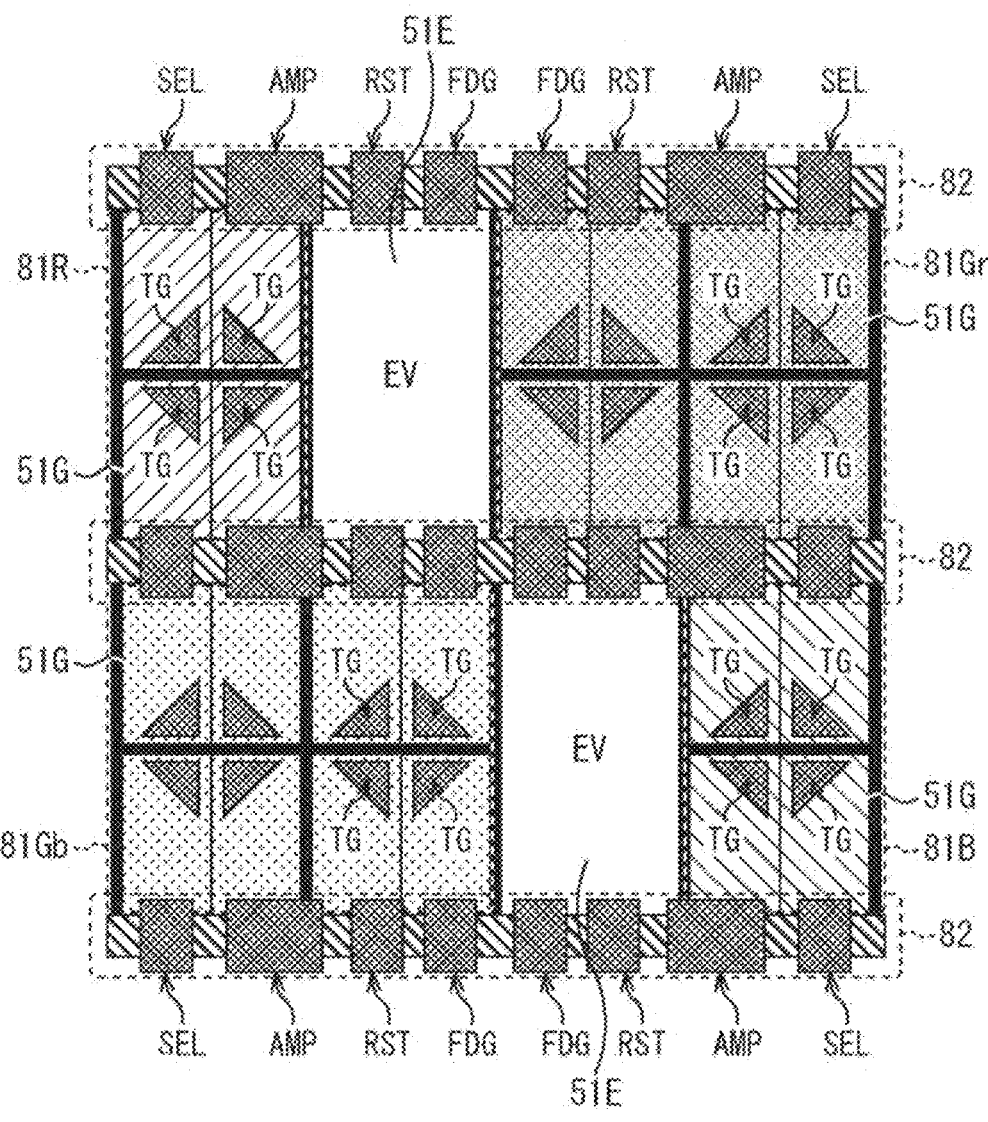
FIG. 10 is a plan view for explaining a third pixel layout in the pixel array unit.

FIG. 10 is a plan view of a third pixel layout illustrating another arrangement example of the event pixels 51E.

In the above-described example, the pixel layout has been described in which only one unit region (region of four pixels of 2×2) is replaced with the event pixel 51E with respect to the pixel region of 32 pixels of 8×4 having the color filter arrangement of R, Gr, Gb, and B which is the repeating unit of the Bayer array.

However, the pixel array unit 41 can also adopt a pixel layout in which two unit regions are replaced with event pixels 51E for a pixel region of 32 pixels of 8×4 having a combination of R, Gr, Gb, and B color filters as repeating units of the Bayer array.

FIG. 10 illustrates an example of a pixel layout in which two unit regions in a pixel region of 32 pixels are replaced with event pixels 51E.

The event pixels 51E are arranged at the R color filter position and the B color filter position, and the two event pixels 51E are arranged adjacent to each other in the diagonal direction. With the arrangement of the event pixels 51E, each of the R same color region 81R and the B same color region 81B includes four gradation pixels 51G of 2×2.

Figure 11:
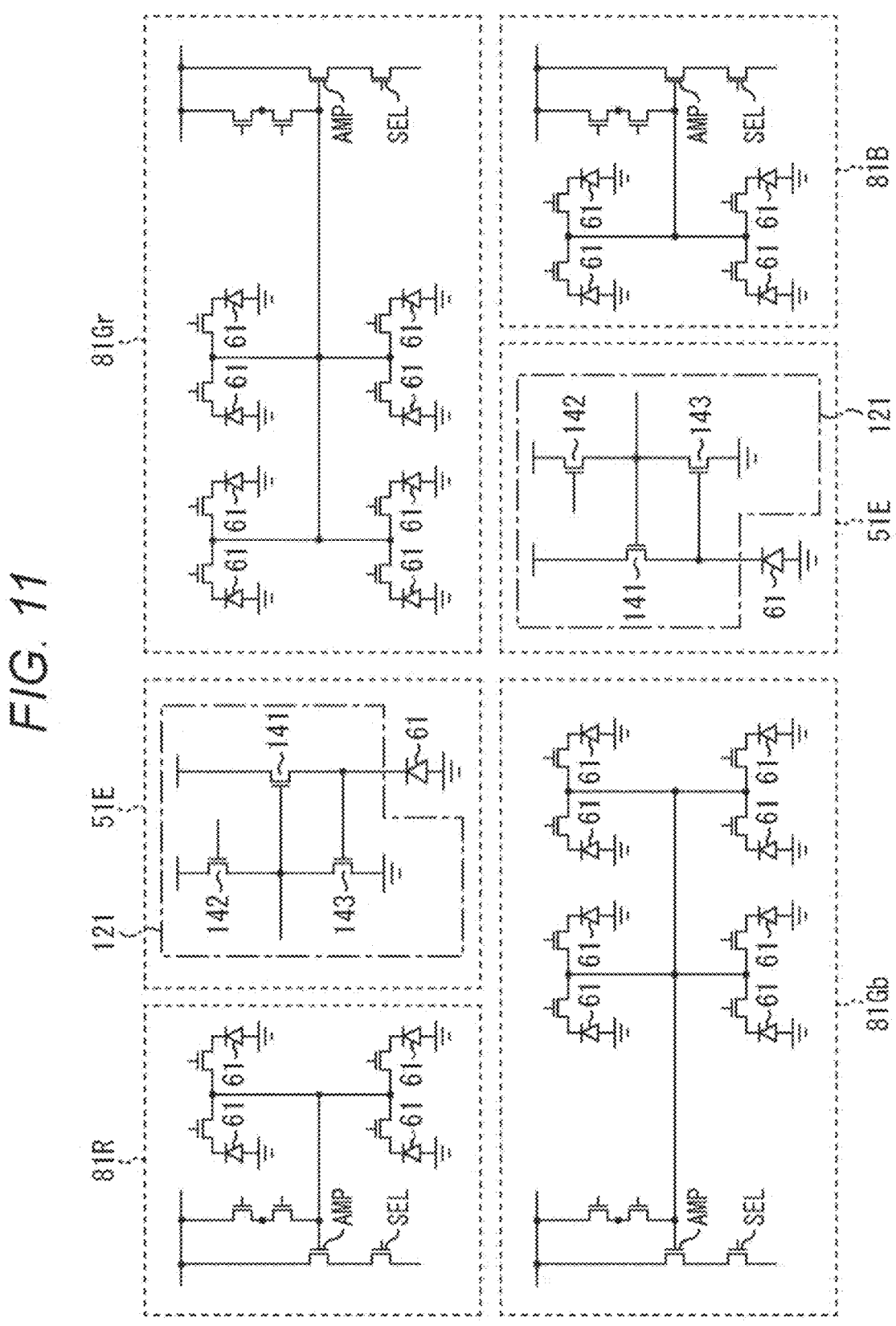
FIG. 11 is a diagram illustrating a first circuit configuration example of a third pixel layout.

FIG. 11 illustrates a first circuit configuration example of the third pixel layout of FIG. 10 in which two event pixels 51E are disposed in a pixel region of 32 pixels. Note that, similarly to FIG. 8, some reference signs are omitted.

In the first circuit configuration of FIG. 11, in the R same color region 81R whose region is reduced by arranging the event pixel 51E, the four gradation pixels 51G of 2×2 share the reset transistor RST, the amplification transistor AMP, the switching transistor FDG, and the selection transistor SEL. Similarly, the B same color region 81B whose region is reduced by arranging the event pixel 51E also shares the reset transistor RST, the amplification transistor AMP, the switching transistor FDG, and the selection transistor SEL in the four gradation pixels 51G of 2×2.

Figure 12:
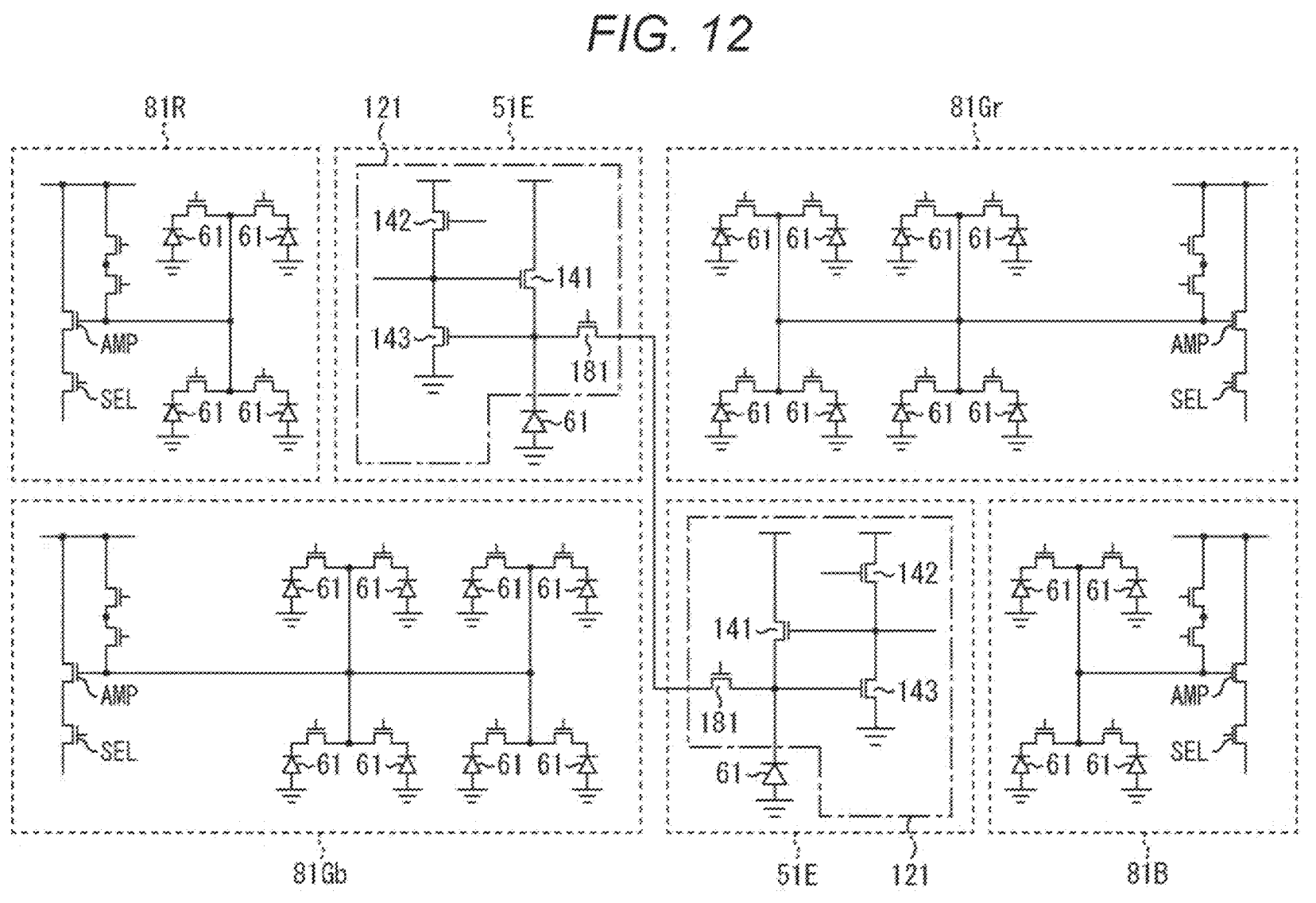

The event pixel 51E includes a photodiode 61 and an address event detection circuit 62 at each of the R color filter position and the B color filter position. In FIG. 11, only the current-voltage conversion circuit 121 that is a part of the address event detection circuit 62 is illustrated. FIG. 12 illustrates a second circuit configuration example of the third pixel layout of FIG. 10 in which two event pixels 51E are disposed in a pixel region of 32 pixels. Note that, similarly to FIG. 11, some reference signs are omitted.

The second circuit configuration illustrated in FIG. 12 is different from the first circuit configuration in FIG. 11 in that an addition transistor 181 is newly provided in each of the current-voltage conversion circuits 121 of the two event pixels 51E, and the addition transistors 181 are connected, and is common in other points.

More specifically, one of the drain and the source of the addition transistor 181 of each event pixel 51E is connected to each other, and the other is connected to a connection point of the photodiode 61, the gate of the transistor 143, and the source of the transistor 141. An addition control signal is supplied from the drive unit 42 to the gate of the addition transistor 181. When the addition transistors 181 of the two event pixels 51E are turned on by the control of the drive unit 42, the photocurrents flowing through the two event pixels 51E are summed up, so that it is possible to operate as one event pixel 51E. As a result, event detection at low illuminance becomes easy, and event detection characteristics can be improved.

Figure 13:
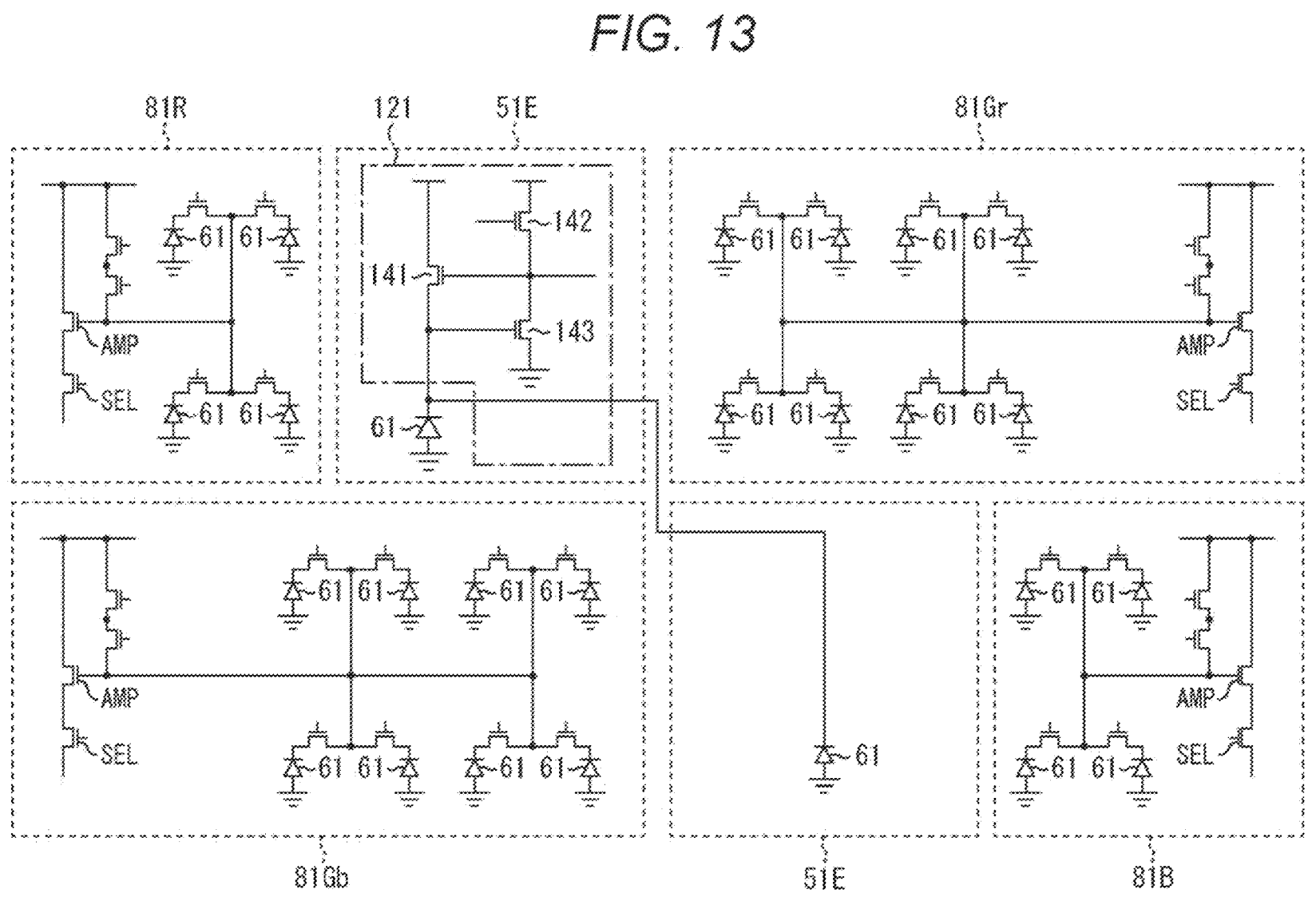

FIG. 13 illustrates a third circuit configuration example of the third pixel layout of FIG. 10 in which two event pixels 51E are disposed in a pixel region of 32 pixels.

The second circuit configuration in FIG. 12 is configured such that the photodiode 61 and the address event detection circuit 62 are provided in each of the two event pixels 51E, and the operation as one event pixel 51E or the operation as two event pixels 51E can be switched by turning on and off the connection between the two event pixels 51E by the addition transistor 181.

On the other hand, the third circuit configuration of FIG. 13 is different from the second circuit configuration of FIG. 12 in that only one address event detection circuit 62 is provided in the regions of the two event pixels 51E and operates as only one event pixel 51E, and is common in other points.

Specifically, in the third circuit configuration of FIG. 13, the photodiodes 61 are individually provided in the regions of the two event pixels 51E, but only one address event detection circuit 62 is provided. The photodiodes 61 provided in the two event pixels 51E are electrically connected by predetermined wiring of a multilayer wiring layer formed on one surface of the semiconductor substrate.

Figure 14:
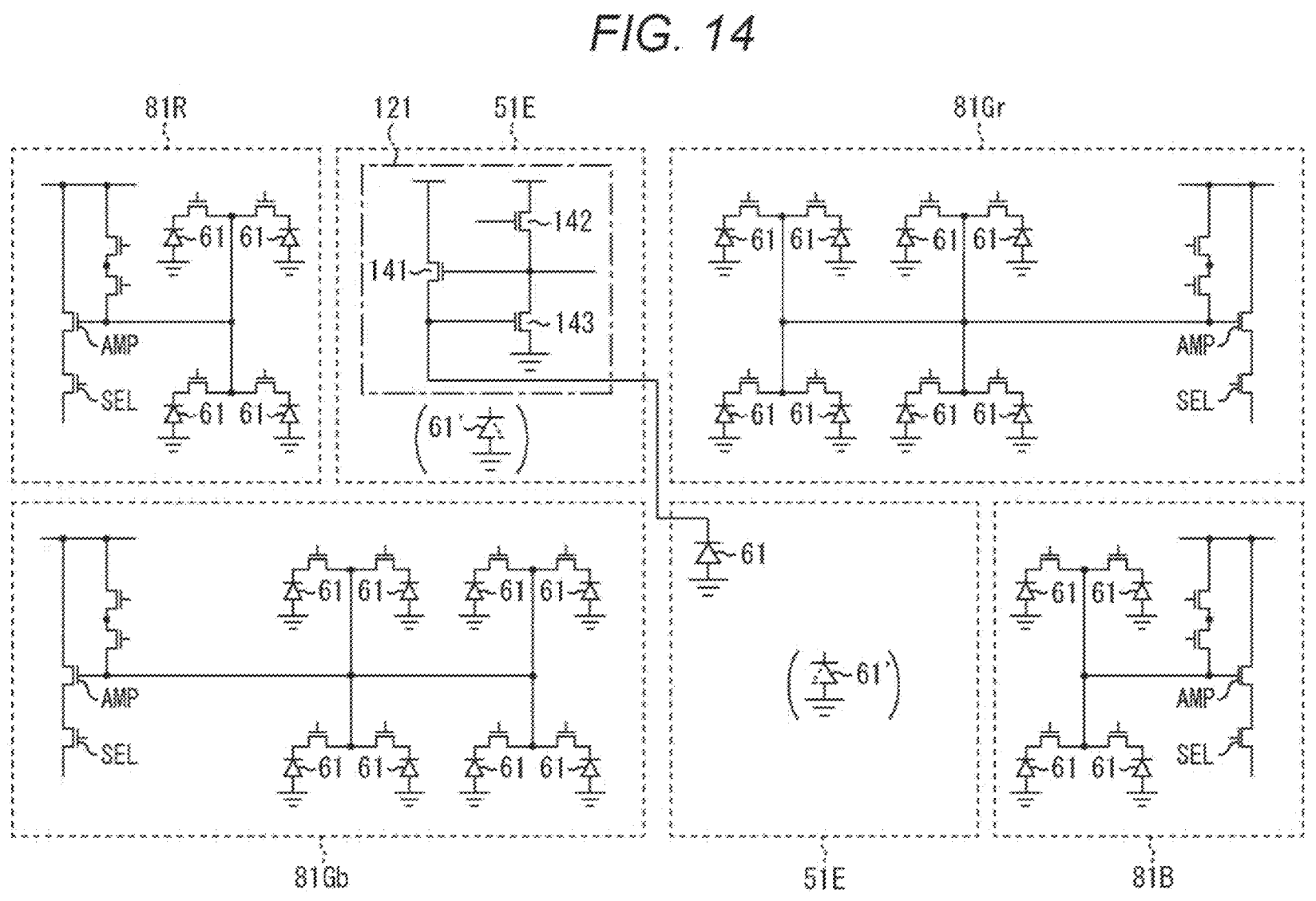

FIG. 14 illustrates a fourth circuit configuration example of the third pixel layout in FIG. 10 in which two event pixels 51E are disposed in a pixel region of 32 pixels.

In the third circuit configuration of FIG. 13, the photodiodes 61 are individually provided in the regions of the two event pixels 51E and are connected by wiring, so that the photodiodes operate substantially as one photodiode 61.

On the other hand, the fourth circuit configuration in FIG. 14 is different from the circuit configuration in FIG. 13 in that one photodiode 61 is physically formed in the regions of the two event pixels 51E in the semiconductor substrate, and is common in other points.

In other words, a part of the photodiode 61 (photodiode 61') formed in one of the regions of the two event pixels 51E and a part of the photodiode 61 (photodiode 61') formed in the other are connected in the semiconductor substrate, thereby configuring one photodiode 61.

According to the third circuit configuration in FIG. 13 and the fourth circuit configuration in FIG. 14, since the formation region of the photodiode 61 in one event pixel 51E is doubled as compared with the first circuit configuration in FIG. 11 and the second circuit configuration in FIG. 12 in which the addition transistor 181 is turned off, the event detection characteristics can be improved.

Note that, in a case where the regions of the two event pixels 51E are operated as substantially one photodiode 61 as in the second to fourth circuit configurations in FIGS. 12 to 14, arranging the event pixels 51E in two unit regions adjacent in the diagonal direction as in the pixel layout illustrated in FIG. 10 is preferable because the distance between the two event pixels 51E can be shortened. The circuit configuration of the two event pixels 51E having the second to fourth circuit configurations in FIGS. 12 to 14 may be applied to two unit regions adjacent in the row direction or the column direction.

The second to fourth circuit configurations in FIGS. 12 to 14 that connect the regions of the two event pixels 51E are not limited to a case where the regions of the two event pixels 51E are disposed in two unit regions adjacent in the diagonal direction, the row direction, or the column direction.

Figure 15:
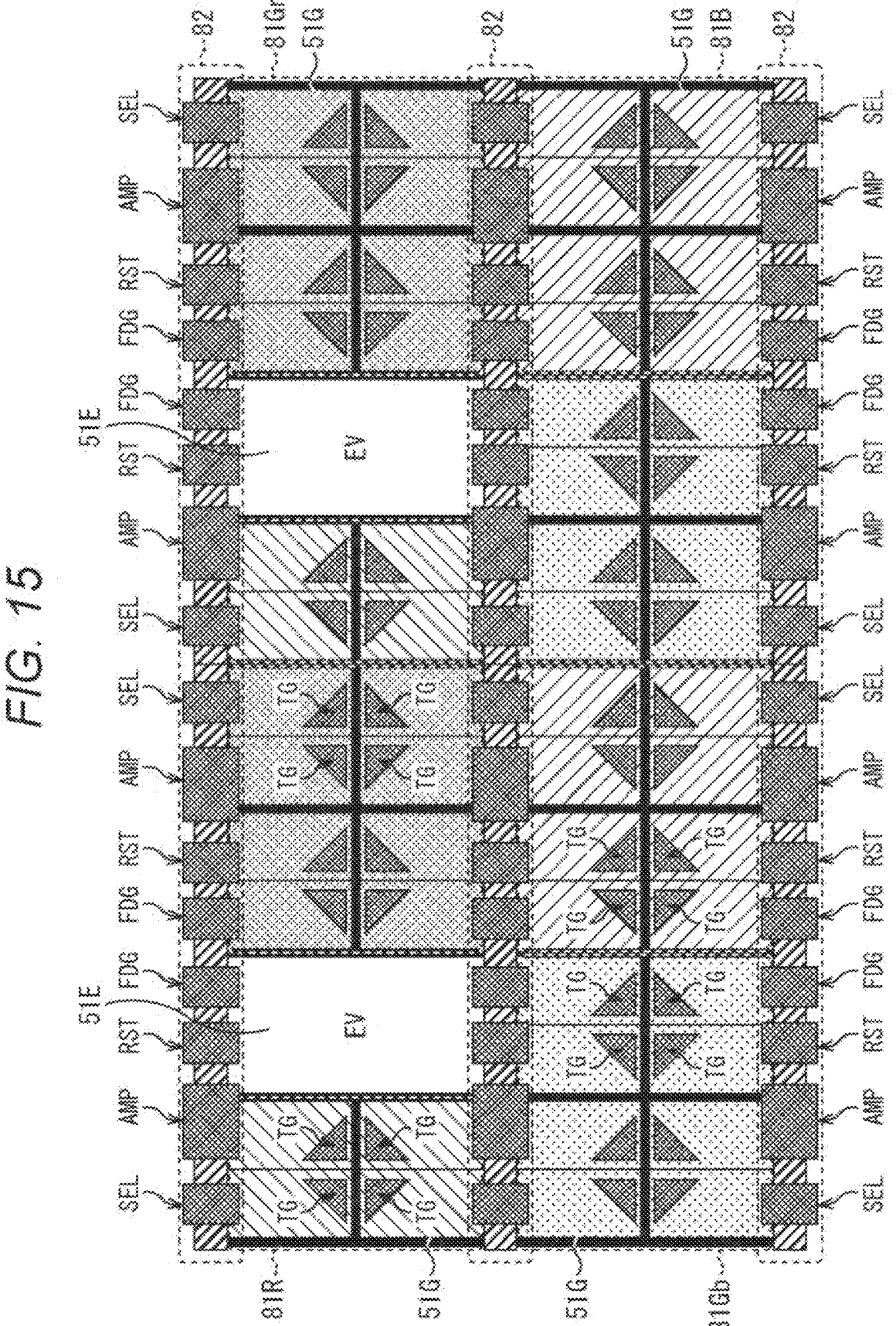
FIG. 15 is a plan view for explaining a pixel layout to which second to fourth circuit configurations can be applied.

For example, as in the pixel layout in FIG. 15, the circuit configuration of the two event pixels 51E having the second to fourth circuit configurations in FIGS. 12 to 14 may be applied to the two event pixels 51E arranged at the R color filter position in the layout in which the first pixel layout described in FIG. 3 is repeatedly arranged in the row direction and the column direction.

FIG. 15 illustrates an example in which the second to fourth circuit configurations of FIGS. 12 to 14 are applied to the two event pixels 51E adjacent in the row direction, but the second to fourth circuit configurations of FIGS. 12 to 14 may be applied to the event pixels 51E adjacent in the column direction.

The example described with reference to FIGS. 10 to 15 has a configuration in which the log-transformed voltage signals of the two event pixels 51E are summed, but may have a configuration in which the log-transformed voltage signals of three or more event pixels 51E are summed.

In the first to fourth circuit configurations of FIGS. 11 to 14, the circuit configuration of FIG. 6 in which the one-stage loop circuit is provided has been adopted and described as the circuit configuration of the current-voltage conversion circuit 121 of the event pixel 51E. However, it goes without saying that the circuit configuration of the current-voltage conversion circuit 121 of FIG. 7 in which the two-stage loop circuit is provided may be adopted.

Figure 16:
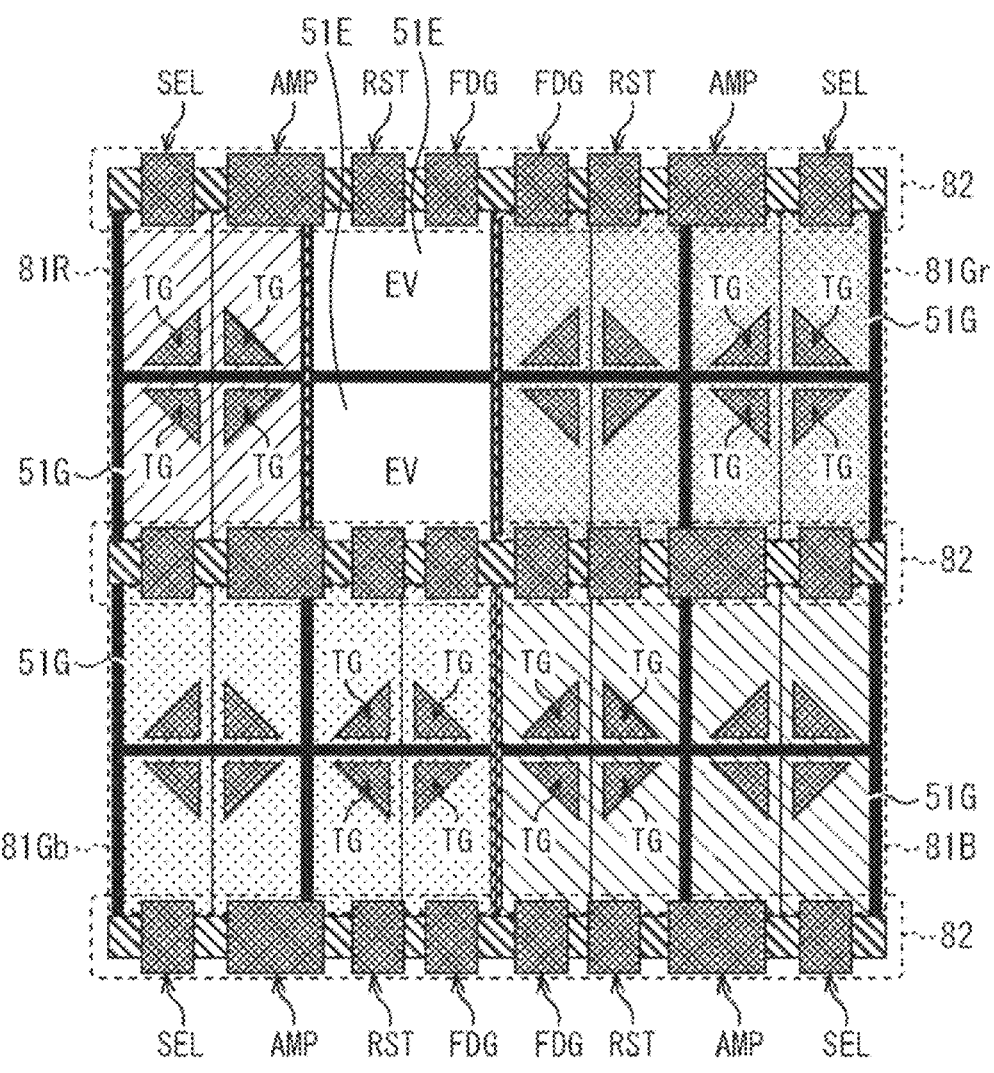
FIG. 16 is a plan view for explaining a fourth pixel layout in the pixel array unit.

FIG. 16 is a plan view of a fourth pixel layout illustrating another arrangement example of the event pixels 51E.

The above-described first to third pixel layouts have a configuration in which one unit region (region of four pixels of 2×2) of the pixel region of 32 pixels of 8×4 having the color filter arrangement of R, Gr, Gb, and B, which is a repeating unit of the Bayer array, is replaced with one event pixel 51E.

On the other hand, in the fourth pixel layout in FIG. 16, by dividing one unit region into two and arranging the event pixels 51E in each of the two unit regions, the two event pixels 51E are arranged for one unit region. The two event pixels 51E arranged in one unit region have a circuit configuration similar to that of the two event pixels 51E having the second circuit configuration illustrated in FIG. 12, and can operate by switching whether or not to add the logarithmic conversion voltage signals of the two event pixels 51E by turning on and off the addition transistor 181.

Note that, although illustration is omitted, it is not limited to the pixel layout in which two event pixels 51E are arranged for one unit region, and a configuration may be employed in which three or more event pixels 51E are arranged, and whether or not to add the logarithmic conversion voltage signals thereof is switched, and the operation is performed.

<7. Cross-Sectional View of Event Pixel>

Figure 17:
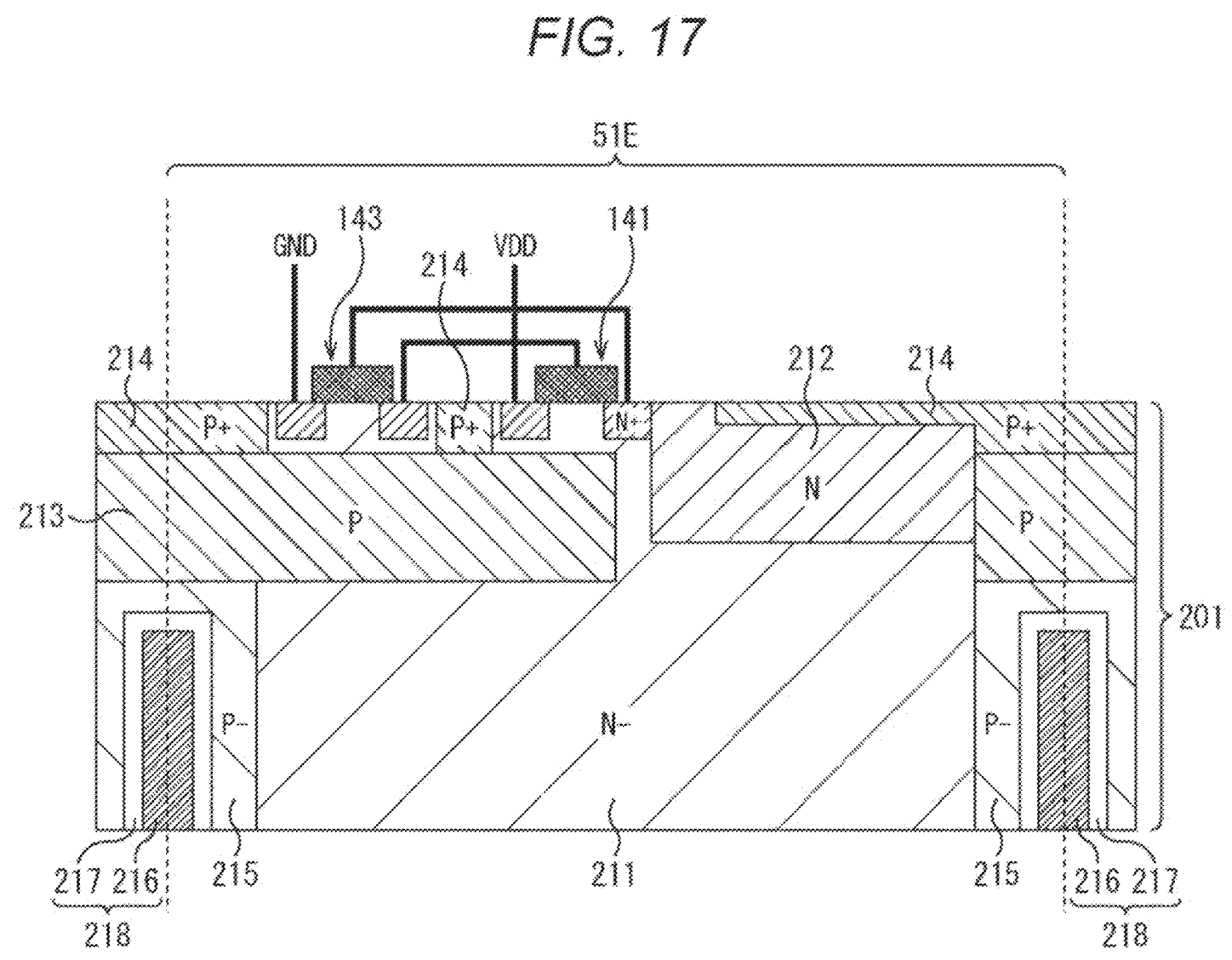

FIG. 17 is a diagram illustrating a cross-sectional configuration example of the event pixel 51E. In FIG. 17, a broken line indicates a boundary between adjacent pixels 51.

The upper surface of the semiconductor substrate 201 on the upper side in FIG. 17 is the front surface of the semiconductor substrate 201, and at least the transistor 141 which is a logarithmic transistor and the transistor 143 which is an amplification transistor are formed. The lower surface of the semiconductor substrate 201 on the lower side in FIG. 17 is a back surface of the semiconductor substrate 201 and is a light incident surface on which incident light is incident. The semiconductor substrate 201 includes, for example, silicon (Si).

In the semiconductor substrate 201, a first conductivity type (N type) N-type semiconductor region 211, a first conductivity type N-type semiconductor region 212 having an impurity concentration higher than that of the N-type semiconductor region 211, and a second conductivity type (P type) P type semiconductor region 213 opposite to the first conductivity type (N type) are formed. The photodiode 61 is formed by a PN junction between the N-type semiconductor region 211 and the P-type semiconductor region 213. Since the N-type semiconductor region 212 is formed with an impurity concentration higher than that of the N-type semiconductor region 211, a concentration gradient for reading signal charges (electrons) generated by photoelectric conversion is provided.

The transistor 141 which is a logarithmic transistor and the transistor 143 which is an amplification transistor are formed on a front surface side interface of the semiconductor substrate 201, and a P-type semiconductor region 214 as a pinning layer for suppressing generation of a dark current is formed. The P-type semiconductor region 214 is formed with an impurity concentration higher than that of the P-type semiconductor region 213. Each of the source and the drain of the transistor 141 and the transistor 143 includes a high-concentration N-type impurity region (N-type diffusion layer).

Furthermore, in the pixel boundary portion of the semiconductor substrate 201, the metal member 216 and the insulating film 217 are embedded in a trench (groove) formed at a predetermined depth from the back surface side, thereby forming the pixel isolation portion 218. The metal member 216 includes, for example, tungsten (W), aluminum (Al), or the like, and the insulating film 217 includes, for example, a $SiO_2$ film, a SiN film, a SiON film, or the like. Note that the pixel isolation portion 218 may be formed only of the insulating film 217 or may be formed by stacking different types of insulating films. A P-type semiconductor region 215 having a lower concentration than the P-type semiconductor region 213 is formed around the pixel isolation portion 218.

In FIG. 17, "P+", "P", and "P−" indicate that the impurity concentration of "P+" is the highest, and the impurity concentration decreases in the order of "P+", "P", and "P−". Similarly in the case of the N-type, "N+", "N", and "N−" indicate that the impurity concentration of "N+" is the highest, and the impurity concentration decreases in the order of "N+", "N", and "N−". As described above, the photodiode 61 of the event pixel 51E and the transistors 141 and 143 that are a part of the current-voltage conversion circuit 121 are formed on one semiconductor substrate 201.

On the other hand, the transistor 142, the buffer 122, the subtractor 123, the quantizer 124, and the transfer circuit 125, which are other circuits of the current-voltage conversion circuit 121 of the event pixel 51E, are formed on another semiconductor substrate stacked with the semiconductor substrate 201.

Figure 18:
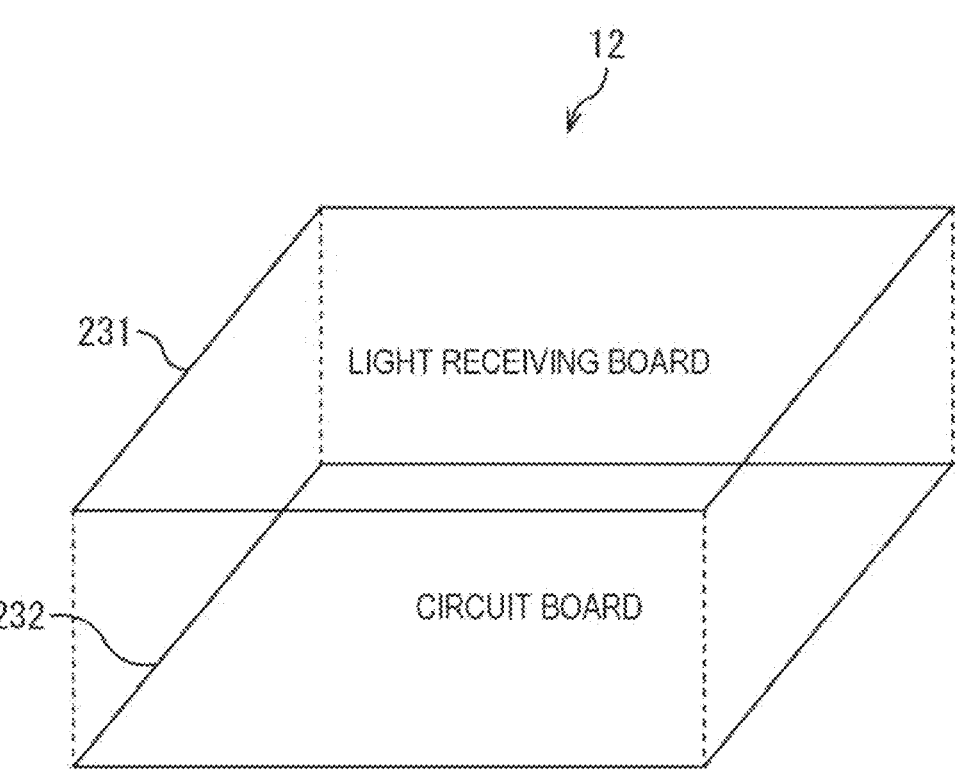
FIG. 18 is a diagram illustrating a structure example of an entire solid-state imaging device.

FIG. 18 is a diagram illustrating a structure example of the entire solid-state imaging device 12.

The solid-state imaging device 12 is configured by laminating the light receiving board 231 and the circuit board 232, and the light receiving board 231 and the circuit board 232 are electrically connected by, for example, metal bonding such as Cu—Cu bonding or bonding using a via or a bump.

The cross-sectional view of FIG. 17 is a view illustrating a configuration example of the event pixel 51E portion of the light receiving board 231 of FIG. 18, and another semiconductor substrate stacked with the semiconductor substrate 201 corresponds to the circuit board 232 of FIG. 18. In addition to the subtractor 123, the quantizer 124, and the like of the event pixel 51E, the event signal processing unit 44, the luminance signal processing unit 45, and the like described in FIG. 2 are also formed on the circuit board 232.

<8. Fifth Pixel Layout Example>

Figure 19:
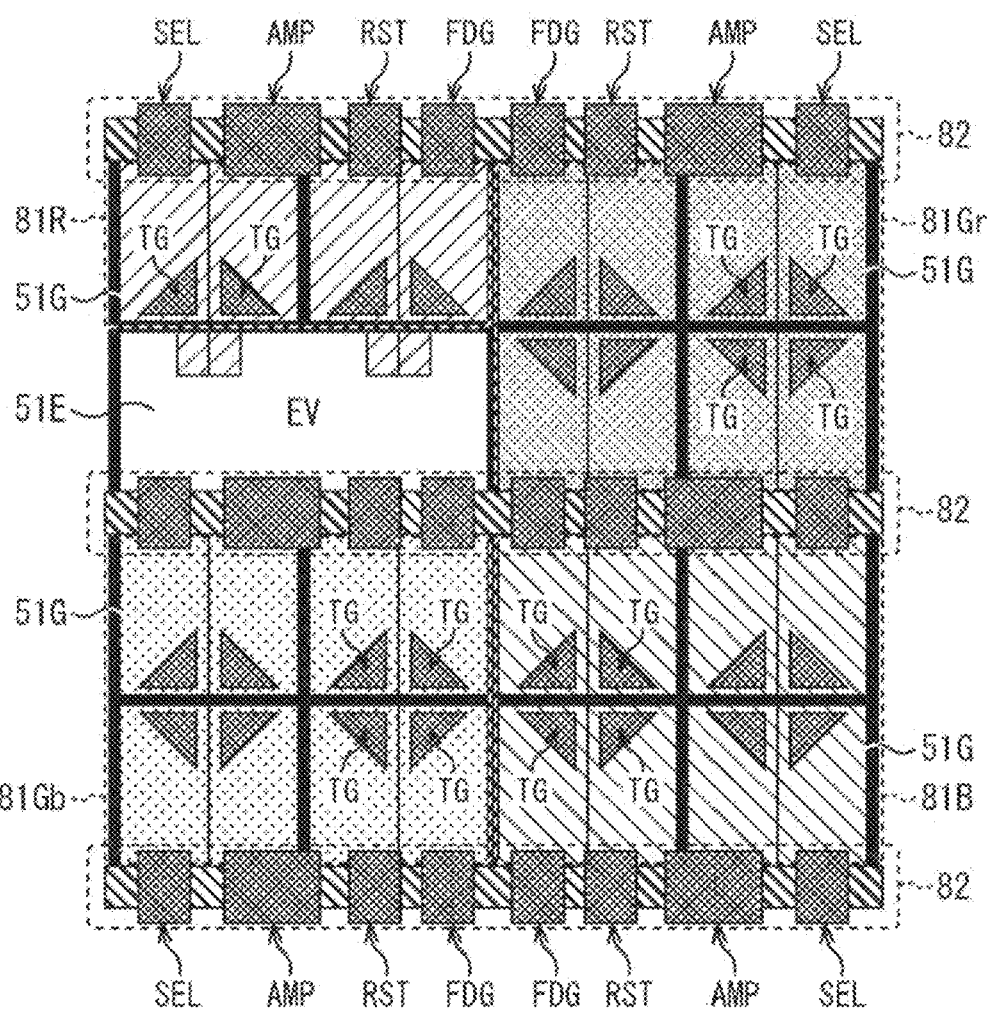
FIG. 19 is a plan view for explaining a fifth pixel layout in the pixel array unit.

FIG. 19 is a plan view of a fifth pixel layout illustrating another arrangement example of the event pixels 51E.

In the first to fourth pixel layouts described above, one event pixel 51E is formed in a unit region including four pixel regions of 2×2.

On the other hand, in the fifth pixel layout in FIG. 19, one event pixel 51E is formed in a four-pixel region including four pixels in the row direction and one pixel (4×1) in the column direction. The R same color region 81R is formed in a 4×1 four-pixel region on the upper side of the event pixel 51E. The pixel layout is similar to the first pixel layout illustrated in FIG. 3 except for the arrangement of the event pixel 51E and the R same color region 81R.

As described above, the region forming the event pixel 51E is not limited to the unit region including the four pixel region of 2×2, and may be a region of a plurality of pixels adjacent in the row direction.

Figure 20:
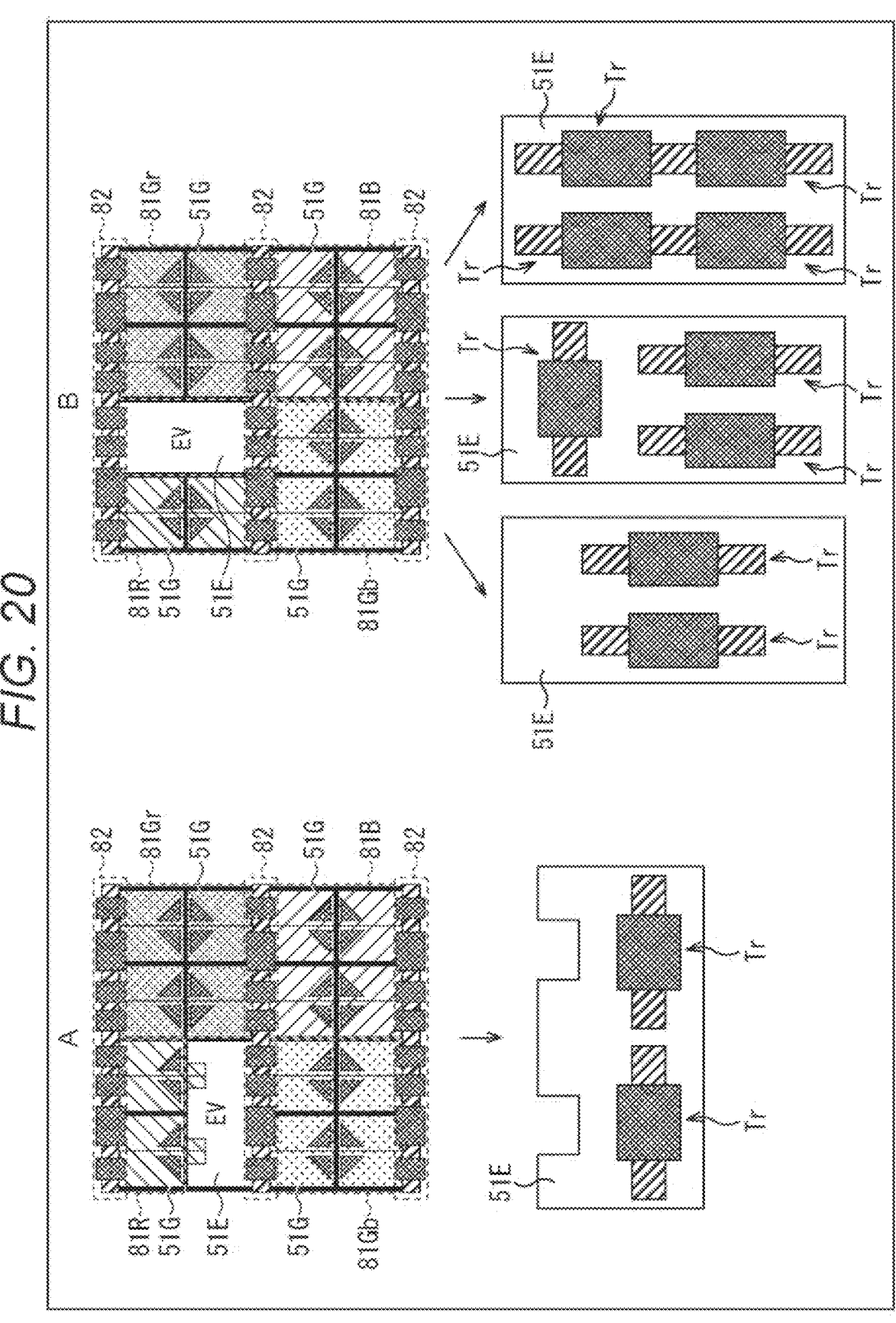
FIG. 20 is a diagram for comparing and explaining formation regions of one event pixel.

FIG. 20 is a diagram for comparing and explaining formation regions of one event pixel 51E.

A of FIG. 20 illustrates an arrangement example of the event pixels 51E in the fifth pixel layout illustrated in FIG. 19.

B of FIG. 20 illustrates an arrangement example of the event pixels 51E in the first pixel layout illustrated in FIG. 3.

The characteristic of the event pixel 51E varies greatly depending on the parasitic capacitance of each terminal of the pixel transistor Tr. In particular, it is desirable to lower the capacitance of the terminal of the pixel transistor Tr connected to the input terminal of the photodiode 61 into which the photocurrent flows, and when the arrangement of the pixel transistor Tr becomes distant, the distribution line extends, and thus the parasitic capacitance increases.

As in A or B of FIG. 20, by allocating a region formed by a plurality of the adjacent gradation pixels 51G to one event pixel 51E, a plurality of the pixel transistors Tr (for example, transistors 141 and 143) necessary for the event pixel 51E can be disposed close to each other in the pixel, so that the event detection performance can be improved. Furthermore, since it does not straddle the shared pixel transistor region 82, the area efficiency is good and the layout becomes easy. That is, in the solid-state imaging device 12 that outputs a luminance signal and an event signal, a pixel layout suitable for miniaturization of the pixels 51 can be realized.

However, as in A of FIG. 20, in a case where the regions of the plurality of gradation pixels 51G arranged in a direction parallel to the shared pixel transistor region 82 in which one or more pixel transistors Tr shared by the plurality of gradation pixels 51G are arranged are allocated to the pixel region of the event pixel 51E, the pixel region of the event pixel 51E has an elongated rectangular shape. Furthermore, in the pixel region of the event pixel 51E, a depression (recess) for avoiding the floating diffusion region FD formed at the central portion of the unit region is formed.

Since the plurality of pixel transistors Tr necessary for the event pixel 51E is arranged in such an elongated rectangular pixel region with a depression, the pixel transistors Tr are linearly arranged in the row direction as illustrated in the lower stage of A of FIG. 20, and the inner terminal (source or drain) is close, but the outer terminal is far.

On the other hand, as in B of FIG. 20, in a case where the region of at least two gradation pixels 51G arranged in the direction perpendicular to the shared pixel transistor region 82 in which one or more pixel transistors Tr shared by the plurality of gradation pixels 51G are arranged is allocated to the pixel region of the event pixel 51E, the difference between the short side and the long side of the rectangular pixel region of the event pixel 51E is smaller than that of the pixel region in A of FIG. 20. Furthermore, a depression (recess) for avoiding the floating diffusion region FD does not occur. As a result, a large number of elements such as the pixel transistor Tr can be arranged, and the area efficiency is improved. Furthermore, as illustrated in the lower part of B of FIG. 20, the gates of the plurality of pixel transistors Tr of the event pixel 51E can be disposed close to each other, various arrangements are possible, and the degree of freedom in capacitance design is increased.

As described above, the region where the event pixel 51E is formed can be formed using a region of a plurality of pixels adjacent in the row direction or the column direction, but it is preferable to allocate a region (region size) of at least two pixels arranged in a direction perpendicular to the shared pixel transistor region 82 to the pixel region of the event pixel 51E.

<9. Example of Arrangement Variation of Event Pixels>

Figure 21:
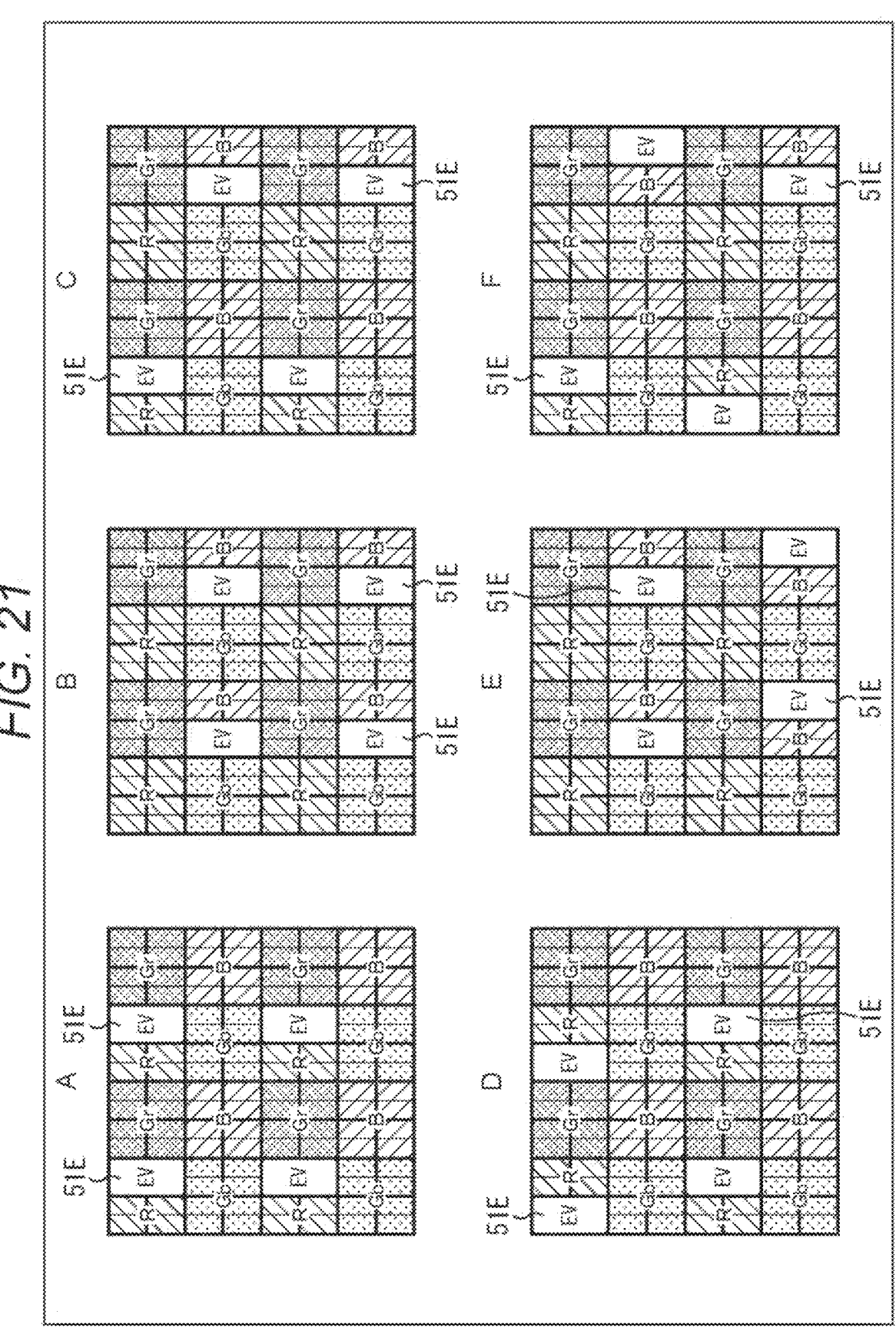
FIG. 21 is a diagram illustrating an example of arrangement variations of event pixels.

FIG. 21 illustrates an example of arrangement variations of the event pixels 51E.

Note that, in FIGS. 21 to 26, in order to describe by focusing on the arrangement of the event pixels 51E, reference signs other than the event pixels 51E are omitted, and characters "R", "Gr", "Gb", and "B" corresponding to the color (type) of the color filter are written and illustrated in a region of the gradation pixel 51G. Furthermore, illustration of the shared pixel transistor region 82 is also omitted.

A of FIG. 21 illustrates a pixel layout in which the basic patterns of the repeating unit in which the event pixels 51E are arranged at the R color filter positions are repeatedly arranged in the row direction and the column direction. The event pixels 51E are arranged in the same color and at the same position in the basic patterns adjacent in the row direction and the column direction.

B of FIG. 21 illustrates a pixel layout in which the basic patterns of the repeating unit in which the event pixels 51E are arranged at the color filter positions of B are repeatedly arranged in the row direction and the column direction. The event pixels 51E are arranged in the same color and at the same position in the basic patterns adjacent in the row direction and the column direction.

C of FIG. 21 illustrates a pixel layout in which a first layout in which the event pixels 51E are arranged at the R color filter positions and a second layout in which the event pixels 51E are arranged at the B color filter positions are repeatedly arranged in the row direction and the column direction. The arrangement of the event pixels 51E is the same between the event pixels 51E at the color filter positions of the same color adjacent in the column direction, but is different between the event pixels 51E at the color filter positions of different colors adjacent in the column direction, that is, R and B.

D of FIG. 21 illustrates a pixel layout in which the basic patterns of the repeating unit in which the event pixels 51E are arranged at the R color filter positions are repeatedly arranged in the row direction and the column direction. The arrangement of the event pixels 51E is the same between the event pixels 51E at the R color filter positions adjacent in the row direction, but is different between the event pixels 51E at the R color filter positions adjacent in the column direction.

E of FIG. 21 illustrates a pixel layout in which the basic patterns of the repeating unit in which the event pixels 51E are arranged at the color filter positions of B are repeatedly arranged in the row direction and the column direction. The arrangement of the event pixels 51E is the same between the event pixels 51E at the B color filter positions adjacent in the row direction, but is different between the event pixels 51E at the B color filter positions adjacent in the column direction.

F of FIG. 21 illustrates a pixel layout in which a first layout in which the event pixels 51E are arranged at the R color filter positions and a second layout in which the event pixels 51E are arranged at the B color filter positions are repeatedly arranged in the row direction and the column direction. The arrangement of the event pixels 51E is at the same position between the event pixels 51E in different colors adjacent in the row direction, that is, the R and B color filter positions, but is at different positions between the event pixels 51E in the same color filter position adjacent in the column direction. The event pixels 51E at the color filter positions of the same color adjacent in the row direction are arranged at the same position.

Figure 22:
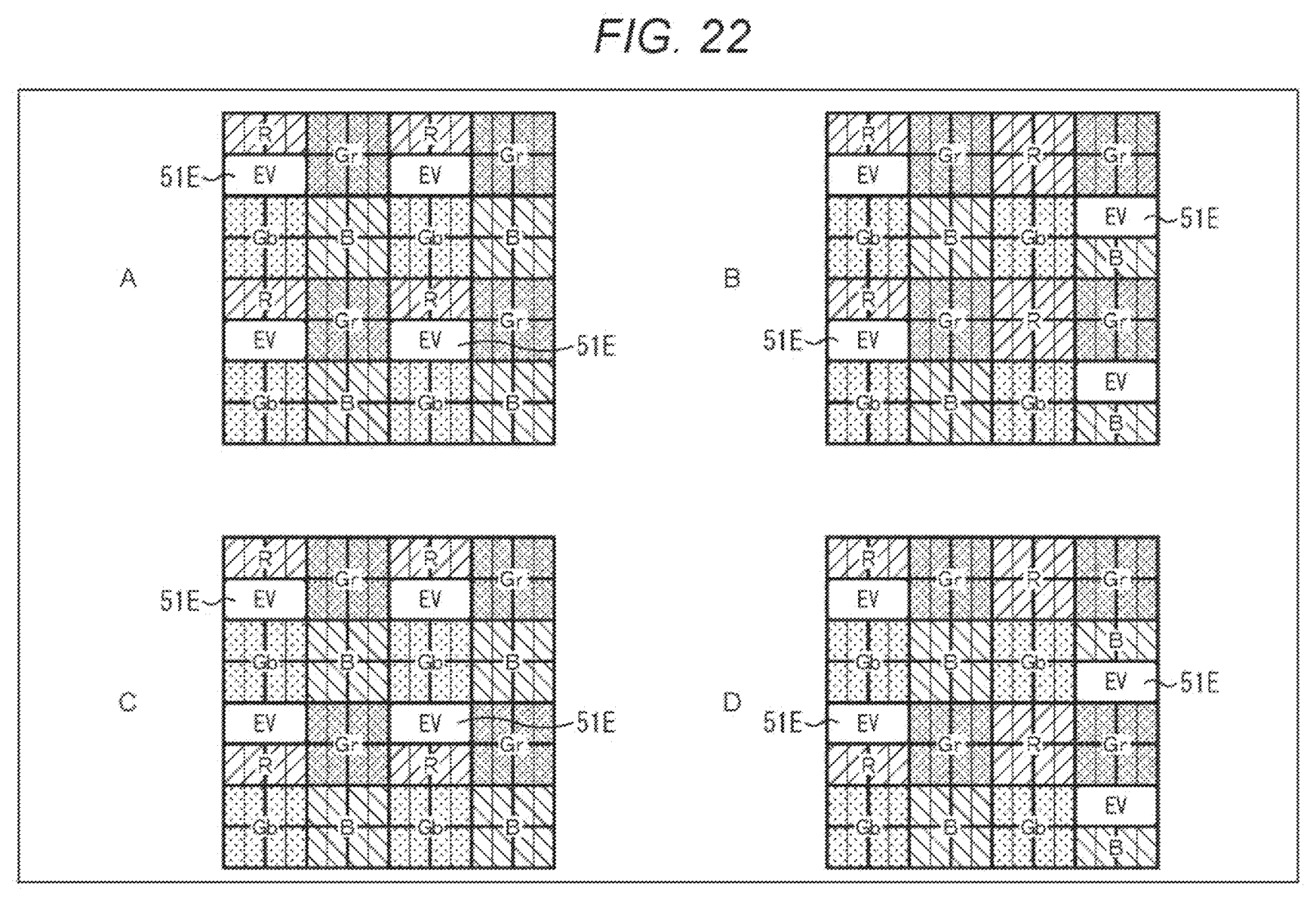

A of FIG. 22 illustrates a pixel layout in which a vertically long region of 2×2 (two pixels in row direction, two pixels in column direction) of the event pixel 51E in the pixel layout described in A of FIG. 21 is changed to a horizontally long shape of 4×1 (four pixels in row direction, one pixel in column direction). The event pixels 51E are arranged in the same color and at the same position in the basic patterns of the repeating units adjacent in the row direction and the column direction.

Although not illustrated, a pixel layout in which the event pixels 51E in the pixel layout in B of FIG. 21 in which the event pixels 51E are arranged at the color filter positions in B is changed from a vertically long shape of 2×2 to a horizontally long shape of 4×1 can be adopted as a matter of course.

B of FIG. 22 illustrates a pixel layout in which the region of the vertically long shape of 2×2 of the event pixel 51E in the pixel layout described in C of FIG. 21 is changed to a horizontally long shape of 4×1. The arrangement of the event pixels 51E is the same between the event pixels 51E at the color filter positions of the same color adjacent in the column direction, but is different between the event pixels 51E at the color filter positions of different colors adjacent in the column direction, that is, R and B.

C of FIG. 22 illustrates a pixel layout in which the region of the vertically long shape of 2×2 of the event pixel 51E in the pixel layout described in D of FIG. 21 is changed to a horizontally long shape of 4×1. The arrangement of the event pixels 51E is the same between the event pixels 51E at the R color filter positions adjacent in the row direction, but is different between the event pixels 51E at the R color filter positions adjacent in the column direction.

Although not illustrated, a pixel layout in which the event pixels 51E of the pixel layout in E of FIG. 21 in which the event pixels 51E are arranged at the color filter positions of B is changed from a vertically long shape of 2×2 to a horizontally long shape of 4×1 can of course be adopted.

D of FIG. 22 illustrates a pixel layout in which the region of the vertically long shape of 2×2 of the event pixel 51E in the pixel layout described in F of FIG. 21 is changed to a horizontally long shape of 4×1. The arrangement of the event pixels 51E is at the same position between the event pixels 51E in different colors adjacent in the row direction, that is, the R and B color filter positions, but is at different positions between the event pixels 51E in the same color filter position adjacent in the column direction. The event pixels 51E at the color filter positions of the same color adjacent in the row direction are arranged at the same position.

In the above-described example, the pixel layout in which the event pixels 51E are arranged at the R color filter position or the B color filter position has been described, but the event pixels 51E may be arranged at the Gr or Gb color filter position.

Figure 23:
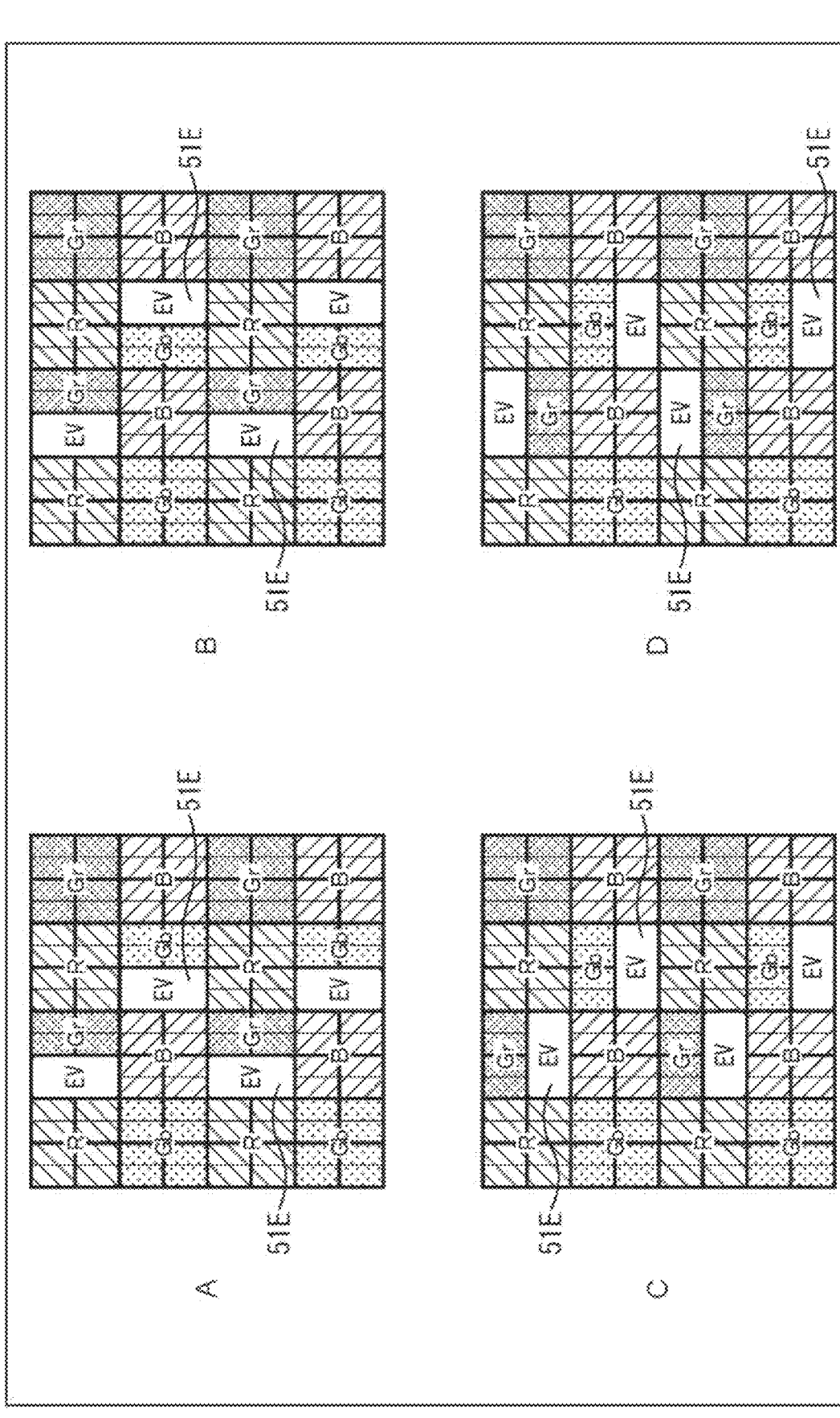
FIG. 23 is a diagram illustrating an example of arrangement variations of event pixels.

A of FIG. 23 illustrates a pixel layout in which a set of a first layout in which the event pixels 51E are arranged at the Gr color filter positions and a second layout in which the event pixels 51E are arranged at the Gb color filter positions are repeatedly arranged in the row direction and the column direction. The event pixels 51E are arranged at the same position at the color filter position of Gr and the color filter position of Gb.

B of FIG. 23 illustrates a pixel layout in which a first layout in which the event pixels 51E are arranged at the Gr color filter positions and a second layout in which the event pixels 51E are arranged at the Gb color filter positions are repeatedly arranged in the row direction and the column direction. The event pixels 51E are arranged at the same positions between the color filter positions of Gr and between the color filter positions of Gb, but are arranged at different positions between the color filter position of Gr and the color filter position of Gb.

C of FIG. 23 illustrates a pixel layout in which the region of the vertically long shape of 2×2 of the event pixel 51E in the pixel layout described in A of FIG. 23 is changed to a horizontally long shape of 4×1. The event pixels 51E are arranged at the same position at the color filter position of Gr and the color filter position of Gb.

D of FIG. 23 illustrates a pixel layout in which the region of the vertically long shape of 2×2 of the event pixel 51E in the pixel layout described in B of FIG. 23 is changed to a horizontally long shape of 4×1. The event pixels 51E are arranged at the same positions between the color filter positions of Gr and between the color filter positions of Gb, but are arranged at different positions between the color filter position of Gr and the color filter position of Gb.

Although illustration of other pixel layouts in a case where the event pixels 51E are arranged at the color filter positions of Gr and Gb is omitted, various pixel layouts in which the arrangement of the event pixels 51E in the pixel layout described in FIGS. 21 and 22 is changed from the color filter positions of R and B to the color filter positions of Gr and Gb are possible. Note that, as described above, from the viewpoint of improving the resolution of the captured image, it is preferable to arrange the event pixels 51E at the R and B color filter positions rather than the Gr and Gb color filter positions.

Next, a pixel layout of a circuit configuration in which the second to fourth circuit configurations illustrated in FIGS. 12 to 14 are formed in the regions of two adjacent event pixels 51E and an event can be detected as one photodiode 61 will be described with reference to FIGS. 24 to 26.

Briefly describing again the second to fourth circuit configurations illustrated in FIGS. 12 to 14, the second circuit configuration described in FIG. 12 is a configuration in which the region of the two event pixels 51E can be operated as one event pixel 51E by turning on the addition transistor 181. The third circuit configuration described with reference to FIG. 13 is a configuration in which the photodiodes 61 individually provided in the regions of the two event pixels 51E are connected by wiring to operate as substantially one photodiode 61. The fourth circuit configuration described with reference to FIG. 14 is a configuration in which one photodiode 61 is physically formed in the semiconductor substrate in the regions of the two event pixels 51E.

Figure 24:
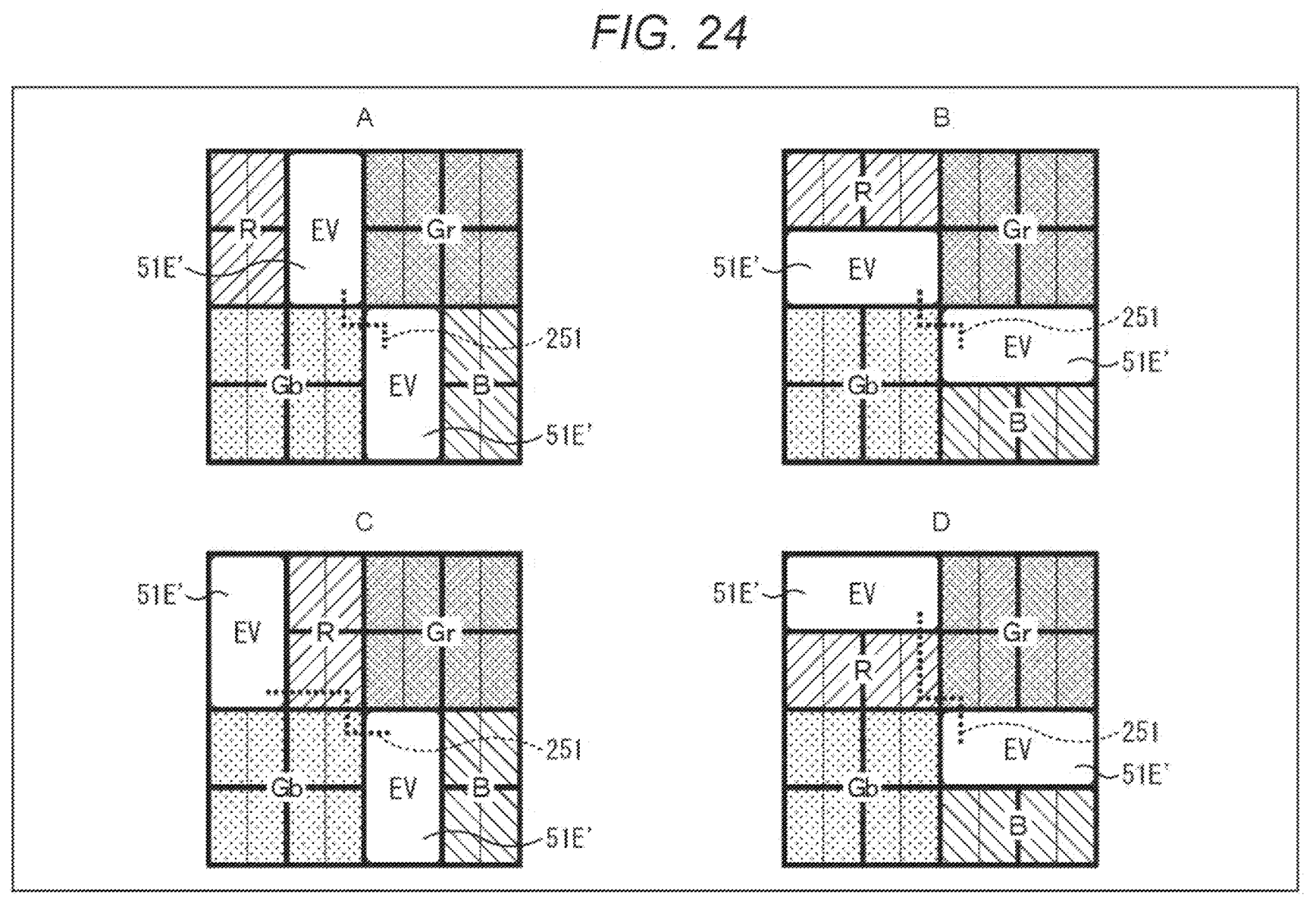
Figure 25:
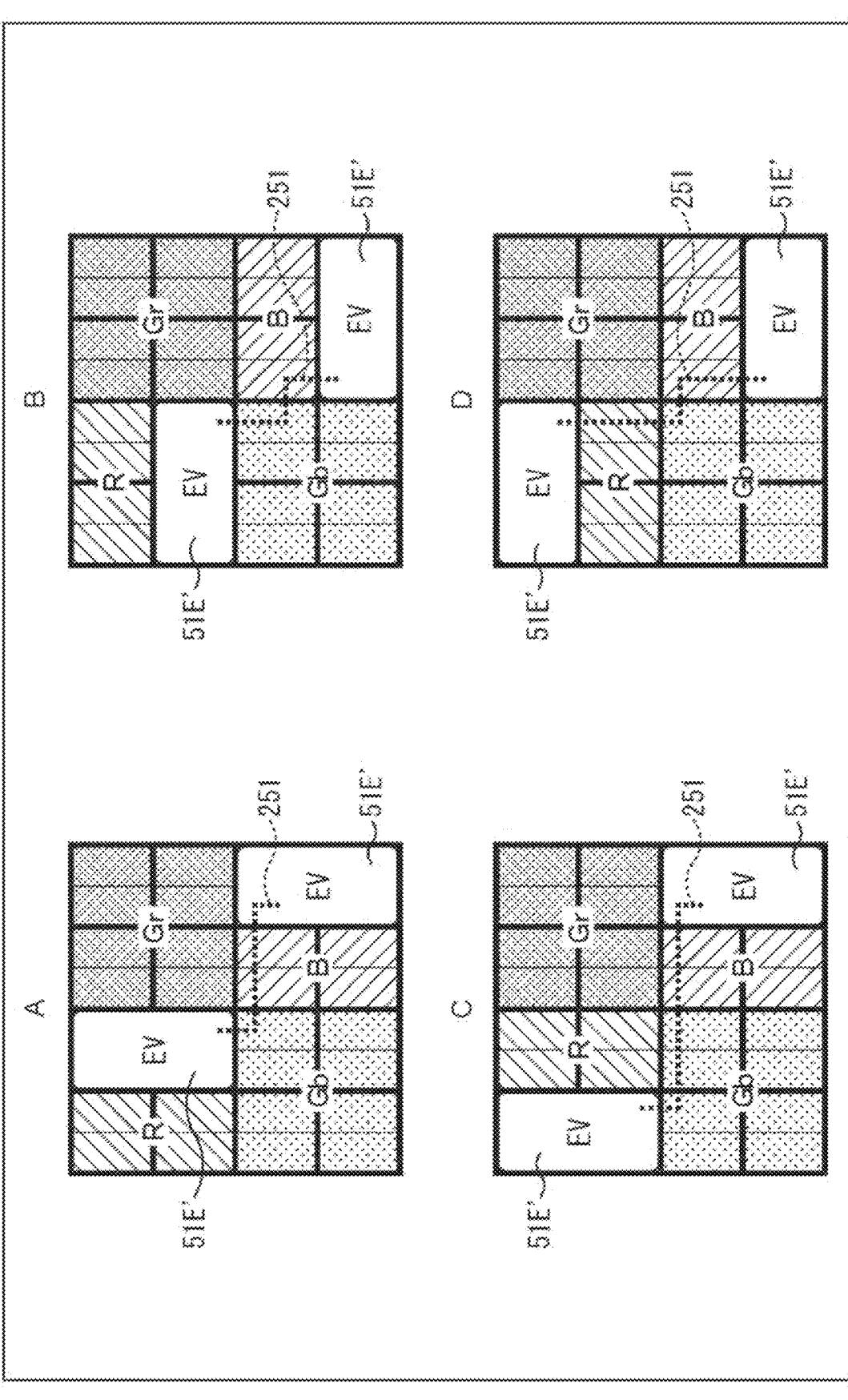
FIG. 25 is a diagram illustrating an example of arrangement variations of event pixels.
Figure 26:
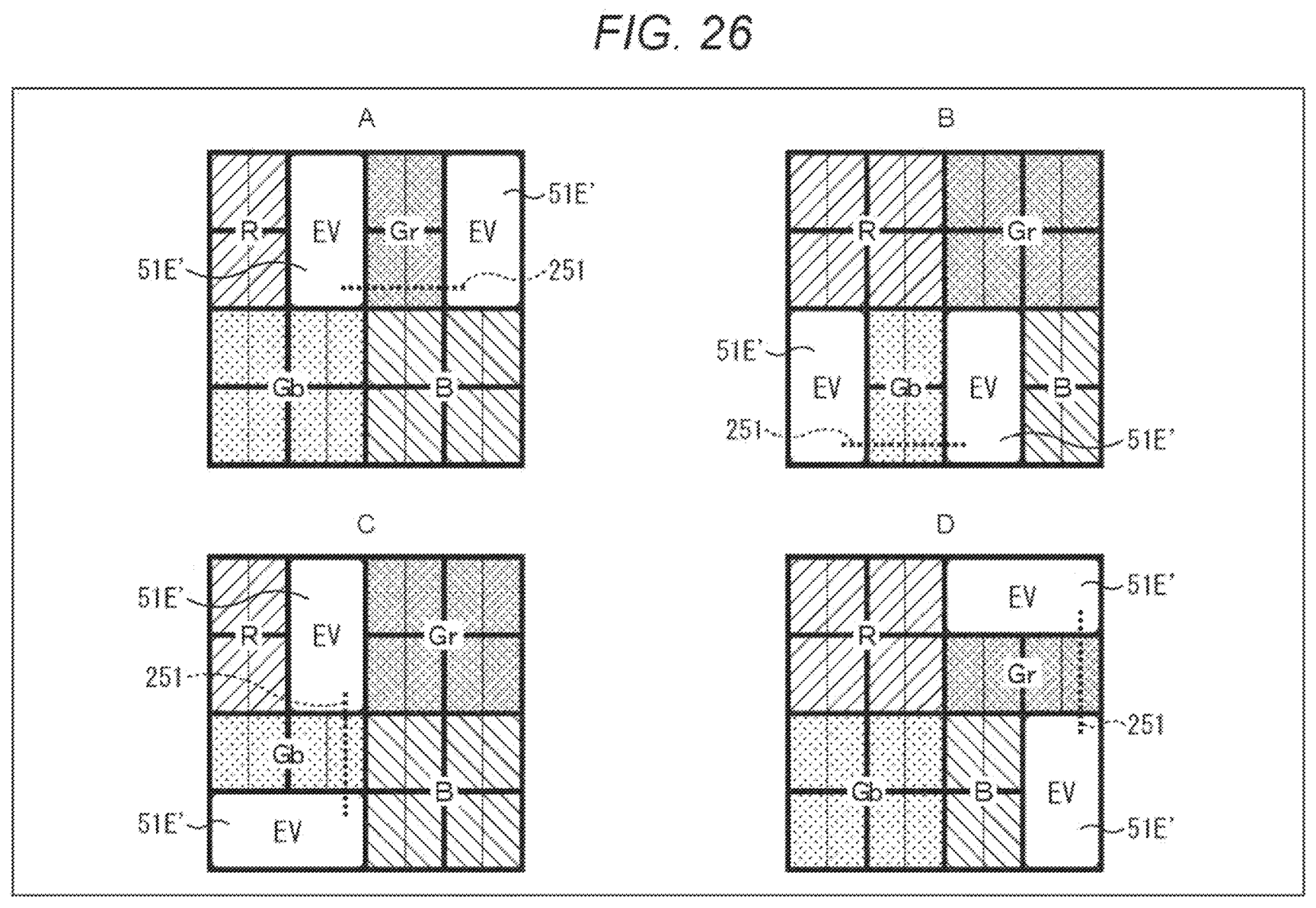

In FIGS. 24 to 26, the event pixel 51E' indicates a circuit configuration of the event pixel 51E of any of the second to fourth circuit configurations illustrated in FIGS. 12 to 14. Furthermore, a connection line 251 of a broken line connecting the regions of the two event pixels 51E' indicates that the regions of the two event pixels 51E' are connected so that the logarithmic conversion voltage signals can be summed according to any of the second to fourth circuit configurations.

A of FIG. 24 is a diagram illustrating the arrangement of the event pixels 51E' in the pixel layout illustrated in FIG. 10 again.

In the pixel layout in A of FIG. 24, event pixels 51E' having a vertically long shape of 2× 2 are arranged at two positions of the R color filter position and the B color filter position. The event pixel 51E' at the R color filter position and the event pixel 51E' at the B color filter position have contacts adjacent in the diagonal direction. The event pixels 51E' at the R color filter positions are arranged on the right side of the R same color region 81R, and the event pixels 51E' at the B color filter positions are arranged on the left side of the B same color region 81B.

B of FIG. 24 illustrates an example of a pixel layout in which the region of the vertically long shape of 2×2 of the event pixel 51E' in the pixel layout in A of FIG. 24 is changed to a horizontally long shape of 4×1.

In the pixel layout in B of FIG. 24, event pixels 51E' each having a horizontally long shape of 4×1 are arranged at two positions of the R color filter position and the B color filter position. The event pixel 51E' at the R color filter position and the event pixel 51E' at the B color filter position have contacts adjacent in the diagonal direction. The event pixels 51E' at the R color filter positions are arranged on the lower side of the R same color region 81R, and the event pixels 51E' at the B color filter positions are arranged on the upper side of the B same color region 81B.

As described above, it is more desirable that the regions of the two event pixels 51E' be arranged adjacent to each other so as to have a contact point in the diagonal direction, because the wiring capacitance can be reduced. However, the regions of the two event pixels 51E' may be arranged at color filter positions not adjacent to each other.

C of FIG. 24 illustrates an example of a pixel layout in which the regions of the two event pixels 51E' are arranged at non-adjacent color filter positions.

In the pixel layout in C of FIG. 24, the event pixels 51E' having a vertically long shape of 2×2 are arranged at two positions of the R color filter position and the B color filter position. However, the event pixel 51E' at the R color filter position and the event pixel 51E' at the B color filter position are not adjacent to each other. The event pixels 51E' at the R color filter positions are arranged on the left side of the R same color region 81R, and the event pixels 51E' at the B color filter positions are also arranged on the left side of the B same color region 81B.

D of FIG. 24 illustrates an example of a pixel layout in which the region of the vertically long shape of 2×2 of the event pixel 51E' in the pixel layout of C of FIG. 24 is changed to a horizontally long shape of 4×1.

In the pixel layout in D of FIG. 24, the event pixels 51E' each having a horizontally long shape of 4×1 are arranged at two positions of the R color filter position and the B color filter position. However, the event pixel 51E' at the R color filter position and the event pixel 51E' at the B color filter position are not adjacent to each other. The event pixels 51E' at the R color filter positions are arranged above the R same color region 81R, and the event pixels 51E' at the B color filter positions are also arranged above the B same color region 81B.

A of FIG. 25 illustrates an example of a pixel layout in which the regions of the two event pixels 51E' are arranged at non-adjacent color filter positions.

In the pixel layout in A of FIG. 25, the event pixels 51E' having a vertically long shape of 2×2 are arranged at two positions of the R color filter position and the B color filter position. However, the event pixel 51E' at the R color filter position and the event pixel 51E' at the B color filter position are not adjacent to each other.

In the pixel layout illustrated in C of FIG. 24, the event pixel 51E' is disposed on the left side of each of the R same color region 81R and the B same color region 81B, whereas in the pixel layout in A of FIG. 25, the event pixel 51E' is disposed on the right side of each of the R same color region 81R and the B same color region 81B.

B of FIG. 25 illustrates an example of a pixel layout in which the regions of the two event pixels 51E' are arranged at non-adjacent color filter positions.

In the pixel layout in B of FIG. 25, the event pixels 51E' each having a horizontally long shape of 4×1 are arranged at two positions of the R color filter position and the B color filter position. However, the event pixel 51E' at the R color filter position and the event pixel 51E' at the B color filter position are not adjacent to each other.

In the pixel layout illustrated in D of FIG. 24, the event pixels 51E' are arranged on the upper side of each of the R same color region 81R and the B same color region 81B, whereas in the pixel layout in B of FIG. 25, the event pixels 51E' are arranged on the lower side of each of the R same color region 81R and the B same color region 81B.

C of FIG. 25 illustrates an example of a pixel layout in which the regions of the two event pixels 51E' are disposed at non-adjacent color filter positions.

In the pixel layout in C of FIG. 25, the event pixels 51E' having a vertically long shape of 2×2 are arranged at two positions of the R color filter position and the B color filter position. However, the event pixel 51E' at the R color filter position and the event pixel 51E' at the B color filter position are not adjacent to each other. The event pixels 51E' at the R color filter positions are arranged on the left side of the R same color region 81R, and the event pixels 51E' at the B color filter positions are arranged on the right side of the B same color region 81B.

D of FIG. 25 illustrates an example of a pixel layout in which the region of the vertically long shape of 2×2 of the event pixel 51E' in the pixel layout of C of FIG. 25 is changed to a horizontally long shape of 4×1.

In the pixel layout in D of FIG. 25, event pixels 51E' each having a horizontally long shape of 4×1 are arranged at two positions of the R color filter position and the B color filter position. However, the event pixel 51E' at the R color filter position and the event pixel 51E' at the B color filter position are not adjacent to each other. The event pixels 51E' at the R color filter positions are arranged on the upper side of the R same color region 81R, and the event pixels 51E' at the B color filter positions are arranged on the lower side of the B same color region 81B.

The pixel layout illustrated in FIGS. 24 and 25 is a layout in which the event pixels 51E' are arranged at the color filter positions of the R color filter and the B color filter other than the G (Gr, Gb) color filter.

A to D of FIG. 26 illustrate an example of a pixel layout in which the event pixels 51E' are also arranged at the color filter positions of the G (Gr, Gb) color filters.

A of FIG. 26 illustrates an example of a pixel layout in which the event pixels 51E' are arranged at the color filter positions of Gr and R.

In the pixel layout in A of FIG. 26, the event pixels 51E' having a vertically long shape of 2×2 are arranged at two positions of the color filter position Gr and the color filter position R. However, the event pixel 51E' at the color filter position of Gr and the event pixel 51E' at the color filter position of R are not adjacent to each other. The event pixels 51E' at the color filter positions of Gr are arranged on the right side of the Gr same color region 81Gr, and the event pixels 51E' at the color filter positions of R are also arranged on the right side of the R same color region 81R. Although not illustrated, a pixel layout in which the event pixels 51E' are arranged on the left side of each of the Gr same color region 81Gr and the R same color region 81R is also possible.

B of FIG. 26 illustrates an example of a pixel layout in which the event pixels 51E' are arranged at the Gb color filter position and the B color filter position.

In the pixel layout in B of FIG. 26, the event pixels 51E' having a vertically long shape of 2×2 are arranged at two positions of a color filter position of Gb and a color filter position of B. However, the event pixel 51E 'at the Gb color filter position and the event pixel 51E' at the B color filter position are not adjacent to each other. The event pixels 51E' at the Gb color filter positions are arranged on the left side of the Gb same color region 81Gb, and the event pixels 51E' at the B color filter positions are also arranged on the left side of the B same color region 81B. Although not illustrated, a pixel layout in which the event pixels 51E' are arranged on the right side of each of the Gr same color region 81Gr and the R same color region 81R is also possible.

Furthermore, a pixel layout in which the region of the vertically long shape of 2×2 of the event pixel 51E' in the pixel layout in A and B of FIG. 26 is changed to a horizontally long shape of 4×1 is also possible.

C of FIG. 26 illustrates an example of a pixel layout in which the event pixels 51E' are arranged at the Gb color filter position and the R color filter position.

In the pixel layout in C of FIG. 26, the event pixels 51E' having a horizontally long shape of 4×1 are arranged at the Gb color filter position, and the event pixels 51E' having a vertically long shape of 2×2 are arranged at the R color filter positions. However, the event pixel 51E' at the Gb color filter position and the event pixel 51E' at the R color filter position are not adjacent to each other.

D of FIG. 26 illustrates an example of a pixel layout in which the event pixels 51E' are arranged at the color filter positions of Gr and B.

In the pixel layout in D of FIG. 26, the event pixels 51E' having a horizontally long shape of 4×1 are arranged at the color filter positions of Gr, and the event pixels 51E' having a vertically long shape of 2×2 are arranged at the color filter position of B. However, the event pixel 51E' at the color filter position of Gr and the event pixel 51E' at the color filter position of B are not adjacent to each other.

As in the pixel layout in C and D of FIG. 26, the event pixel 51E' having a horizontally long shape of 4×1 and the event pixels 51E' having a vertically long shape of 2×2 may be combined and arranged.

<10. Sixth Pixel Layout Example>

Figure 27:
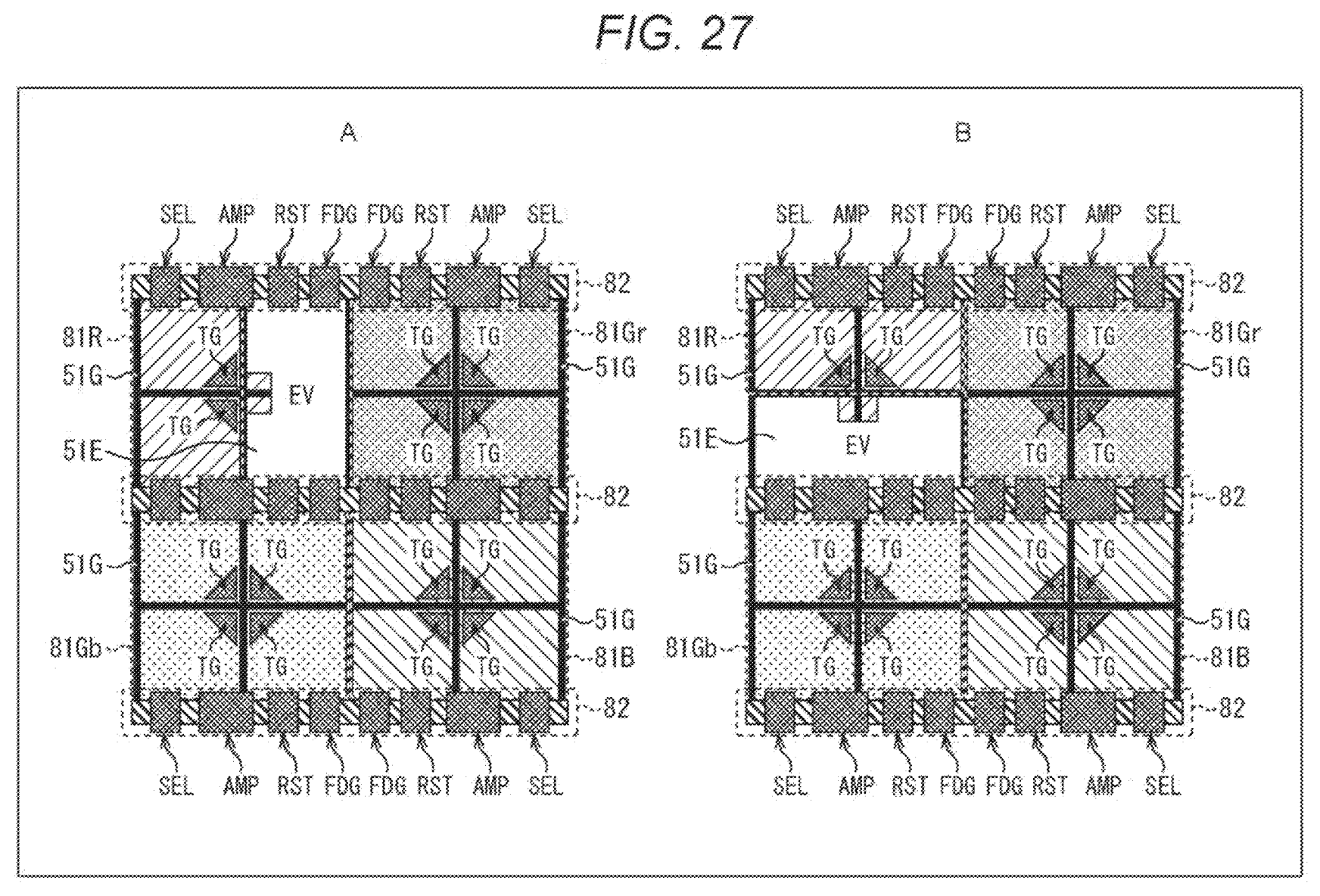

FIG. 27 is a plan view of a sixth pixel layout illustrating another arrangement example of the event pixels 51E.

In the first to fifth pixel layouts described above, one event pixel 51E is formed using a pixel region of 4 pixels of 2×2.

On the other hand, in the sixth pixel layout in FIG. 27, one event pixel 51E is formed using pixel regions of two gradation pixels 51G.

A of FIG. 27 illustrates an example in which the event pixels 51E are arranged in a region of two gradation pixels 51G arranged in a direction perpendicular to the shared pixel transistor region 82.

B of FIG. 27 illustrates an example in which the event pixels 51E are arranged in a region of two gradation pixels 51G arranged in a direction parallel to the shared pixel transistor region 82.

In a case where the pixel region of one gradation pixel 51G has a square shape, the area of the event pixel 51E is the same regardless of whether the event pixel is disposed in the vertically long shape of 1×2 in A of FIG. 27 or the horizontally long shape of 2×1 in B of FIG. 27. However, in a case where the pixel region of one gradation pixel 51G has a rectangular shape, the difference between the short side and the long side is small in the vertically long shape of 1×2, and the pixel transistor Tr can be disposed with high area efficiency.

Each of the Gr same color region 81Gr, the B same color region 81B, and the Gb same color region 81Gb is configured by one unit region with a square gradation pixel 51G as a unit region of four pixel regions of two pixels in the row direction and two pixels (2×2) in the column direction. Since the event pixels 51E are arranged, the R same color region 81R includes two pixel regions of 1×2 or 2×1.

The pixel array unit 41 of the solid-state imaging device 12 has a layout in which a pixel region of 16 pixels of 4×4 including four pixels in the row direction and 4 pixels in the column direction in A or B of FIG. 27 is set as a basic pattern of a repeating unit, and the basic pattern is repeatedly arrayed in the row direction and the column direction.

Since the event pixel 51E is a region where the R color filter is formed if the event pixel 51E is not disposed, the array of color filters of the pixel array unit 41 is configured by a so-called Bayer array.

Note that the pixel array unit 41 may repeatedly arrange the basic pattern of the repeating unit in A or B of FIG. 27 at predetermined intervals, for example, at a pitch of 4×N pixels (N>1) in the row direction and at a pitch of 4×M pixels (M>1) in the column direction. In the other regions, the event pixels 51E are not arranged, and only the gradation pixels 51G are arranged in 4×4.

In other words, the event pixels 51E in FIG. 27 can be regularly arranged at predetermined intervals in the pixel array unit 41, or can be randomly arranged in the pixel array unit 41.

Figure 28:
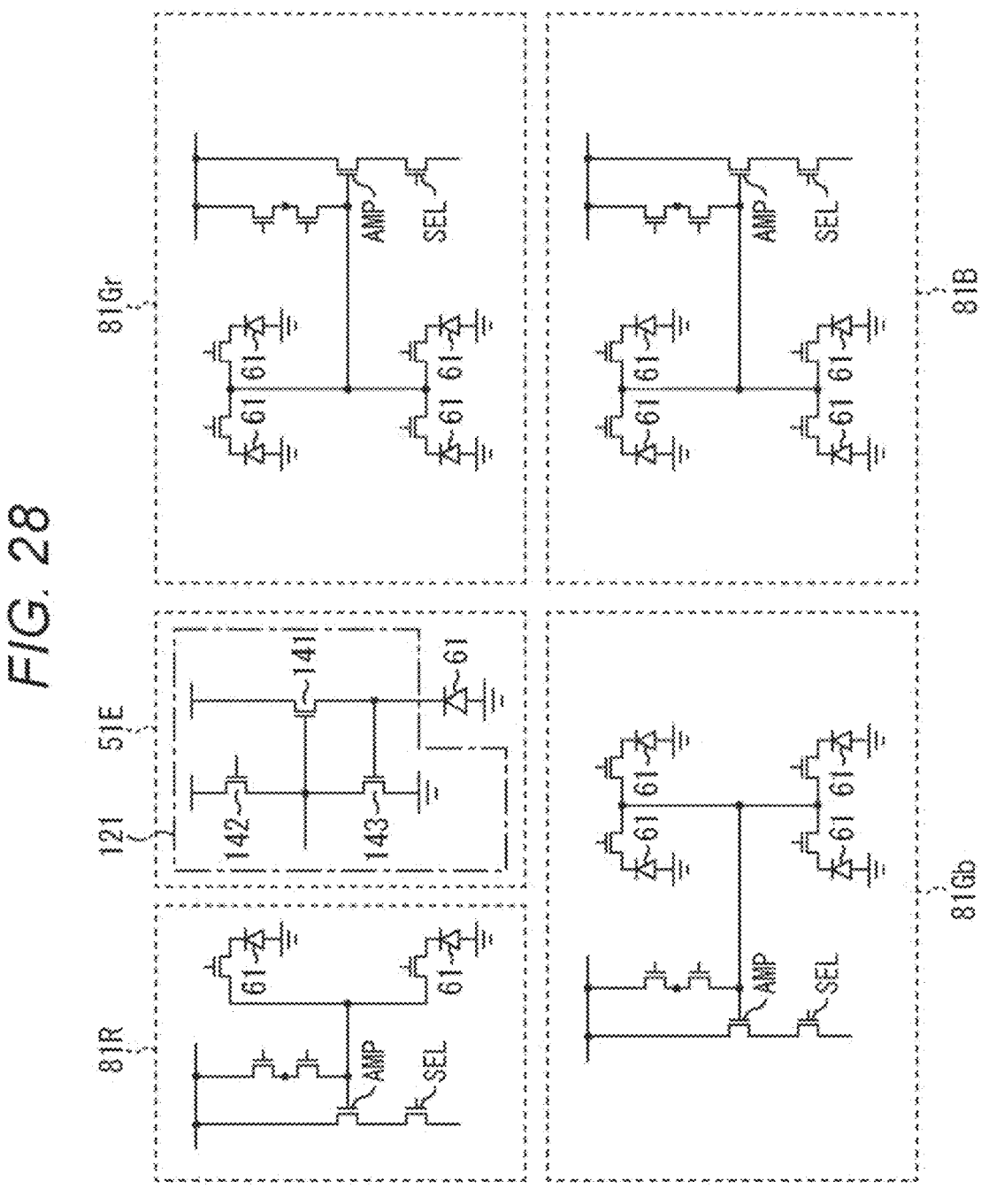
FIG. 28 is a diagram illustrating a circuit configuration example of 16 pixels described in FIG. 27.

FIG. 28 illustrates a circuit configuration example corresponding to the sixth pixel layout described in FIG. 27, specifically, a 16 pixel region including one event pixel 51E and each gradation pixel 51G of the R same color region 81R, the Gr same color region 81Gr, the Gb same color region 81Gb, and the B same color region 81B. Note that, similarly to FIG. 8, some reference signs are omitted, and only the current-voltage conversion circuit 121 that is a part of the address event detection circuit 62 is illustrated for the event pixel 51E.

Each of the Gr same color region 81Gr, the Gb same color region 81Gb, and the B same color region 81B shares the reset transistor RST, the amplification transistor AMP, the switching transistor FDG, and the selection transistor SEL of the shared pixel transistor region 82 in the four gradation pixels 51G.

In the R same color region 81R, the reset transistor RST, the amplification transistor AMP, the switching transistor FDG, and the selection transistor SEL of the shared pixel transistor region 82 are shared by the two gradation pixels 51G.

<11. Application Example to RGB-W Pixel>

In addition to the Bayer array described above, an RGB-W array in which W pixels are combined with R pixels, G pixels, and B pixels and arranged is known as an array of color filters. The W pixel is a pixel having a W filter that transmits light of all colors (wavelengths) of red (R), green (G), and blue (B). The W filter is also a type of color filter.

Figure 29:
FIG. 29 is a diagram illustrating an application example of an event pixel to an RGB-W pixel.

In the RGB-W array, for example, as illustrated on the left side of FIG. 29, there is an array layout in which 16 pixels of 4×4 in which four pixels of 2×2 in which two pixels of a W pixel are arranged in the diagonal direction, and two pixels of an R pixel, a Gr pixel, a Gb pixel, or a B pixel are arranged in the diagonal direction are arranged in the arrangement of R, Gr, Gb, and B of the Bayer array are repeatedly arranged in the row direction and the column direction.

When the event pixels 51E are combined with this array layout, an array in which two pixels of R pixels and W pixels are replaced with one event pixel 51E or two pixels of B pixels and W pixels are replaced with one event pixel 51E among the 4×4 16 pixels of the basic pattern of the repeating unit can be adopted as illustrated by the tip of the arrow in FIG. 29.

The example of FIG. 29 is an example in which one event pixel 51E is disposed in a 1×2 vertically long shape, but may be disposed in a 2×1 horizontally long shape. Furthermore, two pixels of the Gb pixel and the W pixel or two pixels of the Gr pixel and the W pixel may be replaced with one event pixel 51E.

Figure 30:
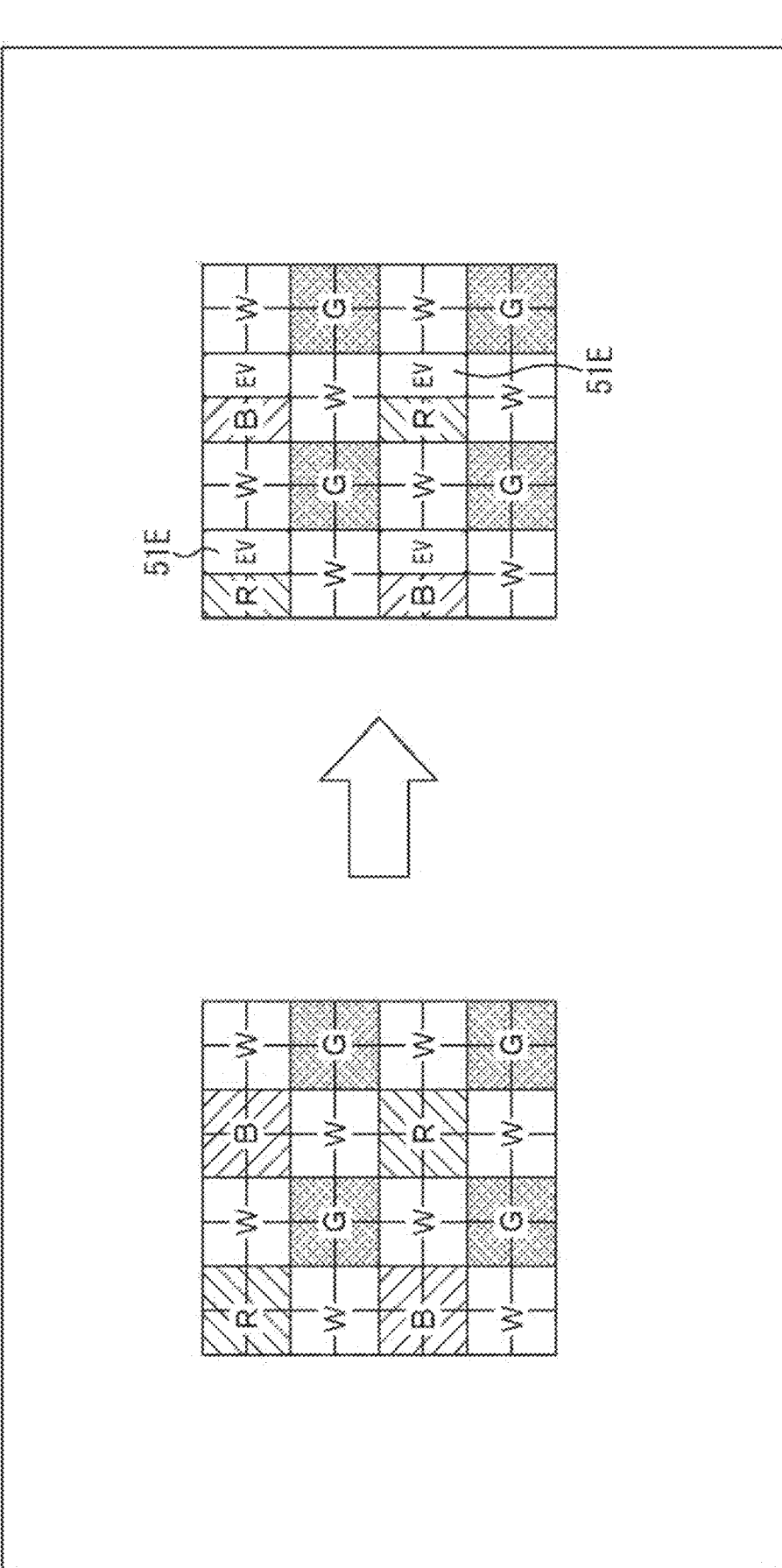
FIG. 30 is a diagram illustrating an application example of an event pixel to an RGB-W pixel.

Furthermore, as another RGB-W array, as illustrated on the left side of FIG. 30, there is an array layout in which 64 pixels of 8×8 in which R pixels, G pixels, B pixels, and W pixels are arrayed in units of 2×2=4 pixels at a ratio of R:G:B:W=1:2:1:4 are repeatedly arrayed in the row direction and the column direction.

When the event pixels 51E are combined with this arrangement layout, an arrangement in which one event pixel 51E is disposed in a 1×2 vertically long shape at the R color filter position and the B color filter position can be adopted as illustrated by the tip of the arrow in FIG. 30.

The example of FIG. 30 is an example in which one event pixel 51E is disposed in a 1×2 vertically long shape, but may be disposed in a 2×1 horizontally long shape. Furthermore, two pixels at the G color filter position or the W color filter position may be replaced with one event pixel 51E.

<12. Application Example to RGB-IR Pixel>

In addition to the Bayer array described above, an RGB-IR array in which IR pixels are combined with R pixels, G pixels, and B pixels and arranged is also known as an array of color filters. The IR pixel is a pixel having an IR filter that transmits only infrared light. The IR filter is also a type of color filter.

Figure 31:
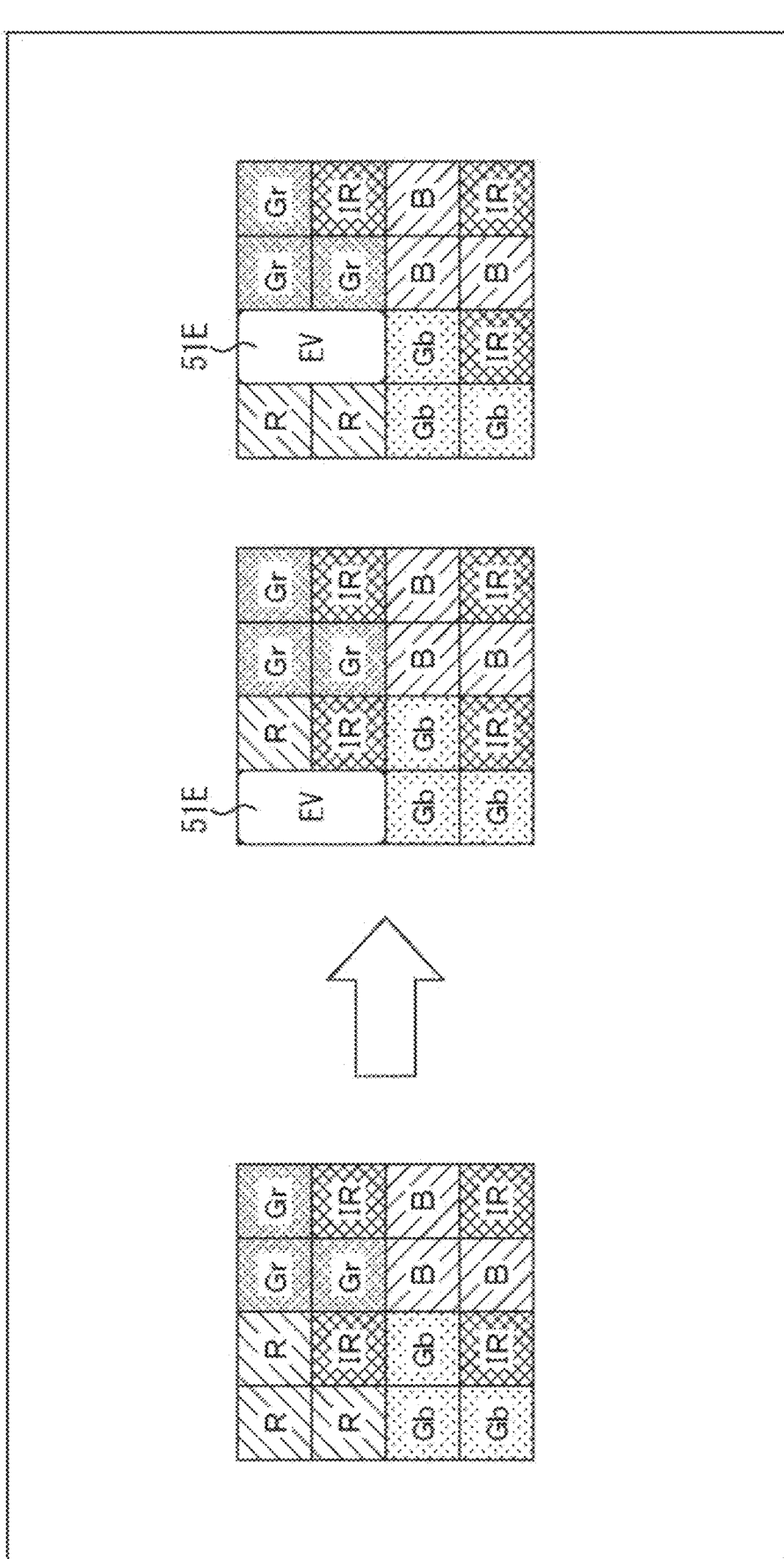
FIG. 31 is a diagram illustrating an application example of an event pixel to an RGB-IR pixel.

In the RGB-IR array, for example, as illustrated on the left side of FIG. 31, there is an array layout in which 16 pixels of 4×4 in which R pixels, Gr pixels, Gb pixels, and B pixels are arranged in units of four pixels of 2×2 in the Bayer array in the arrangement of R, Gr, Gb, and B, and one pixel among the four pixels of each color of R, Gr, Gb, and B is replaced with an IR pixel are repeatedly arranged in the row direction and the column direction.

When the event pixels 51E are combined with this array layout, as illustrated by the tip of the arrow in FIG. 31, an array can be adopted in which, among the 4×4 16 pixels of the basic pattern of the repeating unit, two pixels of R pixels are replaced with one event pixel 51E, or two pixels of R pixels and IR pixels are replaced with one event pixel 51E.

The example of FIG. 31 is an example in which one event pixel 51E is disposed in a 1×2 vertically long shape, but may be disposed in a 2×1 horizontally long shape. Furthermore, two pixels of the B pixel may be replaced with one event pixel 51E, or two pixels of the B pixel and the IR pixel may be replaced with one event pixel 51E. Two G pixels (Gr pixel, Gb pixel) may be replaced with one event pixel 51E, or two G pixels and IR pixels may be replaced with one event pixel 51E.

Figure 32:
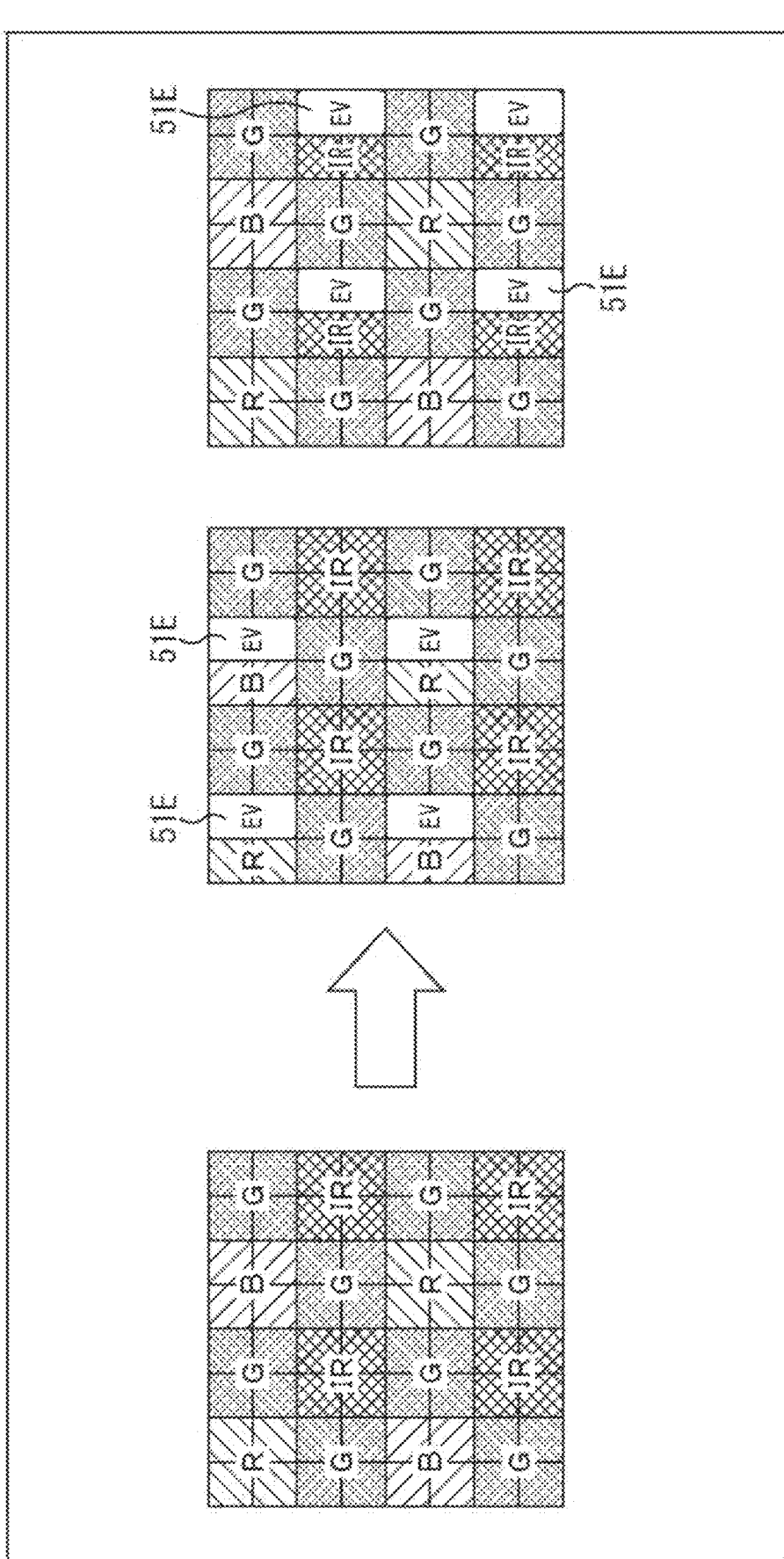
FIG. 32 is a diagram illustrating an application example of an event pixel to an RGB-IR pixel.

Furthermore, as another RGB-IR array, as illustrated on the left side of FIG. 32, there is an array layout in which 64 pixels of 8×8 in which R pixels, G pixels, B pixels, and IR pixels are arrayed in units of 2×2=4 pixels at a ratio of R:G:B:IR=1:4:1:2 are repeatedly arrayed in the row direction and the column direction.

When the event pixels 51E are combined with this arrangement layout, an arrangement in which one event pixel 51E is disposed in a 1×2 vertically long shape at the R color filter position and the B color filter position can be adopted as illustrated by the tip of the arrow in FIG. 32. Furthermore, an array in which two pixels of 1×2 out of 2×2=four pixels of IR pixels are replaced with one event pixel 51E can be adopted.

The example of FIG. 31 is an example in which one event pixel 51E is disposed in a 1×2 vertically long shape, but may be disposed in a 2×1 horizontally long shape. Furthermore, two pixels at the G color filter position may be replaced with one event pixel 51E.

<13. Example of Event Pixels for Detecting IR Light>

In the above-described embodiment, the color filter is not disposed in the event pixel 51E, and the wavelength of the incident light detected by the event pixel 51E is not limited. In other words, the event pixel 51E of the above-described embodiment receives light of all colors (wavelengths) of red (R), green (G), and blue (B), and detects that a luminance change of the light exceeds a predetermined threshold value as an event.

However, an IR filter that transmits only infrared light may be disposed in the event pixel 51E, and the event pixel 51E may detect a luminance change of the infrared light as an event.

Figure 33:
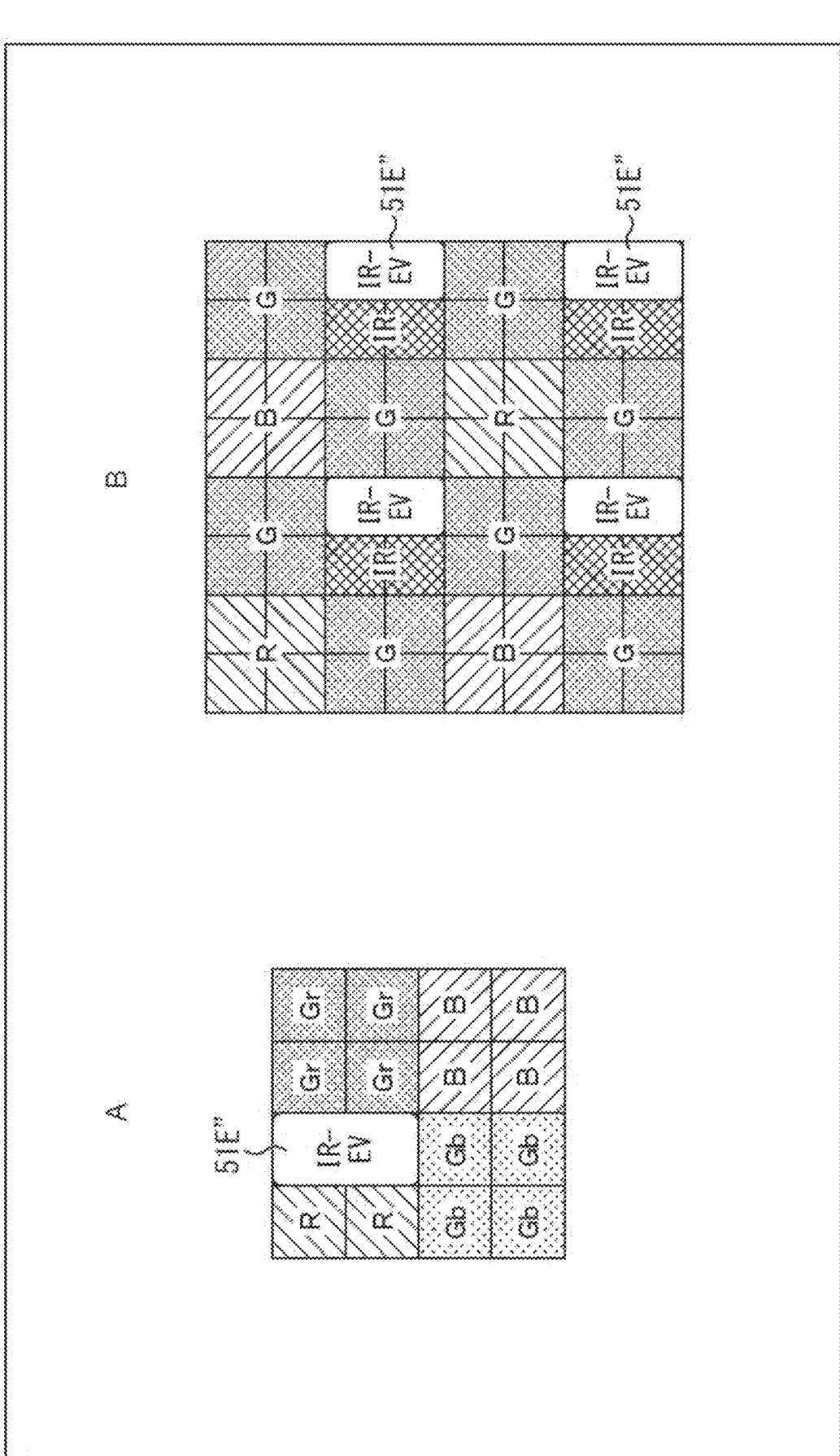
FIG. 33 is a diagram illustrating an application example of an event pixel that detects IR light.

FIG. 33 illustrates a pixel layout in a case where the event pixel 51E is configured to detect a change in luminance of infrared light as an event.

A of FIG. 33 illustrates an example in which the event pixel 51E in the sixth pixel layout illustrated in FIG. 27 is changed to an event pixel 51E″ that detects infrared light. The event pixel 51E″ is disposed at the R color filter position, and detects that the luminance change of the infrared light exceeds a predetermined threshold as an event.

B of FIG. 33 illustrates an example in which the event pixel 51E in the array layout of the RGB-IR array illustrated in FIG. 32 is changed to an event pixel 51E″ that detects infrared light. The event pixels 51E″ are arranged at the positions of two pixels of 1×2 among the IR pixels of 2×2=four pixels, and detect that the luminance change of the infrared light exceeds a predetermined threshold as an event.

The solid-state imaging device 12 equipped with the event pixel 51E″ that detects a change in luminance of infrared light can be applied to a sensing system or a distance measurement system.

<14. Configuration Example of Distance Measurement System>

Figure 34:
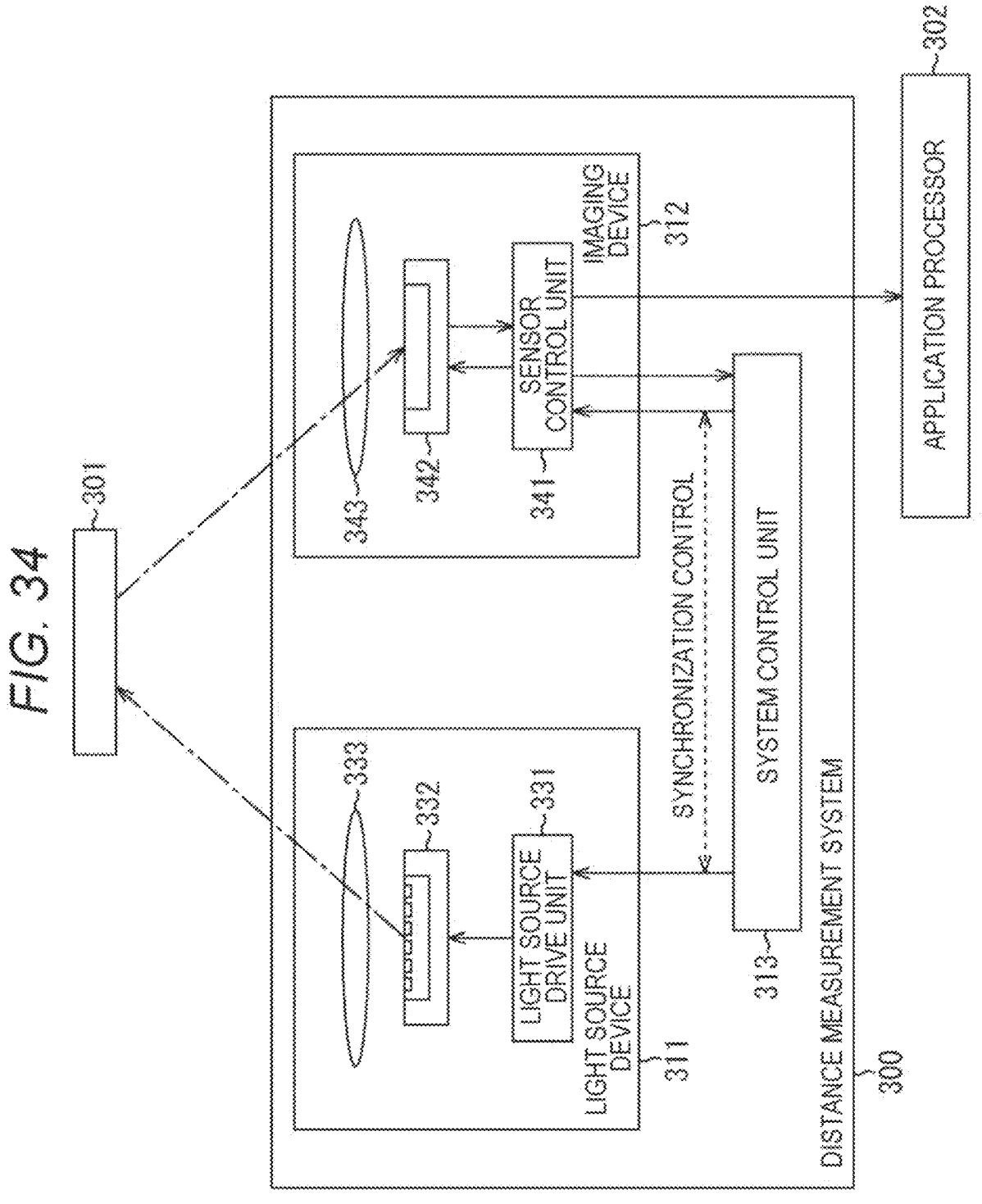
FIG. 34 is a block diagram illustrating a configuration example of a distance measurement system according to an embodiment of the present disclosure.

FIG. 34 is a block diagram illustrating a configuration example of a distance measurement system according to an embodiment of the present disclosure.

A distance measurement system 300 in FIG. 34 includes a light source device 311, an imaging device 312, and a system control unit 313.

The light source device 311 includes a light source drive unit 331, a light emission source 332, and a light source-side optical system 333. The light source drive unit 331 includes, for example, a laser driver or the like, and causes each light emitting element of the light emission source 332 to emit light in accordance with a light emission control signal supplied from the system control unit 313. The light emission source 332 includes, for example, a light source array in which a plurality of light emitting elements such as a vertical cavity surface emitting laser (VCSEL) is disposed in a planar direction. The light emission source 332 irradiates the subject 301 as a measurement target with a predetermined pattern of irradiation light under the control of the light source drive unit 331. As the irradiation light, for example, infrared light having a wavelength in a range of about 850 nm to 940 nm is used.

The imaging device 312 includes a sensor control unit 341, a solid-state imaging device 342, and an imaging-side optical system 343.

The sensor control unit 341 includes, for example, a processor (CPU), and controls the exposure timing of the solid-state imaging device 342 according to a light reception control signal supplied from the system control unit 313. The solid-state imaging device 342 performs a light receiving operation under the control of the sensor control unit 341. The solid-state imaging device 342 includes, for example, the solid-state imaging device 12 having the pixel layout in A or B of FIG. 33.

The system control unit 313 includes, for example, a processor (CPU), and controls irradiation timing of irradiation light by the light source device 311 and light reception timing by the imaging device 312. Specifically, the system control unit 313 generates a light emission control signal and a light reception control signal so as to operate the irradiation timing of the irradiation light and the light reception timing of the imaging device 312 in synchronization, and outputs the light emission control signal and the light reception control signal to the light source drive unit 331 and the sensor control unit 341.

The subject 301 is irradiated with the irradiation light of the predetermined pattern emitted from the light emission source 332 through the light source-side optical system 333. The irradiation light is reflected by the subject 301, passes through the imaging-side optical system 343, and enters the solid-state imaging device 342. The solid-state imaging device 342 receives the reflected light of the irradiation light reflected by the subject 301.

The event pixel 51E″ of the pixel array unit 41 of the solid-state imaging device 342 receives the reflected light reflected by the subject 301, detects that the luminance change of the pixel exceeds a predetermined threshold as an event, and generates an event signal (event data). The R pixel, the Gr pixel, the Gb pixel, and the B pixel other than the event pixel 51E″ of the pixel array unit 41 receive the R, Gr, Gb, and B lights, respectively, and generate luminance signals according to the amount of incident light.

The sensor control unit 341 generates image information on the basis of the luminance signal from the solid-state imaging device 342. Furthermore, the sensor control unit

341 generates distance measurement information to the subject 301 on the basis of the event signal from the solid-state imaging device 342. The generated image information and distance measurement information are output to an application processor 302.

The application processor 302 performs predetermined information processing using the image information and the distance measurement information output from the imaging device 312. For example, the application processor 302 extracts the face area of the user as the subject 301 as the attended area on the basis of the image information and the distance measurement information, executes pattern matching in the attended area, and performs face recognition (face authentication). For example, the application processor 302 detects a face area of the user as the subject 301 on the basis of the image information and the distance measurement information, and performs eye tracking.

<Application Example to Electronic Device>

The distance measurement system 300 described above can be used as, for example, a three-dimensional image acquisition system (face authentication system) mounted on various electronic devices having a face authentication function. Examples of the electronic device having the face authentication function include mobile devices such as a smartphone, a tablet, and a personal computer. However, the electronic device that can use the distance measurement system 300 is not limited to the mobile device.

<15. Another Usage Example of Addition Transistor>

In the second circuit configuration described with reference to FIG. 12, the configuration has been described in which the photodiode 61 and the address event detection circuit 62 of the event pixel 51E are provided in each of the two unit regions, and the addition transistor 181 turns on and off the connection of the current-voltage conversion circuits 121 of the two event pixels 51E.

On the other hand, the third circuit configuration described with reference to FIG. 13 is a configuration in which one address event detection circuit 62 is provided in two unit regions and the photodiodes 61 formed in the two unit regions are connected by wiring to operate as substantially one photodiode 61, and the fourth circuit configuration described with reference to FIG. 14 is a configuration in which one address event detection circuit 62 is provided in two unit regions and one photodiode 61 is physically formed in a semiconductor substrate of two unit regions.

With respect to the configuration in which one event pixel 51E is formed in two unit regions as in the third circuit configuration described with reference to FIG. 13 and the fourth circuit configuration described with reference to FIG. 14, a configuration in which connection with another event pixel 51E is turned on and off is also possible similarly to the addition transistor 181 illustrated in FIG. 12.

Figure 35:
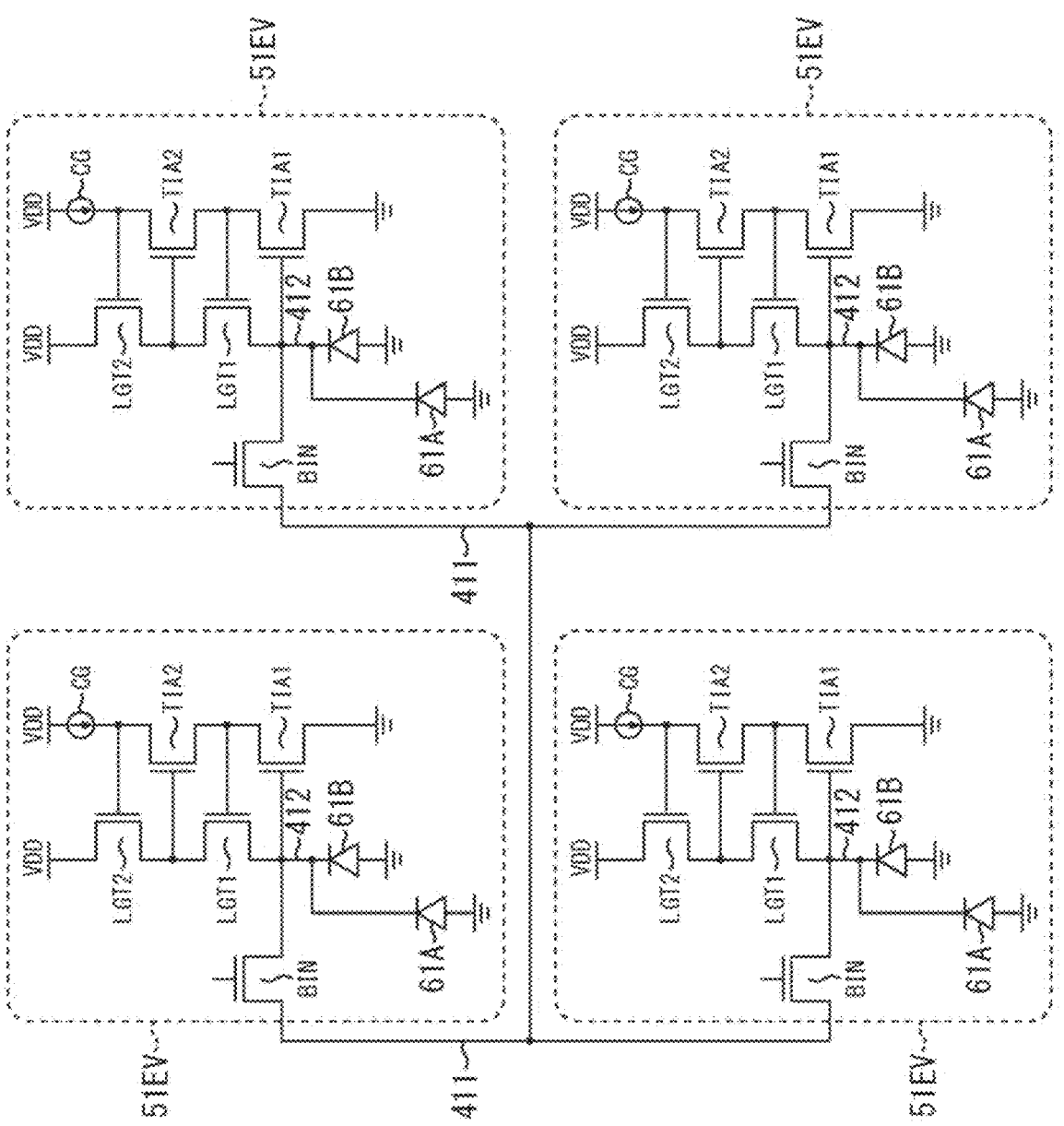
FIG. 35 is a diagram illustrating a circuit configuration example illustrating another usage example of the addition transistor.

FIG. 35 illustrates a circuit configuration example illustrating another usage example of the addition transistor.

The event pixel 51EV in FIG. 35 is one event pixel formed in two unit regions by adopting the third circuit configuration described in FIG. 13. That is, the event pixel 51EV includes photodiodes 61A and 61B provided corresponding to two unit regions, and one address event detection circuit 62. The connection wiring 412 is a wiring that connects (the cathode terminals of) the photodiodes 61A and 61B provided corresponding to the two unit regions and is connected to the gate of the first amplification transistor TIA1. In FIG. 35, as the configuration of the current-voltage conversion circuit 121 of the address event detection circuit 62, not the 2Tr-type provided with one loop circuit illustrated in FIG. 6 but the 4Tr-type provided with the two-stage loop circuit illustrated in FIG. 7 is adopted.

In the event pixel 51EV, each of the first logarithmic transistor LGT1 and the second logarithmic transistor LGT2 outputs a voltage signal corresponding to the logarithmic value of the photocurrent generated by photoelectrically converting the incident light. Each of the first amplification transistor TIA1 and the second amplification transistor TIA2 amplifies a voltage between a gate having a potential corresponding to a photocurrent and a source having a predetermined reference potential, and outputs the amplified voltage from a drain. The first logarithmic transistor LGT1 corresponds to the transistor 141 of the 4Tr-type current-voltage conversion circuit 121 in FIG. 7, and the first amplification transistor TIA1 corresponds to the transistor 143 of the 4Tr-type current-voltage conversion circuit 121 in FIG. 7. The second logarithmic transistor LGT2 corresponds to the transistor 145 of the 4Tr-type current-voltage conversion circuit 121 in FIG. 7, and the second amplification transistor TIA2 corresponds to the transistor 146 of the 4Tr-type current-voltage conversion circuit 121 in FIG. 7. The constant current source CG corresponds to the transistor 142 of the 4Tr-type current-voltage conversion circuit 121 in FIG. 7.

One addition transistor BIN is provided in each event pixel 51EV. The addition transistor BIN turns on and off connection with one or more other event pixels 51EV adjacent to each other. In the example of FIG. 35, the drains of the four adjacent addition transistors BIN are connected by a wiring 411, and a maximum of four event pixels 51EV can be connected.

The first logarithmic transistor LGT1, the first amplification transistor TIA1, the second logarithmic transistor LGT2, the second amplification transistor TIA2, and the addition transistor BIN in FIG. 35 are formed on the same substrate as the semiconductor substrate 201 on which the photodiode 61 is formed in FIG. 17, and the constant current source CG is formed on a substrate different from the semiconductor substrate 201 on which the photodiode 61 is formed. Hereinafter, as an example of the circuit configuration of the event pixel 51EV, the arrangement of the transistors formed on the semiconductor substrate 201 on which the photodiodes 61 are formed will be described, and thus description of circuits other than the current-voltage conversion circuit 121 of the address event detection circuit 62 will be omitted.

Figure 36:
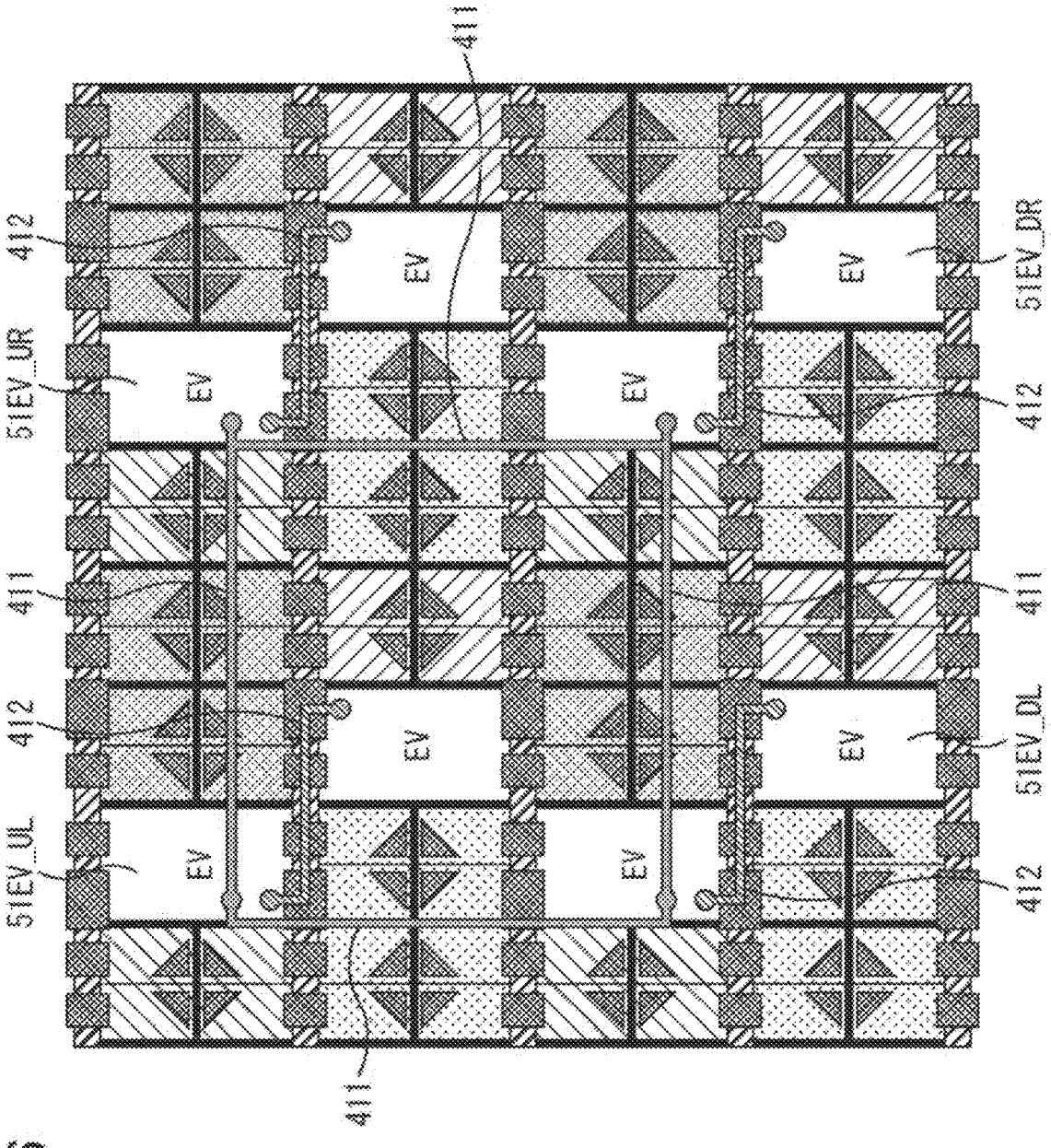
FIG. 36 is a plan view of a pixel layout illustrating an arrangement example of four event pixels connected by an addition transistor.

FIG. 36 is a plan view of a pixel layout illustrating an arrangement example of four event pixels 51EV connected by an addition transistor BIN.

The event pixel 51EV_UL is the event pixel 51EV disposed at the upper left among the four event pixels 51EV of 2×2 connected by the addition transistor BIN, and the event pixel 51EV_UR is the event pixel 51EV disposed at the upper right. The event pixel 51EV_DL is the event pixel 51EV disposed at the lower left among the four event pixels 51EV connected by the addition transistor BIN, and the event pixel 51EV_DR is the event pixel 51EV disposed at the lower right.

The wiring 411 connects four event pixels 51EV_UL, 51EV_UR, 51EV_DL, and 51EV_DR in 2×2. The connection wiring 412 connects (the cathode terminals of) the photodiodes 61A and 61B provided in two unit regions of each of the event pixels 51EV_UL, 51EV_UR, 51EV_DL, and 51EV_DR.

The layout of the event pixel 51EV and the gradation pixel 51G is similar to the third pixel layout illustrated in FIG. 10. The event pixels 51EV are formed in the unit region at the R color filter position and the unit region at the B color filter position, and are formed adjacent to each other in the diagonal direction. The reference signs of the gradation pixels 51G are omitted to prevent complication.

<16. Problem of Wiring Capacitance Connected to Gate of First Amplification Transistor>

Figure 37:
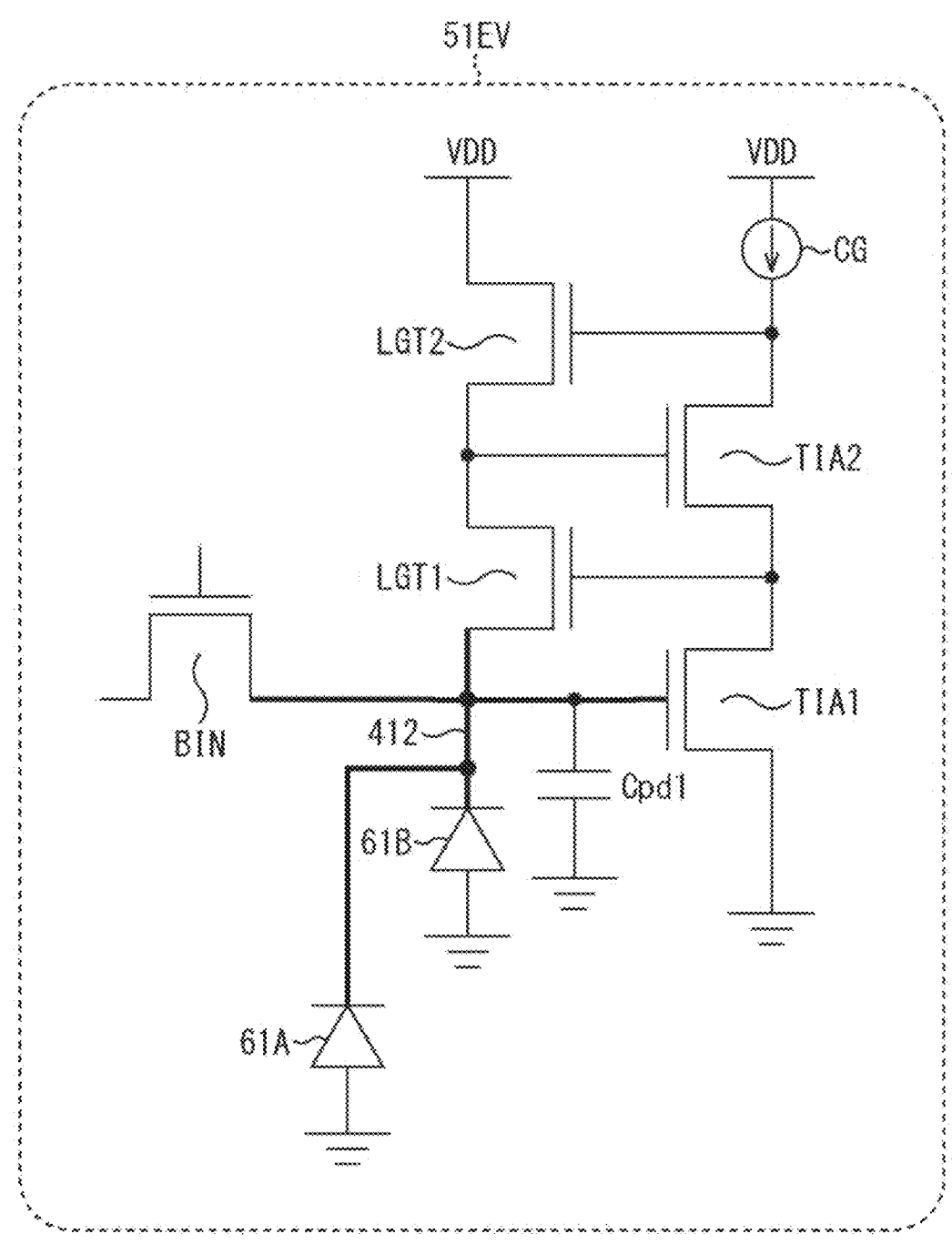
FIG. 37 is a diagram illustrating a problem of a wiring capacitance connected to a first amplification transistor gate.

FIG. 37 is a diagram illustrating a circuit configuration example of one event pixel 51EV connectable by the addition transistor BIN illustrated in FIG. 35.

As illustrated in FIG. 37, in one event pixel 51EV, a connection wiring 412 connecting (the cathode terminals of) the photodiodes 61A and 61B is also connected to the gate of the first amplification transistor TIA1, the source of the first logarithmic transistor LGT1, and the source of the addition transistor BIN. Therefore, depending on the arrangement of the three transistors of the first amplification transistor TIA1, the first logarithmic transistor LGT1, and the addition transistor BIN, the length of the connection wiring 412 increases, and the wiring capacitance Cpd1 of the connection wiring 412 increases.

Figure 38:
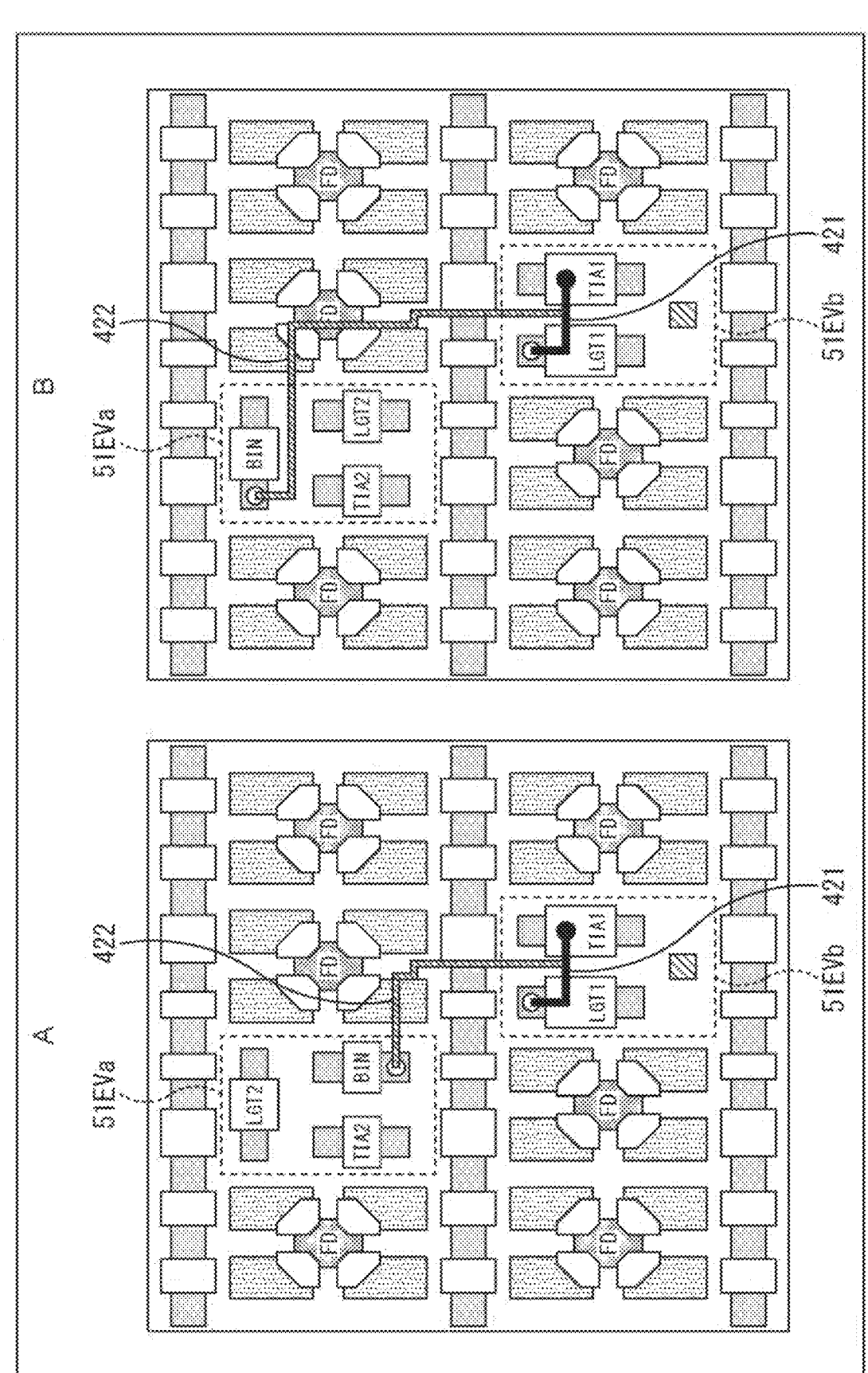
FIG. 38 is a diagram for explaining a first amplification transistor gate wiring capacitance due to transistor arrangement.

A and B of FIG. 38 are plan views of the event pixels 51EV having different transistor arrangements.

The event pixel 51EVa is an upper left unit region in which a photodiode 61A (not illustrated) is formed among one event pixel 51EV formed in two unit regions, and the event pixel 51EVb is a lower right unit region in which a photodiode 61B (not illustrated) is formed.

In the drawings after FIG. 38, in order to prevent the drawing from being complicated, the reference signs of the transistors of the gradation pixel 51G are omitted, and the reference signs of the transistors in the event pixel 51EVa and the event pixel 51EVb are described on the gate electrodes of the transistors. Specifically, in FIG. 38, the transistor with the mark "LGT1" on the gate electrode represents the first logarithmic transistor LGT1, the transistor with the mark "TIA1" on the gate electrode represents the first amplification transistor TIA1, the transistor with the mark "LGT2" on the gate electrode represents the second logarithmic transistor LGT2, the transistor with the mark "TIA2" on the gate electrode represents the second amplification transistor TIA2, and the transistor with the mark "BIN" on the gate electrode represents the addition transistor BIN.

In both the event pixels 51EV in A and B of FIG. 38, the second logarithmic transistor LGT2, the second amplification transistor TIA2, and the addition transistor BIN are disposed in the upper left event pixel 51EVa, and the first logarithmic transistor LGT1 and the first amplification transistor TIA1 are disposed in the lower right event pixel 51EVb.

In the event pixel 51EVa on the upper left of the event pixel 51EV in A of FIG. 38, the second logarithmic transistor LGT2 is disposed in the horizontal direction, and the second amplification transistor TIA2 and the addition transistor BIN are disposed side by side in the vertical direction perpendicular to the second logarithmic transistor LGT2 in the drawing.

On the other hand, in the event pixel 51EVa on the upper left of the event pixel 51EV in B of FIG. 38, the addition transistor BIN is disposed in the horizontal direction in the drawing, and the second amplification transistor TIA2 and the second logarithmic transistor LGT2 are disposed side by side in the vertical direction perpendicular to the addition transistor BIN.

The connection wiring 412 of FIG. 37 connected to the gate of the first amplification transistor TIA1 includes, for example, two wirings of a wiring 421 and a wiring 422. The wiring 421 is a wiring that connects the source of the first logarithmic transistor LGT1 and the gate of the first amplification transistor TIA1, and the wiring 422 is a wiring that connects the source of the addition transistor BIN and the wiring 421. The wiring 421 and the wiring 422 are formed in different layers and are electrically connected via vias.

In the event pixel 51EV in A of FIG. 38 and the event pixel 51EV in B of FIG. 38 having different transistor arrangements, the wiring length of the wiring 422 is longer and the wiring length of the entire connection wiring 412 is also longer in the event pixel 51EV in B of FIG. 38. As a result, the wiring capacitance Cpd1 of the connection wiring 412 is larger in the event pixel 51EV in B of FIG. 38 than in the event pixel 51EV in A of FIG. 38. When the wiring capacitance Cpd1 increases, noise of the first amplification transistor TIA1 viewed from the output of the event pixel 51EV increases.

As described above, depending on the transistor arrangement in one event pixel 51EV, the wiring capacitance Cpd1 of the connection wiring 412 connected to the gate of the first amplification transistor TIA1 increases, and noise characteristics may deteriorate.

Hereinafter, a transistor arrangement for reducing the wiring capacitance Cpd1 of the connection wiring 412 connected to the gate of the first amplification transistor TIA1 will be described.

<17. Transistor Arrangement for Reducing Capacitance of Gate Wiring of First Amplification Transistor>
<First Rule>

Figure 39:
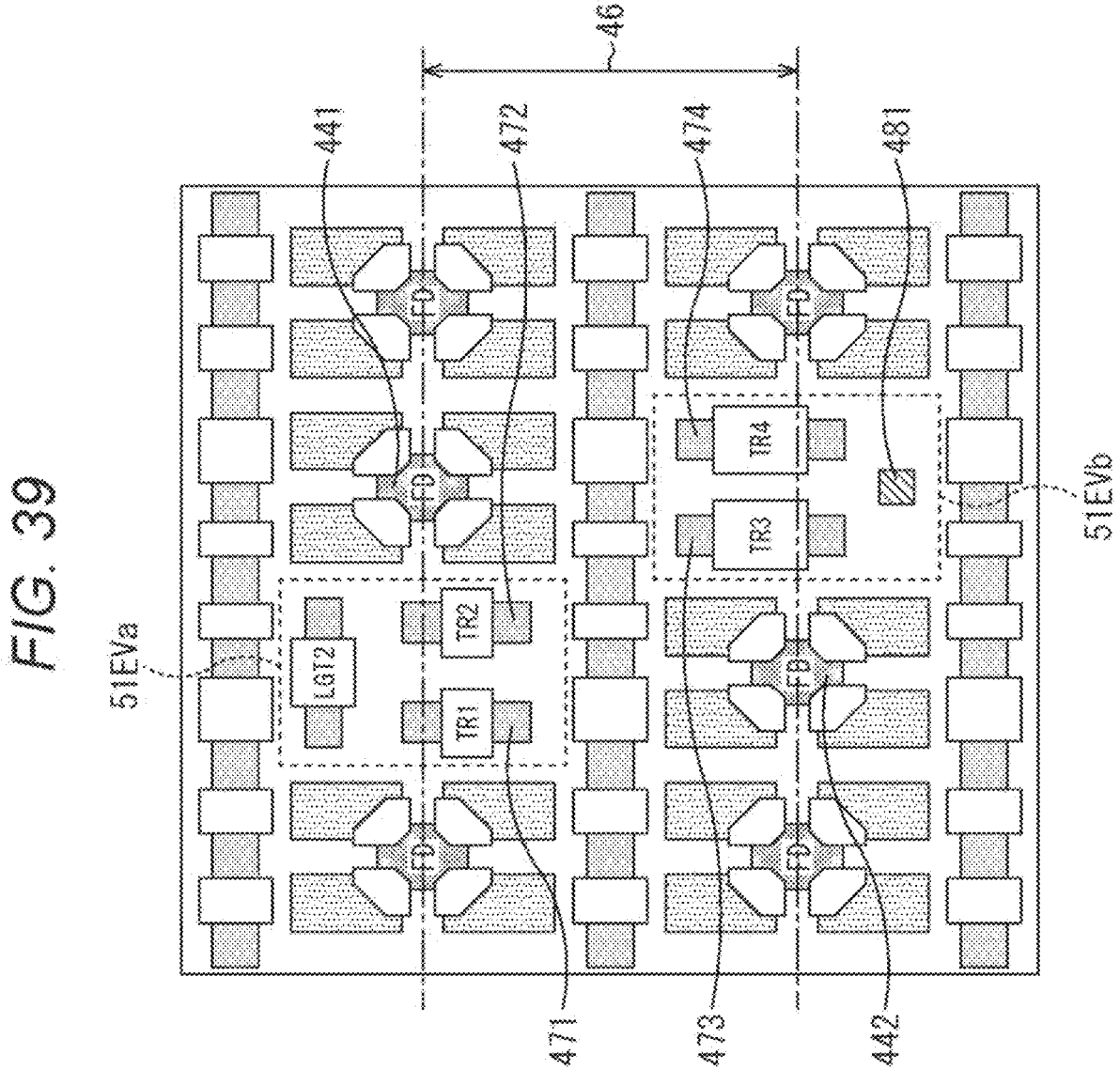
FIG. 39 is a plan view for explaining a first rule of transistor arrangement for reducing the capacitance of the gate wiring of the first amplification transistor.

FIG. 39 is a plan view for explaining a first rule of transistor arrangement for reducing the wiring capacitance Cpd1 of the connection wiring 412.

The first rule of the transistor arrangement is a rule of arranging two diffusion layers of the source of the addition transistor BIN connected to the gate of the first amplification transistor TIA1 and the source of the first logarithmic transistor LGT1 in any one of the four diffusion layers 471 to 474 located in the region 461 vertically sandwiched by the two floating diffusion regions FD, that is the floating diffusion region (FD) 441 of the gradation pixel 51G adjacent to the right of the upper left event pixel 51EVa and the floating diffusion region (FD) 442 of the gradation pixel 51G adjacent to the left of the lower right event pixel 51EVb. By arranging the two diffusion layers of the source of the addition transistor BIN and the source of the first logarithmic transistor LGT1 in the region 461 that is located in the vicinity of the event pixel 51EVa and the event pixel 51EVb in the diagonal direction, the wiring capacitance Cpd1 of the connection wiring 412 can be reduced, and noise of the first amplification transistor TIA1 can be reduced. Specifically, as illustrated in FIG. 39, assuming that the second logarithmic transistor LGT2 is disposed in the horizontal direction in the upper left event pixel 51EVa, the two transistors TR1 and TR2 are disposed side by side in the vertical direction perpendicular to the second logarithmic transistor LGT2, and the two transistors TR3 and TR4 are disposed in the lower right event pixel 51EVb, the transistors TR1 to TR4 are any one of the addition transistor BIN, the second amplification transistor TIA2, the first logarithmic transistor LGT1, and the first amplification transistor TIA1. The arrangement direction of the transistors TR3 and TR4 disposed in the event pixel 51EVb at the lower right is not limited. The diffusion layer 481 in the event pixel 51EVb at the lower right is a well contact that supplies a predetermined potential to a well layer including a high-concentration P-type semiconductor region.

(First Rule: First Transistor Arrangement Example)

Figure 40:
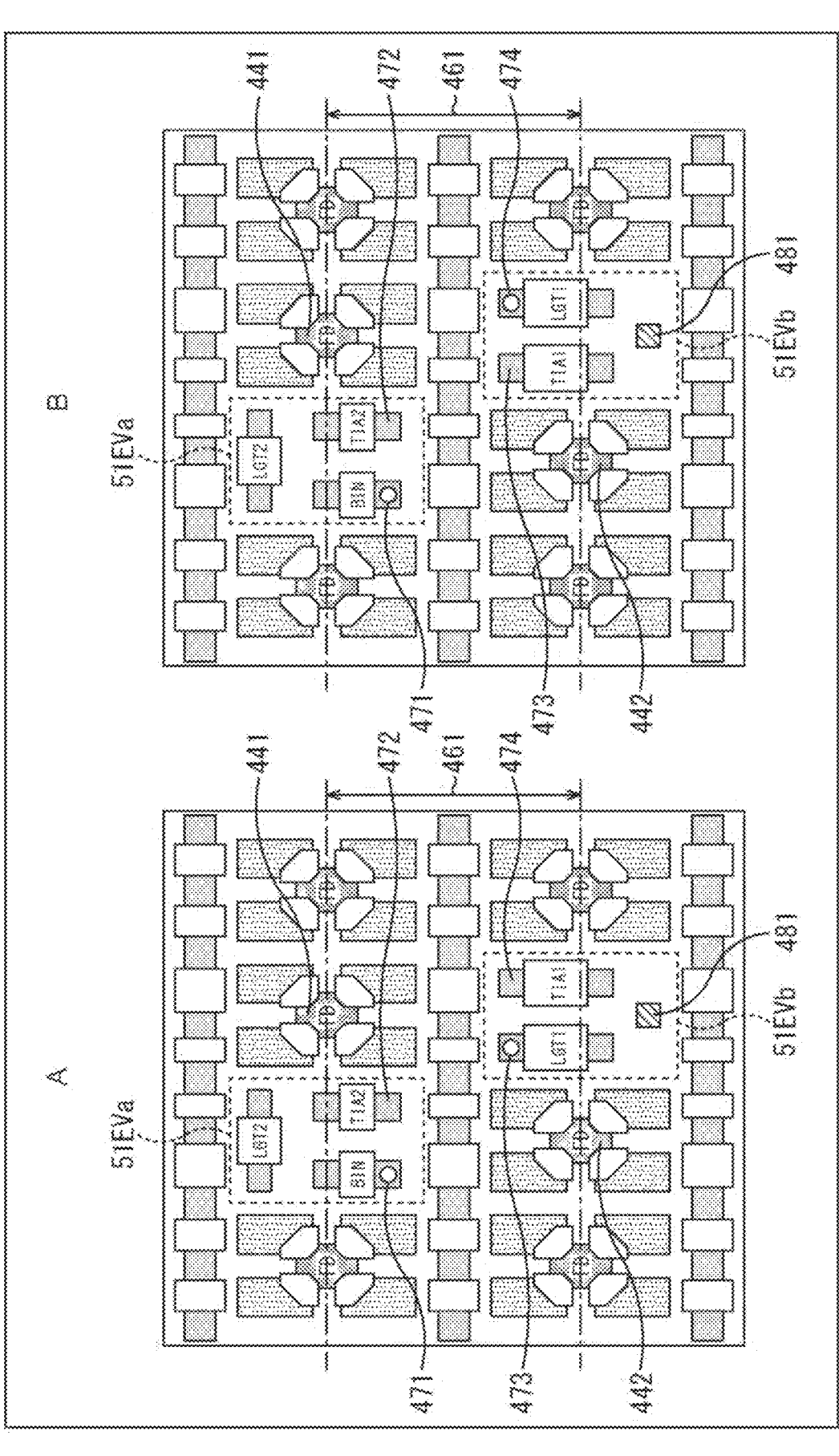
FIG. 40 is a plan view illustrating first and second transistor arrangement examples of the first rule.

A of FIG. 40 is a plan view illustrating a first transistor arrangement example according to the first rule.

In the first transistor arrangement example illustrated in A of FIG. 40, the second logarithmic transistor LGT2 is disposed in the horizontal direction in the upper left event pixel 51EVa, and the addition transistor BIN and the second amplification transistor TIA2 are disposed in the vertical direction perpendicular to the second logarithmic transistor LGT2. In the event pixel 51EVb at the lower right, a first logarithmic transistor LGT1 and a first amplification transistor TIA1 are disposed in a direction parallel to the addition transistor BIN and the second amplification transistor TIA2.

Among the four diffusion layers 471 to 474 located in the region 461 vertically sandwiched by the two floating diffusion regions FD, that is the upper left floating diffusion region (FD) 441 and the lower right floating diffusion region (FD) 442, the diffusion layer 471 is the source of the addition transistor BIN, and the diffusion layer 473 is the source of the first logarithmic transistor LGT1. A white circle is attached to the source of the addition transistor BIN and the source of the first logarithmic transistor LGT1.

(First Rule: Second Transistor Arrangement Example)

B of FIG. 40 is a plan view illustrating a second transistor arrangement example according to the first rule.

In the second transistor arrangement example illustrated in B of FIG. 40, the second logarithmic transistor LGT2 is disposed in the horizontal direction in the upper left event pixel 51EVa, and the addition transistor BIN and the second amplification transistor TIA2 are disposed in the vertical direction perpendicular to the second logarithmic transistor LGT2. In the event pixel 51EVb at the lower right, the first amplification transistor TIA1 and the first logarithmic transistor LGT1 are disposed in a direction parallel to the addition transistor BIN and the second amplification transistor TIA2. The arrangement of the first logarithmic transistor LGT1 and the first amplification transistor TIA1 in the event pixel 51EVb at the lower right is opposite to that of the first transistor arrangement example illustrated in A of FIG. 40.

Among the four diffusion layers 471 to 474 located in the region 461 vertically sandwiched by the two floating diffusion regions FD, that is the upper left floating diffusion region (FD) 441 and the lower right floating diffusion region (FD) 442, the diffusion layer 471 is the source of the addition transistor BIN, and the diffusion layer 474 is the source of the first logarithmic transistor LGT1.

(Rule 1: Third Transistor Arrangement Example)

Figure 41:
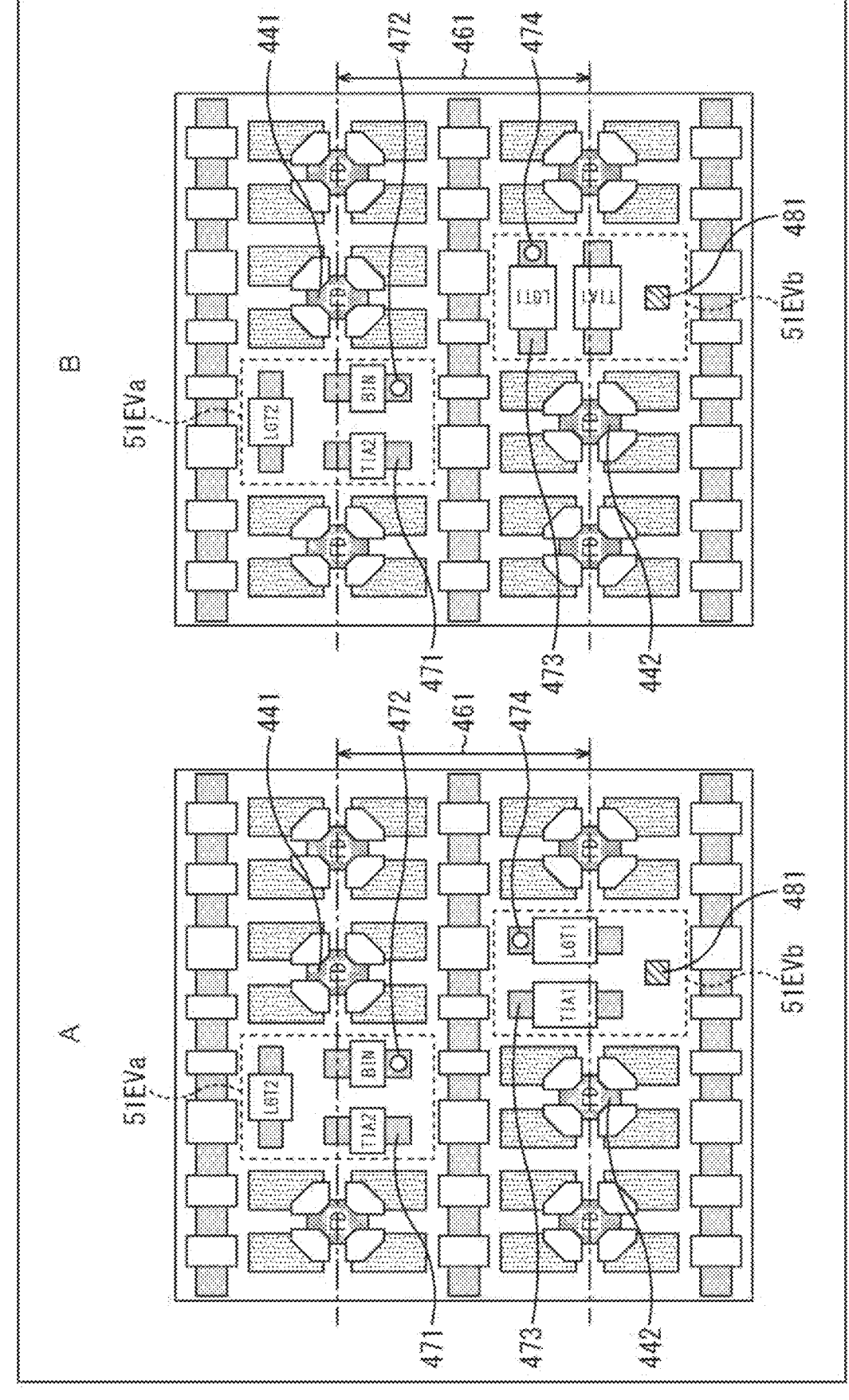
FIG. 41 is a plan view illustrating third and fourth transistor arrangement examples of the first rule.

A of FIG. 41 is a plan view illustrating a third transistor arrangement example according to the first rule.

In the third transistor arrangement example illustrated in A of FIG. 41, the second logarithmic transistor LGT2 is disposed in the horizontal direction in the upper left event pixel 51EVa, and the second amplification transistor TIA2 and the addition transistor BIN are disposed in the vertical direction perpendicular to the second logarithmic transistor LGT2. The arrangement of the second amplification transistor TIA2 and the addition transistor BIN is opposite to that of the second transistor arrangement example illustrated in B of FIG. 40. In the event pixel 51EVb at the lower right, the first amplification transistor TIA1 and the first logarithmic transistor LGT1 are disposed in a direction parallel to the second amplification transistor TIA2 and the addition transistor BIN.

Among the four diffusion layers 471 to 474 located in the region 461 vertically sandwiched by the two floating diffusion regions FD, that is the upper left floating diffusion region (FD) 441 and the lower right floating diffusion region (FD) 442, the diffusion layer 472 is the source of the addition transistor BIN, and the diffusion layer 474 is the source of the first logarithmic transistor LGT1.

The arrangement of the first amplification transistor TIA1 and the first logarithmic transistor LGT1 in the lower right event pixel 51EVb may be opposite to each other as in the first transistor arrangement example illustrated in A of FIG. 40. In this case, the diffusion layer 473 is used as a source of the first logarithmic transistor LGT1.

(Rule 1: Fourth Transistor Arrangement Example)

B of FIG. 41 is a plan view illustrating a fourth transistor arrangement example according to the first rule.

In the fourth transistor arrangement example illustrated in B of FIG. 41, the second logarithmic transistor LGT2 is disposed in the horizontal direction in the upper left event pixel 51EVa, and the second amplification transistor TIA2 and the addition transistor BIN are disposed in the vertical direction perpendicular to the second logarithmic transistor LGT2. In the event pixel 51EVb at the lower right, the first amplification transistor TIA1 and the first logarithmic transistor LGT1 are disposed in a direction perpendicular to the second amplification transistor TIA2 and the addition transistor BIN.

Among the four diffusion layers 471 to 474 located in the region 461 vertically sandwiched by the two floating diffusion regions FD, that is the upper left floating diffusion region (FD) 441 and the lower right floating diffusion region (FD) 442, the diffusion layer 472 is the source of the addition transistor BIN, and the diffusion layer 474 is the source of the first logarithmic transistor LGT1.

(Rule 1: Fifth Transistor Arrangement Example)

Figure 42:
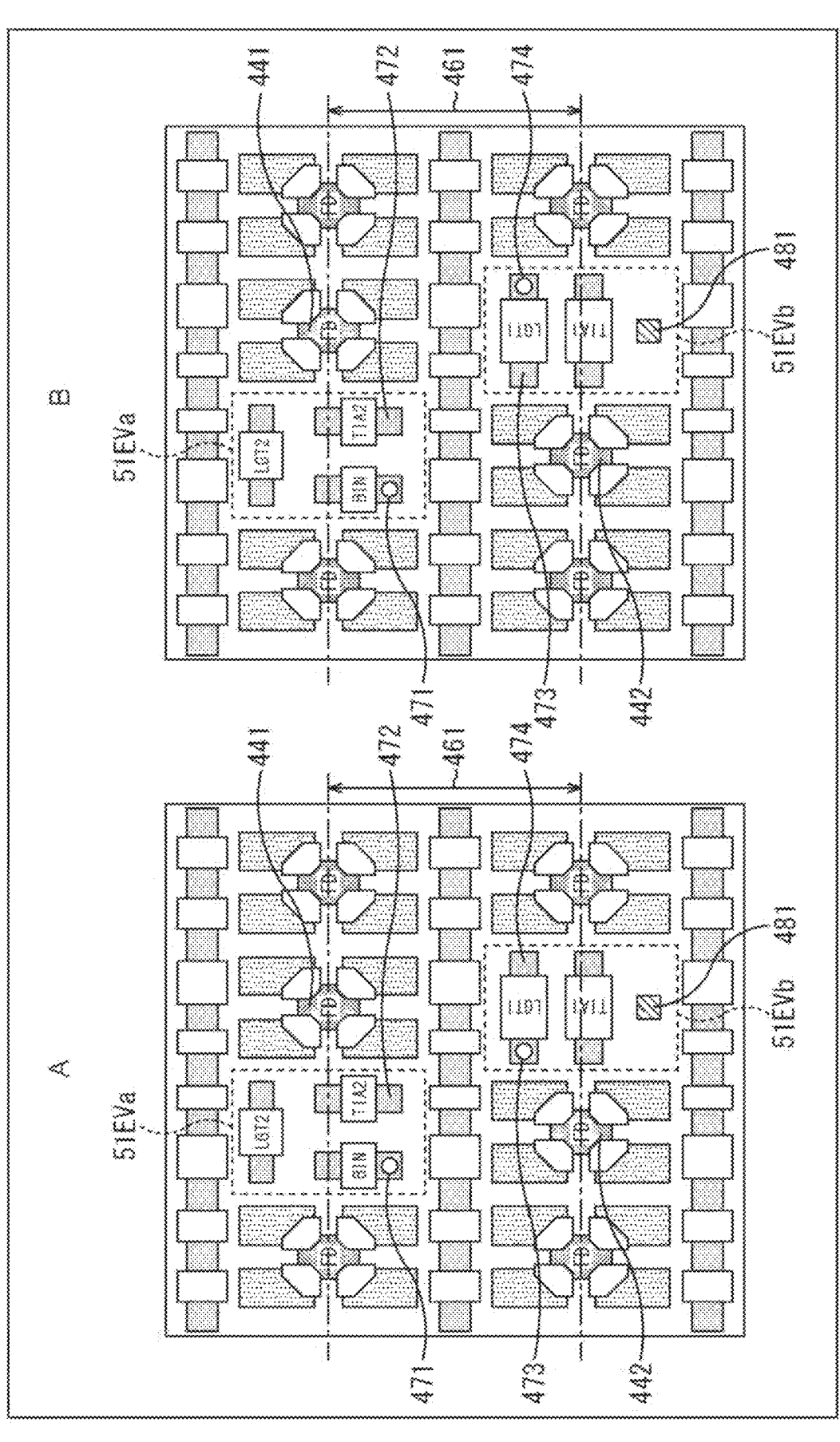
FIG. 42 is a plan view illustrating fifth and sixth transistor arrangement examples of the first rule.

A of FIG. 42 is a plan view illustrating a fifth transistor arrangement example according to the first rule.

In the fifth transistor arrangement example illustrated in A of FIG. 42, the second logarithmic transistor LGT2 is disposed in the horizontal direction in the upper left event pixel 51EVa, and the addition transistor BIN and the second amplification transistor TIA2 are disposed in the vertical direction perpendicular to the second logarithmic transistor LGT2. The arrangement of the addition transistor BIN and the second amplification transistor TIA2 is opposite to that of the fourth transistor arrangement example illustrated in B of FIG. 41. In the event pixel 51EVb at the lower right, the first amplification transistor TIA1 and the first logarithmic transistor LGT1 are disposed in a direction perpendicular to the addition transistor BIN and the second amplification transistor TIA2.

Among the four diffusion layers 471 to 474 located in the region 461 vertically sandwiched by the two floating diffusion regions FD, that is the upper left floating diffusion region (FD) 441 and the lower right floating diffusion region (FD) 442, the diffusion layer 471 is the source of the addition transistor BIN, and the diffusion layer 473 is the source of the first logarithmic transistor LGT1.

(Rule 1: Sixth Transistor Arrangement Example)

B of FIG. 42 is a plan view illustrating a sixth transistor arrangement example according to the first rule.

In the sixth transistor arrangement example illustrated in B of FIG. 42, the second logarithmic transistor LGT2 is disposed in the horizontal direction in the upper left event pixel 51EVa, and the addition transistor BIN and the second amplification transistor TIA2 are disposed in the vertical direction perpendicular to the second logarithmic transistor LGT2. In the event pixel 51EVb at the lower right, the first amplification transistor TIA1 and the first logarithmic transistor LGT1 are disposed in a direction perpendicular to the addition transistor BIN and the second amplification transistor TIA2.

Among the four diffusion layers 471 to 474 located in the region 461 vertically sandwiched by the two floating diffusion regions FD, that is the upper left floating diffusion region (FD) 441 and the lower right floating diffusion region (FD) 442, the diffusion layer 471 is the source of the addition transistor BIN, and the diffusion layer 474 is the source of the first logarithmic transistor LGT1.

<Second Rule>

Figure 43:
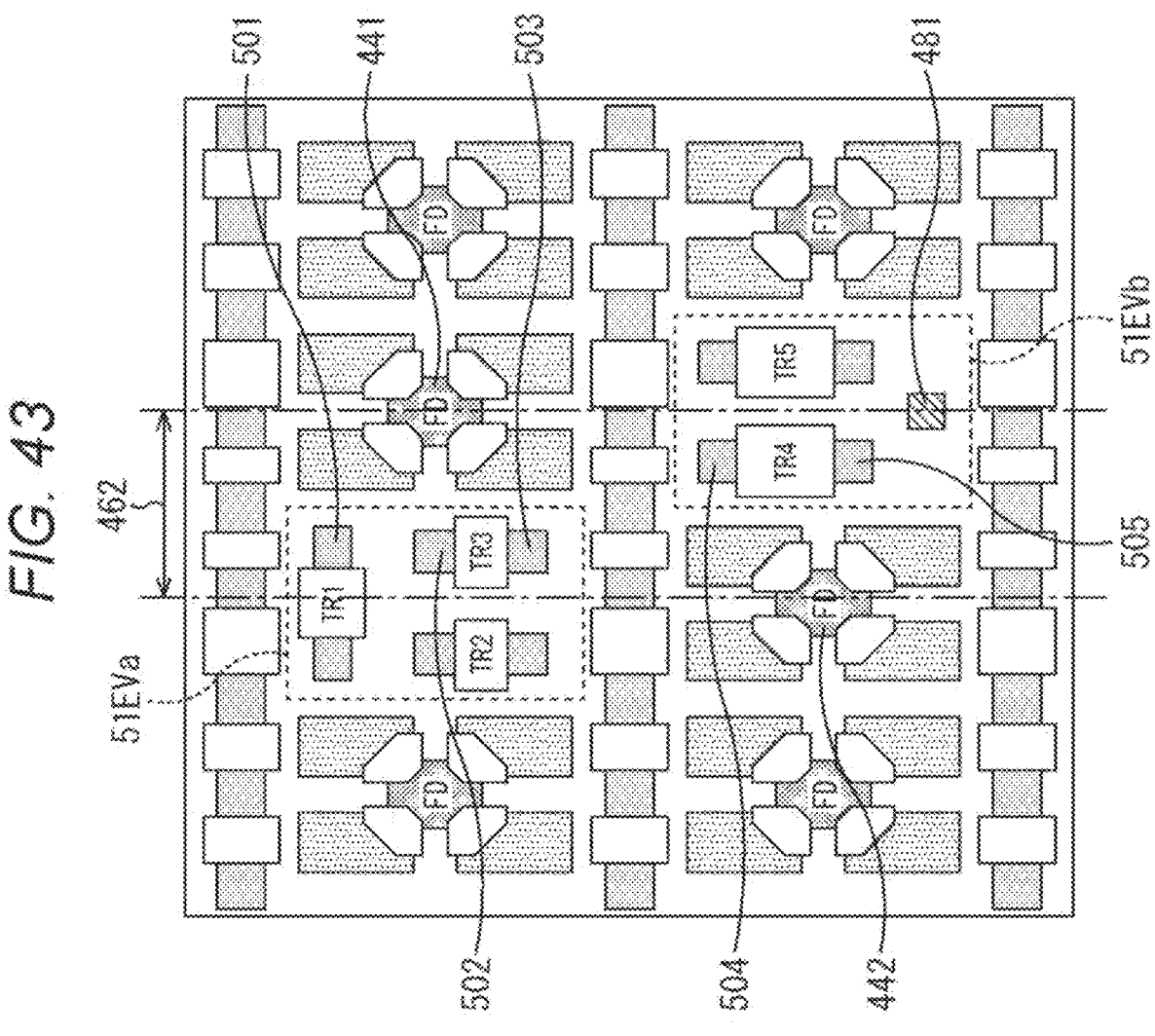
FIG. 43 is a plan view for explaining a second rule of transistor arrangement for reducing the capacitance of the gate wiring of the first amplification transistor.

FIG. 43 is a plan view for describing the second rule of the transistor arrangement for reducing the wiring capacitance Cpd1 of the connection wiring 412.

The second rule of transistor arrangement is a rule of arranging two diffusion layers of the source of the addition transistor BIN connected to the gate of the first amplification transistor TIA1 and the source of the first logarithmic transistor LGT1 in any one of the five diffusion layers 501 to 505 located in the region 462 sandwiched in the left-right direction by the two floating diffusion regions FD, that is the floating diffusion region (FD) 441 of the gradation pixel 51G adjacent to the right of the upper left event pixel 51EVa and the floating diffusion region (FD) 442 of the gradation pixel 51G adjacent to the left of the lower right event pixel 51EVb. By disposing the two diffusion layers of the source of the addition transistor BIN and the source of the first logarithmic transistor LGT1 in the region 462 that is located in the vicinity of the event pixel 51EVa and the event pixel 51EVb in the diagonal direction, the wiring capacitance Cpd1 of the connection wiring 412 can be reduced, and noise of the first amplification transistor TIA1 can be reduced. Specifically, as illustrated in FIG. 43, three transistors TR1 to TR3 may be disposed in the upper left event pixel 51EVa, and two transistors TR4 and TR5 may be disposed in the lower right event pixel 51EVb. However, the transistors TR1 to TR5 are any one of the first logarithmic transistor LGT1, the first amplification transistor TIA1, the second logarithmic transistor LGT2, the second amplification transistor TIA2, and the addition transistor BIN. The arrangement direction of the transistors TR4 and TR5 disposed in the event pixel 51EVb at the lower right is not limited.

(Second Rule: First Transistor Arrangement Example)

Figure 44:
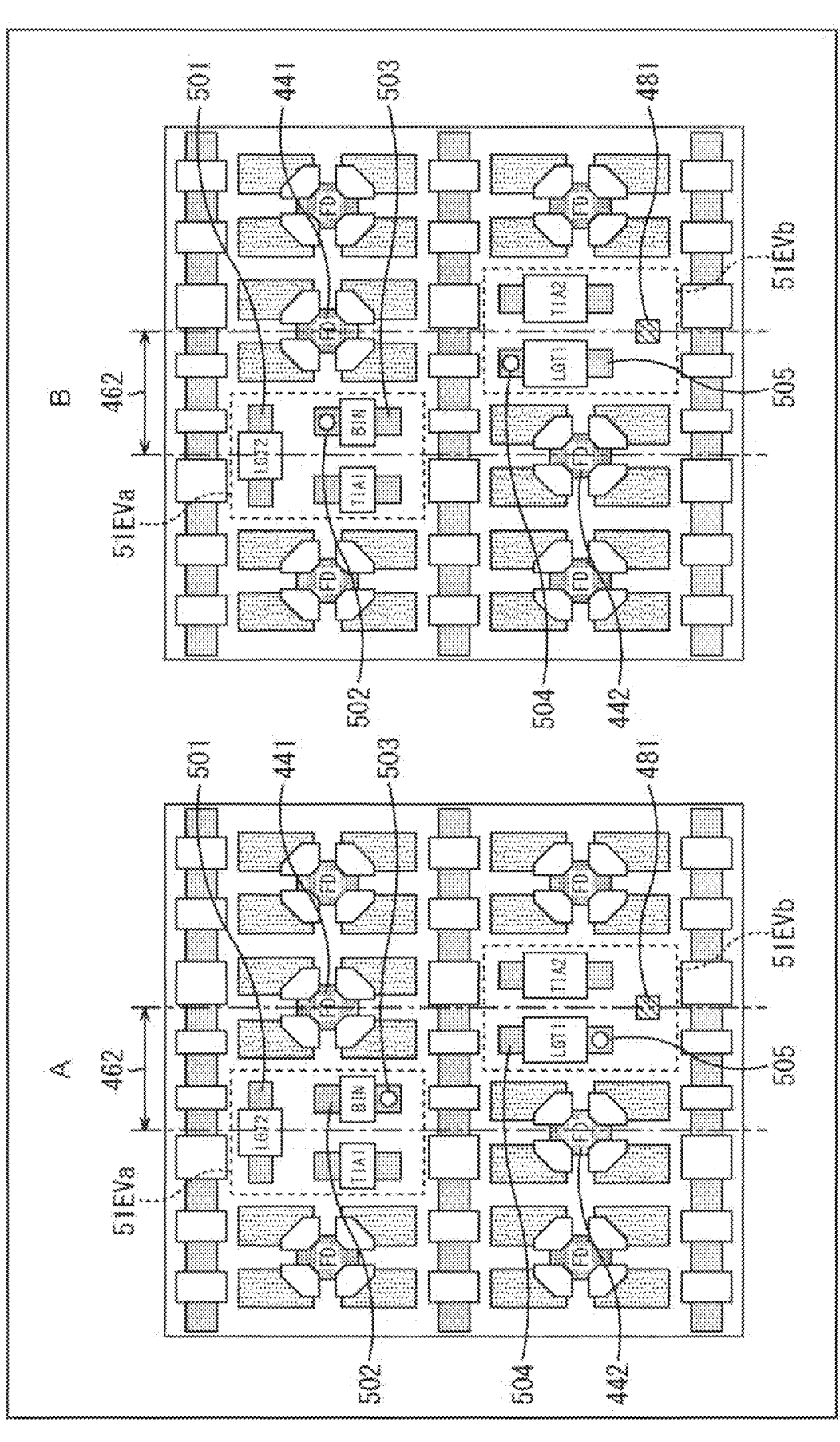
FIG. 44 is a plan view illustrating first and second transistor arrangement examples of the second rule.

A of FIG. 44 is a plan view illustrating a first transistor arrangement example according to the second rule.

In the first transistor arrangement example illustrated in A of FIG. 44, the second logarithmic transistor LGT2 is disposed in the horizontal direction in the upper left event pixel 51EVa, and the first amplification transistor TIA1 and the addition transistor BIN are disposed in the vertical direction perpendicular to the second logarithmic transistor LGT2. In the event pixel 51EVb at the lower right, a first logarithmic transistor LGT1 and a second amplification transistor TIA2 are disposed in a direction parallel to the first amplification transistor TIA1 and the addition transistor BIN.

Among the five diffusion layers 501 to 505 located in the region 462 sandwiched in the left-right direction by the two floating diffusion regions FD, that is the upper left floating diffusion region (FD) 441 and the lower right floating diffusion region (FD) 442, the diffusion layer 503 is the source of the addition transistor BIN, and the diffusion layer 505 is the source of the first logarithmic transistor LGT1.

(Second Rule: Second Transistor Arrangement Example)

B of FIG. 44 is a plan view illustrating a second transistor arrangement example according to the second rule.

In the second transistor arrangement example illustrated in B of FIG. 44, the second logarithmic transistor LGT2 is disposed in the horizontal direction in the upper left event pixel 51EVa, and the first amplification transistor TIA1 and the addition transistor BIN are disposed in the vertical direction perpendicular to the second logarithmic transistor LGT2. In the event pixel 51EVb at the lower right, a first logarithmic transistor LGT1 and a second amplification transistor TIA2 are disposed in a direction parallel to the first amplification transistor TIA1 and the addition transistor BIN.

Among the five diffusion layers 501 to 505 located in the region 462 sandwiched in the left-right direction by the two floating diffusion regions FD, that is the upper left floating diffusion region (FD) 441 and the lower right floating diffusion region (FD) 442, the diffusion layer 502 is the source of the addition transistor BIN, and the diffusion layer 504 is the source of the first logarithmic transistor LGT1.

(Second Rule: Third Transistor Arrangement Example)

Figure 45:
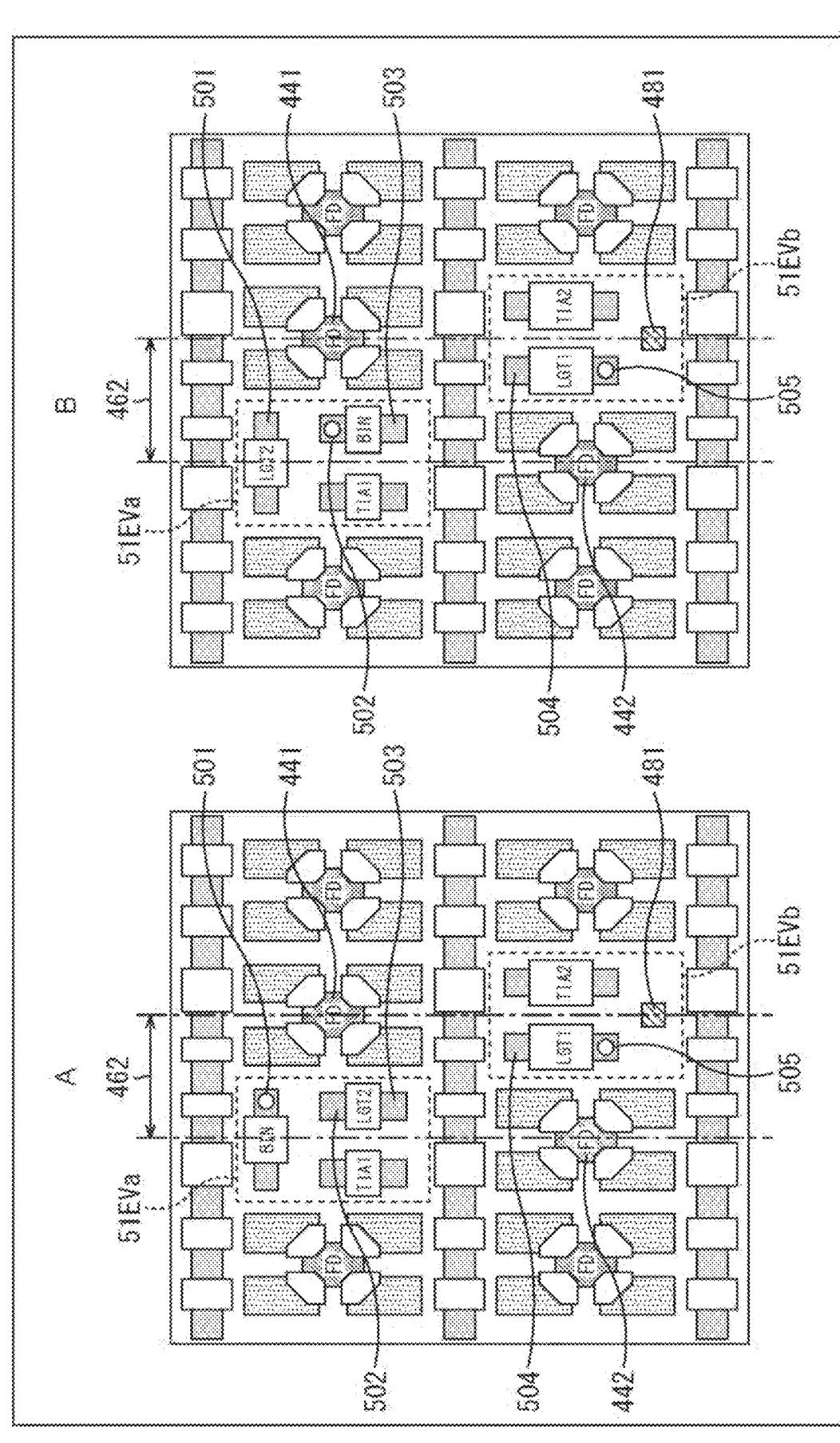
FIG. 45 is a plan view illustrating third and fourth transistor arrangement examples of the second rule.

A of FIG. 45 is a plan view illustrating a third transistor arrangement example according to the second rule.

In the third transistor arrangement example illustrated in A of FIG. 45, the addition transistor BIN is disposed in the horizontal direction in the upper left event pixel 51EVa, and the first amplification transistor TIA1 and the second logarithmic transistor LGT2 are disposed in the vertical direction perpendicular to the addition transistor BIN. In the event pixel 51EVb at the lower right, a first logarithmic transistor LGT1 and a second amplification transistor TIA2 are disposed in a direction parallel to the first amplification transistor TIA1 and the second logarithmic transistor LGT2.

Among the five diffusion layers 501 to 505 located in the region 462 sandwiched in the left-right direction by the two floating diffusion regions FD, that is the upper left floating diffusion region (FD) 441 and the lower right floating diffusion region (FD) 442, the diffusion layer 501 is the source of the addition transistor BIN, and the diffusion layer 505 is the source of the first logarithmic transistor LGT1.

(Rule 2: Fourth Transistor Arrangement Example)

B of FIG. 45 is a plan view illustrating a fourth transistor arrangement example according to the second rule.

In the fourth transistor arrangement example illustrated in B of FIG. 45, the second logarithmic transistor LGT2 is disposed in the horizontal direction in the upper left event pixel 51EVa, and the first amplification transistor TIA1 and the addition transistor BIN are disposed in the vertical direction perpendicular to the second logarithmic transistor LGT2. In the event pixel 51EVb at the lower right, a first logarithmic transistor LGT1 and a second amplification transistor TIA2 are disposed in a direction parallel to the first amplification transistor TIA1 and the addition transistor BIN.

Among the five diffusion layers 501 to 505 located in the region 462 sandwiched in the left-right direction by the two floating diffusion regions FD, that is the upper left floating diffusion region (FD) 441 and the lower right floating diffusion region (FD) 442, the diffusion layer 502 is the source of the addition transistor BIN, and the diffusion layer 505 is the source of the first logarithmic transistor LGT1.

(Rule 2: Fifth Transistor Arrangement Example)

Figure 46:
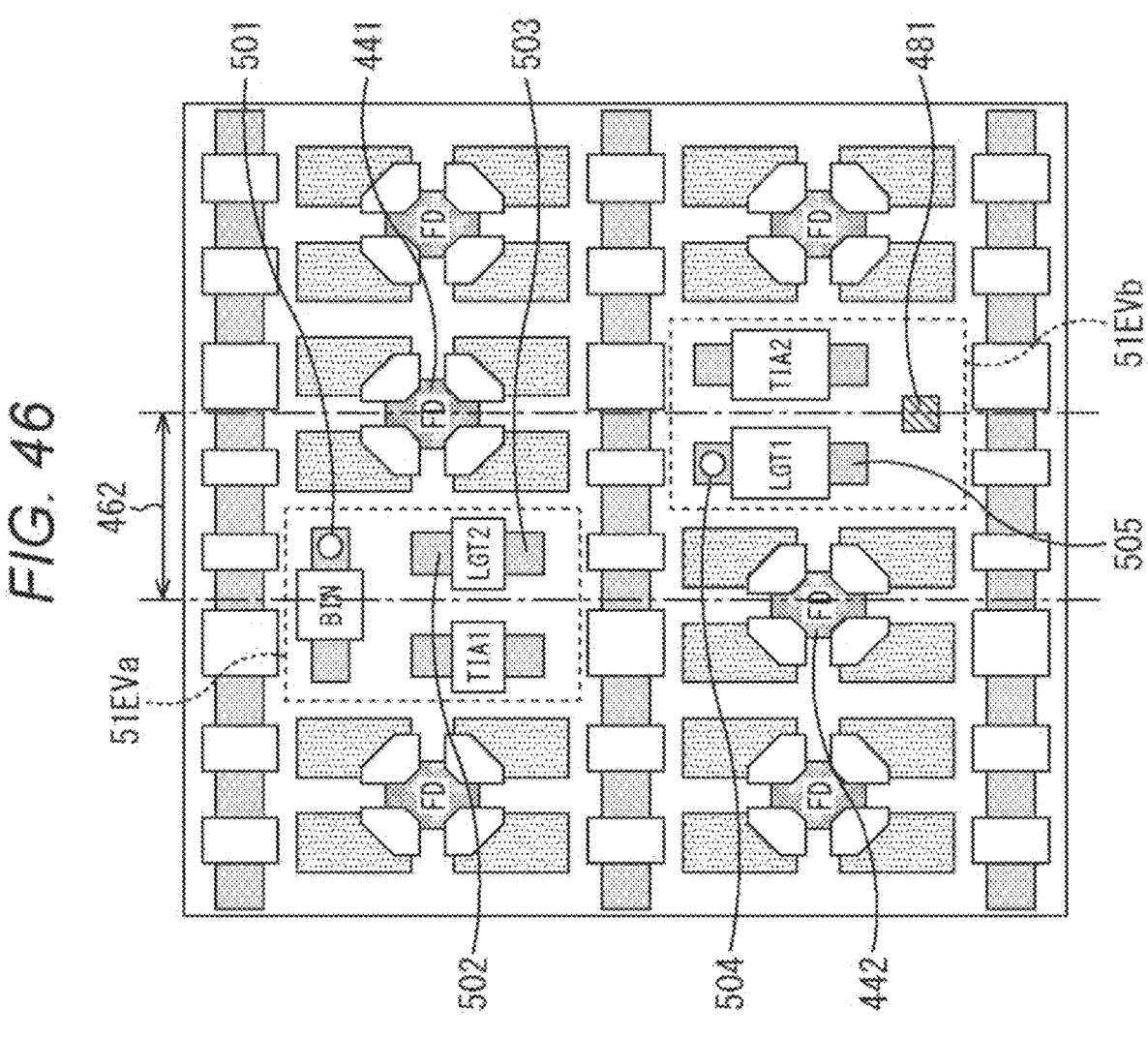
FIG. 46 is a plan view illustrating a fifth transistor arrangement example of the second rule.

FIG. 46 is a plan view illustrating a fifth transistor arrangement example according to the second rule.

In the fifth transistor arrangement example illustrated in FIG. 46, the addition transistor BIN is disposed in the horizontal direction in the upper left event pixel 51EVa, and the first amplification transistor TIA1 and the second logarithmic transistor LGT2 are disposed in the vertical direction perpendicular to the addition transistor BIN. In the event pixel 51EVb at the lower right, a first logarithmic transistor LGT1 and a second amplification transistor TIA2 are disposed in a direction parallel to the first amplification transistor TIA1 and the second logarithmic transistor LGT2.

Among the five diffusion layers 501 to 505 located in the region 462 sandwiched in the left-right direction by the two floating diffusion regions FD, that is the upper left floating diffusion region (FD) 441 and the lower right floating diffusion region (FD) 442, the diffusion layer 501 is the source of the addition transistor BIN, and the diffusion layer 504 is the source of the first logarithmic transistor LGT1.

<Third Rule>

Figure 47:
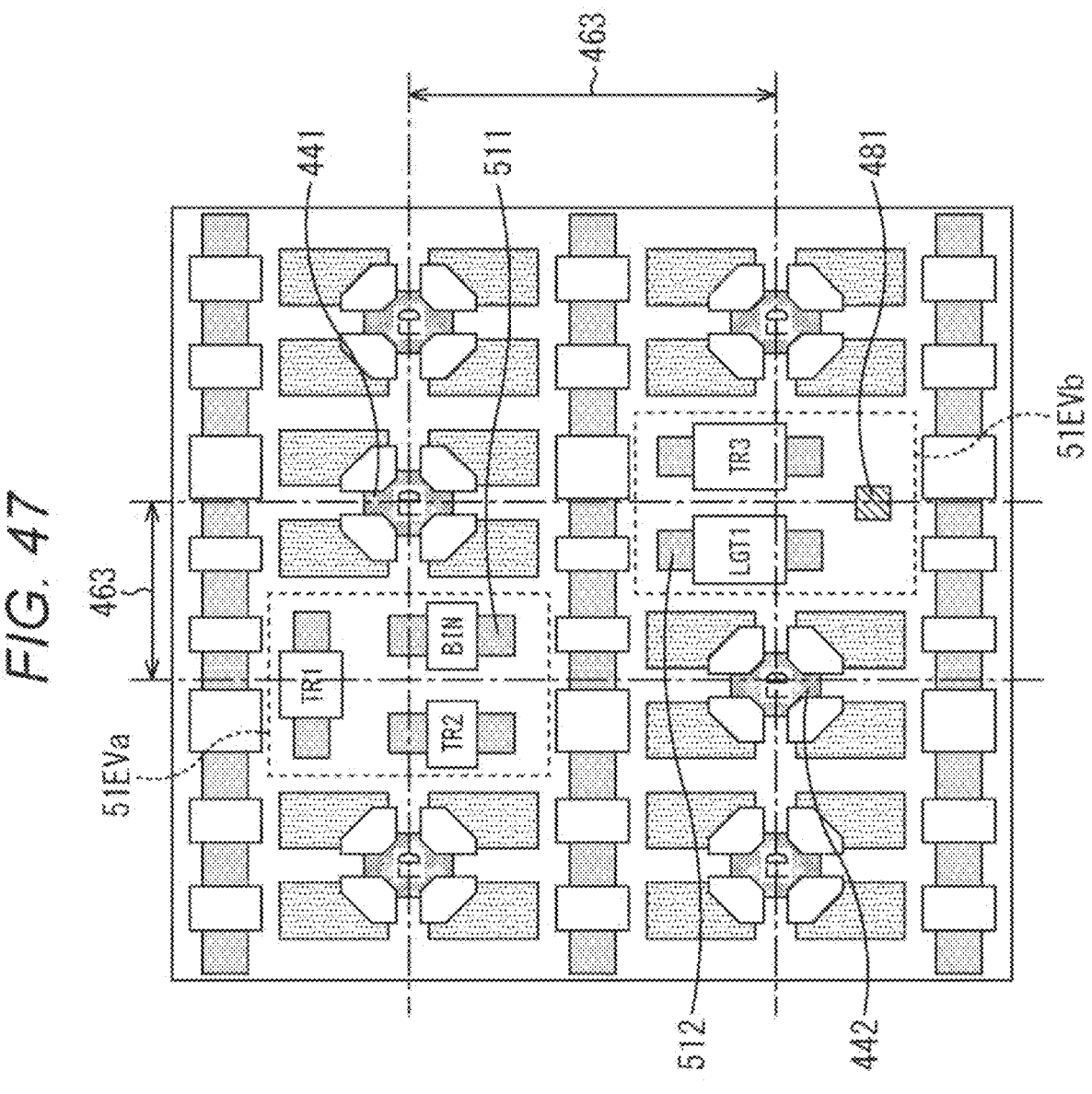
FIG. 47 is a plan view for explaining a third rule of transistor arrangement for reducing the capacitance of the gate wiring of the first amplification transistor.

FIG. 47 is a plan view for explaining a third rule of transistor arrangement for reducing the wiring capacitance Cpd1 of the connection wiring 412.

The third rule of the transistor arrangement is a rule of arranging two diffusion layers of the source of the addition transistor BIN connected to the gate of the first amplification transistor TIA1 and the source of the first logarithmic transistor LGT1 in the two diffusion layers 511 and 512 located in the region 463 sandwiched in the vertical and left-right directions by the two floating diffusion regions FD, that is the floating diffusion region (FD) 441 of the gradation pixel 51G adjacent to the right of the upper left event pixel 51EVa and the floating diffusion region (FD) 442 of the gradation pixel 51G adjacent to the left of the lower right event pixel 51EVb. By disposing the two diffusion layers of the source of the addition transistor BIN and the source of the first logarithmic transistor LGT1 in the region 463 that is located in the vicinity of the event pixel 51EVa and the event pixel 51EVb in the diagonal direction, the wiring capacitance Cpd1 of the connection wiring 412 can be reduced, and noise of the first amplification transistor TIA1 can be reduced. Specifically, as illustrated in FIG. 47, the transistor including the diffusion layer 511 and the transistor including the diffusion layer 512 are either the addition transistor BIN or the first logarithmic transistor LGT1. FIG. 47 illustrates an example in which the transistor including the diffusion layer 511 is the addition transistor BIN and the transistor including the diffusion layer 512 is the first logarithmic transistor LGT1. The other two transistors TR1 and TR2 disposed in the upper left event pixel 51EVa and the other transistor TR3 disposed in the lower right event pixel 51EVb are any of the first amplification transistor TIA1, the second amplification transistor TIA2, and the second logarithmic transistor LGT2. The arrangement direction of the first logarithmic transistors LGT1 and TR3 disposed in the event pixel 51EVb at the lower right is not limited.

(Rule 3: First Transistor Arrangement Example)

Figure 48:
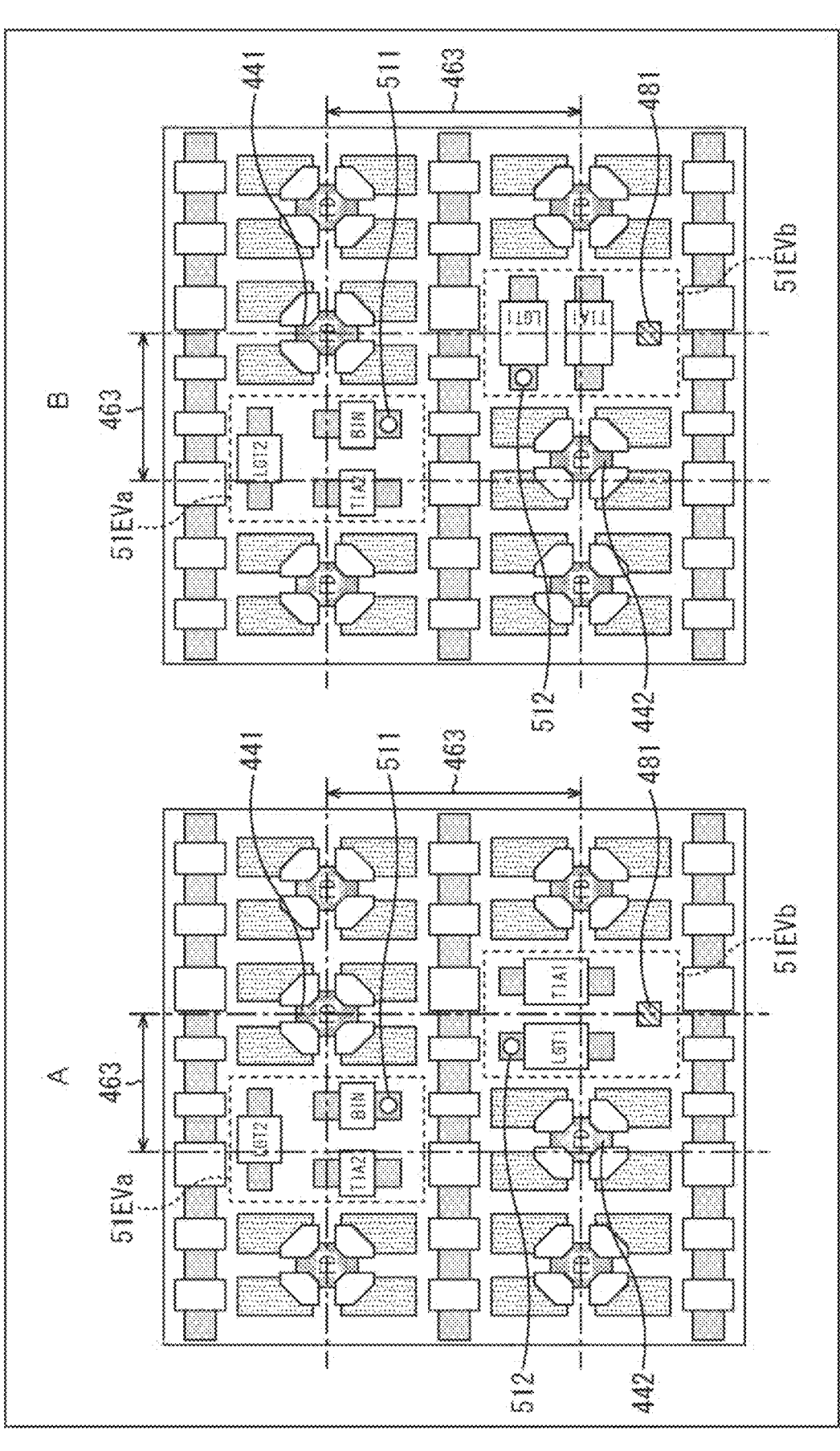
FIG. 48 is a plan view illustrating first and second transistor arrangement examples of a third rule.

A of FIG. 48 is a plan view illustrating a first transistor arrangement example according to the third rule.

In the first transistor arrangement example illustrated in A of FIG. 48, the second logarithmic transistor LGT2 is disposed in the horizontal direction in the upper left event pixel 51EVa, and the second amplification transistor TIA2 and the addition transistor BIN are disposed in the vertical direction perpendicular to the second logarithmic transistor LGT2. In the event pixel 51EVb at the lower right, a first logarithmic transistor LGT1 and a first amplification transistor TIA1 are disposed in a direction parallel to the second amplification transistor TIA2 and the addition transistor BIN.

Among the two diffusion layers 511 and 512 located in the region 463 sandwiched in the vertical and left-right directions by the two floating diffusion regions FD, that is the upper left floating diffusion region (FD) 441 and the lower right floating diffusion region (FD) 442, the diffusion layer 511 is the source of the addition transistor BIN, and the diffusion layer 512 is the source of the first logarithmic transistor LGT1.

(Rule 3: Second Transistor Arrangement Example)

B of FIG. 48 is a plan view illustrating a second transistor arrangement example according to the third rule.

In the second transistor arrangement example illustrated in B of FIG. 48, the second logarithmic transistor LGT2 is disposed in the horizontal direction in the upper left event pixel 51EVa, and the second amplification transistor TIA2 and the addition transistor BIN are disposed in the vertical direction perpendicular to the second logarithmic transistor LGT2. In the event pixel 51EVb at the lower right, the first amplification transistor TIA1 and the first logarithmic transistor LGT1 are disposed in a direction perpendicular to the second amplification transistor TIA2 and the addition transistor BIN.

Among the two diffusion layers 511 and 512 located in the region 463 sandwiched in the vertical and left-right directions by the two floating diffusion regions FD, that is the upper left floating diffusion region (FD) 441 and the lower right floating diffusion region (FD) 442, the diffusion layer 511 is the source of the addition transistor BIN, and the diffusion layer 512 is the source of the first logarithmic transistor LGT1.

<18. Arrangement Rule of First Amplification Transistor for Wiring Capacitance Reduction>

Figure 49:
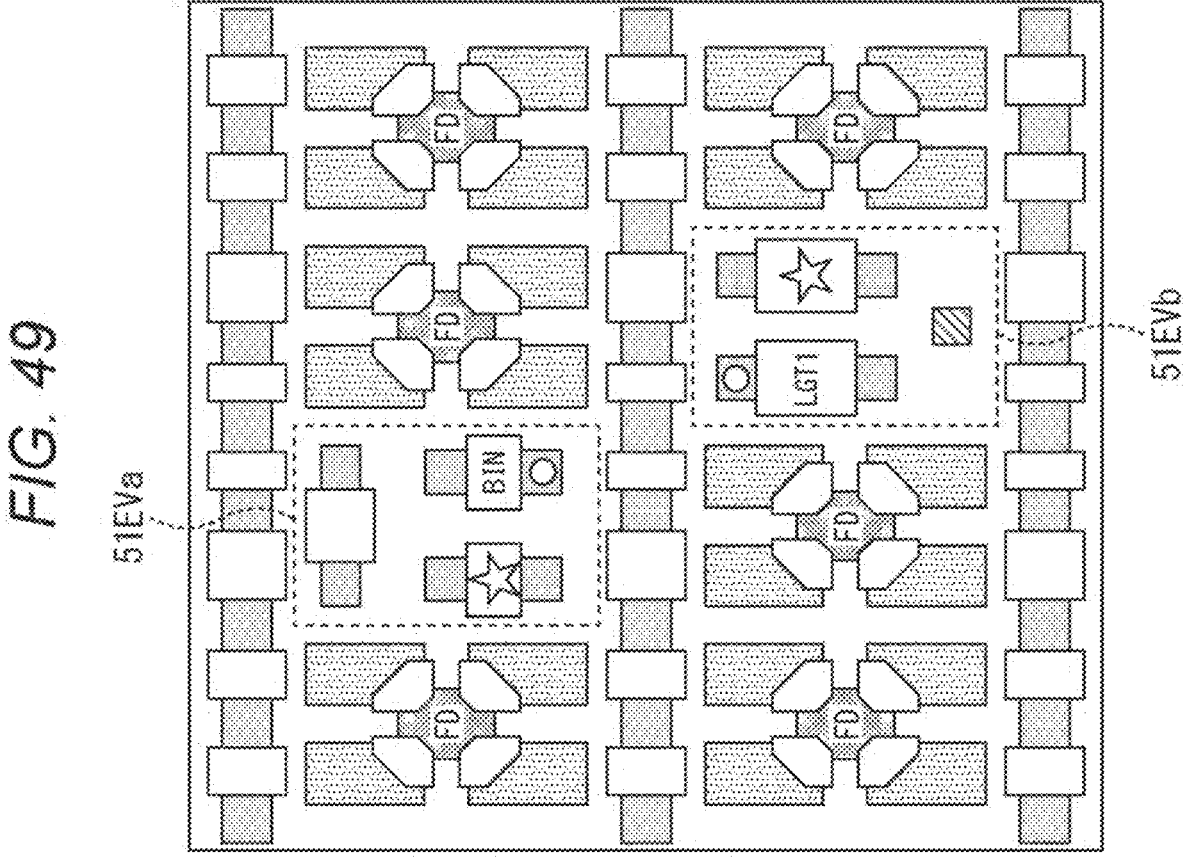
FIG. 49 is a plan view for explaining an arrangement rule of first amplification transistors.

FIG. 49 is a plan view for explaining an arrangement rule of the first amplification transistor TIA1 for reducing the wiring capacitance Cpd1 of the connection wiring 412.

As a rule different from that the two diffusion layers of the source of the addition transistor BIN and the source of the first logarithmic transistor LGT1 are disposed according to the first rule to the third rule described above, an arrangement rule of the first amplification transistor TIA1 will be described.

The first amplification transistor TIA1 is disposed at a position closest to either one of the two diffusion layers of the source of the addition transistor BIN and the source of the first logarithmic transistor LGT1.

In FIG. 49, the position of the transistor with the star-shaped figure is the candidate position where the first amplification transistor TIA1 is disposed. The transistor to which the star-shaped figure is attached in the upper left event pixel 51EVa corresponds to the transistor at the position closest to the source of the addition transistor BIN, and the transistor to which the star-shaped figure is attached in the lower right event pixel 51EVb corresponds to the transistor at the position closest to the source of the first logarithmic transistor LGT1. A white circle is attached to the source of the addition transistor BIN and the source of the first logarithmic transistor LGT1.

(Arrangement Example of First Amplification Transistor)

Figure 50:
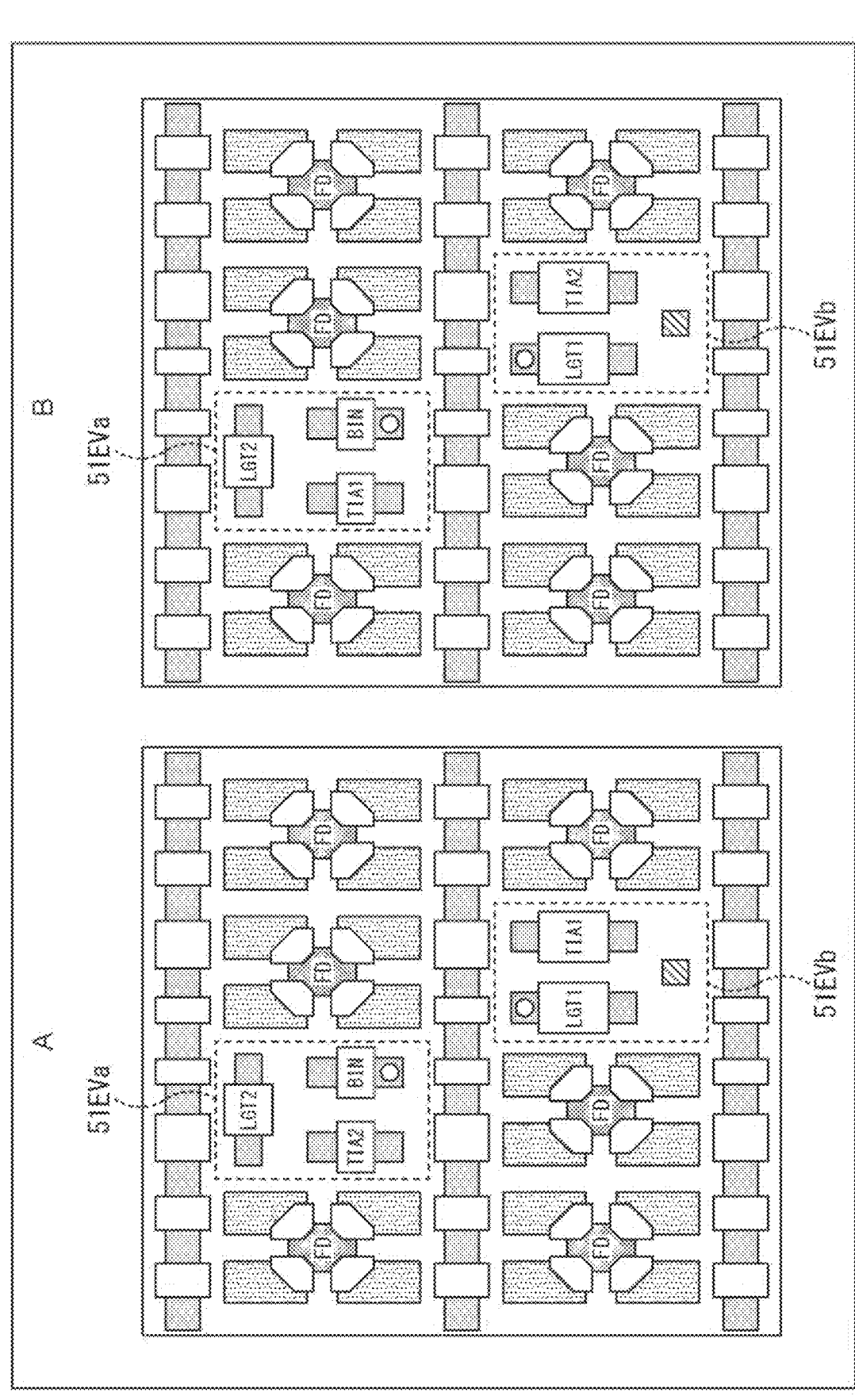
FIG. 50 is a plan view illustrating first and second arrangement examples of the arrangement rule of the first amplification transistor.

A of FIG. 50 is a plan view illustrating a first arrangement example according to the arrangement rule of the first amplification transistor TIA1.

In A of FIG. 50, the second logarithmic transistor LGT2, the second amplification transistor TIA2, and the addition transistor BIN are disposed in the upper left event pixel 51EVa, and the first logarithmic transistor LGT1 and the first amplification transistor TIA1 are disposed in the lower right event pixel 51EVb. The first amplification transistor TIA1 is disposed at a position closest to the source of the first logarithmic transistor LGT1 in the event pixel 51EVb at the lower right.

B of FIG. 50 is a plan view illustrating a second arrangement example according to the arrangement rule of the first amplification transistor TIA1.

In B of FIG. 50, the second logarithmic transistor LGT2, the first amplification transistor TIA1, and the addition transistor BIN are disposed in the upper left event pixel 51EVa, and the first logarithmic transistor LGT1 and the second amplification transistor TIA2 are disposed in the lower right event pixel 51EVb. The first amplification transistor TIA1 is disposed at a position closest to the source of the addition transistor BIN in the upper left event pixel 51EVa.

Figure 51:
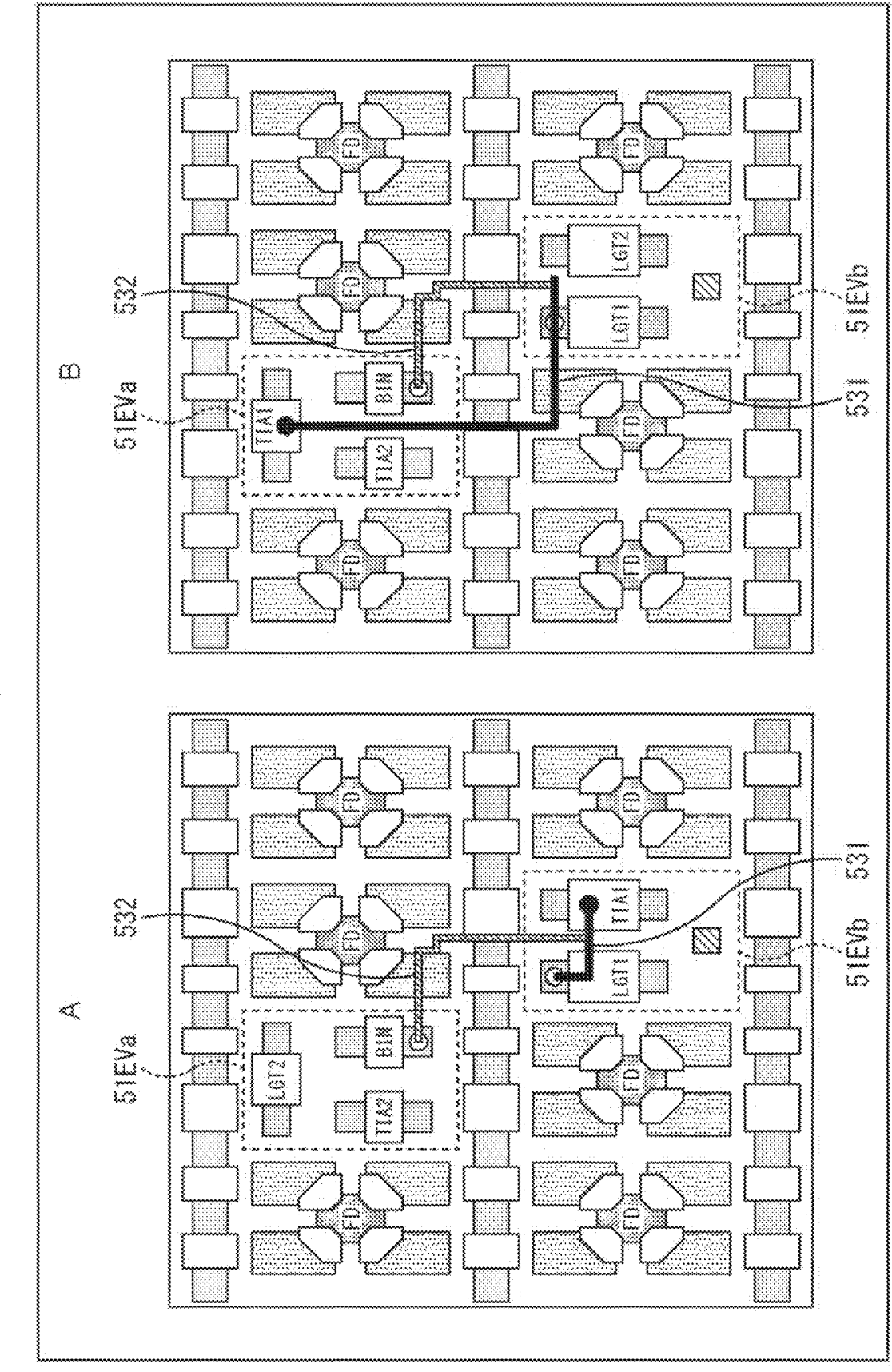
FIG. 51 is a plan view illustrating a wiring example according to the presence or absence of the arrangement rule of the first amplification transistor.

FIG. 51 is a plan view illustrating a wiring example depending on the presence or absence of the arrangement rule of the first amplification transistor TIA1.

A of FIG. 51 is a plan view illustrating a wiring example similar to the transistor arrangement illustrated in A of FIG. 50 and in a case of following both the third rule of transistor arrangement and the arrangement rule of the first amplification transistor TIA1.

In the transistor arrangement example illustrated in A of FIG. 51, the second logarithmic transistor LGT2 is disposed in the horizontal direction in the upper left event pixel 51EVa, and the second amplification transistor TIA2 and the addition transistor BIN are disposed in the vertical direction perpendicular to the second logarithmic transistor LGT2. In the event pixel 51EVb at the lower right, a first logarithmic transistor LGT1 and a first amplification transistor TIA1 are disposed in a direction parallel to the second amplification transistor TIA2 and the addition transistor BIN.

B of FIG. 51 is a plan view illustrating a wiring example in a case where the arrangement rule of the first amplification transistor TIA1 is not followed.

In the transistor arrangement example illustrated in B of FIG. 51, the first amplification transistor TIA1 is disposed in the horizontal direction in the upper left event pixel 51EVa, and the second amplification transistor TIA2 and the addition transistor BIN are disposed in the vertical direction perpendicular to the first amplification transistor TIA1. In the event pixel 51EVb at the lower right, a first logarithmic transistor LGT1 and a second logarithmic transistor LGT2 are disposed in a direction parallel to the second amplification transistor TIA2 and the addition transistor BIN.

In the transistor arrangement of A and B of FIG. 51, the connection wiring 412 that connects the photodiodes 61A and 61B and is connected to the gate of the first amplification transistor TIA1 is configured by the wiring 531 and the wiring 532. The wiring 531 is a wiring that connects the source of the first logarithmic transistor LGT1 and the gate of the first amplification transistor TIA1, and the wiring 532 is a wiring that connects the source of the addition transistor BIN and the wiring 531. The wiring 531 and the wiring 532 are formed in different layers and are electrically connected via vias.

Comparing the wiring lengths of the wiring 531 and the wiring 532 in A and B of FIG. 51, the wiring length of the wiring 531 is longer in the case of not following the arrangement rule of the first amplification transistor TIA1 illustrated in B of FIG. 51 than in the case of following the arrangement rule of the first amplification transistor TIA1 illustrated in A of FIG. 51. As described above, by arranging the first amplification transistor TIA1 at the position closest to either one of the two diffusion layers, the source of the addition transistor BIN and the source of the first logarithmic transistor LGT1, the wiring length of the connection wiring 412 as a whole can be shortened, and the wiring capacitance Cpd1 of the connection wiring 412 can be reduced.

<19. Transistor Wiring Example of Event Pixel>

Next, an example of another transistor wiring of the 4Tr-type event pixel 51EV will be described with reference to FIGS. 52 to 56.

Figure 54:
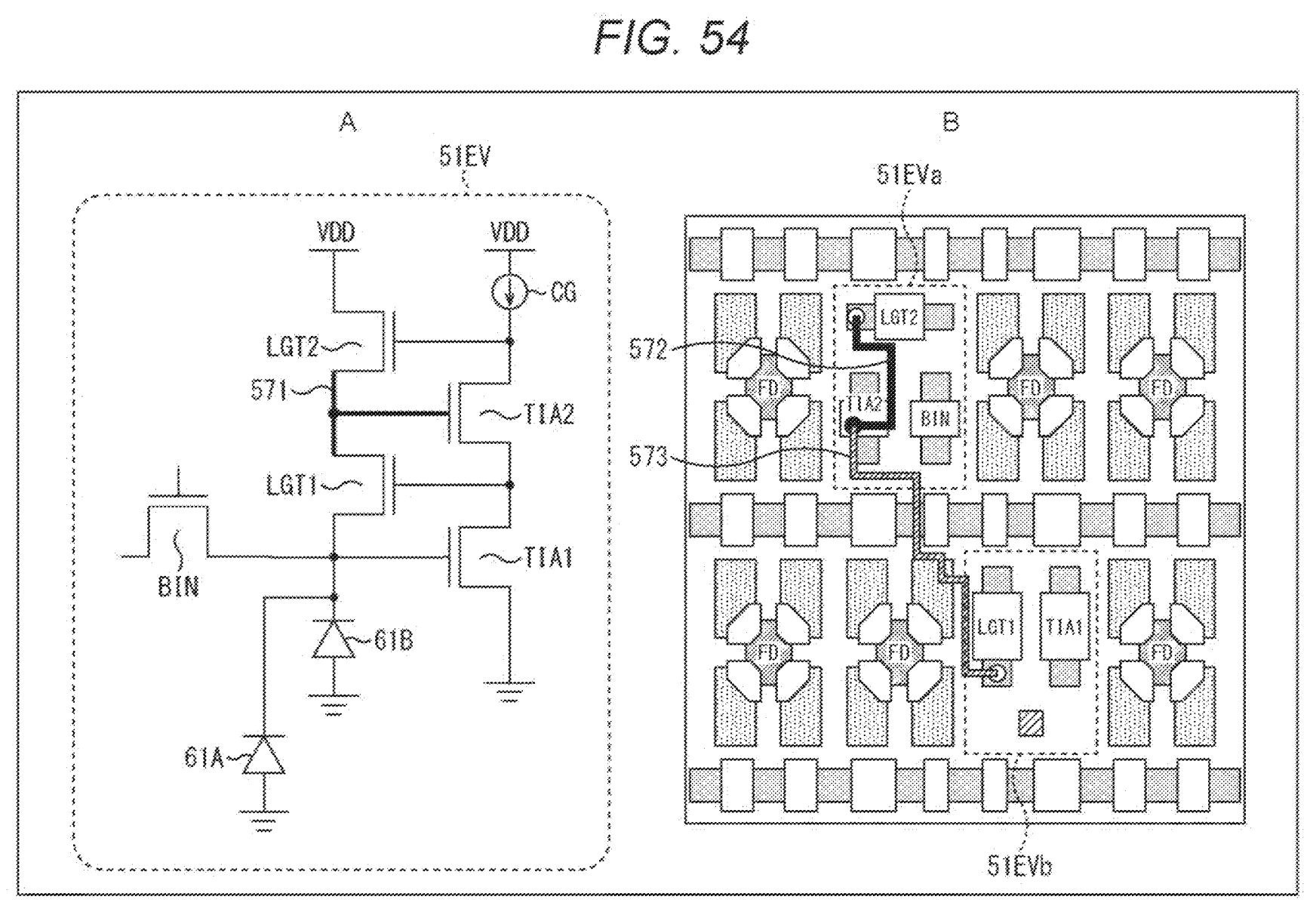
Figure 55:
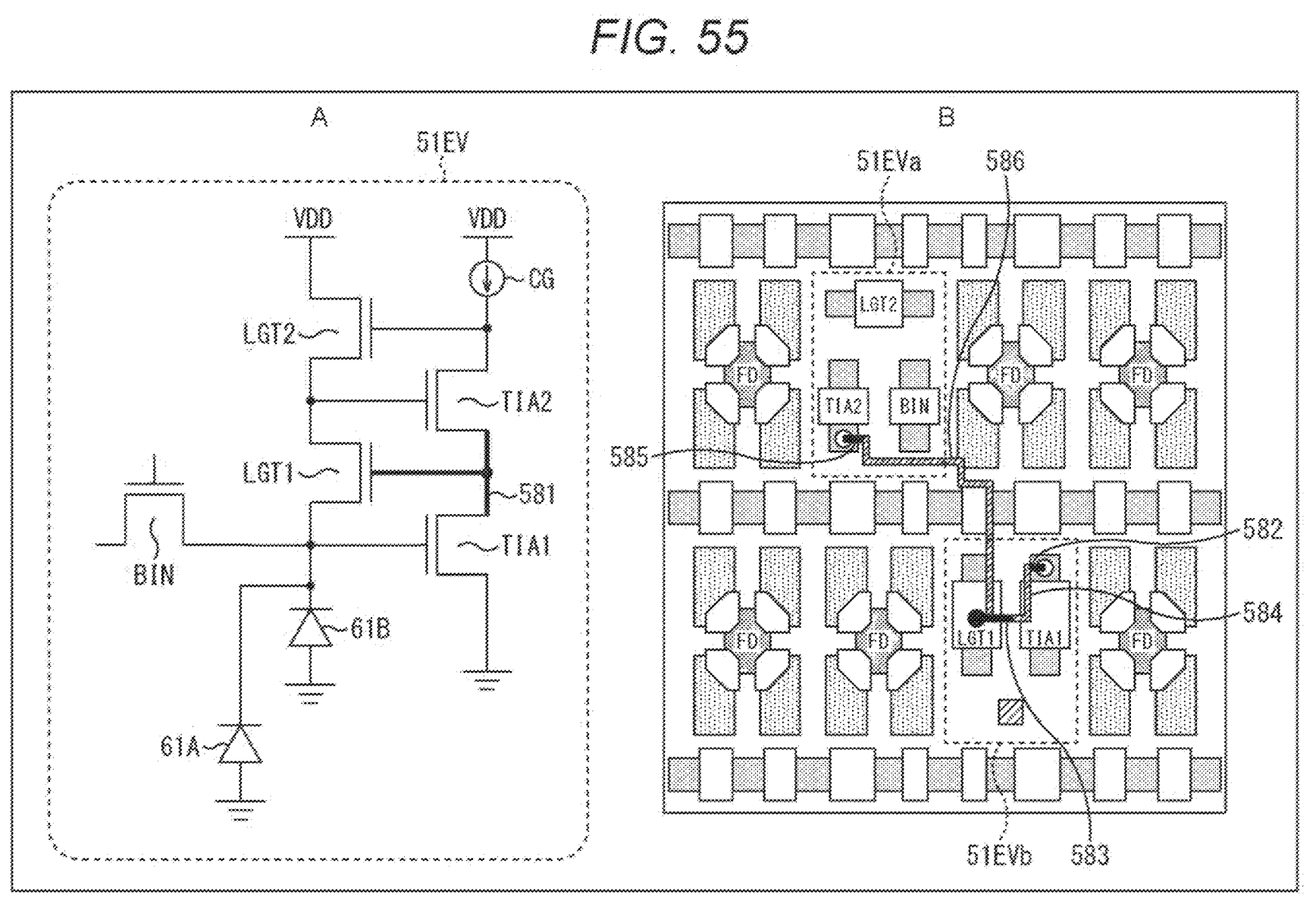
Figure 56:
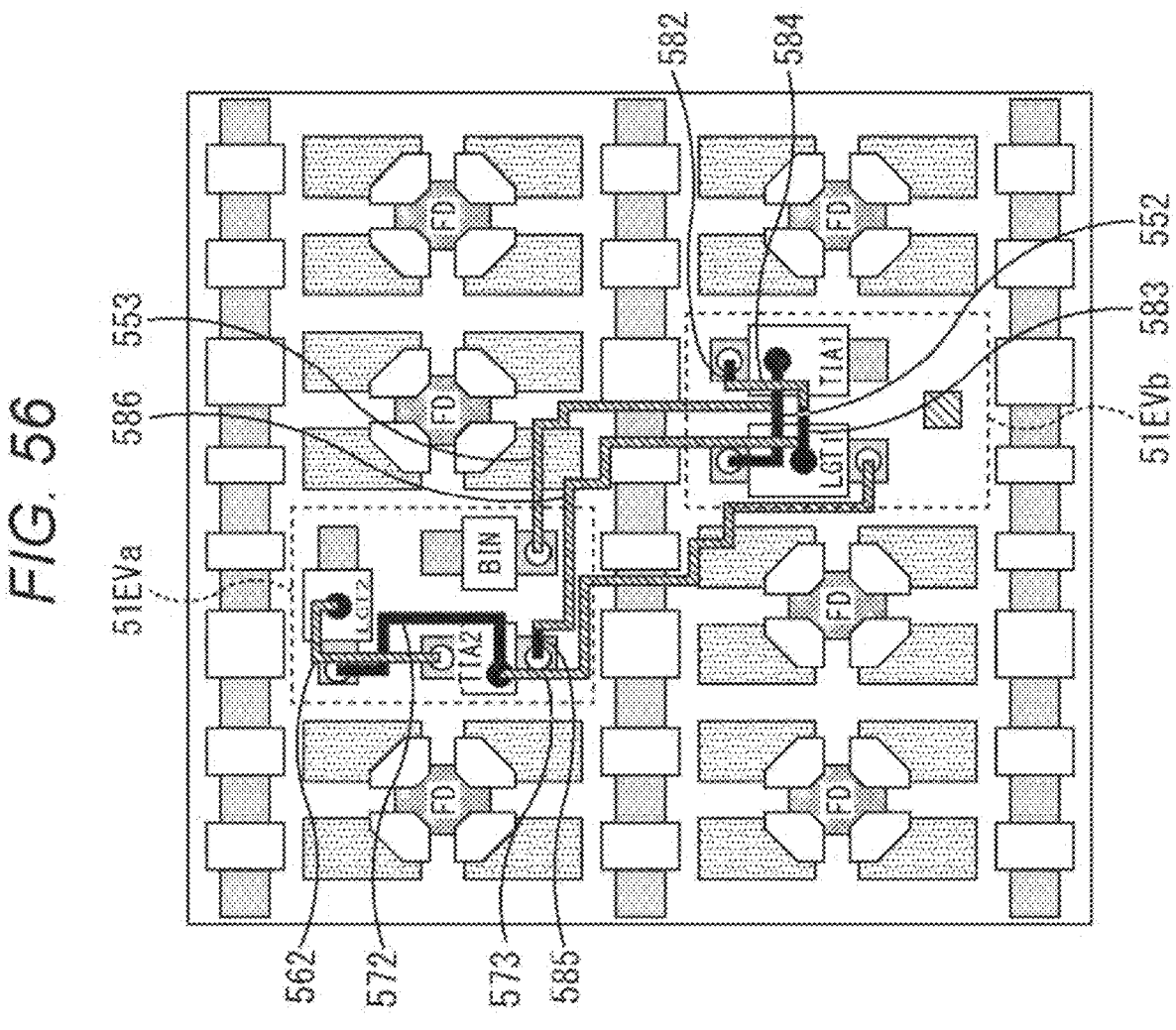
FIG. 56 is a diagram illustrating an example of transistor wiring of a 4Tr-type event pixel.

In order to make the wiring easily viewable, the wiring of the 4Tr-type current-voltage conversion circuit 121 will be separately described in FIGS. 52 to 55, and all the wirings are illustrated in an overlapping manner in the plan view of FIG. 56. Note that the constant current source CG is formed on another semiconductor substrate laminated with the semiconductor substrate 201 on which the photodiodes 61A and 61B and the transistors such as the first logarithmic transistor LGT1 and the first amplification transistor TIA1 are formed.

Figure 52:
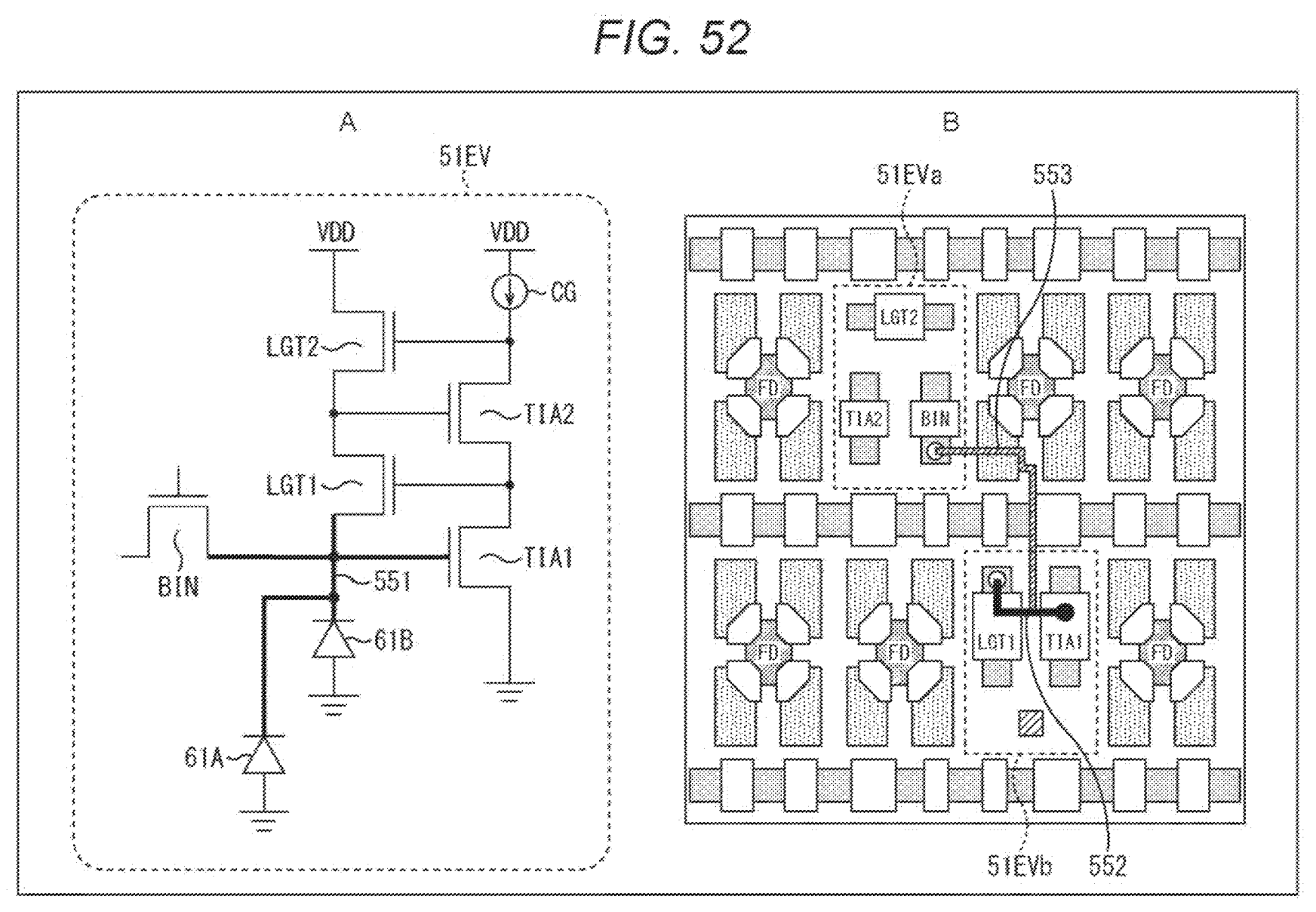

FIG. 52 illustrates a specific wiring example of the wiring 551 indicated by a thick line in A of FIG. 52 in the circuit of the event pixel 51EV.

The wiring 551 is a wiring that connects (the cathode terminals of) the photodiodes 61A and 61B provided corresponding to the two unit regions, the source of the first logarithmic transistor LGT1, and the source of the addition transistor BIN, and is connected to the gate of the first amplification transistor TIA1.

For example, as illustrated in B of FIG. 52, the wiring 551 can be realized by a wiring 552 connecting the source of the first logarithmic transistor LGT1 and the gate of the first amplification transistor TIA1, and a wiring 553 connecting the source of the addition transistor BIN and the wiring 552. The wiring 552 and the wiring 553 are wired similarly to the wiring 531 and the wiring 532 illustrated in A of FIG. 51, and are wiring examples in accordance with both the third rule of transistor arrangement and the arrangement rule of the first amplification transistor TIA1.

Figure 53:
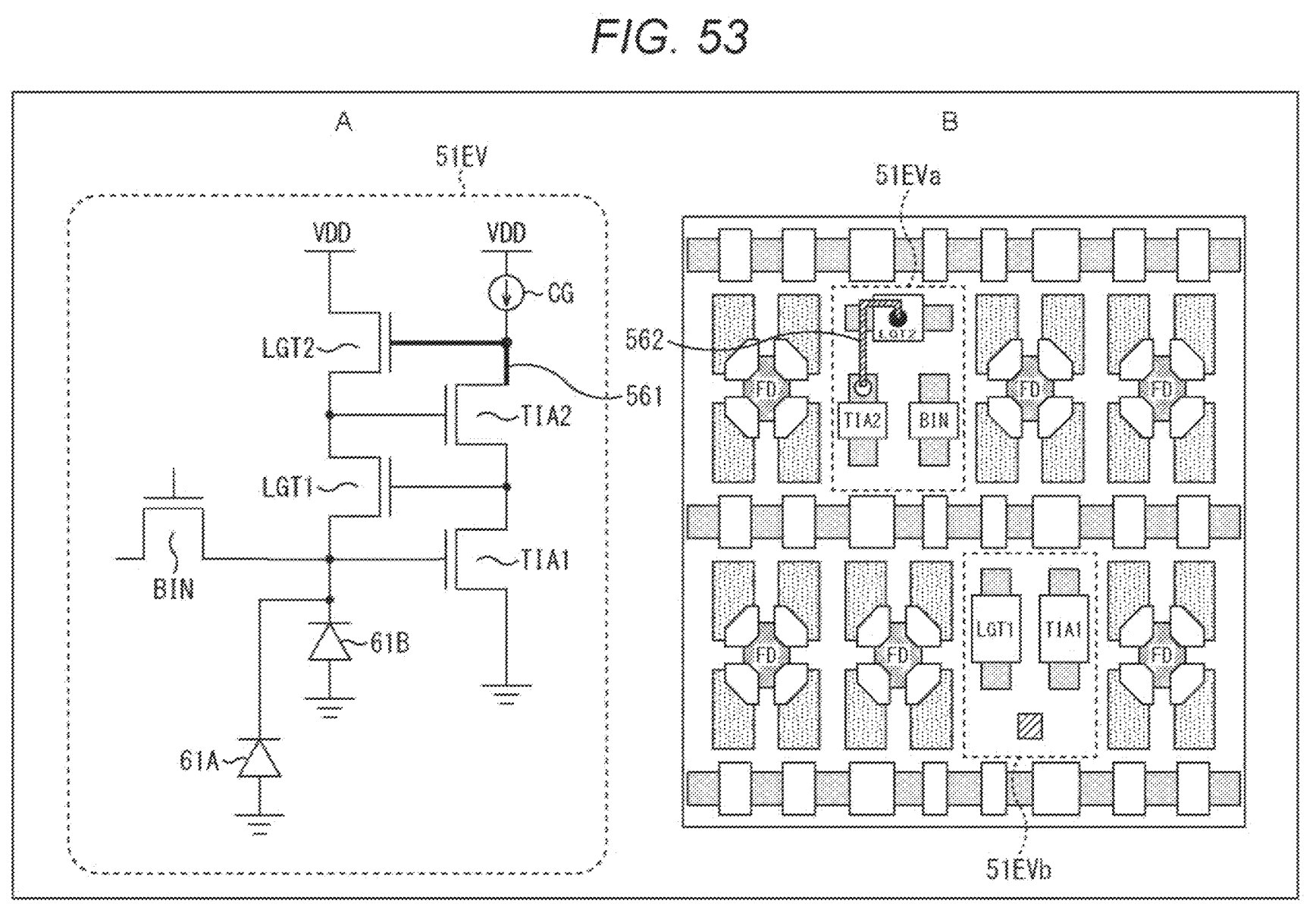

FIG. 53 illustrates a specific wiring example of the wiring 561 indicated by a thick line in A of FIG. 53 in the circuit of the event pixel 51EV.

The wiring 561 is a wiring that connects the gate of the second logarithmic transistor LGT2 and the drain of the second amplification transistor TIA2.

For example, as illustrated in B of FIG. 53, the wiring 561 can be realized by a wiring 562 that connects the gate of the second logarithmic transistor LGT2 and the drain of the second amplification transistor TIA2.

FIG. 54 illustrates a specific wiring example of the wiring 571 indicated by a thick line in A of FIG. 54 in the circuit of the event pixel 51EV.

The wiring 571 is a wiring that connects the drain of the first logarithmic transistor LGT1, the source of the second logarithmic transistor LGT2, and the gate of the second amplification transistor TIA2.

For example, as illustrated in B of FIG. 54, the wiring 571 can be realized by a wiring 572 connecting the source of the second logarithmic transistor LGT2 and the gate of the second amplification transistor TIA2, and a wiring 573 connecting the gate of the second amplification transistor TIA2 and the drain of the first logarithmic transistor LGT1.

FIG. 55 illustrates a specific wiring example of a wiring 581 indicated by a thick line in A of FIG. 55 in the circuit of the event pixel 51EV.

The wiring 581 is a wiring that connects the gate of the first logarithmic transistor LGT1, the drain of the first amplification transistor TIA1, and the source of the second amplification transistor TIA2.

For example, as illustrated in B of FIG. 55, the wiring 581 can be realized by a wiring 582 connected to the drain of the first amplification transistor TIA1, a wiring 583 connected to the gate of the first logarithmic transistor LGT1, a wiring 584 connecting the wiring 582 and the wiring 583, a wiring 585 connected to the source of the second amplification transistor TIA2, and a wiring 586 connecting the wiring 585 and the wiring 583.

The wirings 552 and 553 in B of FIG. 52, the wiring 562 in B of FIG. 53, the wirings 572 and 573 in B of FIG. 54, and the wirings 582 to 586 in B of FIG. 55 are illustrated in an overlapping manner as illustrated in FIG. 56.

<20. Problem of Wiring Capacitance Connected to Gate of Second Amplification Transistor>

In the above-described example, the transistor arrangement for reducing the wiring capacitance Cpd1 of the connection wiring 412 connected to the gate of the first amplification transistor TIA1 has been described.

Figure 57:
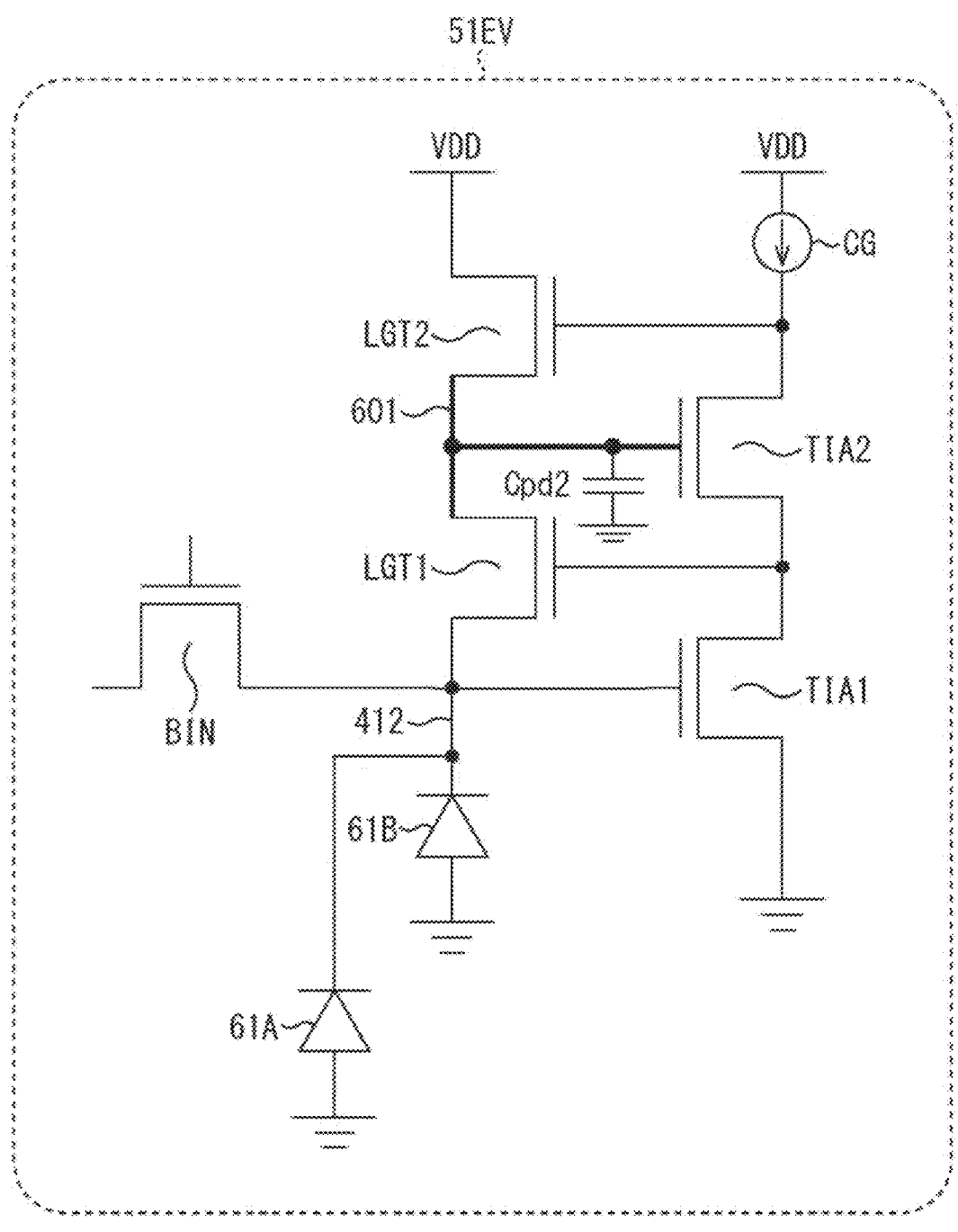
FIG. 57 is a diagram illustrating a problem of a wiring capacitance connected to a second amplification transistor gate.

In the 4Tr-type current-voltage conversion circuit 121 provided with the two-stage loop circuit, as illustrated in FIG. 57, there is also a connection wiring 601 connected to the gate of the second amplification transistor TIA2. The connection wiring 601 is connected to the gate of the second amplification transistor TIA2, the drain of the first logarithmic transistor LGT1, and the source of the second logarithmic transistor LGT2. As for the connection wiring 601, similarly to the connection wiring 412 connected to the gate of the first amplification transistor TIA1, there is a concern that the wiring capacitance Cpd2 increases due to an increase in the wiring length depending on the transistor arrangement.

Hereinafter, a transistor arrangement for reducing the wiring capacitance Cpd2 of the connection wiring 601 connected to the gate of the second amplification transistor TIA2 will be described.

<21. Transistor Arrangement for Reducing Capacitance of Gate Wiring of Second Amplification Transistor>

<First Rule>

Figure 58:
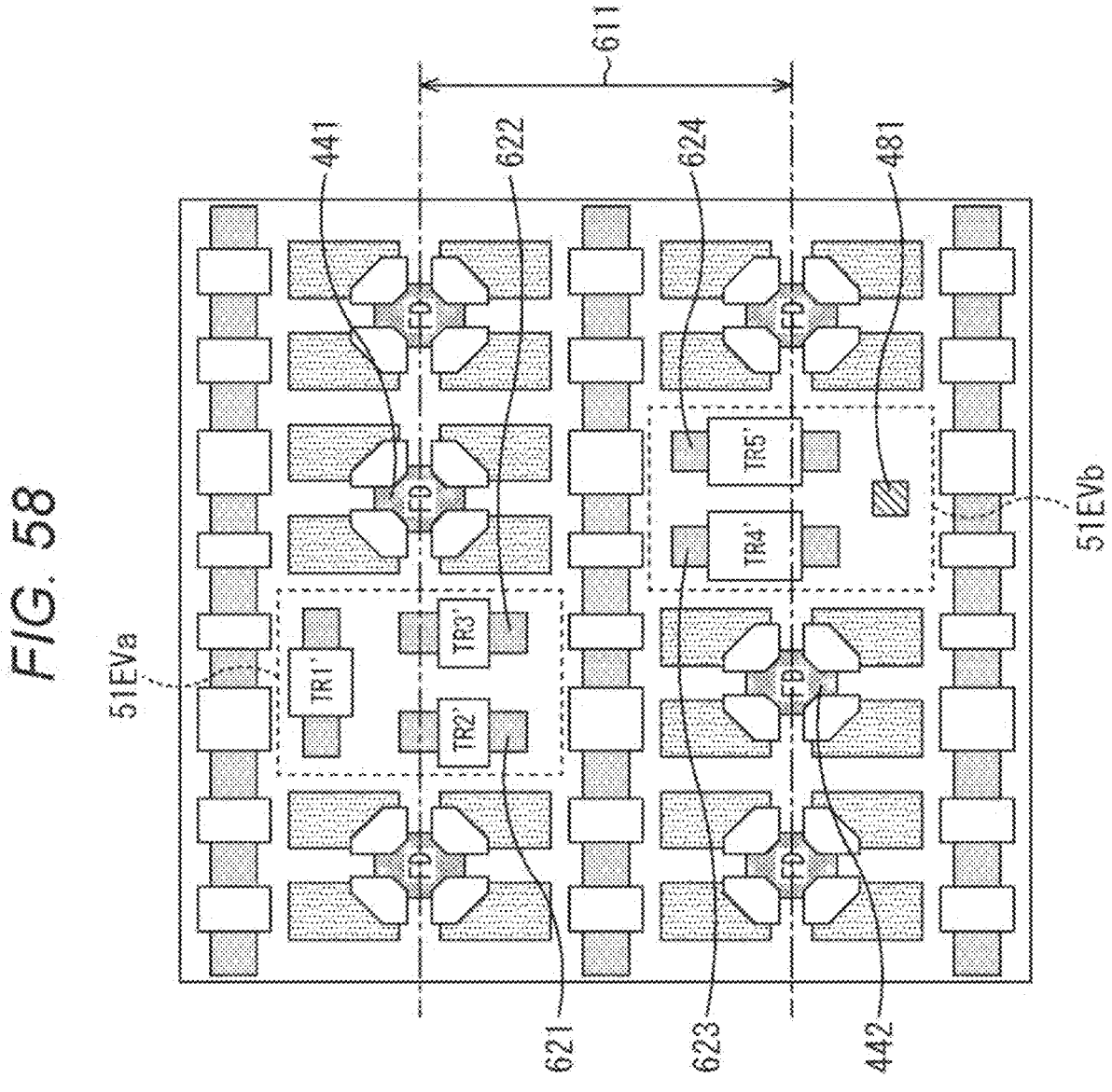
FIG. 58 is a plan view for explaining a first rule of transistor arrangement for reducing the capacitance of the gate wiring of the second amplification transistor.

FIG. 58 is a plan view for explaining a first rule of transistor arrangement for reducing the wiring capacitance Cpd2 of the connection wiring 601.

The first rule of transistor arrangement is a rule of arranging, in any one of the four diffusion layers 621 to 624 located in the region 611 vertically sandwiched by the two floating diffusion regions FD, that is the floating diffusion region (FD) 441 of the gradation pixel 51G adjacent to the right of the upper left event pixel 51EVa and the floating diffusion region (FD) 442 of the gradation pixel 51G adjacent to the left of the lower right event pixel 51EVb, the two diffusion layers of the drain of the first logarithmic transistor LGT1 and the source of the second logarithmic transistor LGT2 connected to the gate of the second amplification transistor TIA2, and the gate of the second amplification transistor TIA2. Of the transistors TR1', TR2', and TR3' disposed in the upper left event pixel 51EVa and the transistors TR4' and TR5' disposed in the lower right event pixel 51EVb, any of the transistors TR2' to TR5' including any of the four diffusion layers 621 to 624 is the second amplification transistor TIA2. The arrangement direction of the transistors TR4' and TR5' disposed in the event pixel 51EVb at the lower right is not limited. By disposing the two diffusion layers of the drain of the first logarithmic transistor LGT1 and the source of the second logarithmic transistor LGT2 and the gate of the second amplification transistor TIA2 in the region 611 that is located in the vicinity of the event pixel 51EVa and the event pixel 51EVb in the diagonal direction, it is possible to reduce the wiring capacitance Cpd2 of the connection wiring 601 and to reduce noise of the second amplification transistor TIA2.

(First Rule: First Transistor Arrangement Example)

Figure 59:
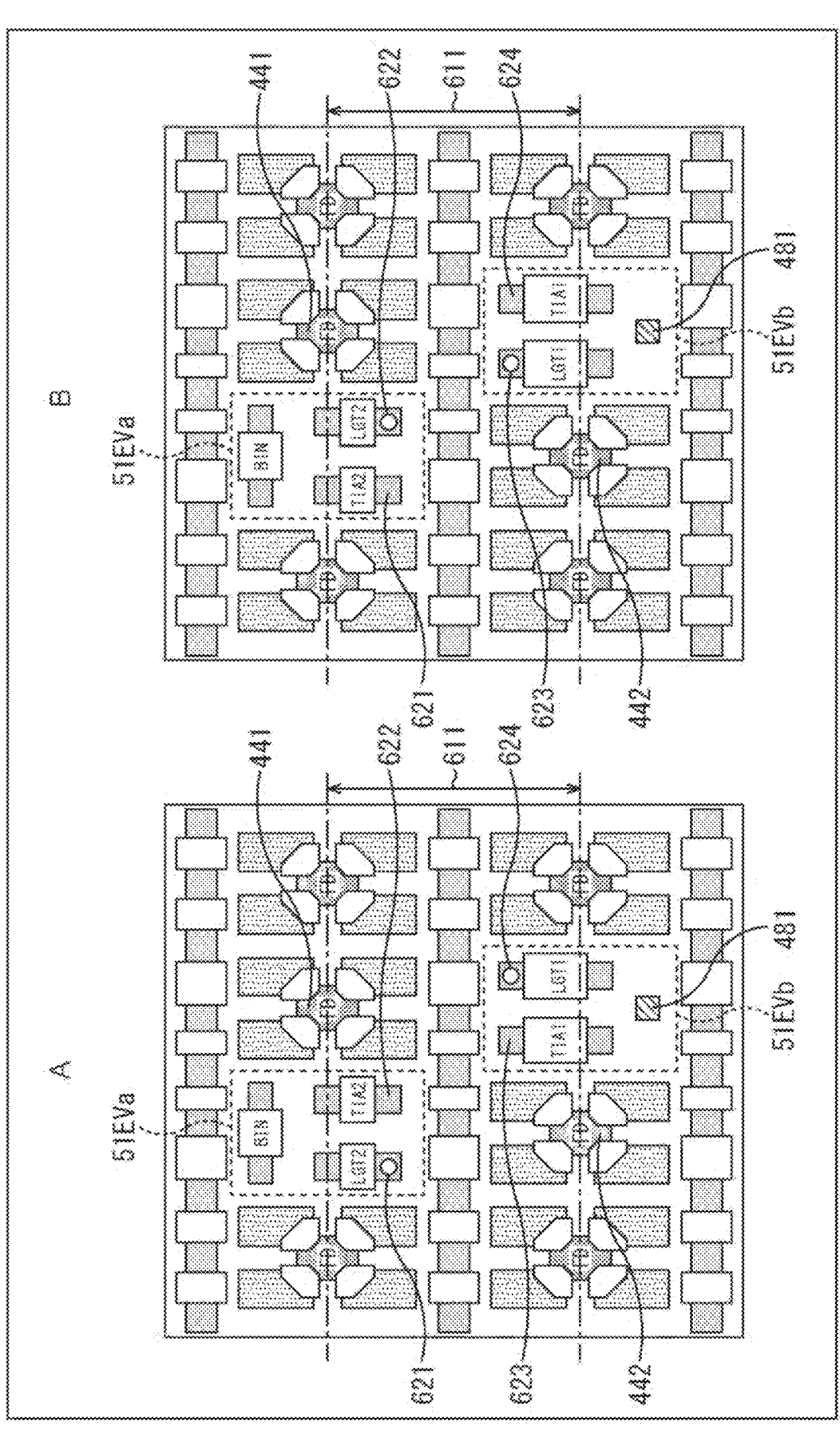
FIG. 59 is a plan view illustrating first and second transistor arrangement examples of the first rule.

A of FIG. 59 is a plan view illustrating a first transistor arrangement example according to the first rule.

In the first transistor arrangement example illustrated in A of FIG. 59, the addition transistor BIN is disposed in the horizontal direction in the upper left event pixel 51EVa, and the second logarithmic transistor LGT2 and the second amplification transistor TIA2 are disposed in the vertical direction perpendicular to the addition transistor BIN. In the event pixel 51EVb at the lower right, the first amplification transistor TIA1 and the first logarithmic transistor LGT1 are disposed in a direction parallel to the second logarithmic transistor LGT2 and the second amplification transistor TIA2.

Among the four diffusion layers 621 to 624 located in the region 611 vertically sandwiched by the two floating diffusion regions FD, that is the upper left floating diffusion region (FD) 441 and the lower right floating diffusion region (FD) 442, the diffusion layer 621 is the source of the second logarithmic transistor LGT2, and the diffusion layer 624 is the drain of the first logarithmic transistor LGT1. White circles are attached to the source of the second logarithmic transistor LGT2 and the drain of the first logarithmic transistor LGT1.

(First Rule: Second Transistor Arrangement Example)

B of FIG. 59 is a plan view illustrating a second transistor arrangement example according to the first rule.

In the second transistor arrangement example illustrated in B of FIG. 59, the addition transistor BIN is disposed in the horizontal direction in the upper left event pixel 51EVa, and the second amplification transistor TIA2 and the second logarithmic transistor LGT2 are disposed in the vertical direction perpendicular to the addition transistor BIN. The arrangement of the second amplification transistor TIA2 and the second logarithmic transistor LGT2 is opposite to that of the first transistor arrangement example illustrated in A of FIG. 59. In the event pixel 51EVb at the lower right, the first logarithmic transistor LGT1 and the first amplification transistor TIA1 are disposed in a direction parallel to the second amplification transistor TIA2 and the second logarithmic transistor LGT2. The arrangement of the first logarithmic transistor LGT1 and the first amplification transistor TIA1 is opposite to that of the first transistor arrangement example illustrated in A of FIG. 59.

Among the four diffusion layers 621 to 624 located in the region 611 vertically sandwiched by the two floating diffusion regions FD, that is the upper left floating diffusion region (FD) 441 and the lower right floating diffusion region (FD) 442, the diffusion layer 622 is the source of the second logarithmic transistor LGT2, and the diffusion layer 623 is the drain of the first logarithmic transistor LGT1.

(Rule 1: Third Transistor Arrangement Example)

Figure 60:
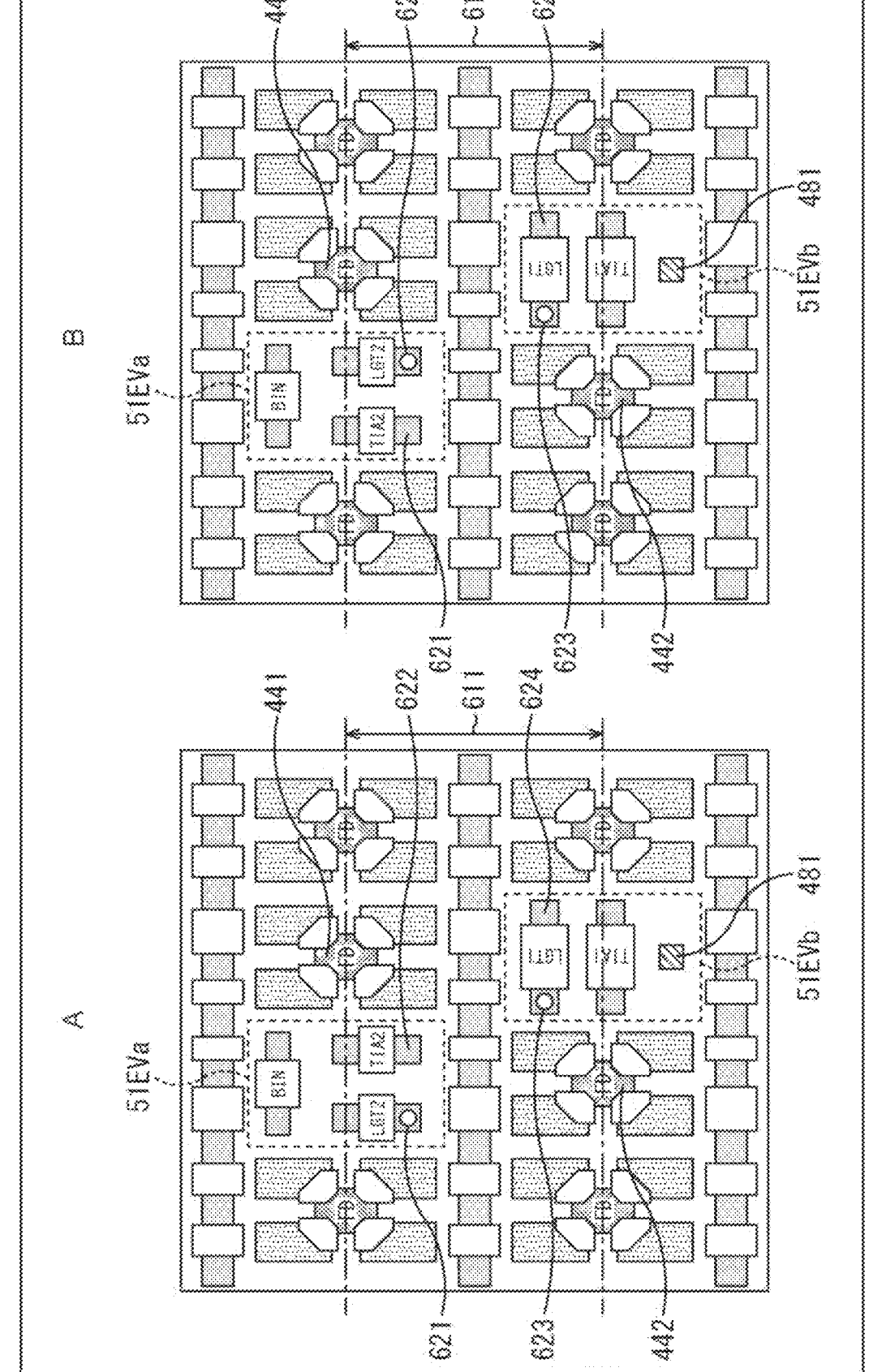
FIG. 60 is a plan view illustrating third and fourth transistor arrangement examples of the first rule.

A of FIG. 60 is a plan view illustrating a third transistor arrangement example according to the first rule.

In the third transistor arrangement example illustrated in A of FIG. 60, the addition transistor BIN is disposed in the horizontal direction in the upper left event pixel 51EVa, and the second logarithmic transistor LGT2 and the second amplification transistor TIA2 are disposed in the vertical direction perpendicular to the addition transistor BIN. In the event pixel 51EVb at the lower right, the first amplification transistor TIA1 and the first logarithmic transistor LGT1 are disposed in a direction perpendicular to the second logarithmic transistor LGT2 and the second amplification transistor TIA2.

Among the four diffusion layers 621 to 624 located in the region 611 vertically sandwiched by the two floating diffusion regions FD, that is the upper left floating diffusion region (FD) 441 and the lower right floating diffusion region (FD) 442, the diffusion layer 621 is the source of the second logarithmic transistor LGT2, and the diffusion layer 623 is the drain of the first logarithmic transistor LGT1.

(Rule 1: Fourth Transistor Arrangement Example)

B of FIG. 60 is a plan view illustrating a fourth transistor arrangement example according to the first rule.

In the fourth transistor arrangement example illustrated in B of FIG. 60, the addition transistor BIN is disposed in the horizontal direction in the upper left event pixel 51EVa, and the second amplification transistor TIA2 and the second logarithmic transistor LGT2 are disposed in the vertical direction perpendicular to the addition transistor BIN. The arrangement of the second amplification transistor TIA2 and the second logarithmic transistor LGT2 is opposite to that of the third transistor arrangement example illustrated in A of FIG. 60. In the event pixel 51EVb at the lower right, the first amplification transistor TIA1 and the first logarithmic transistor LGT1 are disposed in a direction perpendicular to the second amplification transistor TIA2 and the second logarithmic transistor LGT2.

Among the four diffusion layers 621 to 624 located in the region 611 vertically sandwiched by the two floating diffusion regions FD, that is the upper left floating diffusion region (FD) 441 and the lower right floating diffusion region (FD) 442, the diffusion layer 622 is the source of the second logarithmic transistor LGT2, and the diffusion layer 623 is the drain of the first logarithmic transistor LGT1.

(Rule 1: Fifth Transistor Arrangement Example)

Figure 61:
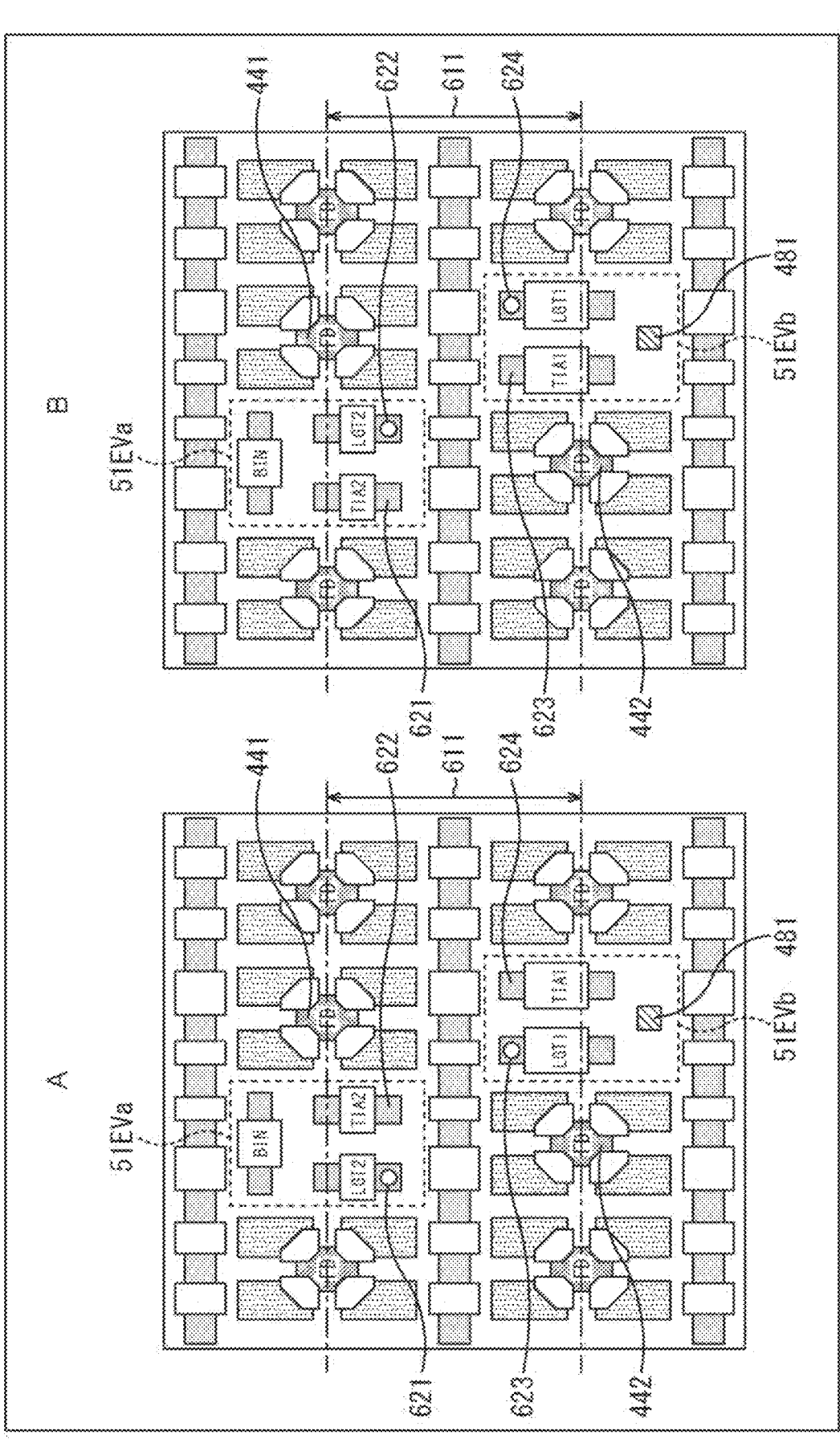
FIG. 61 is a plan view illustrating fifth and sixth transistor arrangement examples of the first rule.

A of FIG. 61 is a plan view illustrating a fifth transistor arrangement example according to the first rule.

In the fifth transistor arrangement example illustrated in A of FIG. 61, the addition transistor BIN is disposed in the horizontal direction in the upper left event pixel 51EVa, and the second logarithmic transistor LGT2 and the second amplification transistor TIA2 are disposed in the vertical direction perpendicular to the addition transistor BIN. In a lower right event pixel 51EVb, a first logarithmic transistor LGT1 and a first amplification transistor TIA1 are disposed in a direction parallel to a second logarithmic transistor LGT2 and a second amplification transistor TIA2.

Among the four diffusion layers 621 to 624 located in the region 611 vertically sandwiched by the two floating diffusion regions FD, that is the upper left floating diffusion region (FD) 441 and the lower right floating diffusion region (FD) 442, the diffusion layer 621 is the source of the second logarithmic transistor LGT2, and the diffusion layer 623 is the drain of the first logarithmic transistor LGT1.

(Rule 1: Sixth Transistor Arrangement Example)

B of FIG. 61 is a plan view illustrating a sixth transistor arrangement example according to the first rule.

In the sixth transistor arrangement example illustrated in B of FIG. 61, the addition transistor BIN is disposed in the horizontal direction in the upper left event pixel 51EVa, and the second amplification transistor TIA2 and the second logarithmic transistor LGT2 are disposed in the vertical direction perpendicular to the addition transistor BIN. The arrangement of the second amplification transistor TIA2 and the second logarithmic transistor LGT2 is opposite to that of the fifth transistor arrangement example illustrated in A of FIG. 61. In the event pixel 51EVb at the lower right, the first amplification transistor TIA1 and the first logarithmic transistor LGT1 are disposed in a direction parallel to the second amplification transistor TIA2 and the second logarithmic transistor LGT2. The arrangement of the first amplification transistor TIA1 and the first logarithmic transistor LGT1 is opposite to that of the fifth transistor arrangement example illustrated in A of FIG. 61.

Among the four diffusion layers 621 to 624 located in the region 611 vertically sandwiched by the two floating diffusion regions FD, that is the upper left floating diffusion region (FD) 441 and the lower right floating diffusion region (FD) 442, the diffusion layer 622 is the source of the second logarithmic transistor LGT2, and the diffusion layer 624 is the drain of the first logarithmic transistor LGT1.

(Rule 1: Seventh Transistor Arrangement Example)

Figure 62:
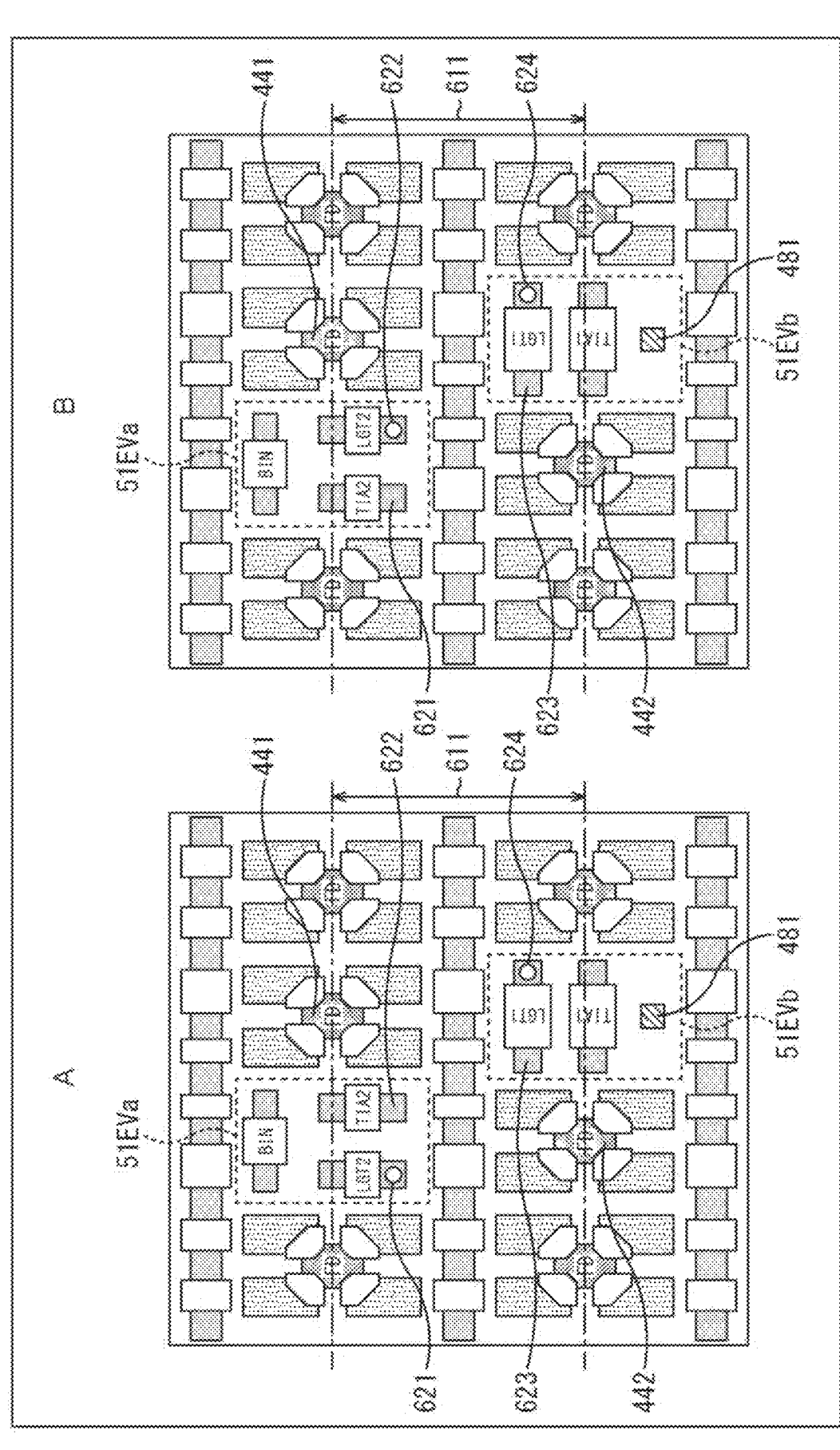
FIG. 62 is a plan view illustrating seventh and eighth transistor arrangement examples of the first rule.

A of FIG. 62 is a plan view illustrating a seventh transistor arrangement example according to the first rule.

In the seventh transistor arrangement example illustrated in A of FIG. 62, the addition transistor BIN is disposed in the horizontal direction in the upper left event pixel 51EVa, and the second logarithmic transistor LGT2 and the second amplification transistor TIA2 are disposed in the vertical direction perpendicular to the addition transistor BIN. In the event pixel 51EVb at the lower right, the first amplification transistor TIA1 and the first logarithmic transistor LGT1 are disposed in a direction perpendicular to the second logarithmic transistor LGT2 and the second amplification transistor TIA2.

Among the four diffusion layers 621 to 624 located in the region 611 vertically sandwiched by the two floating diffusion regions FD, that is the upper left floating diffusion region (FD) 441 and the lower right floating diffusion region (FD) 442, the diffusion layer 621 is the source of the second logarithmic transistor LGT2, and the diffusion layer 624 is the drain of the first logarithmic transistor LGT1.

(Rule 1: Eighth Transistor Arrangement Example)

B of FIG. 62 is a plan view illustrating an eighth transistor arrangement example according to the first rule.

In the eighth transistor arrangement example illustrated in B of FIG. 62, the addition transistor BIN is disposed in the horizontal direction in the upper left event pixel 51EVa, and the second amplification transistor TIA2 and the second logarithmic transistor LGT2 are disposed in the vertical direction perpendicular to the addition transistor BIN. The arrangement of the second amplification transistor TIA2 and the second logarithmic transistor LGT2 is opposite to that of the seventh transistor arrangement example illustrated in A of FIG. 62. In the event pixel 51EVb at the lower right, the first amplification transistor TIA1 and the first logarithmic transistor LGT1 are disposed in a direction perpendicular to the second amplification transistor TIA2 and the second logarithmic transistor LGT2.

Among the four diffusion layers 621 to 624 located in the region 611 vertically sandwiched by the two floating diffusion regions FD, that is the upper left floating diffusion region (FD) 441 and the lower right floating diffusion region (FD) 442, the diffusion layer 622 is the source of the second logarithmic transistor LGT2, and the diffusion layer 624 is the drain of the first logarithmic transistor LGT1.

(Rule 1: Other Transistor Arrangement Examples)

In the above-described example of the first rule, the example in which the addition transistor BIN, the second amplification transistor TIA2, and the second logarithmic transistor LGT2 are disposed in the upper left event pixel 51EVa has been described. However, as long as the first rule described with reference to FIG. 58 is followed, the transistors disposed in the upper left event pixel 51EVa and the lower right event pixel 51EVb can be arbitrarily replaced.

<Second Rule>

Figure 63:
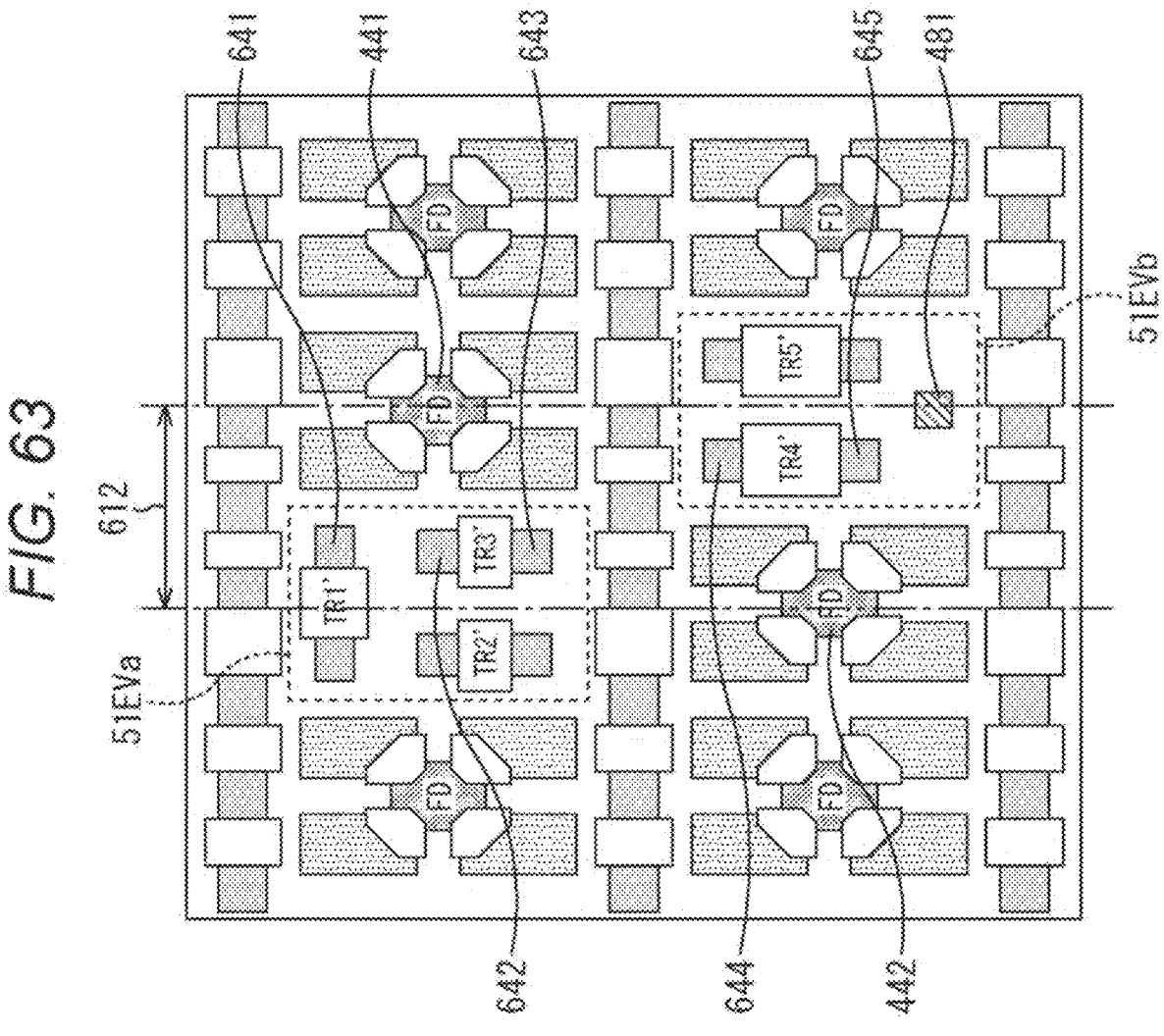
FIG. 63 is a plan view for explaining a second rule of transistor arrangement for reducing the capacitance of the gate wiring of the second amplification transistor.

FIG. 63 is a plan view for describing the second rule of the transistor arrangement for reducing the wiring capacitance Cpd2 of the connection wiring 601.

The second rule of transistor arrangement is a rule of arranging the two diffusion layers of the drain of the first logarithmic transistor LGT1 and the source of the second logarithmic transistor LGT2 connected to the gate of the second amplification transistor TIA2 and the gate of the second amplification transistor TIA2 in any one of the five diffusion layers 641 to 645 located in the region 612 sandwiched in the left-right direction by the two floating diffusion regions FD, that is the floating diffusion region (FD) 441 of the gradation pixel 51G adjacent to the right of the upper left event pixel 51EVa and the floating diffusion region (FD) 442 of the gradation pixel 51G adjacent to the left of the lower right event pixel 51EVb. Among the transistors TR1', TR2', and TR3' disposed in the event pixel 51EVa on the upper left and the transistors TR4' and TR5' disposed in the event pixel 51EVb on the lower right, any of the transistors TR1', TR3', and TR4' including any of the five diffusion layers 641 to 645 is the second amplification transistor TIA2. The arrangement direction of the transistors TR4' and TR5' disposed in the event pixel 51EVb at the lower right is not limited. By disposing the two diffusion layers of the drain of the first logarithmic transistor LGT1 and the source of the second logarithmic transistor LGT2 and the gate of the second amplification transistor TIA2 in the region 612 that is located in the vicinity of the event pixel 51EVa and the event pixel 51EVb in the diagonal direction, it is possible to reduce the wiring capacitance Cpd2 of the connection wiring 601 and to reduce noise of the second amplification transistor TIA2.

(Second Rule: First Transistor Arrangement Example)

Figure 64:
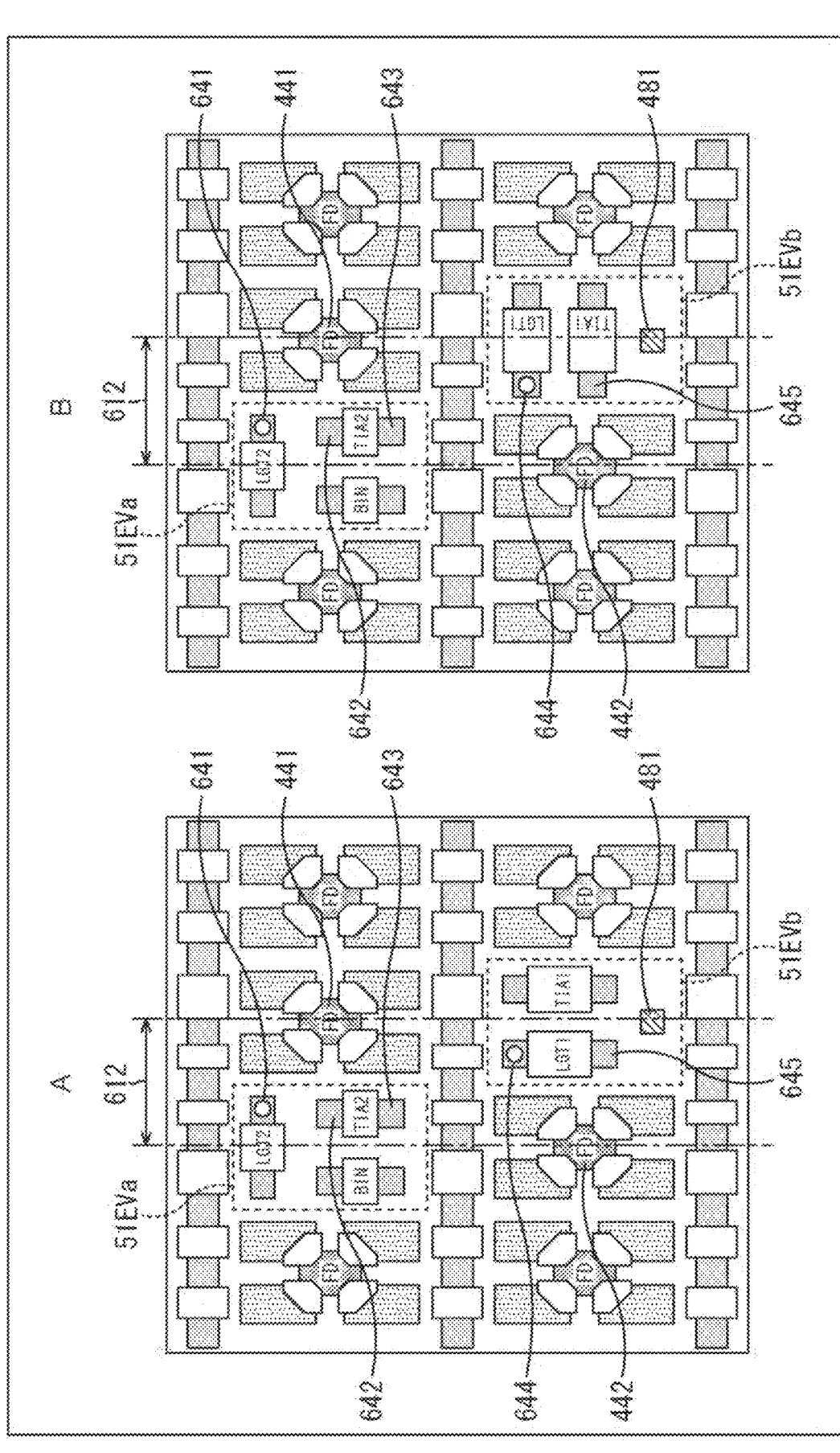
FIG. 64 is a plan view illustrating first and second transistor arrangement examples of the second rule.

A of FIG. 64 is a plan view illustrating a first transistor arrangement example according to the second rule.

In the first transistor arrangement example illustrated in A of FIG. 64, the second logarithmic transistor LGT2 is disposed in the horizontal direction in the upper left event pixel 51EVa, and the addition transistor BIN and the second amplification transistor TIA2 are disposed in the vertical direction perpendicular to the second logarithmic transistor LGT2. The second amplification transistor TIA2 is disposed on the right side in the region 612. In the event pixel 51EVb at the lower right, a first logarithmic transistor LGT1 and a first amplification transistor TIA1 are disposed in a direction parallel to the addition transistor BIN and the second amplification transistor TIA2.

Among the five diffusion layers 641 to 645 located in the region 612 sandwiched in the left-right direction by the two floating diffusion regions FD, that is the upper left floating diffusion region (FD) 441 and the lower right floating diffusion region (FD) 442, the diffusion layer 641 is the source of the second logarithmic transistor LGT2, and the diffusion layer 644 is the drain of the first logarithmic transistor LGT1.

(Second Rule: Second Transistor Arrangement Example)

B of FIG. 64 is a plan view illustrating a second transistor arrangement example according to the second rule.

In the second transistor arrangement example illustrated in B of FIG. 64, the second logarithmic transistor LGT2 is disposed in the horizontal direction in the upper left event pixel 51EVa, and the addition transistor TIA2 are disposed in the vertical direction perpendicular to the second logarithmic transistor LGT2. The second amplification transistor TIA2 is disposed on the right side in the region 612. In the event pixel 51EVb at the lower right, the first amplification transistor TIA1 and the first logarithmic transistor LGT1 are disposed in a direction perpendicular to the addition transistor BIN and the second amplification transistor TIA2.

Among the five diffusion layers 641 to 645 located in the region 462 sandwiched in the left-right direction by the two floating diffusion regions FD, that is the upper left floating diffusion region (FD) 441 and the lower right floating diffusion region (FD) 442, the diffusion layer 641 is the source of the second logarithmic transistor LGT2, and the diffusion layer 644 is the drain of the first logarithmic transistor LGT1.

(Second Rule: Third Transistor Arrangement Example)

Figure 65:
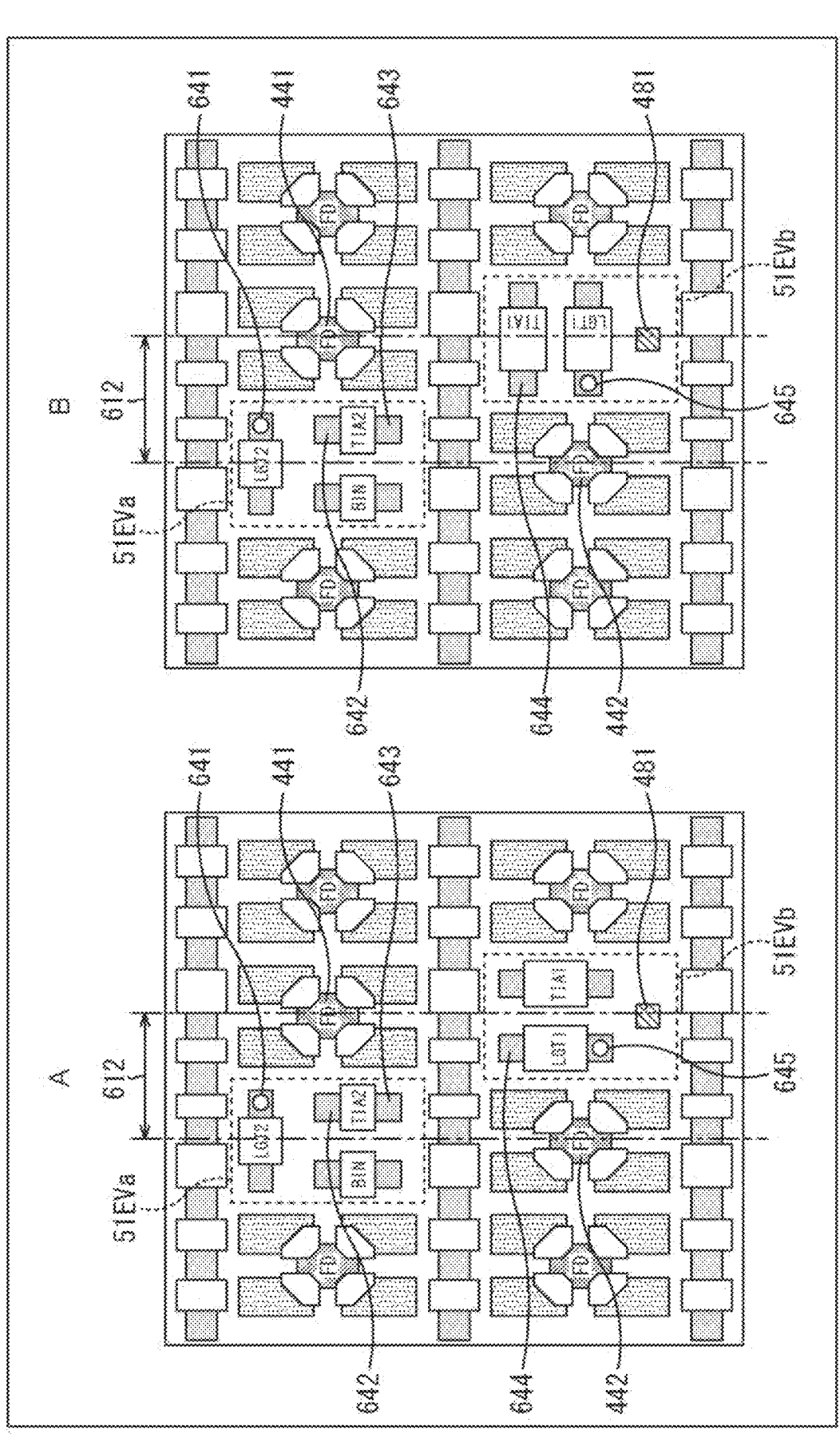
FIG. 65 is a plan view illustrating third and fourth transistor arrangement examples of the second rule.

A of FIG. 65 is a plan view illustrating a third transistor arrangement example according to the second rule.

In the third transistor arrangement example illustrated in A of FIG. 65, the second logarithmic transistor LGT2 is disposed in the horizontal direction in the upper left event pixel 51EVa, and the addition transistor BIN and the second amplification transistor TIA2 are disposed in the vertical direction perpendicular to the second logarithmic transistor LGT2. The second amplification transistor TIA2 is disposed on the right side in the region 612. In the event pixel 51EVb at the lower right, a first logarithmic transistor LGT1 and a first amplification transistor TIA1 are disposed in a direction parallel to the addition transistor BIN and the second amplification transistor TIA2.

Among the five diffusion layers 641 to 645 located in the region 612 sandwiched in the left-right direction by the two floating diffusion regions FD, that is the upper left floating diffusion region (FD) 441 and the lower right floating diffusion region (FD) 442, the diffusion layer 641 is the source of the second logarithmic transistor LGT2, and the diffusion layer 645 is the drain of the first logarithmic transistor LGT1.

(Rule 2: Fourth Transistor Arrangement Example)

B of FIG. 65 is a plan view illustrating a fourth transistor arrangement example according to the second rule.

In the fourth transistor arrangement example illustrated in B of FIG. 65, the second logarithmic transistor LGT2 is disposed in the horizontal direction in the upper left event pixel 51EVa, and the addition transistor BIN and the second amplification transistor TIA2 are disposed in the vertical direction perpendicular to the second logarithmic transistor LGT2. The second amplification transistor TIA2 is disposed on the right side in the region 612. In the event pixel 51EVb at the lower right, a first logarithmic transistor LGT1 and a first amplification transistor TIA1 are disposed in a direction perpendicular to the addition transistor BIN and the second amplification transistor TIA2.

Among the five diffusion layers 641 to 645 located in the region 462 sandwiched in the left-right direction by the two floating diffusion regions FD, that is the upper left floating diffusion region (FD) 441 and the lower right floating diffusion region (FD) 442, the diffusion layer 641 is the source of the second logarithmic transistor LGT2, and the diffusion layer 645 is the drain of the first logarithmic transistor LGT1.

(Rule 2: Other Transistor Arrangement Examples)

In the above-described example of the second rule, the example in which the addition transistor BIN, the second amplification transistor TIA2, and the second logarithmic transistor LGT2 are disposed in the upper left event pixel 51EVa has been described. However, as long as the second rule described with reference to FIG. 63 is followed, the transistors disposed in the upper left event pixel 51EVa and the lower right event pixel 51EVb can be arbitrarily replaced.

<Third Rule>

Figure 66:
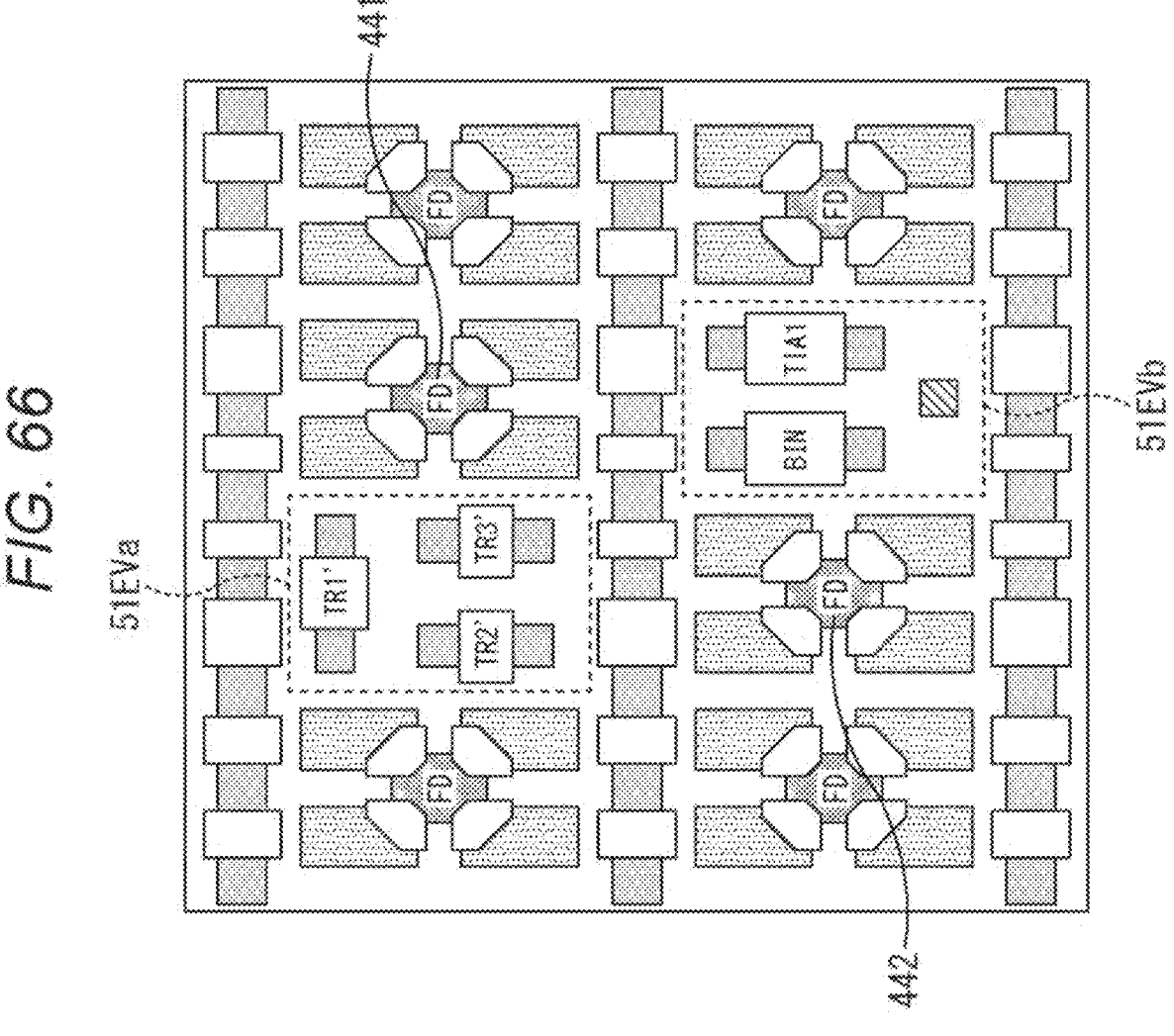
FIG. 66 is a plan view for explaining a third rule of transistor arrangement for reducing the capacitance of the gate wiring of the second amplification transistor.

FIG. 66 is a plan view for explaining a third rule of transistor arrangement for reducing the wiring capacitance Cpd2 of the connection wiring 601.

The third rule of transistor arrangement is a rule that the three transistors TR1' to TR3' disposed in the upper left event pixel 51EVa are set to any one of the first logarithmic transistor LGT1, the second amplification transistor TIA2, and the second logarithmic transistor LGT2, and the addition transistor BIN and the first amplification transistor TIA1 are disposed in the lower right event pixel 51EVb. The arrangement direction of the addition transistor BIN and the first amplification transistor TIA1 disposed in the event pixel 51EVb at the lower right is not limited. By disposing the first logarithmic transistor LGT1, the second amplification transistor TIA2, and the second logarithmic transistor LGT2 in one of the event pixel 51EVa and the event pixel 51EVb in the diagonal direction, the two diffusion layers of the drain of the first logarithmic transistor LGT1 and the source of the second logarithmic transistor LGT2 and the gate of the second amplification transistor TIA2 are disposed nearby. As a result, the wiring capacitance Cpd2 of the connection wiring 601 can be reduced, and noise of the second amplification transistor TIA2 can be reduced.

(Rule 3: First Transistor Arrangement Example)

Figure 67:
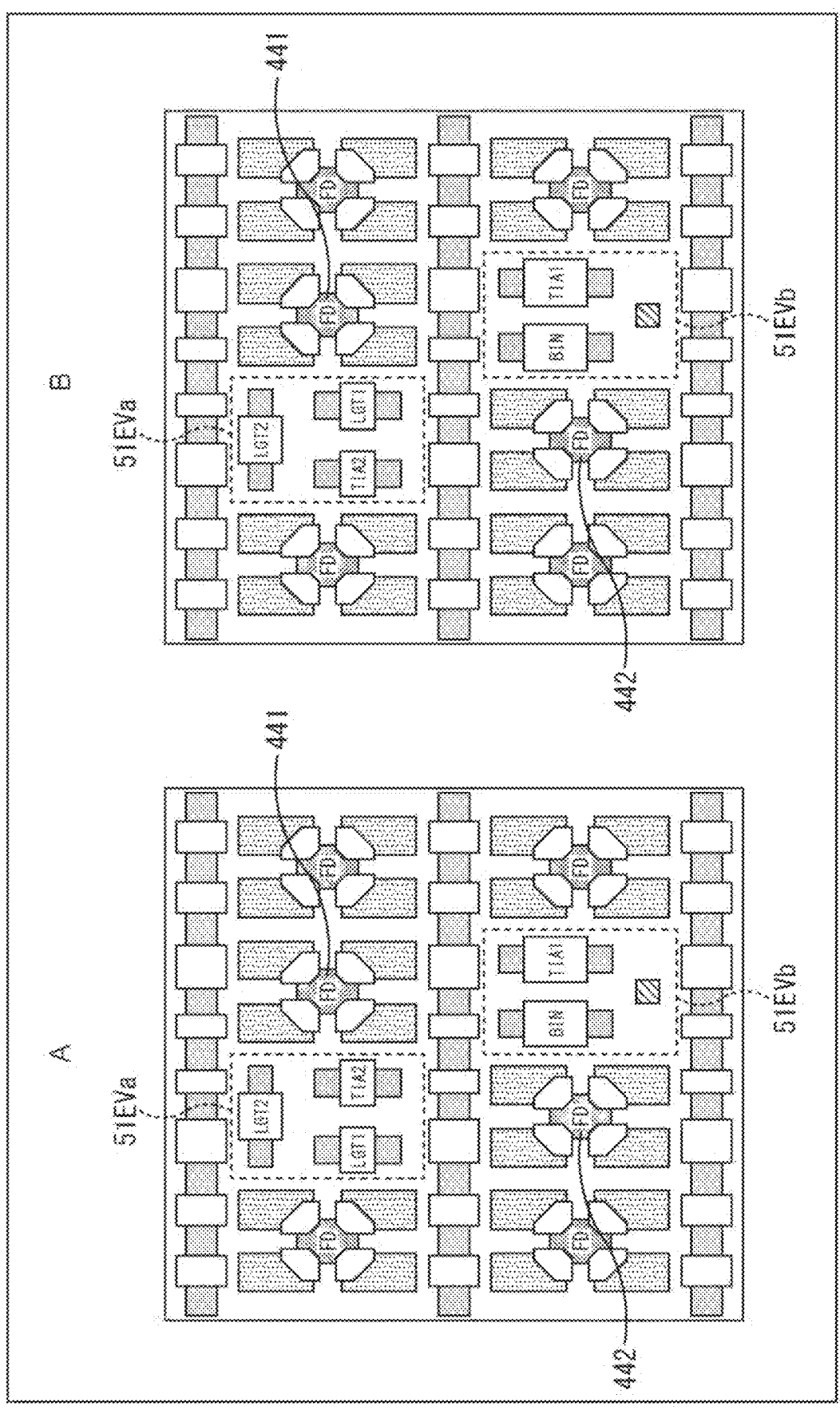
FIG. 67 is a plan view illustrating first and second transistor arrangement examples of the third rule.

A of FIG. 67 is a plan view illustrating a first transistor arrangement example according to the third rule.

In the first transistor arrangement example illustrated in A of FIG. 67, the second logarithmic transistor LGT2 is disposed in the horizontal direction in the upper left event pixel 51EVa, and the first logarithmic transistor LGT1 and the second amplification transistor TIA2 are disposed in the vertical direction perpendicular to the second logarithmic transistor LGT2. In the event pixel 51EVb at the lower right, the addition transistor BIN and the first amplification transistor TIA1 are disposed in a direction parallel to the first logarithmic transistor LGT1 and the second amplification transistor TIA2.

(Rule 3: Second Transistor Arrangement Example)

B of FIG. 67 is a plan view illustrating a second transistor arrangement example according to the third rule.

In the second transistor arrangement example illustrated in B of FIG. 67, the second logarithmic transistor LGT2 is disposed in the horizontal direction in the upper left event pixel 51EVa, and the second amplification transistor TIA2 and the first logarithmic transistor LGT1 are disposed in the vertical direction perpendicular to the second logarithmic transistor LGT2. The arrangement of the second amplification transistor TIA2 and the first logarithmic transistor LGT1 is opposite to that of the first transistor arrangement example illustrated in A of FIG. 67. In the event pixel 51EVb at the lower right, the addition transistor BIN and the first amplification transistor TIA1 are disposed in a direction parallel to the second amplification transistor TIA2 and the first logarithmic transistor LGT1.

(Rule 3: Third Transistor Arrangement Example)

Figure 68:
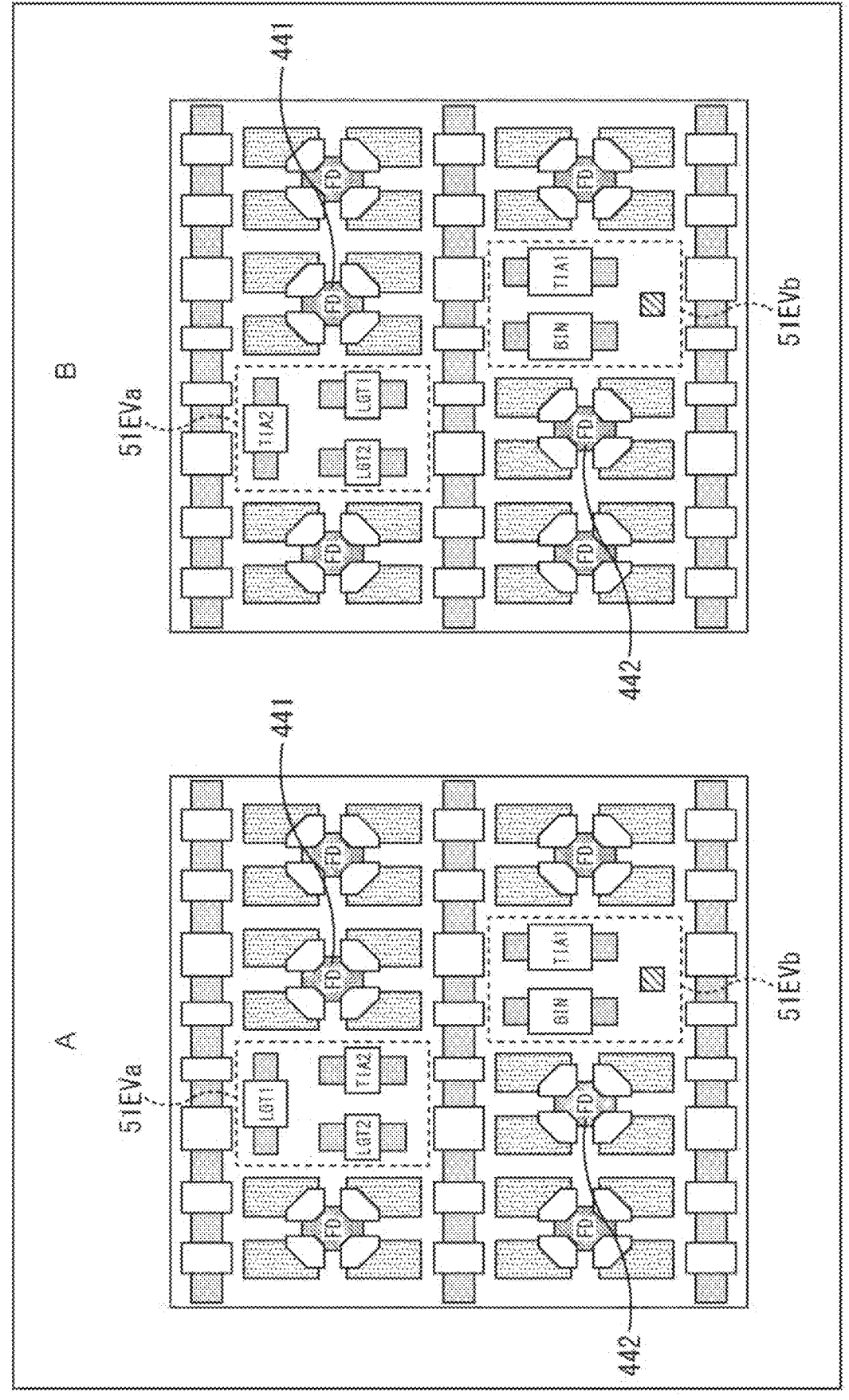
FIG. 68 is a plan view illustrating third and fourth transistor arrangement examples of the third rule.

A of FIG. 68 is a plan view illustrating a third transistor arrangement example according to the third rule.

In the third transistor arrangement example illustrated in A of FIG. 68, the first logarithmic transistor LGT1 is disposed in the horizontal direction in the upper left event pixel 51EVa, and the second logarithmic transistor LGT2 and the second amplification transistor TIA2 are disposed in the vertical direction perpendicular to the first logarithmic transistor LGT1. In the event pixel 51EVb at the lower right, the addition transistor BIN and the first amplification transistor TIA1 are disposed in a direction parallel to the second logarithmic transistor LGT2 and the second amplification transistor TIA2.

(Rule 3: Fourth Transistor Arrangement Example)

B of FIG. 68 is a plan view illustrating a fourth transistor arrangement example according to the third rule.

In the fourth transistor arrangement example illustrated in B of FIG. 68, the second amplification transistor TIA2 is disposed in the horizontal direction in the upper left event pixel 51EVa, and the second logarithmic transistor LGT2 and the first logarithmic transistor LGT1 are disposed in the vertical direction perpendicular to the second amplification transistor TIA2. In the event pixel 51EVb at the lower right, the addition transistor BIN and the first amplification transistor TIA1 are disposed in a direction parallel to the second logarithmic transistor LGT2 and the first logarithmic transistor LGT1.

(Rule 3: Fifth Transistor Arrangement Example)

Figure 69:
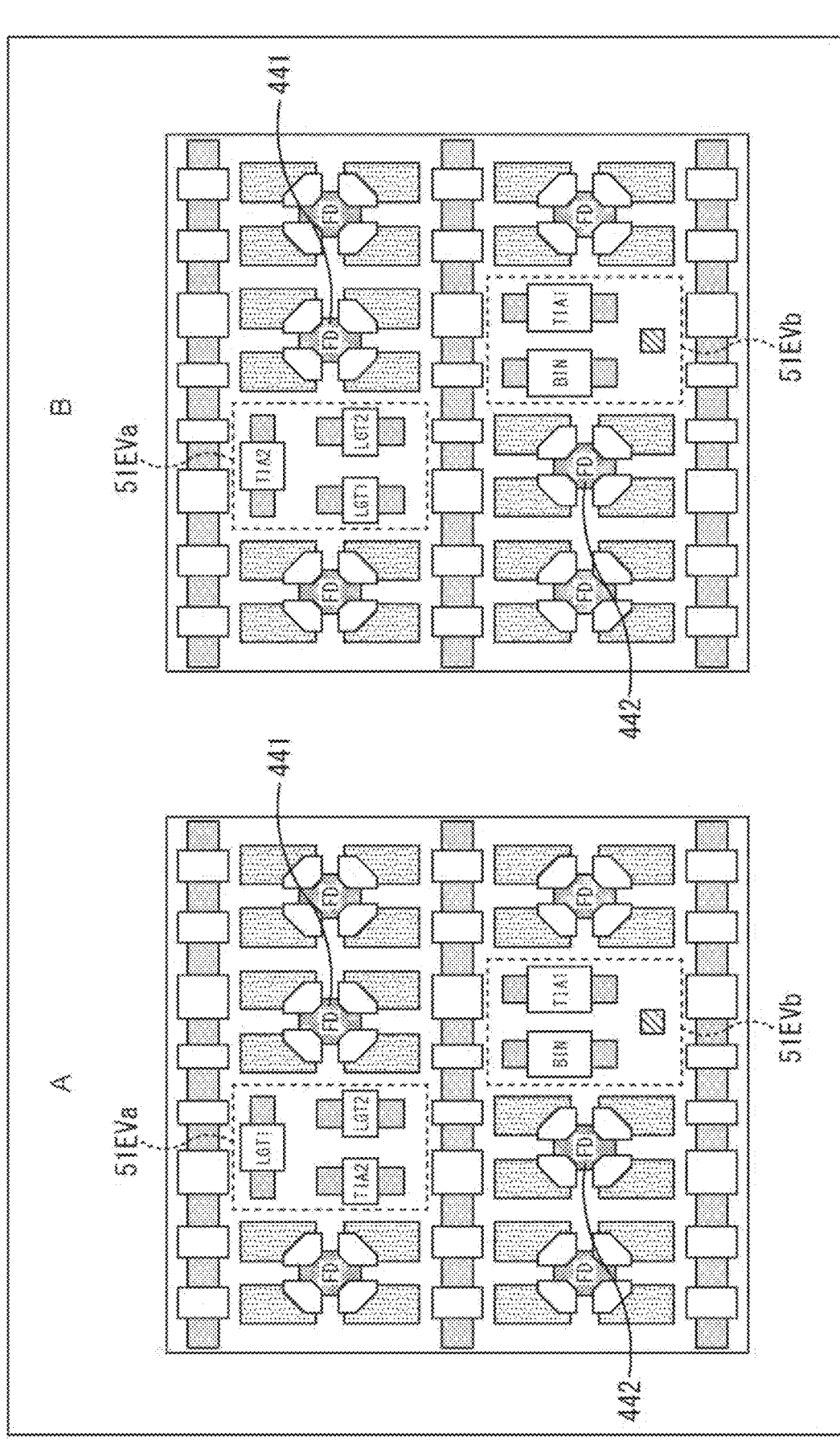
FIG. 69 is a plan view illustrating fifth and sixth transistor arrangement examples of the third rule.

A of FIG. 69 is a plan view illustrating a fifth transistor arrangement example according to the third rule.

In the fifth transistor arrangement example illustrated in A of FIG. 69, the first logarithmic transistor LGT1 is disposed in the horizontal direction in the upper left event pixel 51EVa, and the second amplification transistor TIA2 and the second logarithmic transistor LGT2 are disposed in the vertical direction perpendicular to the first logarithmic transistor LGT1. The arrangement of the second amplification transistor TIA2 and the second logarithmic transistor LGT2 is opposite to that of the third transistor arrangement example illustrated in A of FIG. 68. In the event pixel 51EVb at the lower right, the addition transistor BIN and the first amplification transistor TIA1 are disposed in a direction parallel to the second amplification transistor TIA2 and the second logarithmic transistor LGT2.

(Rule 3: Sixth Transistor Arrangement Example)

B of FIG. 69 is a plan view illustrating a sixth transistor arrangement example according to the third rule.

In the sixth transistor arrangement example illustrated in B of FIG. 69, the second amplification transistor TIA2 is disposed in the horizontal direction in the upper left event pixel 51EVa, and the first logarithmic transistor LGT1 and the second logarithmic transistor LGT2 are disposed in the vertical direction perpendicular to the second amplification transistor TIA2. The arrangement of the first logarithmic transistor LGT1 and the second logarithmic transistor LGT2 is opposite to that of the fourth transistor arrangement example illustrated in B of FIG. 68. In the event pixel 51EVb at the lower right, the addition transistor BIN and the first amplification transistor TIA1 are disposed in parallel with the first logarithmic transistor LGT1 and the second logarithmic transistor LGT2.

(Rule 3: Other Transistor Arrangement Examples)

In the above-described example of the third rule, an example has been described in which the first logarithmic transistor LGT1, the second logarithmic transistor LGT2, and the second amplification transistor TIA2 are disposed in the upper left event pixel 51EVa, and the addition transistor BIN and the first amplification transistor TIA1 are disposed in the lower right event pixel 51EVb. However, the addition transistor BIN and the first amplification transistor TIA1 may be disposed in the upper left event pixel 51EVa, and the first logarithmic transistor LGT1, the second logarithmic transistor LGT2, and the second amplification transistor TIA2 may be disposed in the lower right event pixel 51EVb. That is, the first logarithmic transistor LGT1, the second logarithmic transistor LGT2, and the second amplification transistor TIA2 may be disposed in the same region of either the upper left event pixel 51EVa or the lower right event pixel 51EVb.

<22. Transistor Arrangement Example of Event Pixel for Reducing Capacitance of Gate Wiring of First and Second Amplification Transistors>

Figure 70:
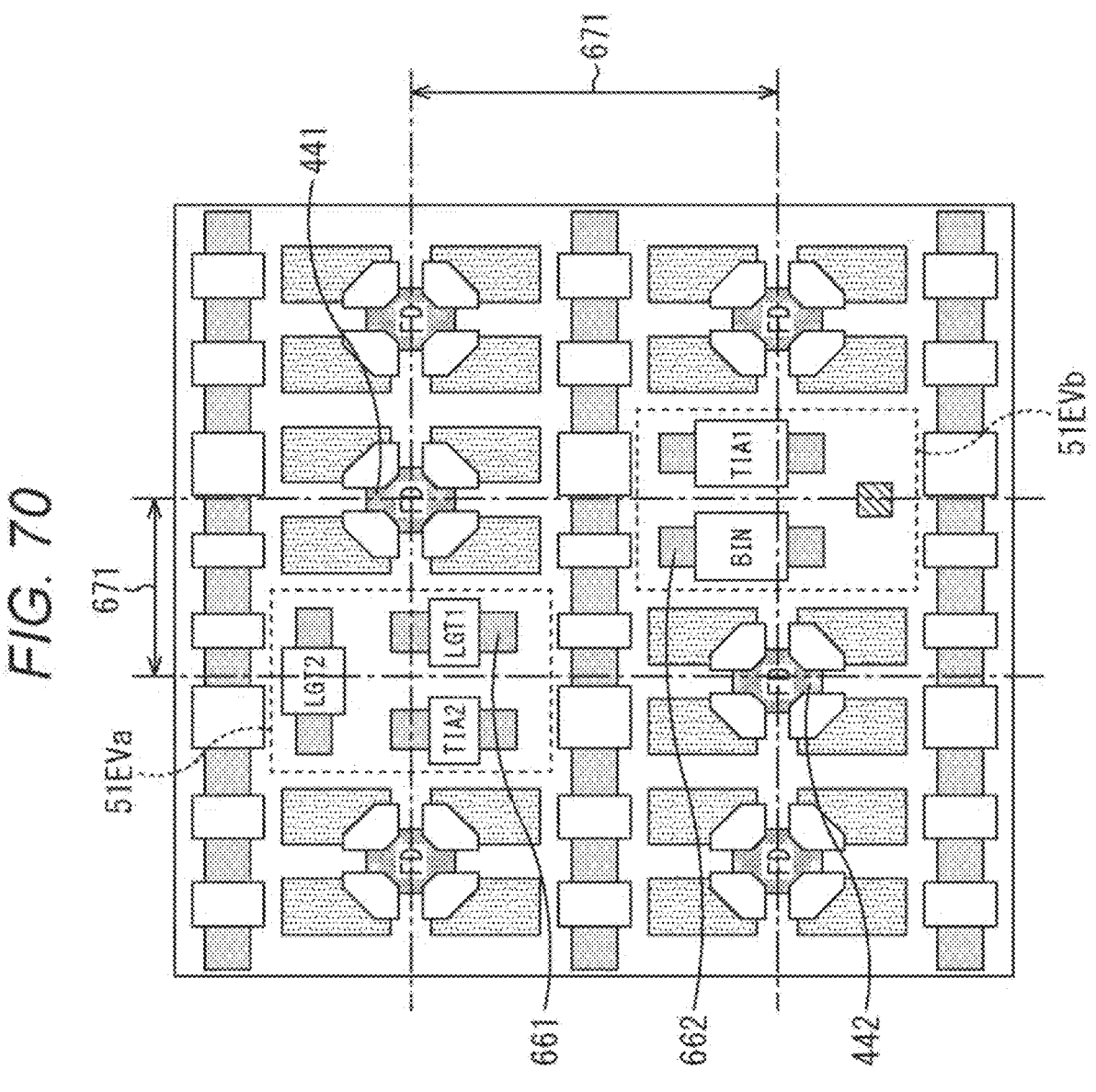
FIG. 70 is a plan view illustrating a transistor arrangement example of event pixels satisfying all rules.

FIG. 70 is a plan view illustrating a transistor arrangement example of the event pixel 51EV satisfying the third rule of the transistor arrangement of the first amplification transistor gate wiring capacitance reduction, the third rule of the transistor arrangement of the first amplification transistor of the wiring capacitance reduction, and the third rule of the transistor arrangement of the second amplification transistor gate wiring capacitance reduction.

In an event pixel 51EV illustrated in FIG. 70, a second logarithmic transistor LGT2 is disposed in a lateral direction in an upper left event pixel 51EVa, and a second amplification transistor TIA2 and a first logarithmic transistor LGT1 are disposed in a vertical direction perpendicular to the second logarithmic transistor LGT2. In the event pixel 51EVb at the lower right, the addition transistor BIN and the first amplification transistor TIA1 are disposed in a direction parallel to the second amplification transistor TIA2 and the first logarithmic transistor LGT1. The diffusion layer 661 is a source of the first logarithmic transistor LGT1, and the diffusion layer 662 is a source of the addition transistor BIN.

The diffusion layer 661 which is the source of the first logarithmic transistor LGT1 and the diffusion layer 662 which is the source of the addition transistor BIN are located in a region 671 sandwiched in the vertical and left-right directions by two floating diffusion regions FD, that is an upper left floating diffusion region (FD) 441 and a lower right floating diffusion region (FD) 442. Therefore, the transistor arrangement of FIG. 70 satisfies the first to third rules of the transistor arrangement for reducing the wiring capacitance Cpd1 of the first amplification transistor gate wiring (connection wiring 412) described above.

The first amplification transistor TIA1 is disposed at a position closest to the diffusion layer 662 which is a source of the addition transistor BIN. Therefore, the transistor arrangement in FIG. 70 satisfies the arrangement rule of the first amplification transistor TIA1 that reduces the wiring capacitance Cpd1 of the connection wiring 412.

A first logarithmic transistor LGT1, a second logarithmic transistor LGT2, and a second amplification transistor TIA2 are disposed in an upper left event pixel 51EVa, and an addition transistor BIN and a first amplification transistor TIA1 are disposed in a lower right event pixel 51EVb. Therefore, the transistor arrangement in FIG. 70 satisfies the third rule of the transistor arrangement that reduces the wiring capacitance Cpd2 of the second amplification transistor gate wiring (connection wiring 601).

As described above, in the transistor arrangement of FIG. 70, in the 4Tr-type event pixel 51EV including the addition transistor BIN, the wiring capacitance Cpd1 of the first amplification transistor gate wiring (connection wiring 412) can be reduced, and the wiring capacitance Cpd2 of the second amplification transistor gate wiring (connection wiring 601) can be reduced.

<23. Circuit Configuration Example of Event Pixel without Addition Transistor>

In the above-described example, the configuration in which one event pixel 51EV formed in two unit regions includes the addition transistor BIN has been described.

Next, the transistor arrangement in one event pixel 51EV in a case where there is no addition transistor BIN will be described.

Figure 71:
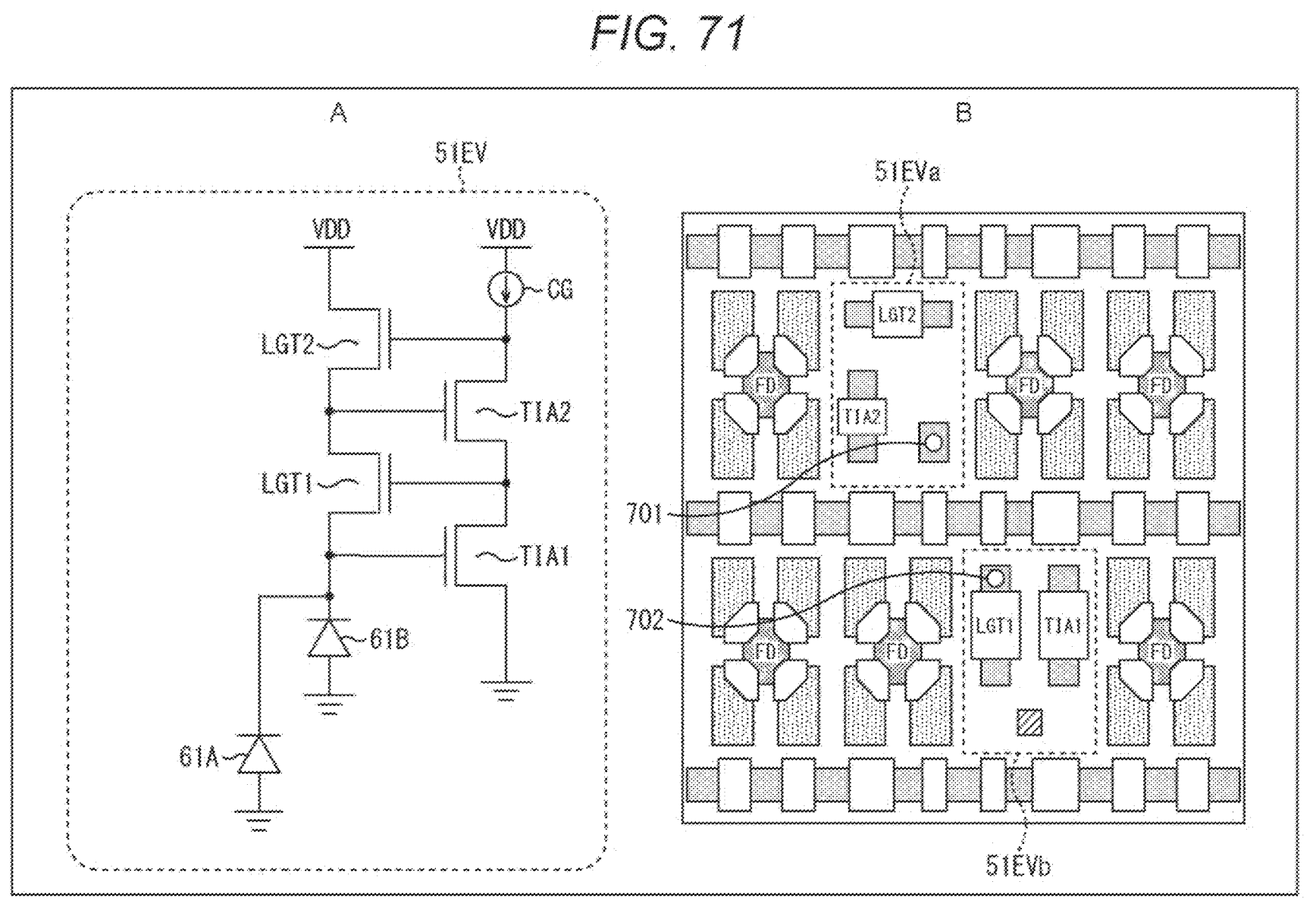

A of FIG. 71 is a diagram illustrating a circuit configuration example of the event pixel 51EV in a case where the addition transistor BIN is not provided, and B of FIG. 71 is a plan view illustrating a transistor arrangement example of the event pixel 51EV in a case where the addition transistor BIN is not provided.

In a case where the event pixel 51EV does not include the addition transistor BIN, in B of FIG. 71, one diffusion layer 701 formed in the upper left event pixel 51EVa and one diffusion layer 702 formed in the lower right event pixel 51EVb are set as the source of the first logarithmic transistor LGT1 and the other diffusion layer is set as the cathode contact of the photodiode 61A or 61B, and are disposed according to any one of the first to third rules of the transistor arrangement of the first amplification transistor gate wiring capacitance reduction described above. In the example in B of FIG. 71, the second logarithmic transistor LGT2 is disposed in the horizontal direction in the upper left event pixel 51EVa, and the second amplification transistor TIA2 is disposed in the vertical direction perpendicular to the second logarithmic transistor LGT2. In the event pixel 51EVb at the lower right, a first logarithmic transistor LGT1 and a first amplification transistor TIA1 are disposed in a direction parallel to the second amplification transistor TIA2. The diffusion layer 701 of the upper left event pixel 51EVa is formed as the cathode contact of the photodiode 61A in the region of the event pixel 51EVa, and the diffusion layer 702 of the lower right event pixel 51EVb is formed as the source of the first logarithmic transistor LGT1.

<24. Circuit Configuration Example of 2Tr-Type Event Pixel>

In the above-described example, the configuration in which the 4Tr-type event pixel 51EV provided with the loop circuit of two stages includes the addition transistor BIN has been described. Next, a transistor arrangement in a case where the 2Tr-type event pixel 51EV illustrated in FIG. 6 includes the addition transistor BIN will be described.

Figure 72:
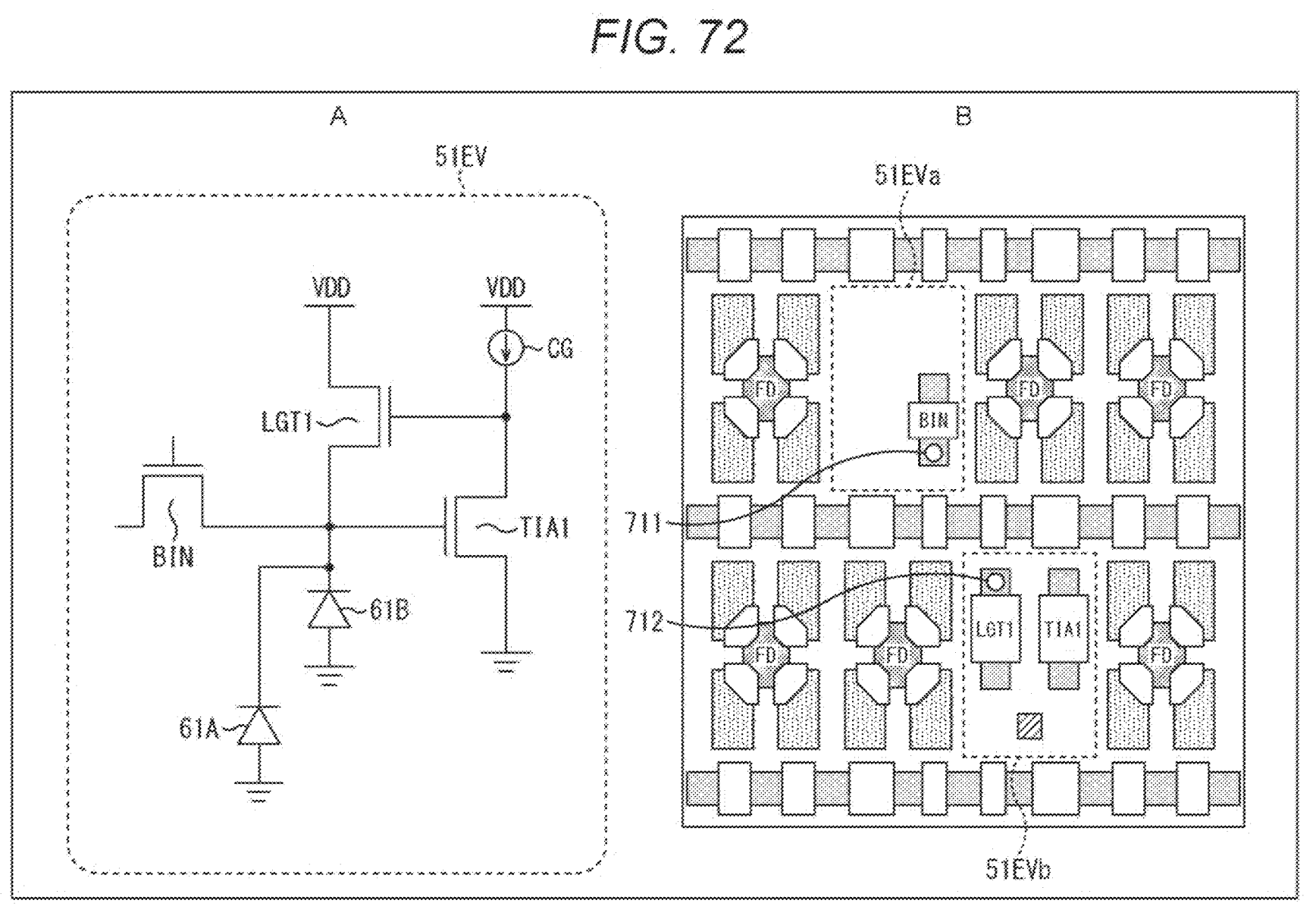

A of FIG. 72 is a diagram illustrating a circuit configuration example of the 2Tr-type event pixel 51EV in a case where the addition transistor BIN is provided, and B of FIG. 72 is a plan view illustrating a transistor arrangement example of the 2Tr-type event pixel 51EV in a case where the addition transistor BIN is provided.

In B of FIG. 72, one diffusion layer 711 formed in the upper left event pixel 51EVa and one diffusion layer 712 formed in the lower right event pixel 51EVb are set as the source of the first logarithmic transistor LGT1 and the other is set as the source of the addition transistor BIN, and are disposed according to any one of the first to third rules of the transistor arrangement of the first amplification transistor gate wiring capacitance reduction described above. In the example in B of FIG. 72, the addition transistor BIN is disposed in the vertical direction in the upper left event pixel 51EVa, and the first logarithmic transistor LGT1 and the first amplification transistor TIA1 are disposed in the direction parallel to the addition transistor BIN in the lower right event pixel 51EVb. The diffusion layer 711 of the upper left event pixel 51EVa is formed as the source of the addition transistor BIN, and the diffusion layer 712 of the lower right event pixel 51EVb is formed as the source of the first logarithmic transistor LGT1.

Note that, although not illustrated, a configuration in which the addition transistor BIN is omitted in the 2Tr-type event pixel 51EV is also possible. In this case, for example, similarly to the 4Tr-type event pixel 51EV in a case where there is no addition transistor BIN illustrated in FIG. 71, the diffusion layer 711 of the upper left event pixel 51EVa is only required to be formed as the cathode contact of the photodiode 61A of the event pixel 51EVa.

Furthermore, the current-voltage conversion circuit 121 of the event pixel 51EV can have a circuit configuration in which three or more stages of loop circuits are provided, such as a 6Tr-type provided with three stages of loop circuits and an 8Tr-type provided with four stages of loop circuits. In this case, similarly, the source of the first logarithmic transistor LGT1 and the source of the addition transistor BIN can be disposed according to any one of the first to third rules of the transistor arrangement of the first amplification transistor gate wiring capacitance reduction described above. Moreover, in the event pixel 51EV including the loop circuit of three or more stages, the first to third rules of the transistor arrangement of the second amplification transistor gate wiring capacitance reduction described above can be similarly applied as the transistor arrangement for reducing the wiring capacitance Cpd3 of the connection wiring connected to the gate of the third amplification transistor TIA3, the wiring capacitance Cpd4 of the connection wiring connected to the gate of the fourth amplification transistor TIA4, and the like.

<25. Circuit Configuration Example of One-Stage Diode Type Event Pixel>

In the above-described example, the circuit configuration of the 4Tr-type event pixel 51EV provided with the loop circuit of two stages has been described. The current-voltage conversion circuit 121 of the event pixel 51EV can be configured to use a diode-connected transistor instead of providing a plurality of stages of loop circuits.

Figure 73:
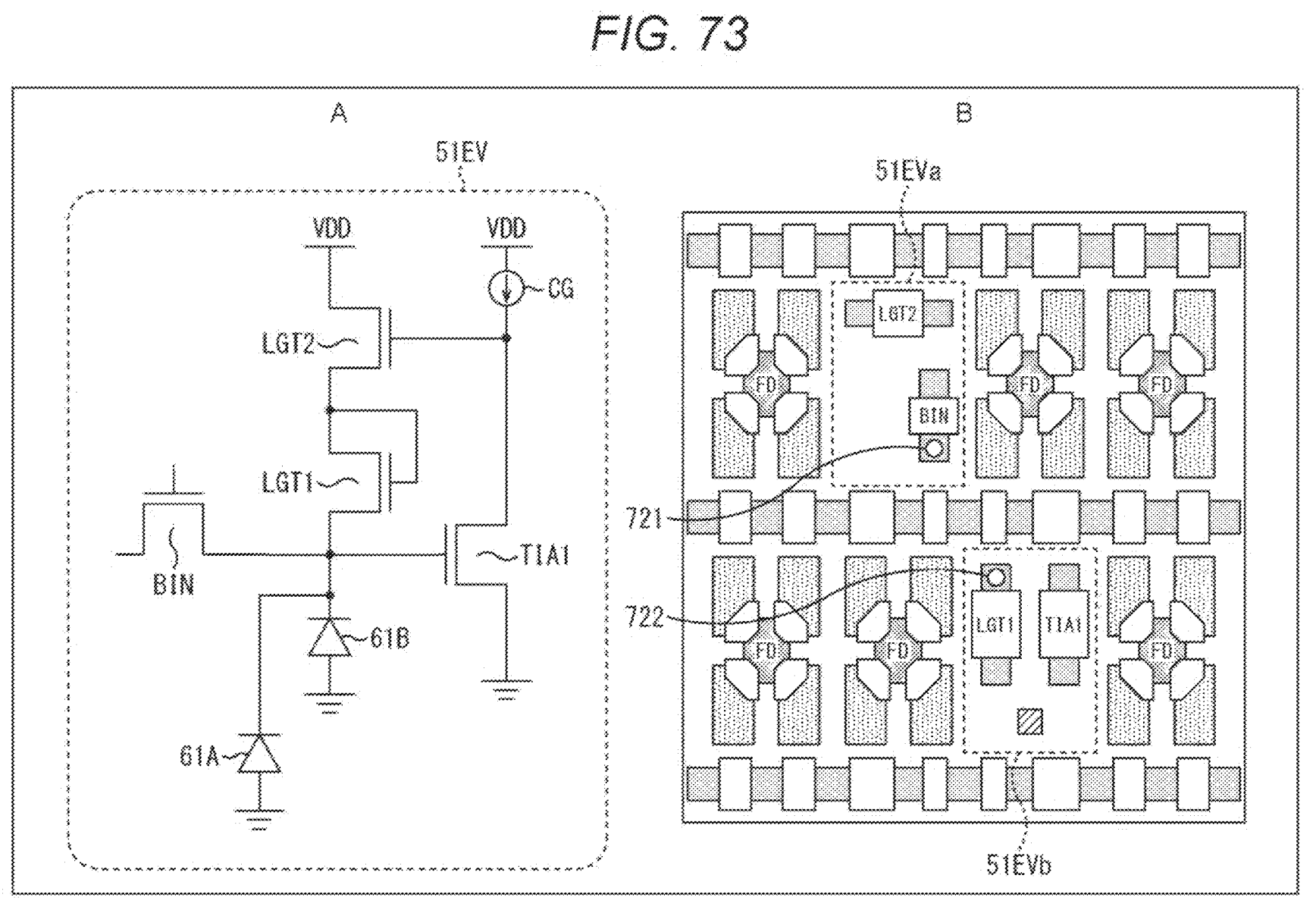

A of FIG. 73 is a diagram illustrating a circuit configuration example of the event pixel 51EV including the loop circuit of one stage and one logarithmic transistor diode-connected, and B of FIG. 73 is a plan view illustrating a transistor arrangement example of the event pixel 51EV in that case.

The event pixel 51EV in A of FIG. 73 includes a one-stage loop circuit including a first amplification transistor TIA1 and a second logarithmic transistor LGT2, and a diode-connected first logarithmic transistor LGT1. When the event pixel 51EV in A of FIG. 73 is compared with the case of the two-stage loop circuit illustrated in FIG. 37, the second amplification transistor TIA2 is omitted, and the first logarithmic transistor LGT1 is changed to a so-called diode connection in which the drain and the gate are connected. By changing the single-stage loop circuit to the diode-connected logarithmic transistor LGT, the upper limit of the output voltage can be reduced without changing the conversion gain.

In a case where the event pixel 51EV includes the loop circuit of one stage including the first amplification transistor TIA1 and the second logarithmic transistor LGT2, the diode-connected first logarithmic transistor LGT1, and the addition transistor BIN, as illustrated in B of FIG. 73, one diffusion layer 721 formed in the upper left event pixel 51EVa and one diffusion layer 722 formed in the lower right event pixel 51EVb are set as the source of the addition transistor BIN and the other is set as the source of the first logarithmic transistor LGT1, and are disposed according to any one of the first to third rules of the transistor arrangement of the first amplification transistor gate wiring capacitance reduction described above. In the example in B of FIG. 73, the second logarithmic transistor LGT2 is disposed in the horizontal direction in the upper left event pixel 51EVa, and the addition transistor BIN is disposed in the vertical direction perpendicular to the second logarithmic transistor LGT2. In the event pixel 51EVb at the lower right, a first logarithmic transistor LGT1 and a first amplification transistor TIA1 are disposed in a direction parallel to the addition transistor BIN. The diffusion layer 721 of the upper left event pixel 51EVa is formed as the source of the addition transistor BIN, and the diffusion layer 722 of the lower right event pixel 51EVb is formed as the source of the first logarithmic transistor LGT1.

<26. Circuit Configuration Example of Two-Stage Diode Type Event Pixel>

The loop circuit is provided in a plurality of stages of two stages and three stages to increase the conversion gain, so that the SNR of the output signal can be increased. However, the diode-connected logarithmic transistor LGT is also provided in a plurality of stages to increase the conversion gain, so that the SNR of the signal can be increased.

Figure 74:
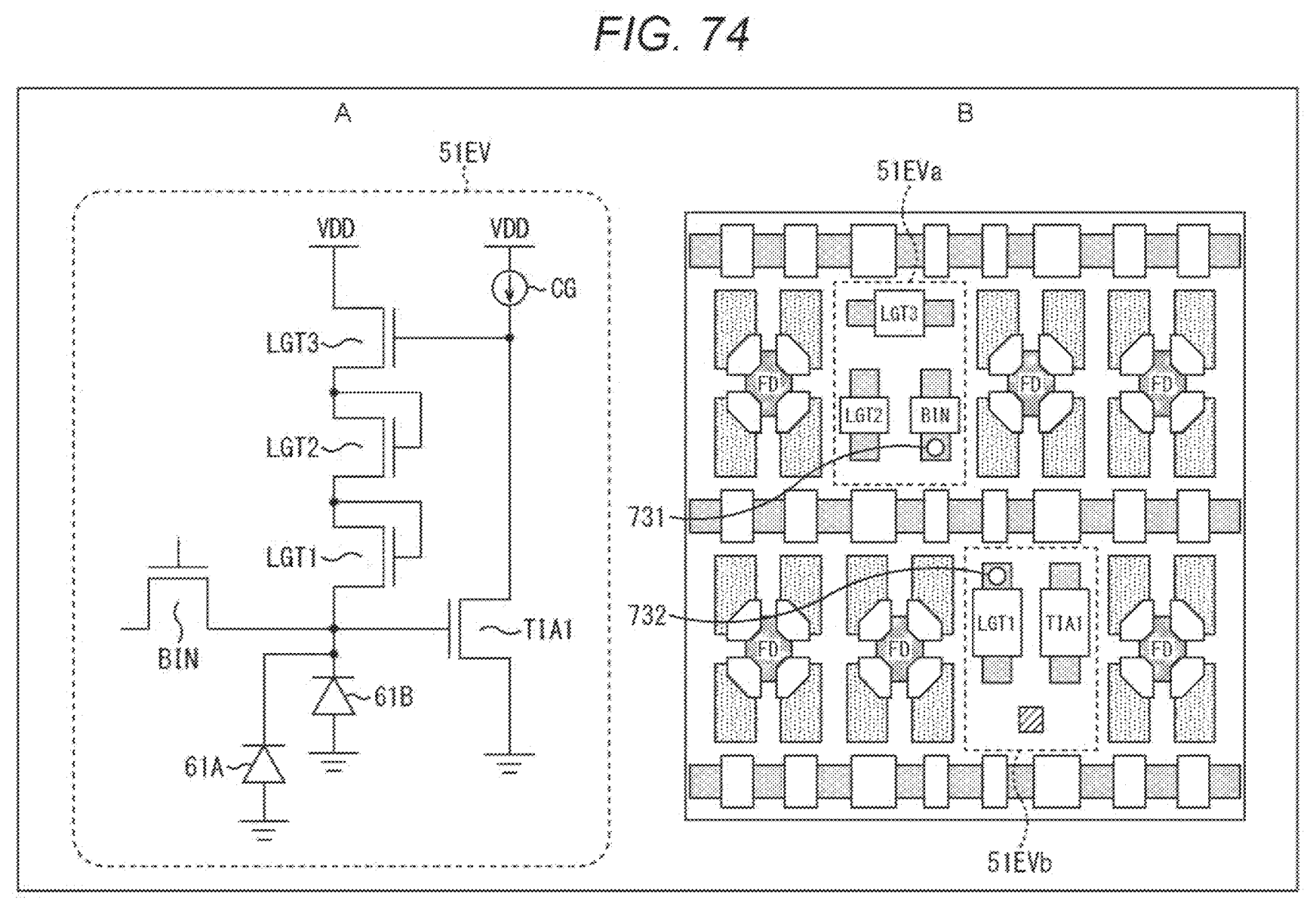

A of FIG. 74 is a diagram illustrating a circuit configuration example of an event pixel 51EV including a one-stage loop circuit and two logarithmic transistors diode-connected, and B of FIG. 74 is a plan view illustrating a transistor arrangement example of the event pixel 51EV in that case.

The event pixel 51EV in A of FIG. 74 includes a one-stage loop circuit including a first amplification transistor TIA1 and a third logarithmic transistor LGT3, and a first logarithmic transistor LGT1 and a second logarithmic transistor LGT2 which are two diode-connected logarithmic transistors LGT. The drain of the third logarithmic transistor LGT3 is connected to the power supply VDD, and the gate is connected to the constant current source CG, the drain of the first amplification transistor TIA1, and the input terminal (FIG. 6) of the buffer 122. When the event pixel 51EV in A of FIG. 74 is compared with the event pixel 51EV in A of FIG. 73, the number of stages of diode connection is increased. By increasing the number of stages of the diode-connected logarithmic transistors LGT, the conversion gain can be increased to increase the SNR of the signal. Three or more stages of diode-connected logarithmic transistors LGT may be provided.

In a case where the event pixel 51EV includes the one-stage loop circuit including the first amplification transistor TIA1 and the third logarithmic transistor LGT3, the two-stage first logarithmic transistor LGT1 and the second logarithmic transistor LGT2 diode-connected, and the addition transistor BIN, as illustrated in B of FIG. 74, one diffusion layer 731 formed in the upper left event pixel 51EVa and one diffusion layer 732 formed in the lower right event pixel 51EVb are set as the source of the first logarithmic transistor LGT1 and the other is set as the source of the addition transistor BIN, and are disposed according to any one of the first rule to the third rule of the transistor arrangement of the first amplification transistor gate wiring capacitance reduction described above. In the example in B of FIG. 74, the third logarithmic transistor LGT3 is disposed in the horizontal direction in the upper left event pixel 51EVa, and the second logarithmic transistor LGT2 and the addition transistor BIN are disposed in the vertical direction perpendicular to the third logarithmic transistor LGT3. In the event pixel 51EVb at the lower right, the first logarithmic transistor LGT1 and the first amplification transistor TIA1 are disposed in a direction parallel to the second logarithmic transistor LGT2 and the addition transistor BIN. The diffusion layer 731 of the upper left event pixel 51EVa is formed as the source of the addition transistor BIN, and the diffusion layer 732 of the lower right event pixel 51EVb is formed as the source of the first logarithmic transistor LGT1.

<27. Problem of Coupling Between Output Wiring and Floating Diffusion Region>

In the transistor arrangement of the event pixel 51EV described above, the preferred transistor arrangement has been described focusing on the wiring capacitance of the wiring connected to the gate of the amplification transistor TIA.

Next, a preferred transistor arrangement of the event pixel 51EV focusing on the coupling capacitance of the gradation pixel 51G with the floating diffusion region FD will be described.

Figure 75:
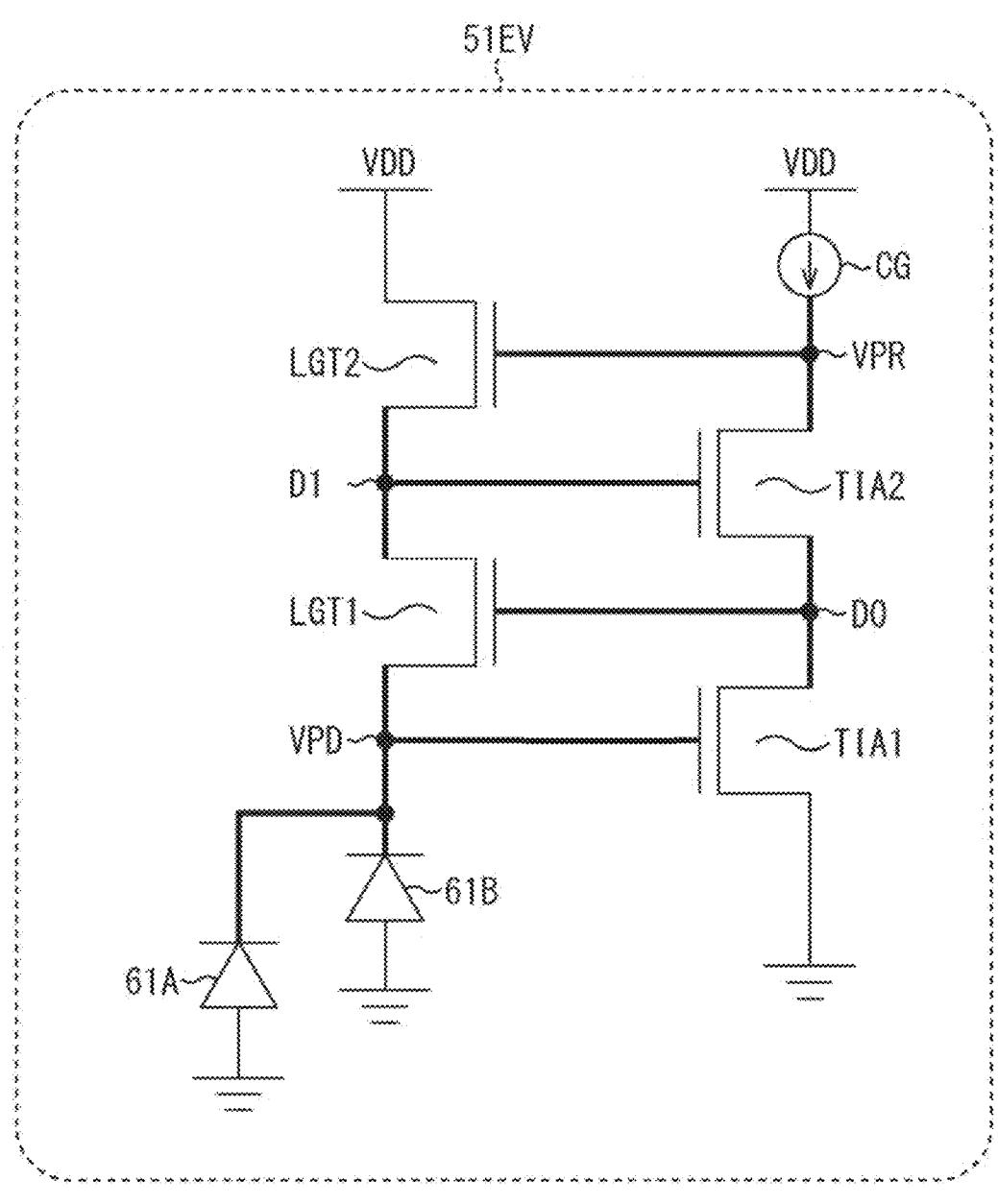
FIG. 75 is a diagram illustrating a current-voltage conversion circuit of an event pixel.

FIG. 75 is a diagram illustrating the current-voltage conversion circuit 121 of the event pixel 51EV again.

The event pixel 51EV includes photodiodes 61A and 61B provided corresponding to two unit regions and an address event detection circuit 62, and FIG. 75 is a diagram illustrating a configuration example of a current-voltage conversion circuit 121 provided on the same semiconductor substrate 201 (FIG. 17) as the photodiodes 61A and 61B in the address event detection circuit 62. However, the constant current source CG is formed on a semiconductor substrate different from the semiconductor substrate 201 on which the photodiodes 61A and 61B are formed. In a case where the photodiodes 61A and 61B are not particularly distinguished, they are simply referred to as photodiodes 61.

The current-voltage conversion circuit 121 of the event pixel 51EV in FIG. 75 has a 4Tr-type configuration provided with the two-stage loop circuit illustrated in FIG. 7. Each of the first logarithmic transistor LGT1 and the second logarithmic transistor LGT2 outputs a voltage signal corresponding to the logarithmic value of the photocurrent generated by photoelectrically converting the incident light. Each of the first amplification transistor TIA1 and the second amplification transistor TIA2 amplifies a voltage between a gate having a potential corresponding to a photocurrent and a source having a predetermined reference potential, and outputs the amplified voltage from a drain. The first logarithmic transistor LGT1 corresponds to the transistor 141 in FIG. 7, and the first amplification transistor TIA1 corresponds to the transistor 143 in FIG. 7. The second logarithmic transistor LGT2 corresponds to the transistor 145 in FIG. 7, and the second amplification transistor TIA2 corresponds to the transistor 146 in FIG. 7. The constant current source CG corresponds to the transistor 142 in FIG. 7.

Hereinafter, the arrangement of the transistors of the current-voltage conversion circuit 121 provided on the same semiconductor substrate 201 as the photodiode 61 will be described as an example of the circuit configuration of the event pixel 51EV. Therefore, even in a case where the event pixel 51EV is simply referred to, only the current-voltage conversion circuit 121 will be described, and the description of circuits other than the current-voltage conversion circuit 121 will be omitted.

In order to distinguish the wiring connecting the transistors of (the current-voltage conversion circuit 121 of) the event pixel 51EV illustrated in FIG. 75, the wiring connected to the gate of the first amplification transistor TIA1 is referred to as a VPD wiring, and the wiring connected to the gate of the first logarithmic transistor LGT1 is referred to as a DO wiring. Furthermore, the wiring connected to the gate of the second amplification transistor TIA2 is referred to as a D1 wiring, and the wiring connected to the gate of the second logarithmic transistor LGT2 is referred to as a VPR wiring. The VPD wiring is connected to the gate of the first amplification transistor TIA1, the cathode terminals of the photodiodes 61A and 61B, and the source of the first logarithmic transistor LGT1. The DO wiring is connected to the gate of the first logarithmic transistor LGT1, the drain of the first amplification transistor TIA1, and the source of the second amplification transistor TIA2. The D1 wiring is connected to the gate of the second amplification transistor TIA2, the drain of the first logarithmic transistor LGT1, and the source of the second logarithmic transistor LGT2. The VPR wiring is connected to the gate of the second logarithmic transistor LGT2, the drain of the second amplification transistor TIA2, the constant current source CG, and the input terminal of the buffer 122 (FIG. 6).

Figure 76:
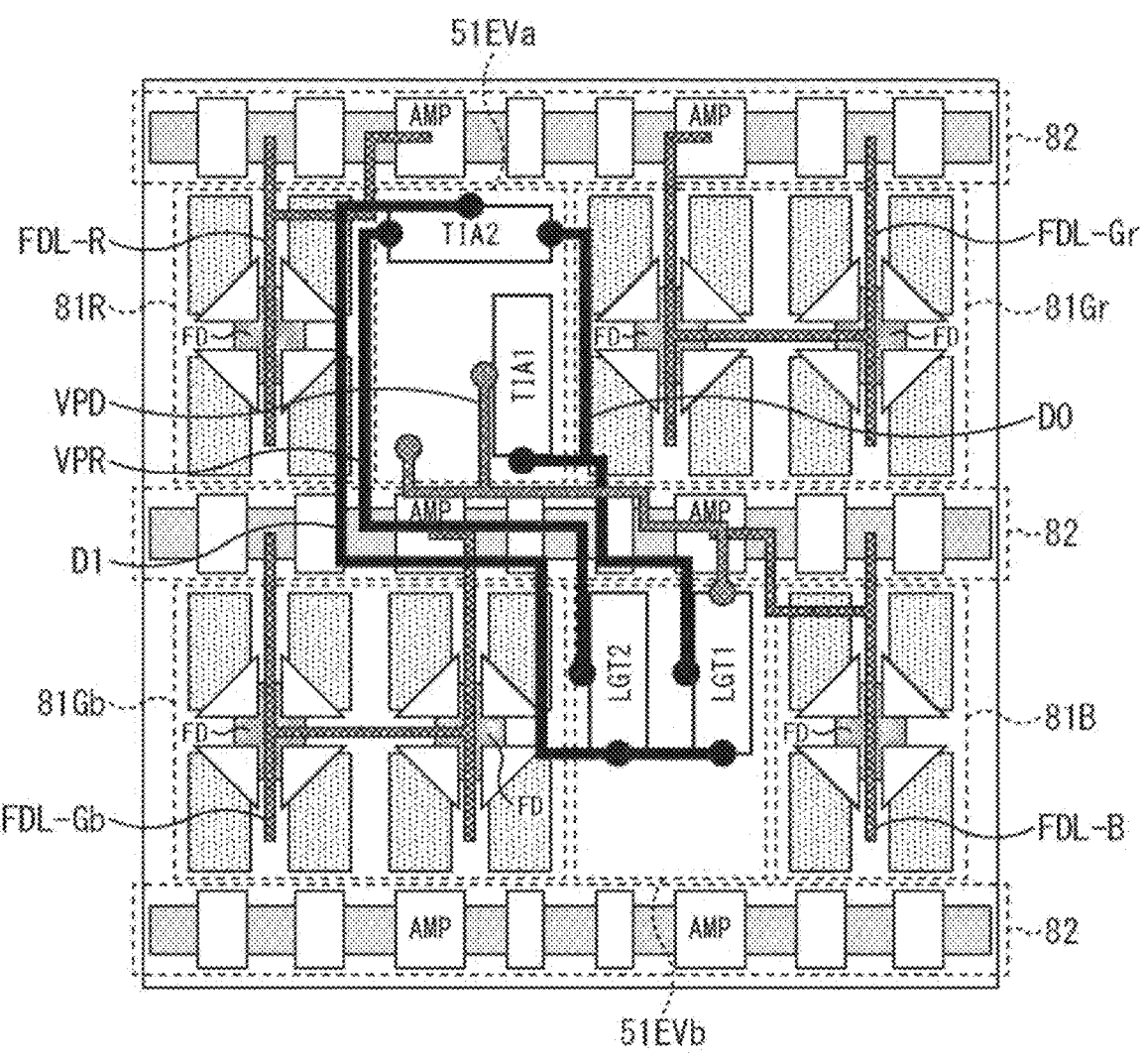
FIG. 76 is a plan view illustrating an example of transistor arrangement of event pixels.

FIG. 76 is a plan view illustrating an example of the transistor arrangement of the event pixel 51EV.

The event pixel 51EV is similar to the pixel layout illustrated in FIG. 10, and includes an event pixel 51EVa in a unit region at the R color filter position and an event pixel 51EVb in a unit region at the B color filter position in an 8×4 32 pixel pixel region having a combination of R, Gr, Gb, and B color filters as repeating units of the Bayer array.

For example, the first amplification transistor TIA1 and the second amplification transistor TIA2 are disposed in the event pixel 51EVa at the R color filter position, and for example, the first logarithmic transistor LGT1 and the second logarithmic transistor LGT2 are disposed in the event pixel 51EVb at the B color filter position. As described above, in a case where the transistors are disposed in the upper left event pixel 51EVa and the lower right event pixel 51EVb, the VPD wiring, the DO wiring, the D1 wiring, and the VPR wiring are wired as illustrated in FIG. 76, for example. In FIG. 76, in a case where the connection point between the VPD wiring, the DO wiring, the D1 wiring, or the VPR wiring and the transistor of the first amplification transistor TIA1, the second amplification transistor TIA2, the first logarithmic transistor LGT1, or the second logarithmic transistor LGT2 is located at both ends of the transistor, the connection point indicates the connection with the source or the drain, and in a case where the connection point is located at the central portion of the transistor, the connection point indicates the connection with the gain.

A connection wiring FDL-R is wired in an R same color region 81R that is a region of the gradation pixel 51G in which the R color filter is formed. The connection wiring FDL-R connects the floating diffusion region FD formed in the central portion of the unit region in the R same color region 81R and the gate of the amplification transistor AMP of the shared pixel transistor region 82.

The connection wiring FDL-Gr is wired in a Gr same color region 81Gr that is a region of the gradation pixel 51G in which the Gr color filter is formed. The connection wiring FDL-Gr connects the floating diffusion region FD formed in the central portion of the unit region in the Gr same color region 81Gr and the gate of the amplification transistor AMP of the shared pixel transistor region 82.

A connection wiring FDL-Gb is wired in a Gb same color region 81Gb which is a region of the gradation pixel 51G in which a Gb color filter is formed. The connection wiring FDL-Gb connects the floating diffusion region FD formed in the central portion of the unit region in the Gb same color region 81Gb and the gate of the amplification transistor AMP of the shared pixel transistor region 82.

A connection wiring FDL-B is wired in a B same color region 81B that is a region of the gradation pixel 51G in which the B color filter is formed. The connection wiring FDL-B connects the floating diffusion region FD formed in the central portion of the unit region in the B same color region 81B and the gate of the amplification transistor AMP of the shared pixel transistor region 82.

Hereinafter, in a case where it is not necessary to particularly distinguish the connection wirings FDL-R, FDL-Gr, FDL-Gb, and FDL-B, they are simply referred to as connection wirings FDL.

As described above, in a case where the first amplification transistor TIA1 and the second amplification transistor TIA2 are disposed in the upper left event pixel 51EVa and the first logarithmic transistor LGT1 and the second logarithmic transistor LGT2 are disposed in the lower right event pixel 51EVb, the VPR wiring, which is the output wiring of (the current-voltage conversion circuit 121 of) the event pixel 51EV, is wired so as to straddle the shared pixel transistor region 82 as illustrated in FIG. 76, and passes near the connection wiring FDL-R of the gradation pixel 51G or near the connection wiring FDL-Gb. As a result, in a case where the event pixel 51EV operates (outputs an event), the VPR wiring and the connection wiring FDL have a coupling capacitance, and the voltage of the floating diffusion region FD of the gradation pixel 51G fluctuates due to the influence of the coupling capacitance, and there is a concern that an artifact occurs, for example, in the peripheral portion of the high luminance moving subject of the captured image.

As described above, an artifact may occur in the captured image depending on the transistor arrangement in the event pixel 51EV, and thus, there is a need for a transistor arrangement that reduces the occurrence of the artifact. Hereinafter, a configuration example of a transistor arrangement for reducing the occurrence of artifacts will be described.

<28. Transistor Arrangement of 4Tr-Type Event Pixel>
<First Transistor Arrangement Example>

Figure 77:
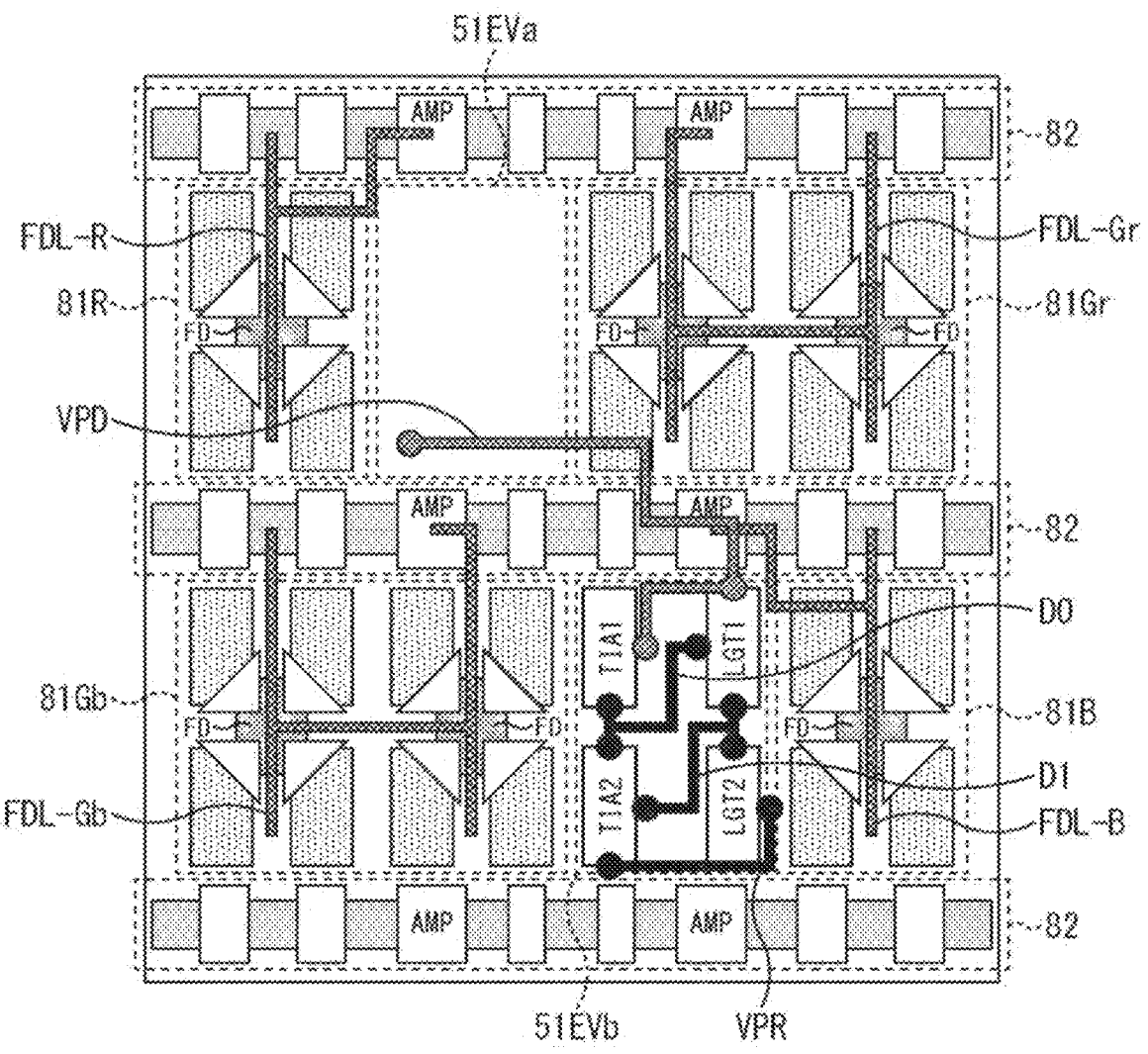
FIG. 77 is a plan view illustrating a first transistor arrangement example of the 4Tr-type event pixel.

FIG. 77 is a plan view illustrating a first transistor arrangement example of the 4Tr-type event pixel.

In the plan views of FIG. 77 and subsequent drawings, parts corresponding to those in the plan view illustrated in FIG. 76 are denoted by the same reference signs, and description of the parts will be omitted as appropriate.

In the first transistor arrangement example illustrated in FIG. 77, all the transistors of the first amplification transistor TIA1, the second amplification transistor TIA2, the first logarithmic transistor LGT1, and the second logarithmic transistor LGT2 are disposed in the event pixel 51EVb on the lower right. In this case, the VPD wiring, the DO wiring, the D1 wiring, and the VPR wiring are wired as illustrated in FIG. 77, for example.

In the first transistor arrangement example, the wiring passing on the shared pixel transistor region 82 between the upper left event pixel 51EVa and the lower right event pixel 51EVb is one of the VPD wirings. Since the VPR wiring connected to the gate of the second logarithmic transistor LGT2 and the drain of the second amplification transistor TIA2 is disposed in the event pixel 51EVb at the lower right, the VPR wiring does not pass through the vicinity of the connection wiring FDL of the gradation pixel 51G without straddling the shared pixel transistor region 82. Therefore, according to the first transistor arrangement example in FIG. 77, it is possible to suppress the voltage fluctuation in the floating diffusion region FD of the gradation pixel 51G and to reduce the occurrence of artifacts.

Note that, in the example of FIG. 77, all the transistors of the first logarithmic transistor LGT1, the second logarithmic transistor LGT2, the first amplification transistor TIA1, and the second amplification transistor TIA2 are disposed in the event pixel 51EVb at the lower right, but a similar effect can be obtained in a case where all the transistors are disposed in the event pixel 51EVa at the upper left. That is, by arranging all the transistors of the first logarithmic transistor LGT1, the second logarithmic transistor LGT2, the first amplification transistor TIA1, and the second amplification transistor TIA2 in either the upper left event pixel 51EVa or the lower right event pixel 51EVb, the coupling capacitance between the connection wiring FDL and the VPR wiring can be reduced, and the occurrence of artifacts caused by the coupling capacitance can be reduced.

<Second Transistor Arrangement Example>

Figure 78:
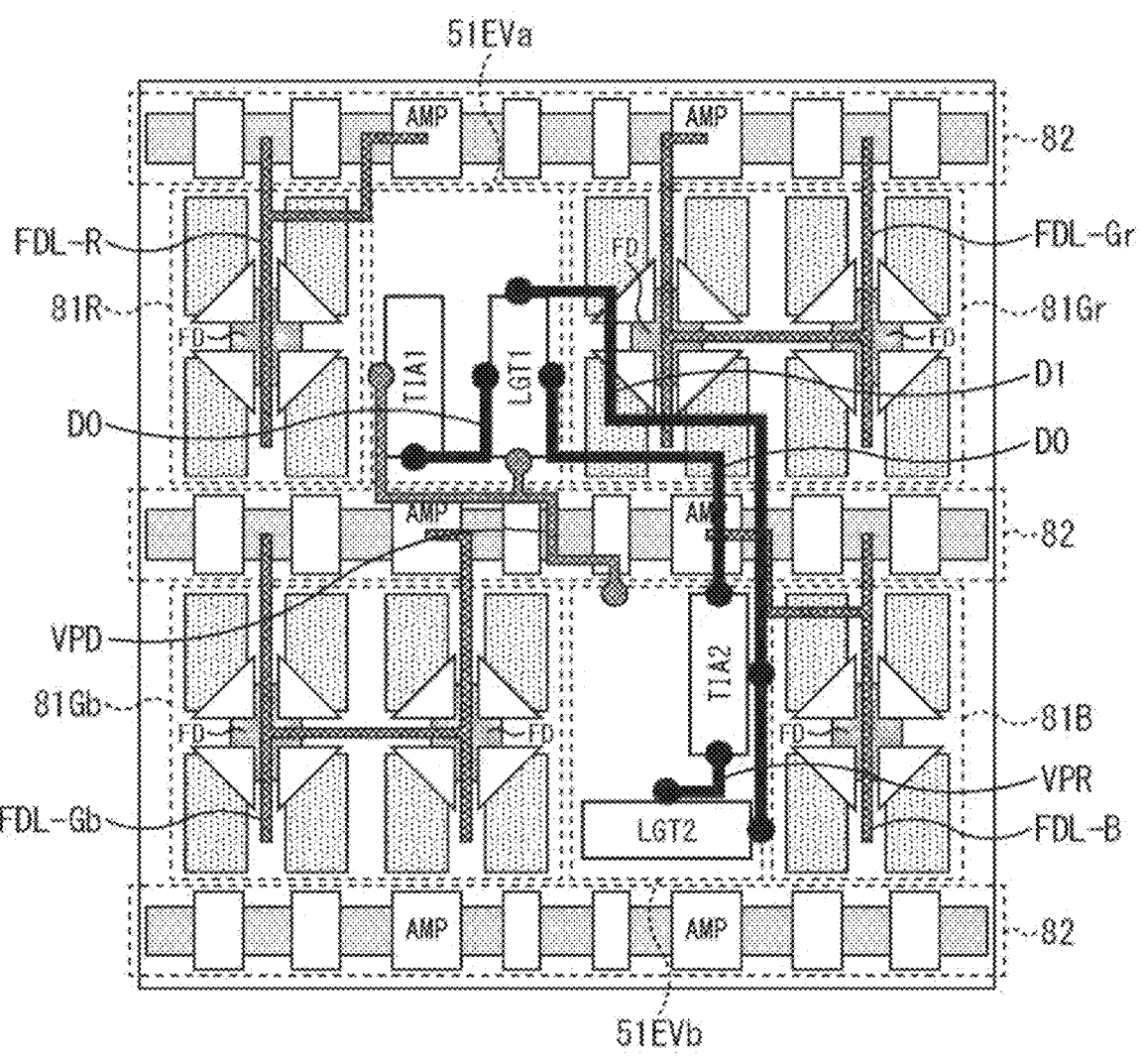
FIG. 78 is a plan view illustrating a second transistor arrangement example of the 4Tr-type event pixel.

FIG. 78 is a plan view illustrating a second transistor arrangement example of the 4Tr-type event pixel.

In the second transistor arrangement example illustrated in FIG. 78, a first logarithmic transistor LGT1 and a first amplification transistor TIA1 are disposed in an upper left event pixel 51EVa, and a second logarithmic transistor LGT2 and a second amplification transistor TIA2 are disposed in a lower right event pixel 51EVb. In other words, the second logarithmic transistor LGT2 and the second amplification transistor TIA2, which are two transistors connected to the VPR wiring, are disposed in one unit region, and the first logarithmic transistor LGT1 and the first amplification transistor TIA1, which are the remaining two transistors, are disposed in the other unit region. In this case, the VPD wiring, the DO wiring, the D1 wiring, and the VPR wiring are wired as illustrated in FIG. 78, for example.

In the second transistor arrangement example, the number of wirings passing over the shared pixel transistor region 82 between the upper left event pixel 51EVa and the lower right event pixel 51EVb is three, namely, the VPD wiring, the DO wiring, and the D1 wiring. Since the VPR wiring is disposed in the event pixel 51EVb at the lower right, the VPR wiring does not pass through the vicinity of the connection wiring FDL of the gradation pixel 51G without straddling the shared pixel transistor region 82. Therefore, according to the second transistor arrangement example in FIG. 78, it is possible to suppress the voltage fluctuation in the floating diffusion region FD of the gradation pixel 51G and to reduce the occurrence of artifacts.

In the first transistor arrangement example illustrated in FIG. 77, since all four transistors are disposed in one unit region, a certain limitation occurs in the transistor size that can be formed in one unit region. In the second transistor arrangement example of FIG. 78, since the number of transistors disposed in one unit region is two, the limitation on the transistor size can be relaxed.

In the second transistor arrangement example, the transistor arrangement of the upper left event pixel 51EVa and the lower right event pixel 51EVb may be switched, and the region in which the two transistors connected to the VPR wiring are disposed may be the upper left event pixel 51EVa, which is similar to the first transistor arrangement example described above.

<Third Transistor Arrangement Example>

Figure 79:
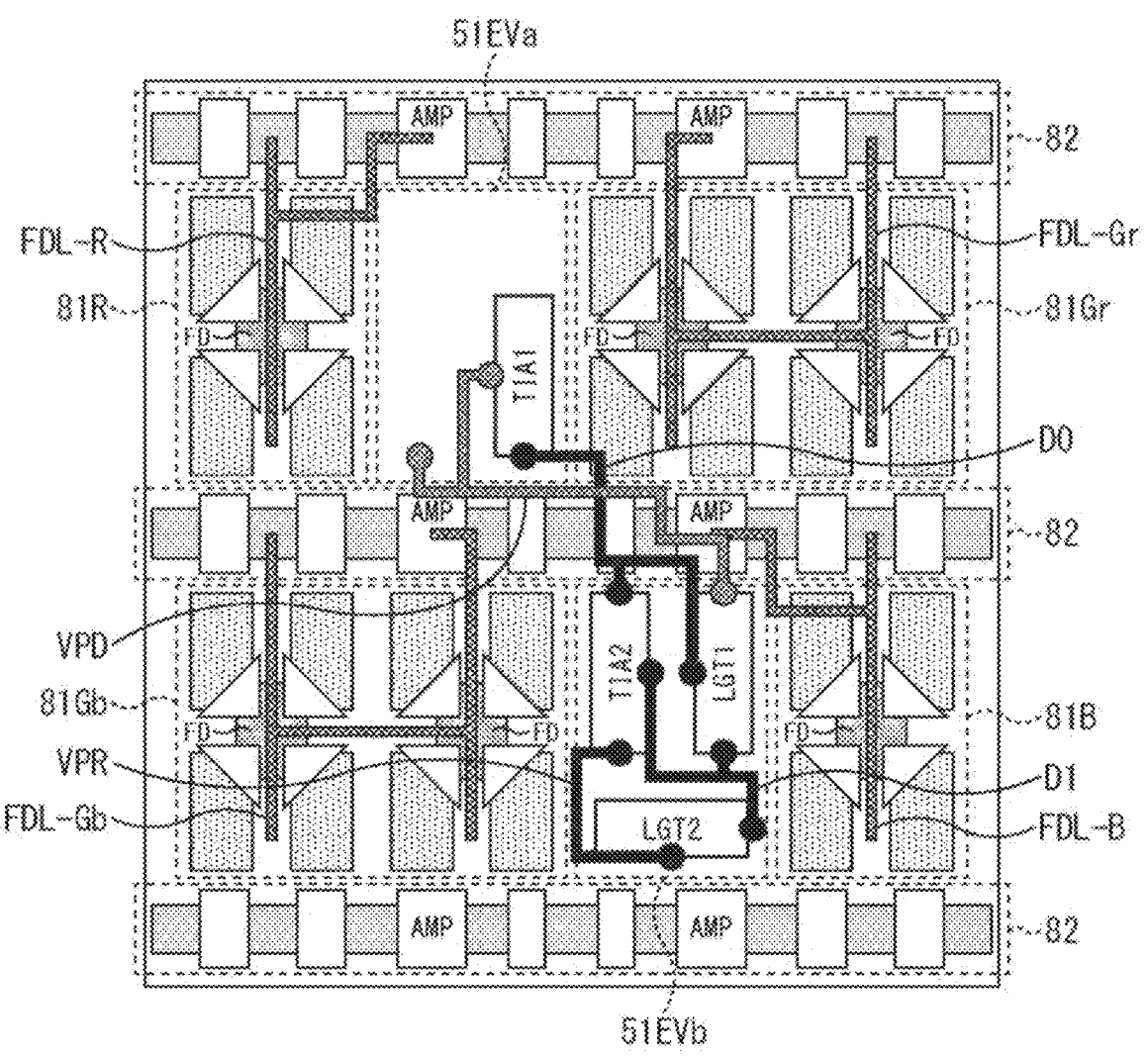
FIG. 79 is a plan view illustrating a third transistor arrangement example of the 4Tr-type event pixel.

FIG. 79 is a plan view illustrating a third transistor arrangement example of the 4Tr-type event pixel.

In the third transistor arrangement example illustrated in FIG. 79, the first amplification transistor TIA1 is disposed in the upper left event pixel 51EVa, and the first logarithmic transistor LGT1, the second logarithmic transistor LGT2, and the second amplification transistor TIA2 are disposed in the lower right event pixel 51EVb. In other words, the first logarithmic transistor LGT1 is further disposed in the same unit region as the second amplification transistor TIA2 and the second logarithmic transistor LGT2, which are two transistors connected to the VPR wiring. In this case, the VPD wiring, the DO wiring, the D1 wiring, and the VPR wiring are wired as illustrated in FIG. 79, for example.

In the third transistor arrangement example, the number of wirings passing on the shared pixel transistor region 82 between the upper left event pixel 51EVa and the lower right event pixel 51EVb is two of the VPD wiring and the DO wiring. Since the VPR wiring is disposed in the event pixel 51EVb at the lower right, the VPR wiring does not pass through the vicinity of the connection wiring FDL of the gradation pixel 51G without straddling the shared pixel transistor region 82. Therefore, according to the third transistor arrangement example in FIG. 79, it is possible to suppress the voltage fluctuation in the floating diffusion region FD of the gradation pixel 51G and to reduce the occurrence of artifacts.

When the third transistor arrangement example in FIG. 79 is compared with the second transistor arrangement example in FIG. 78, the number of wirings passing on the shared pixel transistor region 82 can be reduced from 3 to 2. According to the third transistor arrangement example, in the wiring passing over the shared pixel transistor region 82, only one wiring of the DO wiring can transmit the voltage signal after logarithmic conversion, and as compared with the second transistor arrangement example in which two wiring of the DO wiring and the D1 wiring are provided, the voltage fluctuation in the floating diffusion region FD of the gradation pixel 51G can be further suppressed.

In the third transistor arrangement example, the transistor arrangement of the upper left event pixel 51EVa and the lower right event pixel 51EVb is switched, and the region in which the three transistors of the first logarithmic transistor LGT1, the second logarithmic transistor LGT2, and the second amplification transistor TIA2 are disposed may be the upper left event pixel 51EVa, which is similar to the first transistor arrangement example described above. Arranging three transistors in one unit region improves the degree of freedom of the transistor size as compared with the case where four transistors are disposed as in the first transistor arrangement example.

<Fourth Transistor Arrangement Example>

Figure 80:
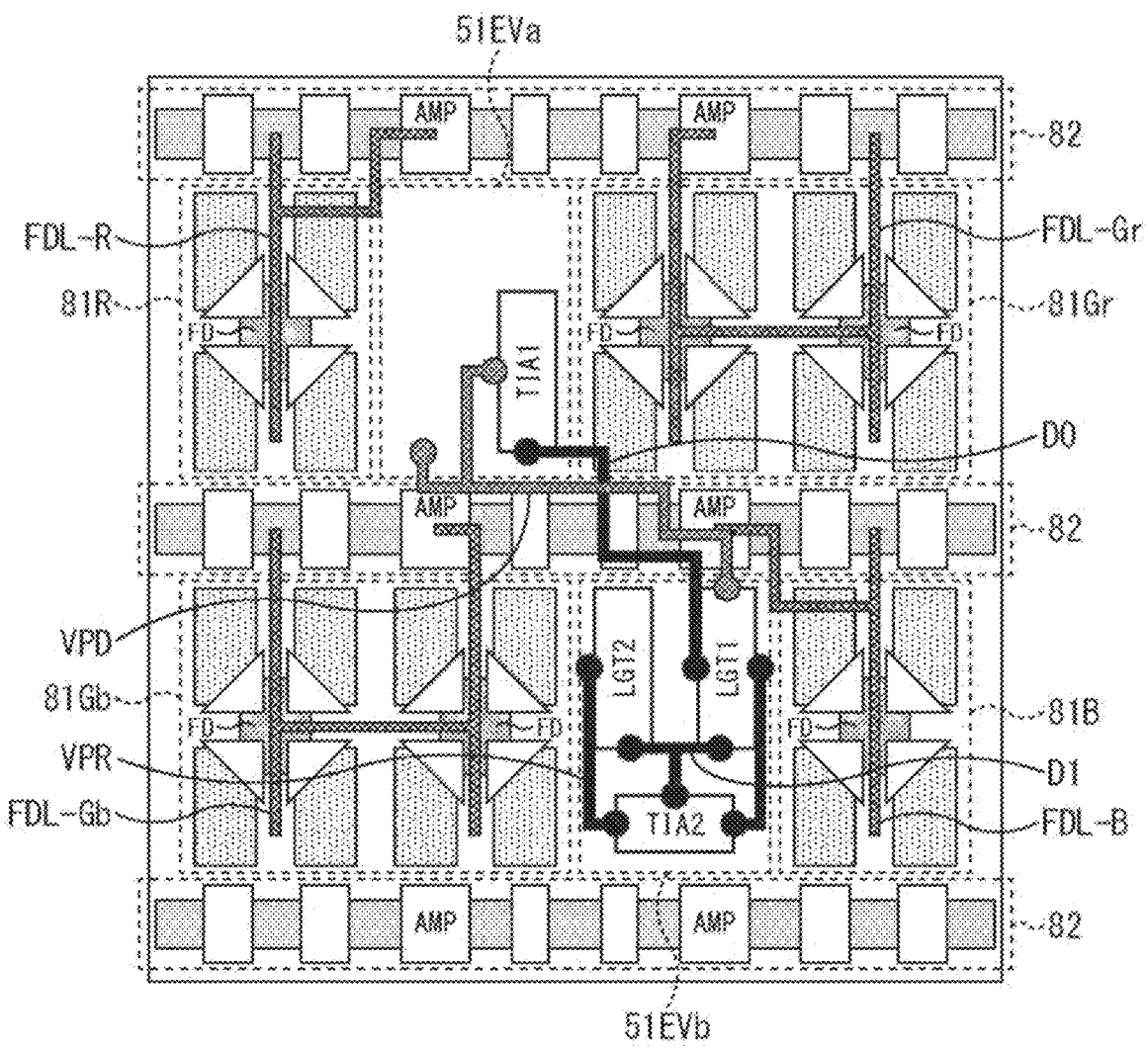
FIG. 80 is a plan view illustrating a fourth transistor arrangement example of the 4Tr-type event pixel.

FIG. 80 is a plan view illustrating a fourth transistor arrangement example of the 4Tr-type event pixel.

In the fourth transistor arrangement example illustrated in FIG. 80, the types of transistors disposed in the upper left event pixel 51EVa and the lower right event pixel 51EVb are similar to those in the third transistor arrangement example illustrated in FIG. 79. On the other hand, the fourth transistor arrangement example is different from the third transistor arrangement example illustrated in FIG. 79 in the arrangement of three transistors in the event pixel 51EVb at the lower right.

Specifically, in the third transistor arrangement example illustrated in FIG. 79, the second logarithmic transistor LGT2 is disposed in the lateral direction at the position closest to the amplification transistor AMP in the lower shared pixel transistor region 82, the second amplification transistor TIA2 is disposed on the left side close to the upper left event pixel 51EVa in the vertical direction perpendicular to the second logarithmic transistor LGT2, and the first logarithmic transistor LGT1 is disposed on the right side.

On the other hand, in the fourth transistor arrangement example in FIG. 80, the second amplification transistor TIA2 is disposed in the lateral direction at the position closest to the amplification transistor AMP of the lower shared pixel transistor region 82, the second logarithmic transistor LGT2 is disposed on the left side close to the upper left event pixel 51EVa in the vertical direction perpendicular to the second amplification transistor TIA2, and the first logarithmic transistor LGT1 is disposed on the right side. In this case, the VPD wiring, the DO wiring, the D1 wiring, and the VPR wiring are wired as illustrated in FIG. 80, for example.

In the fourth transistor arrangement example, the number of wirings passing on the shared pixel transistor region 82 between the upper left event pixel 51EVa and the lower right event pixel 51EVb is two of the VPD wiring and the DO wiring. Since the VPR wiring is disposed in the event pixel 51EVb at the lower right, the VPR wiring does not pass through the vicinity of the connection wiring FDL of the gradation pixel 51G without straddling the shared pixel transistor region 82. Therefore, according to the fourth transistor arrangement example in FIG. 80, it is possible to suppress the voltage fluctuation in the floating diffusion region FD of the gradation pixel 51G and to reduce the occurrence of artifacts.

In the fourth transistor arrangement example, in the wiring passing over the shared pixel transistor region 82, only one wiring of the DO wiring can transmit the voltage signal after logarithmic conversion, and the voltage fluctuation in the floating diffusion region FD of the gradation pixel 51G can be further reduced.

Furthermore, in the fourth transistor arrangement example, among the three transistors disposed in the lower right event pixel 51EVb, the gate of the second logarithmic transistor LGT2 to which the VPR wiring is connected is disposed at the position farthest from the amplification transistor AMP of the shared pixel transistor region 82, specifically, at the position closest to the upper left event pixel 51EVa in the lower right event pixel 51EVb. As a result, the capacitance between the gate of the second logarithmic transistor LGT2 and the gate of the amplification transistor AMP can be further reduced, and the voltage fluctuation in the floating diffusion region FD of the gradation pixel 51G can be further suppressed.

In the fourth transistor arrangement example, the transistor arrangement of the upper left event pixel 51EVa and the lower right event pixel 51EVb is switched, and the region in which the three transistors of the first logarithmic transistor LGT1, the second logarithmic transistor LGT2, and the second amplification transistor TIA2 are disposed may be the upper left event pixel 51EVa, which is similar to the first transistor arrangement example described above. Arranging three transistors in one unit region improves the degree of freedom of the transistor size as compared with the case where four transistors are disposed as in the first transistor arrangement example.

<29. Summary of 4Tr-Type Event Pixels>

In the event pixel 51EV of the 4Tr-type provided with the loop circuit of two stages illustrated in FIG. 75, at least two transistors (the second logarithmic transistor LGT2 and the second amplification transistor TIA2) connected to the VPR wiring which is the output wiring are disposed in any one of two unit regions in the diagonal direction of the event pixel 51EVa and the event pixel 51EVb. As a result, the voltage fluctuation of the floating diffusion region FD due to the coupling capacitance can be suppressed, and the occurrence of artifacts can be reduced. Moreover, in a case where the second logarithmic transistor LGT2 connected to the VPR wiring among the plurality of transistors disposed in the unit region is disposed at a position farthest from the amplification transistor AMP of the gradation pixel 51G, the capacitance between the gate of the second logarithmic transistor LGT2 and the gate of the amplification transistor AMP can be further reduced, and the voltage fluctuation of the floating diffusion region FD can be further suppressed.

<30. Transistor Arrangement of 4Tr-Type Event Pixel with Addition>

<Circuit Configuration Example of 4Tr-Type Event Pixel with Addition>

As also illustrated in FIG. 35, the imaging device 1 can have a configuration in which one addition transistor BIN is provided for one event pixel 51EV provided in two unit regions, and one or more other event pixels 51EV adjacent to each other can be connected by the addition transistor BIN.

Figure 81:
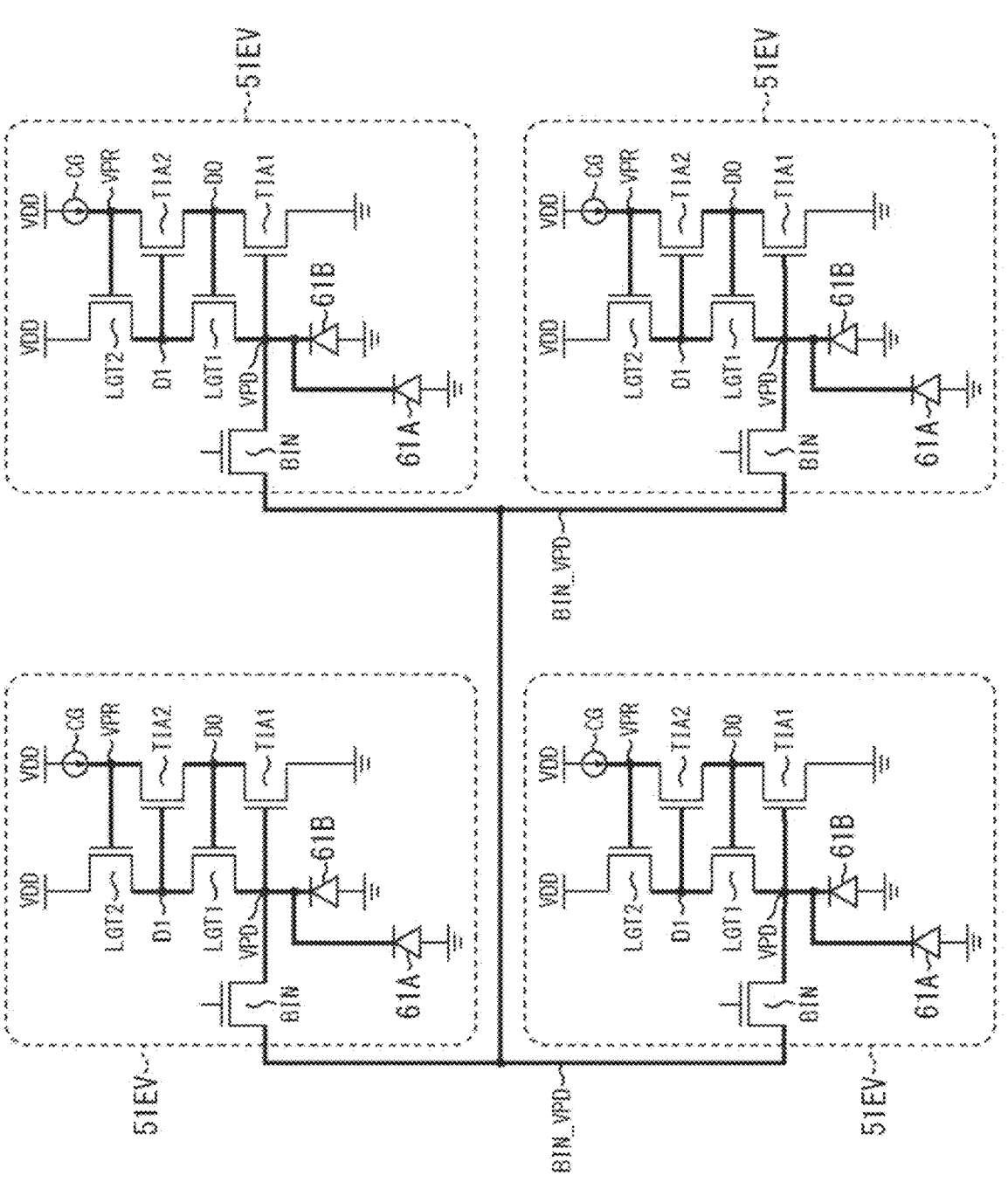
FIG. 81 is a diagram illustrating a circuit configuration example of an event pixel connectable by an addition transistor.

FIG. 81 illustrates a circuit configuration example of the event pixel 51EV connectable by the addition transistor BIN.

The event pixel 51EV is connectable to four adjacent event pixels 51EV by an addition transistor BIN. The source of the addition transistor BIN newly added to each event pixel 51EV is connected to the VPD wiring, and the drain of the addition transistor BIN is connected to the drain of the addition transistor BIN of another event pixel 51EV to be connected by the BIN_VPD wiring. Such an event pixel 51EV is referred to as a 4Tr-type event pixel with addition.

Figure 82:
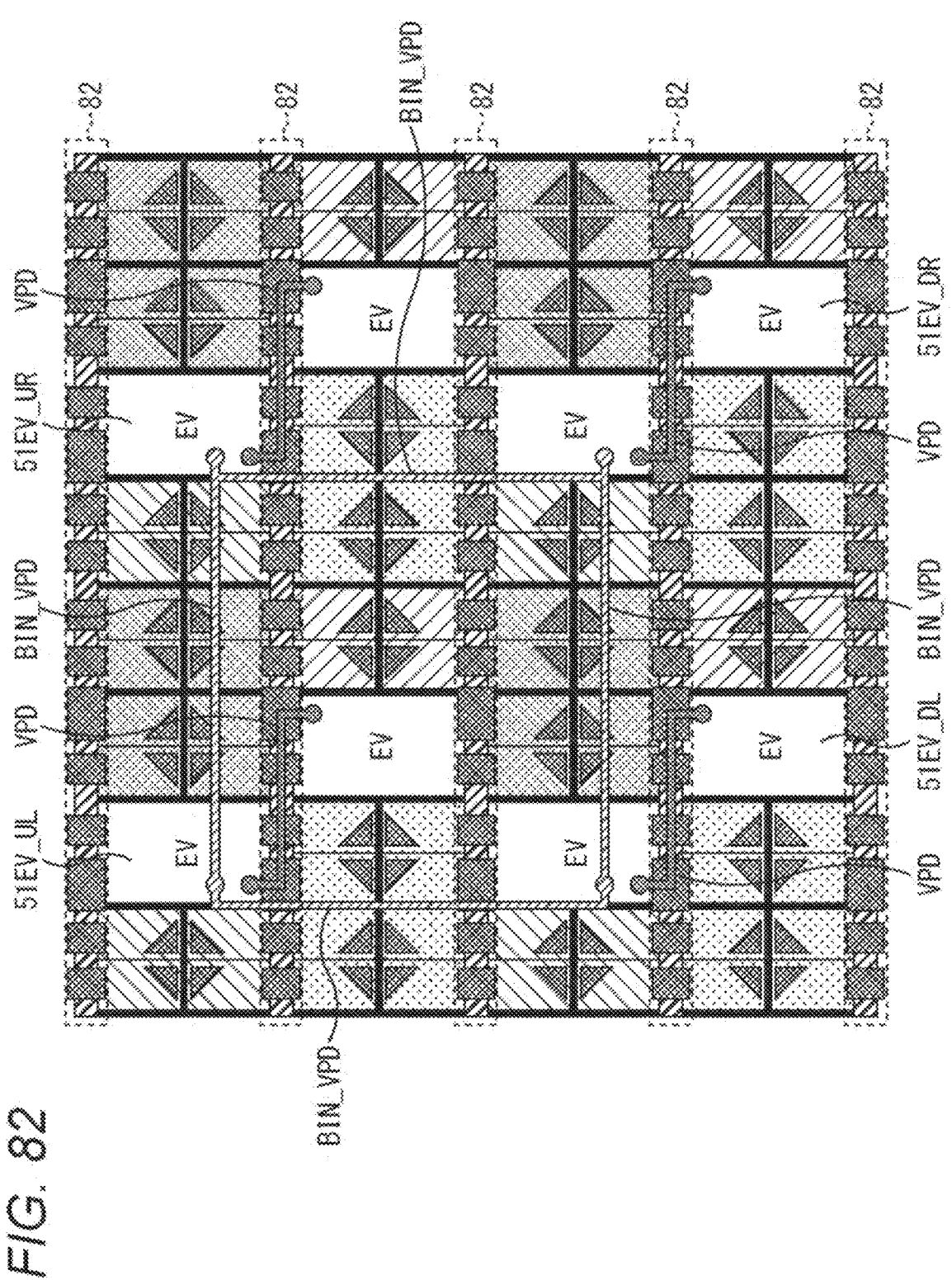
FIG. 82 is a plan view of a pixel layout illustrating an arrangement example of four event pixels connected by an addition transistor.

FIG. 82 is a plan view of a pixel layout illustrating an arrangement example of four 4Tr-type event pixels 51EV with addition.

The event pixel 51EV_UL is a 4Tr-type event pixel 51EV with addition disposed at the upper left among the four 4Tr-type event pixels 51EV with addition of 2×2 connected by the addition transistor BIN, and the event pixel 51EV_UR is a 4Tr-type event pixel 51EV with addition disposed at the upper right. The event pixel 51EV_DL is the 4Tr-type event pixel 51EV with addition disposed at the lower left among the four 4Tr-type event pixels 51EV with addition connected by the addition transistor BIN, and the event pixel 51EV_DR is the 4Tr type event pixel 51EV with addition disposed at the lower right.

The BIN_VPD wiring connects four event pixels 51EV_UL, 51EV_UR, 51EV_DL, and 51EV_DR in 2×2. The VPD wiring connects (the cathode terminals of) the photodiodes 61A and 61B provided in two unit regions of each of the event pixels 51EV_UL, 51EV_UR, 51EV_DL, and 51EV_DR.

The layout of the 4Tr-type event pixel EV with addition and the gradation pixel 51G is similar to the third pixel layout illustrated in FIG. 10. The 4Tr-type event pixel 51EV with addition is formed in a unit region at the R color filter position and a unit region at the B color filter position, and is formed adjacent to each other in the diagonal direction. The reference signs of the gradation pixels 51G are omitted to prevent complication.

<First Transistor Arrangement Example>

Figure 83:
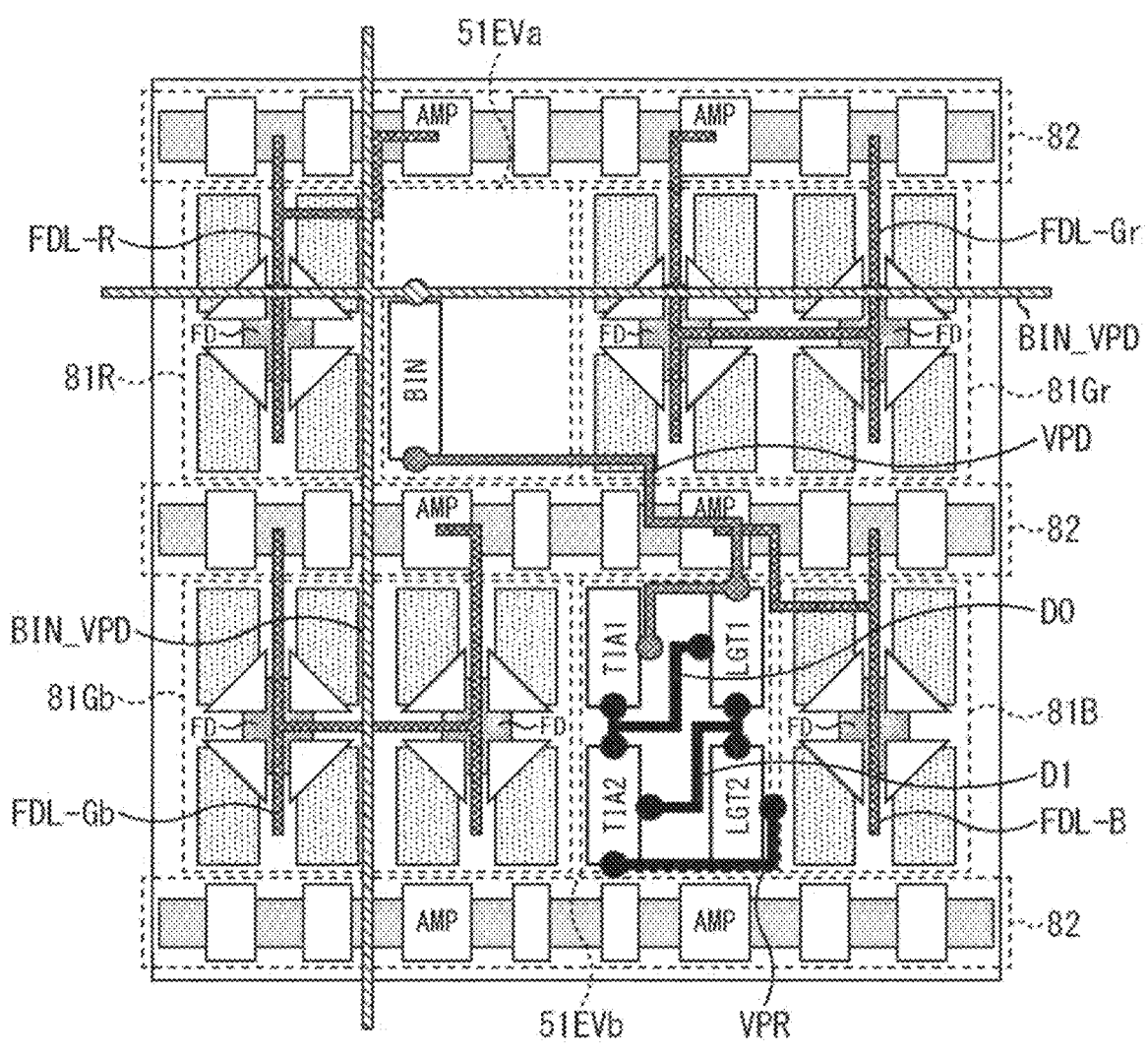
FIG. 83 is a plan view illustrating a first transistor arrangement example of the 4Tr-type event pixel with addition.

FIG. 83 is a plan view illustrating a first transistor arrangement example of the 4Tr-type event pixel with addition.

In the first transistor arrangement example illustrated in FIG. 83, the addition transistor BIN is disposed in the upper left event pixel 51EVa, and the four transistors of the first amplification transistor TIA1, the second amplification transistor TIA2, the first logarithmic transistor LGT1, and the second logarithmic transistor LGT2 are disposed in the lower right event pixel 51EVb. In this case, the VPD wiring, the DO wiring, the D1 wiring, the VPR wiring, and the BIN_VPD wiring are wired as illustrated in FIG. 83, for example.

In the first transistor arrangement example, the wiring passing on the shared pixel transistor region 82 between the upper left event pixel 51EVa and the lower right event pixel 51EVb is one of the VPD wirings. Since the VPR wiring connected to the gate of the second logarithmic transistor LGT2 and the drain of the second amplification transistor TIA2 is disposed in the event pixel 51EVb at the lower right, the VPR wiring does not pass through the vicinity of the connection wiring FDL of the gradation pixel 51G without straddling the shared pixel transistor region 82. Therefore, according to the first transistor arrangement example in FIG. 83, it is possible to suppress the voltage fluctuation in the floating diffusion region FD of the gradation pixel 51G and to reduce the occurrence of artifacts.

Note that, in the example of FIG. 83, the four transistors of the first logarithmic transistor LGT1, the second logarithmic transistor LGT2, the first amplification transistor TIA1, and the second amplification transistor TIA2 are disposed in the event pixel 51EVb at the lower right; however, a similar effect can also be obtained in a case where the transistor arrangement of the event pixel 51EVa at the upper left and the event pixel 51EVb at the lower right is switched and disposed in the event pixel 51EVa at the upper left.

<Second Transistor Arrangement Example>

Figure 84:
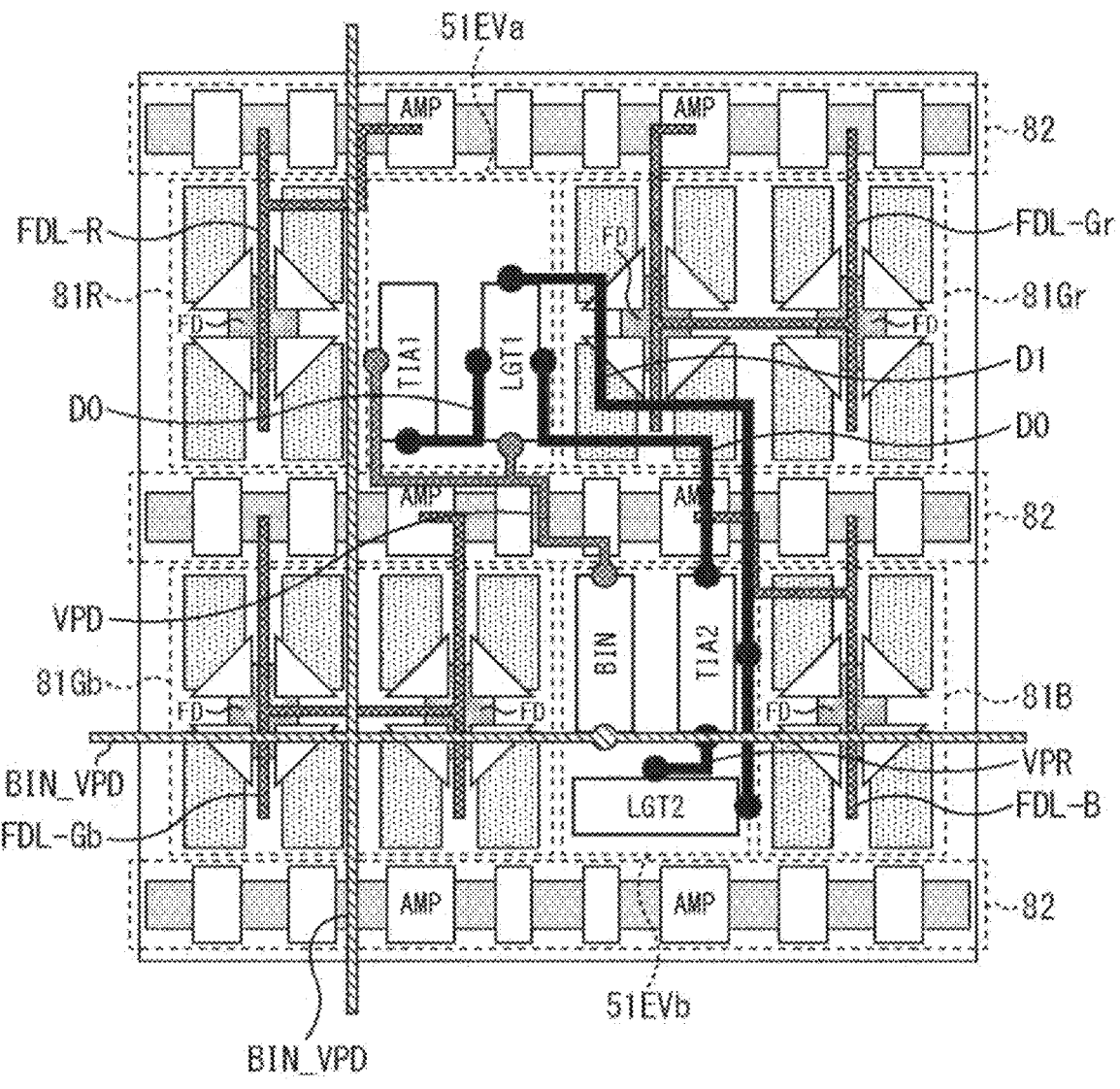
FIG. 84 is a plan view illustrating a second transistor arrangement example of the 4Tr-type event pixel with addition.

FIG. 84 is a plan view illustrating a second transistor arrangement example of the 4Tr-type event pixel with addition.

In the second transistor arrangement example illustrated in FIG. 84, the first logarithmic transistor LGT1 and the first amplification transistor TIA1 are disposed in the upper left event pixel 51EVa, and the addition transistor BIN, the second logarithmic transistor LGT2, and the second amplification transistor TIA2 are disposed in the lower right event pixel 51EVb. The second logarithmic transistor LGT2 and the second amplification transistor TIA2, which are two transistors connected to the VPR wiring, are disposed in one unit region. In this case, the VPD wiring, the DO wiring, the D1 wiring, the VPR wiring, and the BIN_VPD wiring are wired as illustrated in FIG. 84, for example.

In the second transistor arrangement example, the number of wirings passing over the shared pixel transistor region 82 between the upper left event pixel 51EVa and the lower right event pixel 51EVb is three, namely, the VPD wiring, the DO wiring, and the D1 wiring. Since the VPR wiring is disposed in the event pixel 51EVb at the lower right, the VPR wiring does not pass through the vicinity of the connection wiring FDL of the gradation pixel 51G without straddling the shared pixel transistor region 82. Therefore, according to the second transistor arrangement example in FIG. 84, it is possible to suppress the voltage fluctuation in the floating diffusion region FD of the gradation pixel 51G and to reduce the occurrence of artifacts.

In the first transistor arrangement example illustrated in FIG. 83, since four transistors are disposed in one unit region, a certain limitation occurs in the transistor size that can be formed in one unit region. In the second transistor arrangement example of FIG. 84, since the number of transistors disposed in one unit region is 3, the limitation on the transistor size can be relaxed. Arranging three transistors in one unit region improves the degree of freedom of the transistor size as compared with a case where four transistors are disposed.

Also in the second transistor arrangement example, the transistor arrangement of the upper left event pixel 51EVa and the lower right event pixel 51EVb can be interchanged. In this case, a similar effect can be obtained.

<Third Transistor Arrangement Example>

Figure 85:
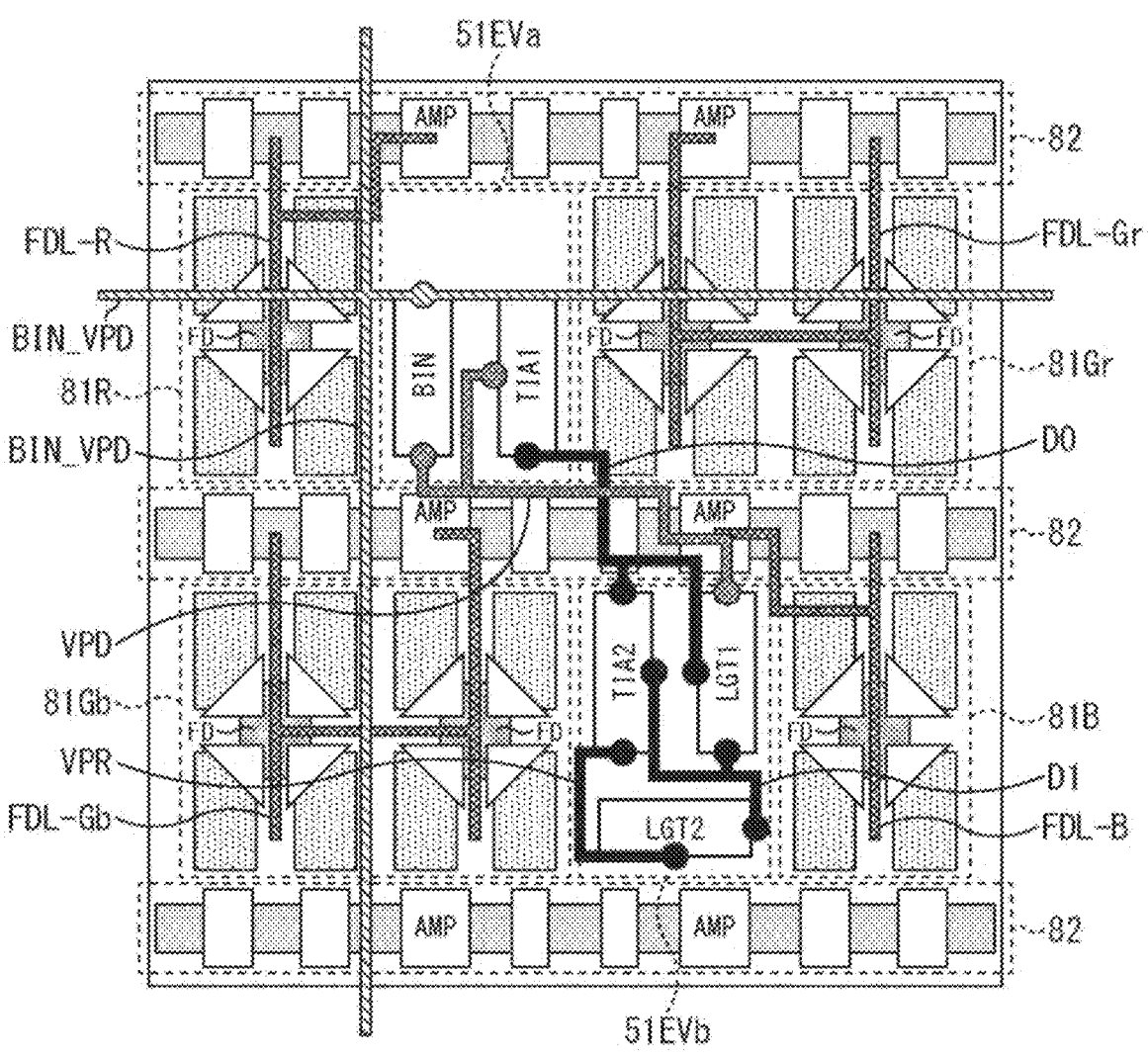
FIG. 85 is a plan view illustrating a third transistor arrangement example of the 4Tr-type event pixel with addition.

FIG. 85 is a plan view illustrating a third transistor arrangement example of the 4Tr-type event pixel with addition.

In the third transistor arrangement example illustrated in FIG. 85, the addition transistor BIN and the first amplification transistor TIA1 are disposed in the upper left event pixel 51EVa, and the first logarithmic transistor LGT1, the second logarithmic transistor LGT2, and the second amplification transistor TIA2 are disposed in the lower right event pixel 51EVb. In other words, the first logarithmic transistor LGT1 is additionally disposed in the same unit region as the second amplification transistor TIA2 and the second logarithmic transistor LGT2, which are two transistors connected to the VPR wiring, and the addition transistor BIN and the first amplification transistor TIA1 are disposed in the other unit region. In this case, the VPD wiring, the DO wiring, the D1 wiring, and the VPR wiring are wired as illustrated in FIG. 85, for example.

In the third transistor arrangement example, the number of wirings passing on the shared pixel transistor region 82 between the upper left event pixel 51EVa and the lower right event pixel 51EVb is two of the VPD wiring and the DO wiring. Since the VPR wiring is disposed in the event pixel 51EVb at the lower right, the VPR wiring does not pass through the vicinity of the connection wiring FDL of the gradation pixel 51G without straddling the shared pixel transistor region 82. Therefore, according to the third transistor arrangement example in FIG. 85, it is possible to suppress the voltage fluctuation in the floating diffusion region FD of the gradation pixel 51G and to reduce the occurrence of artifacts.

When the third transistor arrangement example in FIG. 85 is compared with the second transistor arrangement example in FIG. 84, the number of wirings passing on the shared pixel transistor region 82 can be reduced from 3 to 2. In the third transistor arrangement example, only one wiring of the DO wiring can transmit the voltage signal after logarithmic conversion in the wiring passing over the shared pixel transistor region 82, and the voltage fluctuation in the floating diffusion region FD of the gradation pixel 51G can be further suppressed as compared with the second configuration example in which two wirings of the DO wiring and the D1 wiring are used.

Also in the third transistor arrangement example, the transistor arrangement of the upper left event pixel 51EVa and the lower right event pixel 51EVb can be interchanged. In this case, a similar effect can be obtained. Arranging three transistors in one unit region improves the degree of freedom of the transistor size as compared with the case where four transistors are disposed as in the first transistor arrangement example.

<Fourth Transistor Arrangement Example>

Figure 86:
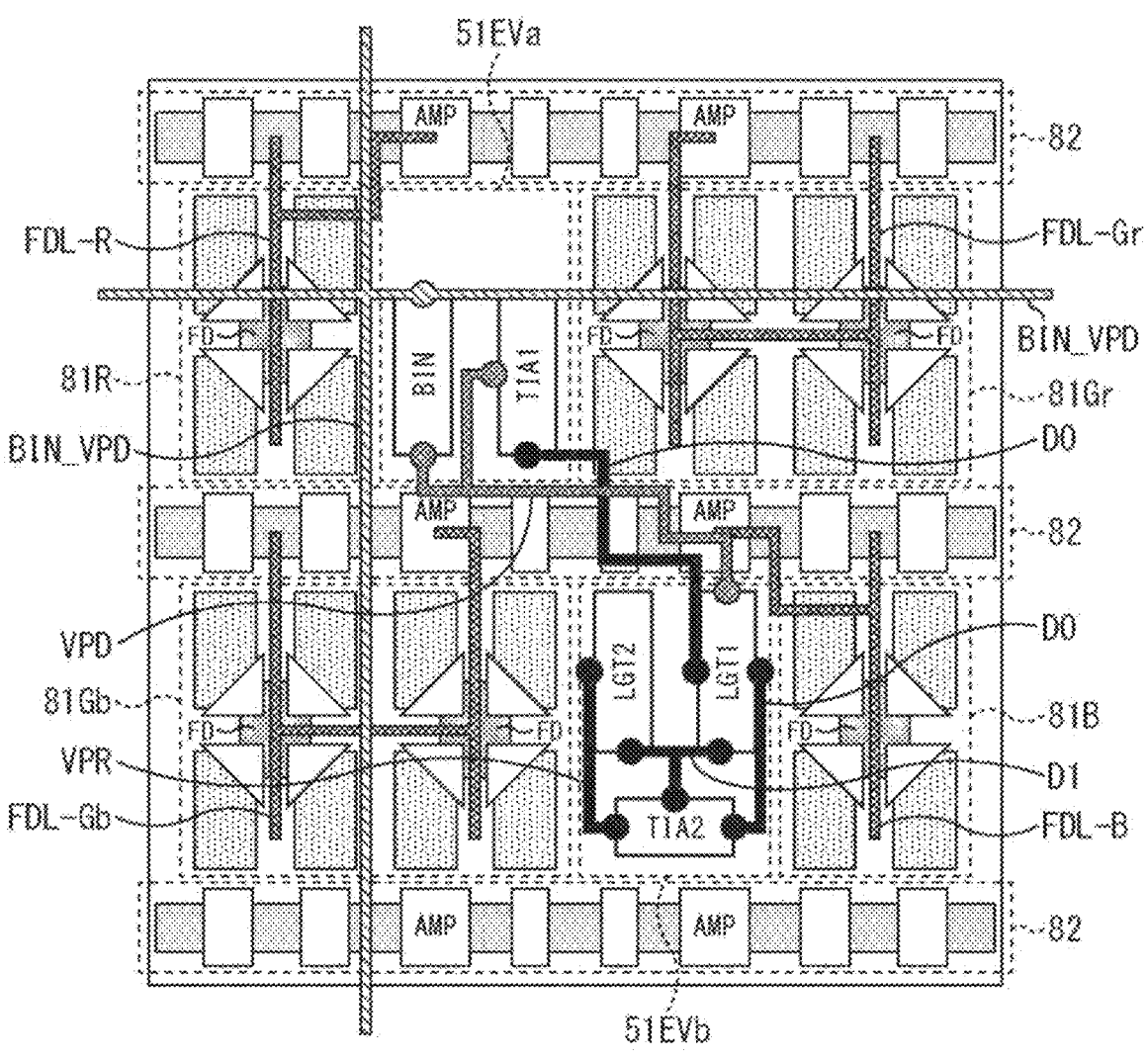
FIG. 86 is a plan view illustrating a fourth transistor arrangement example of the 4Tr-type event pixel with addition.

FIG. 86 is a plan view illustrating a fourth transistor arrangement example of the 4Tr-type event pixel with addition.

In the fourth transistor arrangement example illustrated in FIG. 86, the types of transistors disposed in the upper left event pixel 51EVa and the lower right event pixel 51EVb are similar to those in the third transistor arrangement example illustrated in FIG. 85. On the other hand, the fourth transistor arrangement example is different from the third transistor arrangement example illustrated in FIG. 85 in the arrangement of three transistors in the event pixel 51EVb at the lower right.

Specifically, in the third transistor arrangement example illustrated in FIG. 85, the second logarithmic transistor LGT2 is disposed in the lateral direction at the position closest to the amplification transistor AMP in the lower shared pixel transistor region 82, the second amplification transistor TIA2 is disposed on the left side close to the upper left event pixel 51EVa in the vertical direction perpendicular to the second logarithmic transistor LGT2, and the first logarithmic transistor LGT1 is disposed on the right side.

On the other hand, in the fourth transistor arrangement example in FIG. 86, the second amplification transistor TIA2 is disposed in the lateral direction at the position closest to the amplification transistor AMP of the lower shared pixel transistor region 82, the second logarithmic transistor LGT2 is disposed on the left side close to the upper left event pixel 51EVa in the vertical direction perpendicular to the second amplification transistor TIA2, and the first logarithmic transistor LGT1 is disposed on the right side. In this case, the VPD wiring, the DO wiring, the D1 wiring, the VPR wiring, and the BIN_VPD wiring are wired as illustrated in FIG. 86, for example.

In the fourth transistor arrangement example, the number of wirings passing on the shared pixel transistor region 82 between the upper left event pixel 51EVa and the lower right event pixel 51EVb is two of the VPD wiring and the DO wiring. Since the VPR wiring is disposed in the event pixel 51EVb at the lower right, the VPR wiring does not pass through the vicinity of the connection wiring FDL of the gradation pixel 51G without straddling the shared pixel transistor region 82. Therefore, according to the fourth transistor arrangement example in FIG. 86, it is possible to suppress the voltage fluctuation in the floating diffusion region FD of the gradation pixel 51G and to reduce the occurrence of artifacts.

In the fourth transistor arrangement example, in the wiring passing over the shared pixel transistor region 82, only one wiring of the DO wiring can transmit the voltage signal after logarithmic conversion, and the voltage fluctuation in the floating diffusion region FD of the gradation pixel 51G can be further reduced.

Furthermore, in the fourth transistor arrangement example, among the three transistors disposed in the lower right event pixel 51EVb, the gate of the second logarithmic transistor LGT2 to which the VPR wiring is connected is disposed at the position farthest from the amplification transistor AMP of the shared pixel transistor region 82, specifically, at the position closest to the upper left event pixel 51EVa in the lower right event pixel 51EVb. As a result, the capacitance between the gate of the second logarithmic transistor LGT2 and the gate of the amplification transistor AMP can be further reduced, and the voltage fluctuation in the floating diffusion region FD of the gradation pixel 51G can be further suppressed.

Also in the fourth transistor arrangement example, the transistor arrangement of the upper left event pixel 51EVa and the lower right event pixel 51EVb can be interchanged. In a case where the second amplification transistor TIA2, the first logarithmic transistor LGT1, and the second logarithmic transistor LGT2 are disposed in the upper left event pixel 51EVa, the second logarithmic transistor LGT2 is disposed at a position farthest from the amplification transistor AMP of the shared pixel transistor region 82 adjacent vertically. Arranging three transistors in one unit region improves the degree of freedom of the transistor size as compared with the case where four transistors are disposed as in the first transistor arrangement example.

<31. Summary of 4Tr-Type Event Pixels with Addition>

Also in the 4Tr-type event pixel 51EV with addition provided with the addition transistor BIN illustrated in FIG.

81, at least two transistors (the second logarithmic transistor LGT2 and the second amplification transistor TIA2) connected to the VPR wiring that is the output wiring are disposed in any one of the two unit regions in the diagonal direction of the event pixel 51EVa and the event pixel 51EVb. As a result, the voltage fluctuation of the floating diffusion region FD due to the coupling capacitance can be suppressed, and the occurrence of artifacts can be reduced. The addition transistor BIN may be disposed in a unit region (upper left event pixel 51EVa) different from the unit region (lower right event pixel 51EVb) in which the second logarithmic transistor LGT2 and the second amplification transistor TIA2 are disposed as in the examples of FIGS. 83 and 85, for example, or may be disposed in the same unit region as the unit region (lower right event pixel 51EVb) in which the second logarithmic transistor LGT2 and the second amplification transistor TIA2 are disposed as in the example of FIG. 84.

<32. Transistor Arrangement of One-Stage Diode Type Event Pixel>

<Circuit Configuration Example of One-Stage Diode Type Event Pixel>

In the above-described example, the circuit configuration of the 4Tr-type event pixel 51EV provided with the loop circuit of two stages has been described. The current-voltage conversion circuit 121 of the event pixel 51EV can include a diode-connected logarithmic transistor instead of providing a loop circuit.

Figure 87:
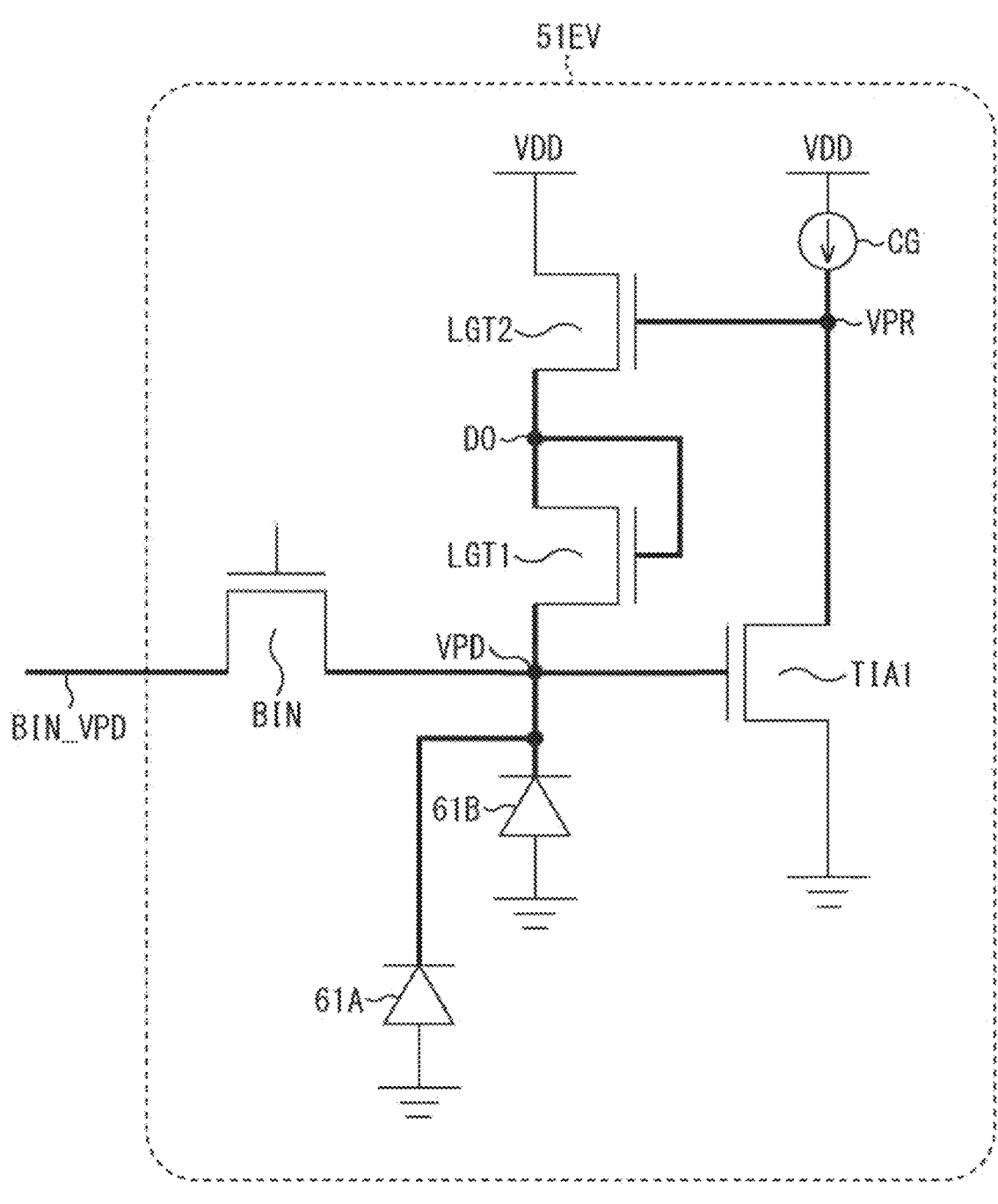
FIG. 87 is a diagram illustrating a circuit configuration example of a one-stage diode type event pixel.

FIG. 87 is a diagram illustrating a circuit configuration example of an event pixel 51EV including a one-stage loop circuit and one logarithmic transistor diode-connected.

The event pixel 51EV in FIG. 87 includes a one-stage loop circuit including a first amplification transistor TIA1 and a second logarithmic transistor LGT2, a diode-connected first logarithmic transistor LGT1, and an addition transistor BIN. In the case of a configuration not connected to another event pixel 51EV, the addition transistor BIN is omitted. When the event pixel 51EV is compared with the circuit configuration including the two-stage loop circuit illustrated in FIG. 81, the second amplification transistor TIA2 is omitted, and the first logarithmic transistor LGT1 is changed to a so-called diode connection in which a drain and a gate are connected. The VPD wiring is connected to the gate of the first amplification transistor TIA1, the cathode terminals of the photodiodes 61A and 61B, the source of the first logarithmic transistor LGT1, and the source of the addition transistor BIN. The DO wiring is connected to the gate and the drain of the first logarithmic transistor LGT1 and the source of the second logarithmic transistor LGT2. The VPR wiring is connected to the gate of the second logarithmic transistor LGT2, the drain of the first amplification transistor TIA1, the constant current source CG, and the input terminal of the buffer 122 (FIG. 6). The BIN_VPD wiring is connected to the drain of the addition transistor BIN and the drain of the addition transistor BIN of another event pixel 51EV to be connected. By changing the single-stage loop circuit to the diode-connected logarithmic transistor LGT, the upper limit of the output voltage can be reduced without changing the conversion gain. The event pixel 51EV having such a one-stage loop circuit and one logarithmic transistor of diode connection is referred to as a one-stage diode-type event pixel 51EV, and in a case where the addition transistor BIN is present, the event pixel EV is referred to as a one-stage diode type event pixel 51EV with addition.

<First Transistor Arrangement Example>

Figure 88:
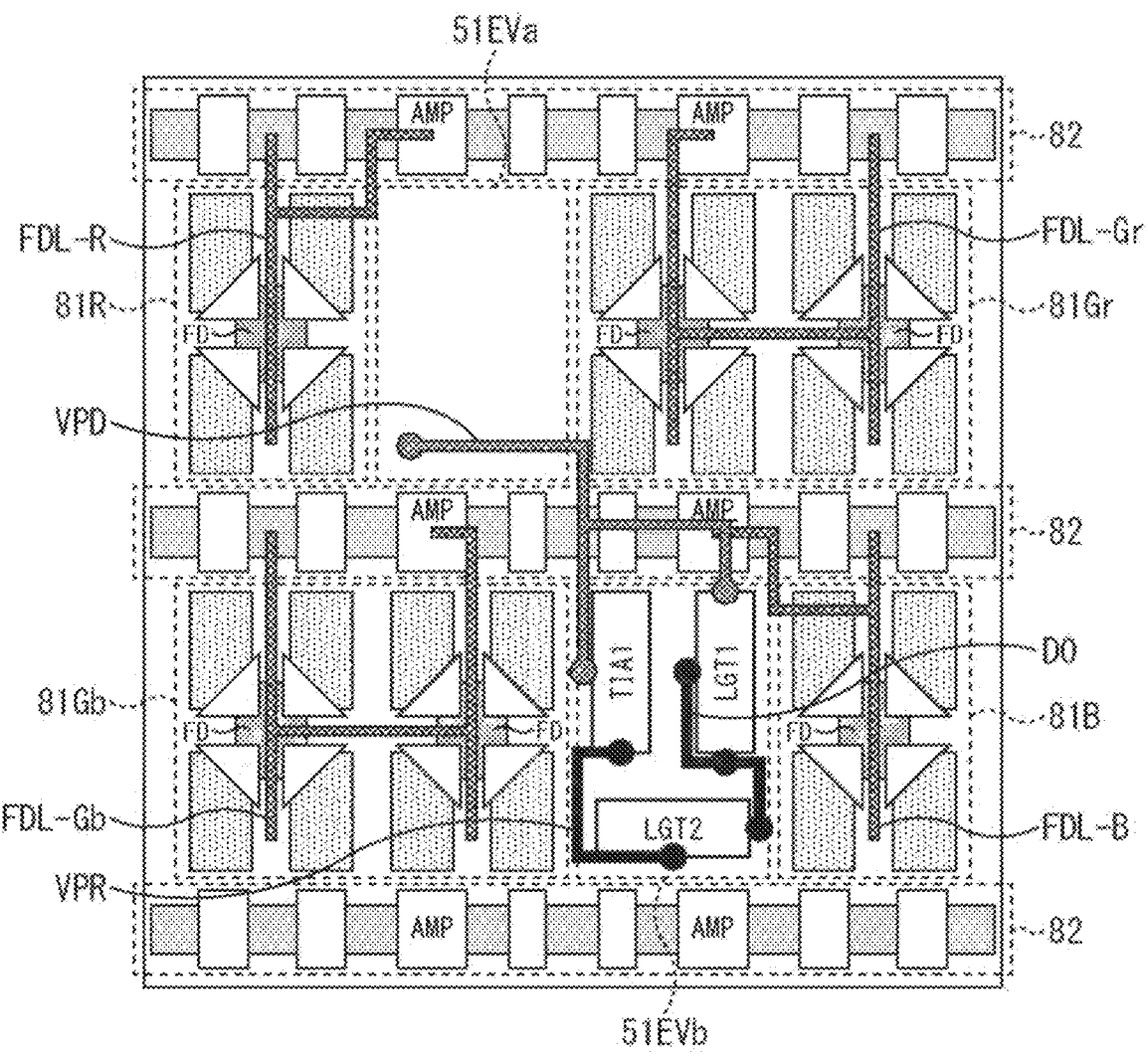
FIG. 88 is a plan view illustrating a first transistor arrangement example of the one-stage diode type event pixel.

FIG. 88 is a plan view illustrating a first transistor arrangement example of the one-stage diode-type event pixel.

In the first transistor arrangement example illustrated in FIG. 88, all the transistors of the first amplification transistor TIA1, the first logarithmic transistor LGT1, and the second logarithmic transistor LGT2 are disposed in the event pixel 51EVb on the lower right. In this case, the VPD wiring, the DO wiring, the D1 wiring, and the VPR wiring are wired as illustrated in FIG. 88, for example.

In the first transistor arrangement example, since the VPR wiring connected to the gate of the second logarithmic transistor LGT2 and the drain of the first amplification transistor TIA1 is disposed in the event pixel 51EVb at the lower right, the VPR wiring does not pass through the vicinity of the connection wiring FDL of the gradation pixel 51G without straddling the shared pixel transistor region 82. Therefore, according to the first transistor arrangement example in FIG. 88, it is possible to suppress the voltage fluctuation in the floating diffusion region FD of the gradation pixel 51G and to reduce the occurrence of artifacts. The wiring passing on the shared pixel transistor region 82 between the upper left event pixel 51EVa and the lower right event pixel 51EVb is one of the VPD wirings. There is no wiring through which the voltage signal after logarithmic conversion is transmitted, and the voltage fluctuation in the floating diffusion region FD of the gradation pixel 51G can be further suppressed. Since the number of transistors disposed in one unit region is three, the degree of freedom of the transistor size is relatively high.

Note that, in the example of FIG. 88, all the transistors of the first logarithmic transistor LGT1, the second logarithmic transistor LGT2, and the first amplification transistor TIA1 are disposed in the event pixel 51EVb at the lower right; however, a similar effect can also be obtained in a case where the transistor arrangement of the event pixel 51EVa at the upper left and the event pixel 51EVb at the lower right is switched and disposed in the event pixel 51EVa at the upper left.

<Second Transistor Arrangement Example>

Figure 89:
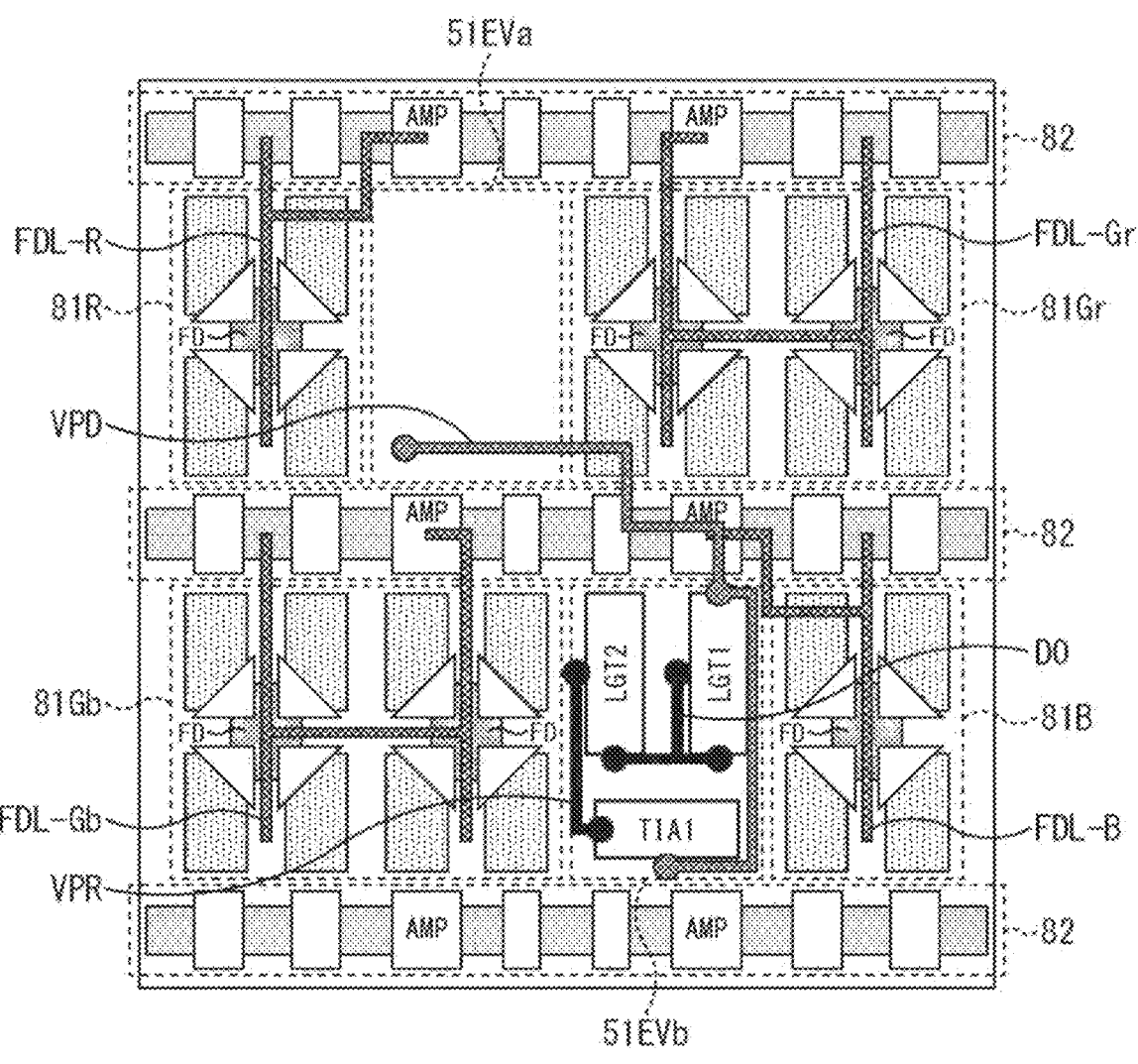
FIG. 89 is a plan view illustrating a second transistor arrangement example of the one-stage diode type event pixel.

FIG. 89 is a plan view illustrating a second transistor arrangement example of the one-stage diode type event pixel.

In the second transistor arrangement example illustrated in FIG. 89, all the transistors of the first logarithmic transistor LGT1, the second logarithmic transistor LGT2, and the first amplification transistor TIA1 are disposed in the event pixel 51EVb at the lower right, which is similar to the first transistor arrangement example illustrated in FIG. 88. On the other hand, the second transistor arrangement example is different from the first transistor arrangement example illustrated in FIG. 88 in the arrangement of three transistors in the event pixel 51EVb at the lower right.

Specifically, in the first transistor arrangement example illustrated in FIG. 88, the second logarithmic transistor LGT2 is disposed in the lateral direction at the position closest to the amplification transistor AMP in the lower shared pixel transistor region 82, the first amplification transistor TIA1 is disposed on the left side close to the upper left event pixel 51EVa in the vertical direction perpendicular to the second logarithmic transistor LGT2, and the first logarithmic transistor LGT1 is disposed on the right side.

On the other hand, in the fourth transistor arrangement example in FIG. 89, the first amplification transistor TIA1 is disposed in the lateral direction at the position closest to the amplification transistor AMP of the lower shared pixel transistor region 82, the second logarithmic transistor LGT2 is disposed on the left side close to the upper left event pixel 51EVa in the vertical direction perpendicular to the first amplification transistor TIA1, and the first logarithmic transistor LGT1 is disposed on the right side. In this case, the VPD wiring, the DO wiring, the D1 wiring, and the VPR wiring are wired as illustrated in FIG. 89, for example.

In the second transistor arrangement example, since the VPR wiring is disposed in the lower right event pixel 51EVb, the VPR wiring does not pass through the vicinity of the connection wiring FDL of the gradation pixel 51G without straddling the shared pixel transistor region 82. Therefore, according to the fourth transistor arrangement example in FIG. 89, it is possible to suppress the voltage fluctuation in the floating diffusion region FD of the gradation pixel 51G and to reduce the occurrence of artifacts. The wiring passing on the shared pixel transistor region 82 between the upper left event pixel 51EVa and the lower right event pixel 51EVb is one of the VPD wirings. There is no wiring through which the voltage signal after logarithmic conversion is transmitted, and the voltage fluctuation in the floating diffusion region FD of the gradation pixel 51G can be further suppressed. Since the number of transistors disposed in one unit region is three, the degree of freedom of the transistor size is relatively high.

Furthermore, in the second transistor arrangement example, among the three transistors disposed in the lower right event pixel 51EVb, the gate of the second logarithmic transistor LGT2 to which the VPR wiring is connected is disposed at the position farthest from the amplification transistor AMP of the shared pixel transistor region 82, specifically, at the position closest to the upper left event pixel 51EVa in the lower right event pixel 51EVb. As a result, the capacitance between the gate of the second logarithmic transistor LGT2 and the gate of the amplification transistor AMP can be further reduced, and the voltage fluctuation in the floating diffusion region FD of the gradation pixel 51G can be further suppressed.

In the second transistor arrangement example, all the transistors of the first logarithmic transistor LGT1, the second logarithmic transistor LGT2, and the first amplification transistor TIA1 are disposed in the event pixel 51EVb at the lower right. However, a similar effect can also be obtained in a case where the transistor arrangement of the event pixel 51EVa at the upper left and the event pixel 51EVb at the lower right is switched and disposed in the event pixel 51EVa at the upper left.

<Third Transistor Arrangement Example>

Figure 90:
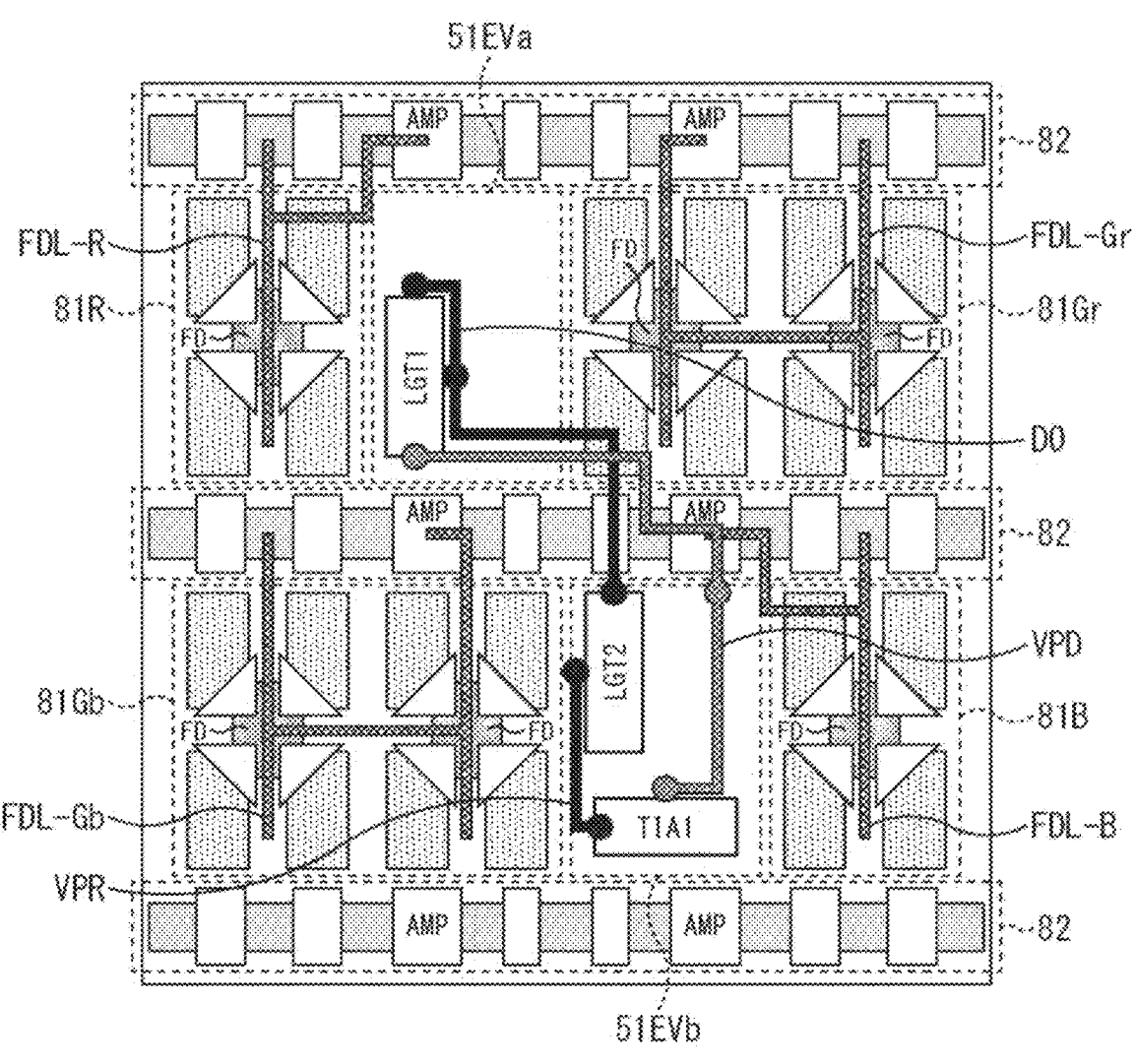
FIG. 90 is a plan view illustrating a third transistor arrangement example of the one-stage diode type event pixel.

FIG. 90 is a plan view illustrating a third transistor arrangement example of the one-stage diode type event pixel.

In the third transistor arrangement example illustrated in FIG. 90, the first logarithmic transistor LGT1 is disposed in the upper left event pixel 51EVa, and the second logarithmic transistor LGT2 and the first amplification transistor TIA1 are disposed in the lower right event pixel 51EVb. The VPD wiring, the DO wiring, and the VPR wiring are wired, for example, as illustrated in FIG. 90.

In the third transistor arrangement example, since the VPR wiring is disposed in the lower right event pixel 51EVb, the VPR wiring does not pass through the vicinity of the connection wiring FDL of the gradation pixel 51G without straddling the shared pixel transistor region 82. Therefore, according to the third transistor arrangement example in FIG. 90, it is possible to suppress the voltage fluctuation in the floating diffusion region FD of the gradation pixel 51G and to reduce the occurrence of artifacts. The number of wirings passing on the shared pixel transistor region 82 between the upper left event pixel 51EVa and the lower right event pixel 51EVb is two of the VPD wiring and the DO wiring. Since the maximum number of transistors disposed in one unit region is two, the degree of freedom of the transistor size is increased.

Furthermore, in the third transistor arrangement example, among the two transistors disposed in the event pixel 51EVb at the lower right, the gate of the second logarithmic transistor LGT2 to which the VPR wiring is connected is disposed at a position farthest from the amplification transistor AMP of the shared pixel transistor region 82. As a result, the capacitance between the gate of the second logarithmic transistor LGT2 and the gate of the amplification transistor AMP can be further reduced, and the voltage fluctuation in the floating diffusion region FD of the gradation pixel 51G can be further suppressed.

In the third transistor arrangement example, in a case where the transistor arrangement of the upper left event pixel 51EVa and the lower right event pixel 51EVb is switched, and the second logarithmic transistor LGT2 and the first amplification transistor TIA1 are disposed in the upper left event pixel 51EVa, a similar effect can be obtained.

<First Transistor Arrangement Example with Addition Transistor>

Figure 91:
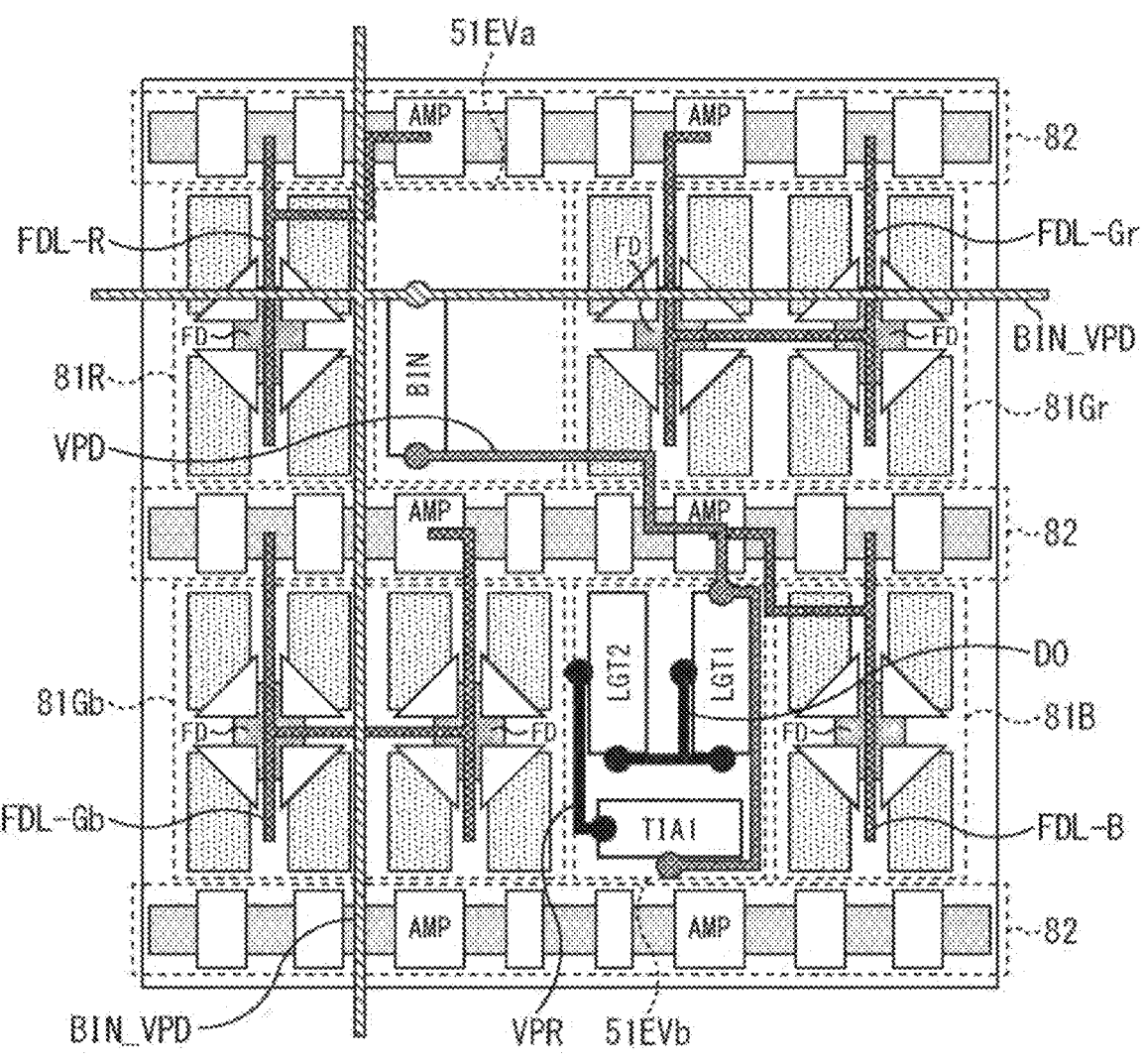
FIG. 91 is a plan view illustrating a first transistor arrangement example of the one-stage diode type event pixel with addition.

FIG. 91 is a plan view illustrating a first transistor arrangement example of the one-stage diode type event pixel with addition.

The transistor arrangement of the event pixel 51EV illustrated in FIG. 91 has a configuration in which an addition transistor BIN is further disposed in the event pixel 51EVa at the upper left of the transistor arrangement illustrated in FIG. 89. Specifically, the addition transistor BIN is disposed in the upper left event pixel 51EVa, and the first amplification transistor TIA1, the first logarithmic transistor LGT1, and the second logarithmic transistor LGT2 are disposed in the lower right event pixel 51EVb. In this case, the VPD wiring, the DO wiring, and the VPR wiring are wired, for example, as illustrated in FIG. 91.

According to the first transistor arrangement example including the addition transistor BIN, it is possible to achieve effects similar to those of the first transistor arrangement example in the case of not including the addition transistor BIN illustrated in FIG. 89. The transistor arrangement of the upper left event pixel 51EVa and the lower right event pixel 51EVb may be interchanged similarly to the first transistor arrangement example in a case where there is no addition transistor BIN illustrated in FIG. 89.

Although not illustrated, the first transistor arrangement example in a case where the addition transistor BIN is not provided illustrated in FIG. 88 and the third transistor arrangement example in a case where the addition transistor BIN is not provided illustrated in FIG. 90 can also have a configuration in which the addition transistor BIN is further disposed in the event pixel 51EVa on the upper left.

<33. Summary of One-Stage Diode Type Event Pixels>

Even in the one-stage diode type event pixel 51EV having one diode-connected transistor (first logarithmic transistor LGT1) between the photodiode 61 and the second logarithmic transistor LGT2, at least two transistors (second logarithmic transistor LGT2 and first amplification transistor TIA1) connected to the VPR wiring that is the output wiring are disposed in any one of two unit regions in the diagonal direction of the event pixel 51EVa and the event pixel 51EVb. As a result, the voltage fluctuation of the floating diffusion region FD due to the coupling capacitance can be suppressed, and the occurrence of artifacts can be reduced. The diode-connected first logarithmic transistor LGT1 may be disposed in the same unit region as the unit region (the event pixel 51EVb on the lower right) in which the second logarithmic transistor LGT2 and the first amplification transistor TIA1 are disposed as in the example of FIGS. 88 and 89, for example, or may be disposed in a different unit region (the event pixel 51EVa on the upper left) as in the example of FIG. 90. In the case of further including the addition transistor BIN, for example, as in the example of FIG. 91, the addition transistor BIN may be disposed in a unit region (upper left event pixel 51EVa) different from the unit region (lower right event pixel 51EVb) in which the second logarithmic transistor LGT2 and the first amplification transistor TIA1 are disposed, or may be disposed in the same unit region.

<34. Transistor Arrangement of Two-Stage Diode Type Event Pixels>

<Circuit Configuration Example of Two-Stage Diode Type Event Pixel>

Like the 4Tr-type event pixel 51EV in which two stages of loop circuits are provided, a configuration in which a plurality of stages of diode-connected logarithmic transistors is provided is possible.

Figure 92:
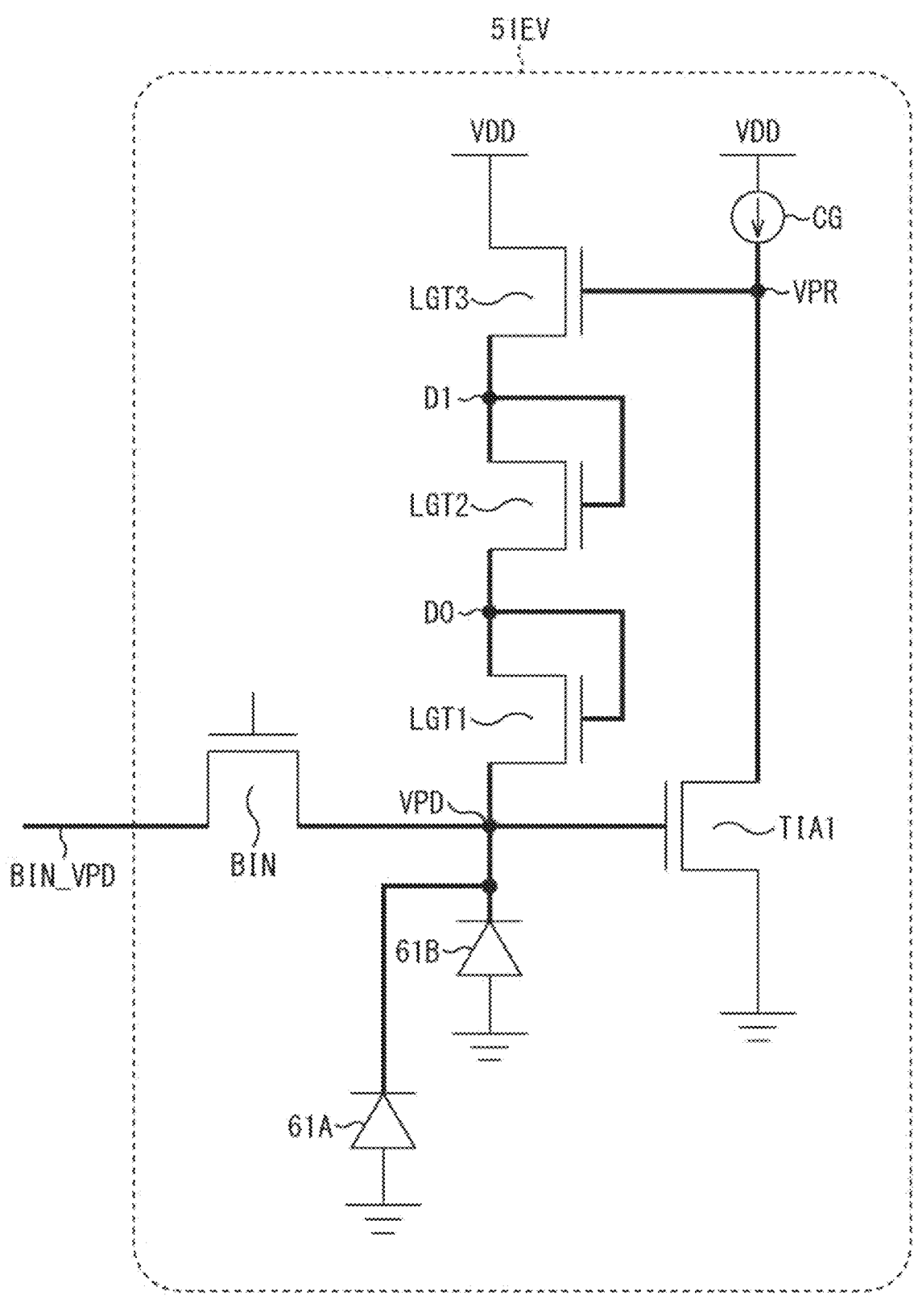
FIG. 92 is a diagram illustrating a circuit configuration example of a two-stage diode type event pixel.

FIG. 92 is a diagram illustrating a circuit configuration example of an event pixel 51EV including a one-stage loop circuit and two logarithmic transistors diode-connected.

The event pixel 51EV in FIG. 92 includes a one-stage loop circuit including a first amplification transistor TIA1 and a third logarithmic transistor LGT3, a first logarithmic transistor LGT1 and a second logarithmic transistor LGT2 which are two diode-connected logarithmic transistors LGT, and an addition transistor BIN. The drain of the third logarithmic transistor LGT3 is connected to the power supply VDD, and the gate is connected to the constant current source CG, the drain of the first amplification transistor TIA1, and the input terminal (FIG. 6) of the buffer 122. The VPD wiring is connected to the gate of the first amplification transistor TIA1, the cathode terminals of the photodiodes 61A and 61B, the source of the first logarithmic transistor LGT1, and the source of the addition transistor BIN. The DO wiring is connected to the gate and the drain of the first logarithmic transistor LGT1 and the source of the second logarithmic transistor LGT2. The D1 wiring is connected to the gate and the drain of the second logarithmic transistor LGT2 and the source of the third logarithmic transistor LGT3. The VPR wiring is connected to the gate of the third logarithmic transistor LGT3, the drain of the first amplification transistor TIA1, the constant current source CG, and the input terminal of the buffer 122 (FIG. 6). The BIN_VPD wiring is connected to the drain of the addition transistor BIN and the drain of the addition transistor BIN of another event pixel 51EV to be connected.

Comparing the event pixel 51EV of FIG. 92 with the circuit configuration of the one-stage diode type event pixel 51EV of FIG. 87, one stage of the diode-connected logarithmic transistor LGT is added. By increasing the number of stages of the diode-connected logarithmic transistors LGT, the conversion gain can be increased to increase the SNR of the signal. Such the event pixel 51EV having the one-stage loop circuit and the two logarithmic transistors diode-connected is referred to as a two-stage diode type event pixel 51EV, and in a case where the addition transistor BIN is present, the event pixel EV is referred to as a two-stage diode type event pixel 51EV with addition. Note that it is also possible to provide three or more stages of diode-connected logarithmic transistors LGT.

<First Transistor Arrangement Example>

Figure 93:
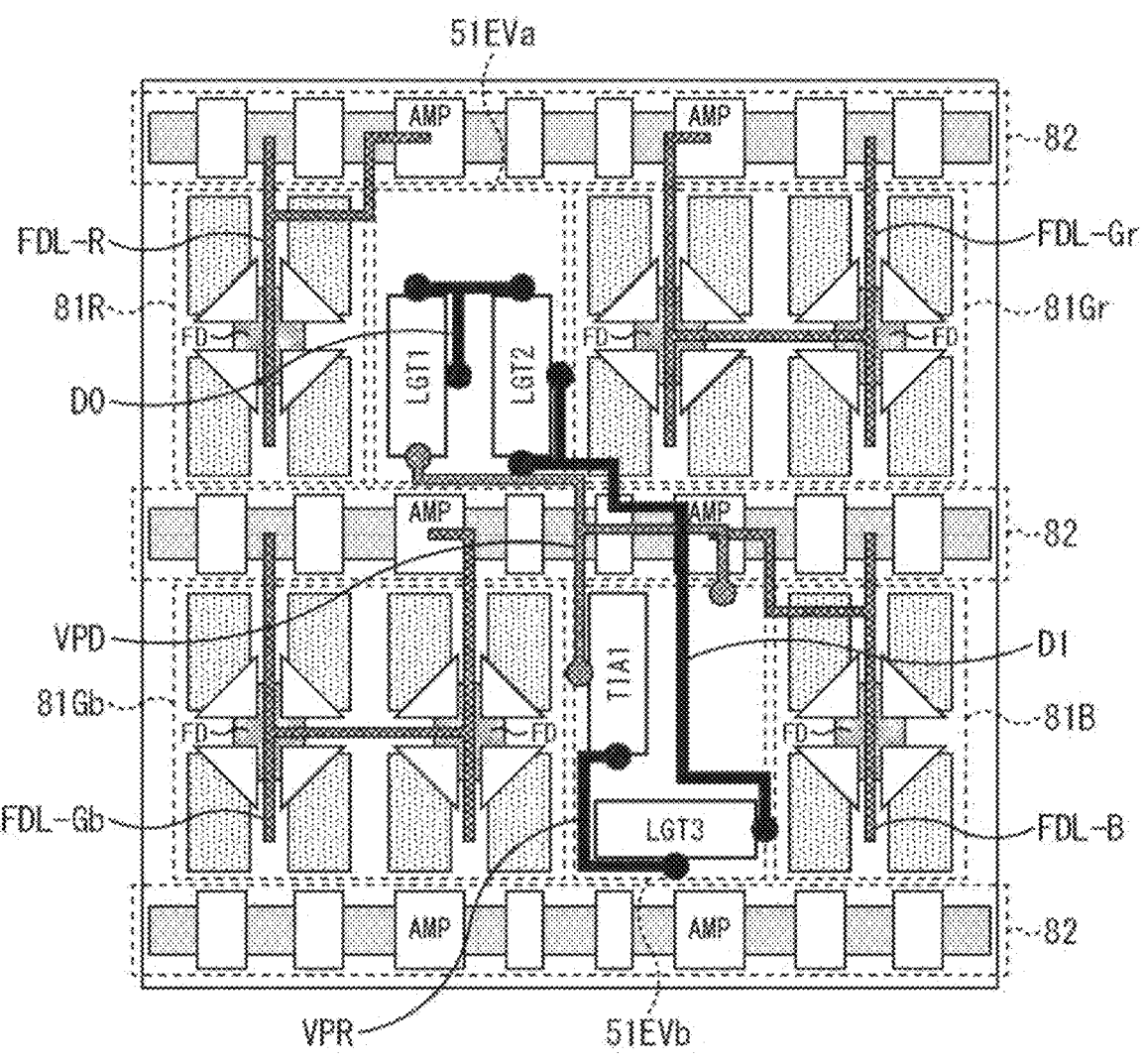
FIG. 93 is a plan view illustrating a first transistor arrangement example of the two-stage diode type event pixel.

FIG. 93 is a plan view illustrating a first transistor arrangement example of the two-stage diode type event pixel.

In the first transistor arrangement example illustrated in FIG. 93, a first logarithmic transistor LGT1 and a second logarithmic transistor LGT2 are disposed in an upper left event pixel 51EVa, and a first amplification transistor TIA1 and a third logarithmic transistor LGT3 are disposed in a lower right event pixel 51EVb. In this case, the VPD wiring, the DO wiring, the D1 wiring, and the VPR wiring are wired as illustrated in FIG. 93, for example.

In the first transistor arrangement example, the number of wirings passing on the shared pixel transistor region 82 between the upper left event pixel 51EVa and the lower right event pixel 51EVb is two of the VPD wiring and the D1 wiring. Since the VPR wiring connected to the gate of the third logarithmic transistor LGT3 and the drain of the first amplification transistor TIA1 is disposed in the event pixel 51EVb at the lower right, the VPR wiring does not pass through the vicinity of the connection wiring FDL of the gradation pixel 51G without straddling the shared pixel transistor region 82. Therefore, according to the first transistor arrangement example in FIG. 93, it is possible to suppress the voltage fluctuation in the floating diffusion region FD of the gradation pixel 51G and to reduce the occurrence of artifacts. Furthermore, in the wiring passing over the shared pixel transistor region 82, only one wiring of the D1 wiring can transmit the voltage signal after logarithmic conversion, and the voltage fluctuation in the floating diffusion region FD of the gradation pixel 51G can be further reduced.

Note that, as the first transistor arrangement example, a configuration in which the transistor arrangement of the upper left event pixel 51EVa and the lower right event pixel 51EVb is interchanged is also possible.

<Second Transistor Arrangement Example>

Figure 94:
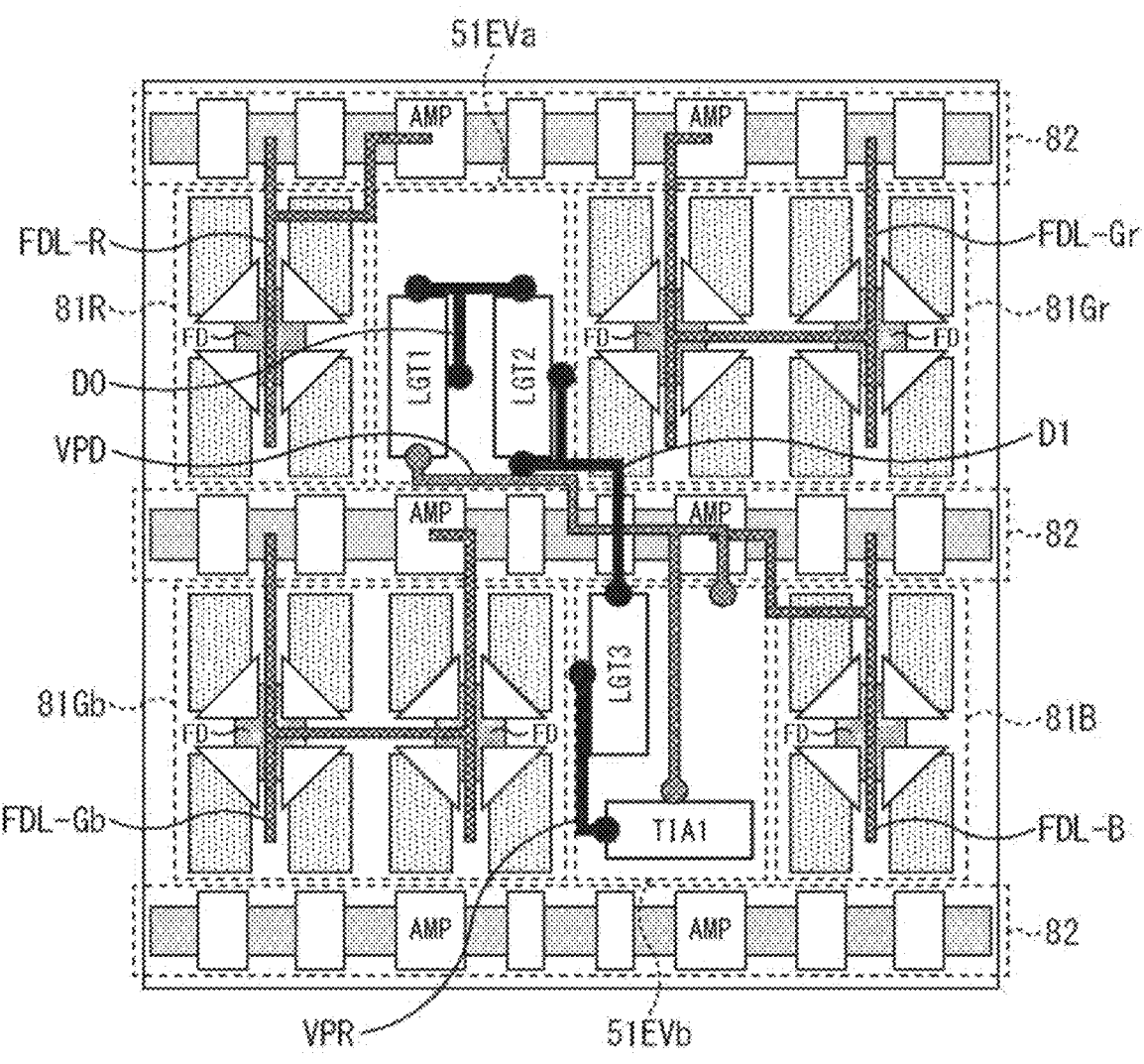
FIG. 94 is a plan view illustrating a second transistor arrangement example of the two-stage diode type event pixel.

FIG. 94 is a plan view illustrating a second transistor arrangement example of the two-stage diode type event pixel.

In the second transistor arrangement example illustrated in FIG. 94, the types of transistors disposed in the upper left event pixel 51EVa and the lower right event pixel 51EVb are similar to those in the first transistor arrangement example illustrated in FIG. 93. On the other hand, the second transistor arrangement example is different from the first transistor arrangement example illustrated in FIG. 93 in the arrangement of two transistors in the event pixel 51EVb at the lower right.

Specifically, in the first transistor arrangement example illustrated in FIG. 93, the third logarithmic transistor LGT3 is disposed in the lateral direction at the position closest to the amplification transistor AMP in the lower shared pixel transistor region 82, and the first amplification transistor TIA1 is disposed on the left side close to the upper left event pixel 51EVa in the vertical direction perpendicular to the third logarithmic transistor LGT3.

On the other hand, in the second transistor arrangement example in FIG. 94, the first amplification transistor TIA1 is disposed in the lateral direction at the position closest to the amplification transistor AMP in the lower shared pixel transistor region 82, and the third logarithmic transistor LGT3 is disposed on the left side close to the upper left event pixel 51EVa in the vertical direction perpendicular to the first amplification transistor TIA1. In this case, the VPD wiring, the DO wiring, the D1 wiring, and the VPR wiring are wired as illustrated in FIG. 94, for example.

In the second transistor arrangement example, the number of wirings passing on the shared pixel transistor region 82 between the upper left event pixel 51EVa and the lower right event pixel 51EVb is two of the VPD wiring and the D1 wiring. Since the VPR wiring connected to the gate of the third logarithmic transistor LGT3 and the drain of the first amplification transistor TIA1 is disposed in the event pixel 51EVb at the lower right, the VPR wiring does not pass through the vicinity of the connection wiring FDL of the gradation pixel 51G without straddling the shared pixel transistor region 82. Therefore, according to the second transistor arrangement example in FIG. 94, it is possible to suppress the voltage fluctuation in the floating diffusion region FD of the gradation pixel 51G and to reduce the occurrence of artifacts. Furthermore, in the wiring passing over the shared pixel transistor region 82, only one wiring of the D1 wiring can transmit the voltage signal after logarithmic conversion, and the voltage fluctuation in the floating diffusion region FD of the gradation pixel 51G can be further reduced.

Furthermore, in the second transistor arrangement example, among the two transistors disposed in the lower right event pixel 51EVb, the gate of the third logarithmic transistor LGT3 to which the VPR wiring is connected is disposed at the position farthest from the amplification transistor AMP of the shared pixel transistor region 82, specifically, at the position closest to the upper left event pixel 51EVa in the lower right event pixel 51EVb. As a result, the capacitance between the gate of the second logarithmic transistor LGT2 and the gate of the amplification transistor AMP can be further reduced, and the voltage fluctuation in the floating diffusion region FD of the gradation pixel 51G can be further suppressed.

<First Transistor Arrangement Example with Addition Transistor>

Figure 95:
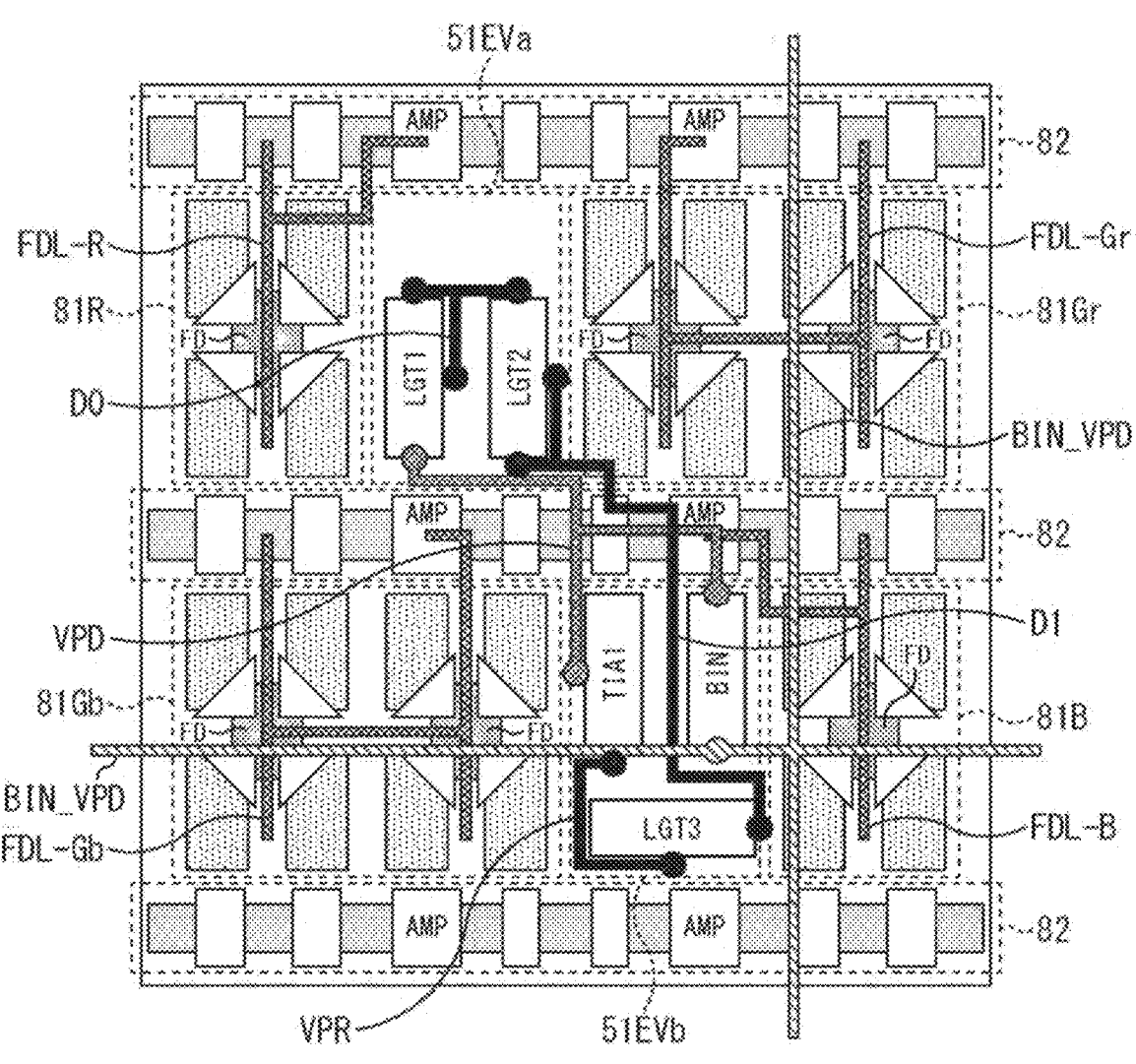
FIG. 95 is a plan view illustrating a first transistor arrangement example of the two-stage diode type event pixel with addition.

FIG. 95 is a plan view illustrating a first transistor arrangement example of the two-stage diode type event pixel with addition.

The transistor arrangement of the two-stage diode type event pixel 51EV with addition illustrated in FIG. 95 has a configuration in which an addition transistor BIN is further disposed in the event pixel 51EVb at the lower right of the transistor arrangement illustrated in FIG. 93. Specifically, the first logarithmic transistor LGT1 and the second logarithmic transistor LGT2 are disposed in the upper left event pixel 51EVa, and the third logarithmic transistor LGT3, the first amplification transistor TIA1, and the addition transistor BIN are disposed in the lower right event pixel 51EVb. In this case, the VPD wiring, the DO wiring, the D1 wiring, and the VPR wiring are wired as illustrated in FIG. 95, for example.

According to the first transistor arrangement example including the addition transistor BIN, it is possible to achieve effects similar to those of the first transistor arrangement example in the case of not including the addition transistor BIN illustrated in FIG. 93. The transistor arrangement of the upper left event pixel 51EVa and the lower right event pixel 51EVb may be interchanged similarly to the first transistor arrangement example in a case where there is no addition transistor BIN illustrated in FIG. 93.

<Second Transistor Arrangement Example with Addition Transistor>

Figure 96:
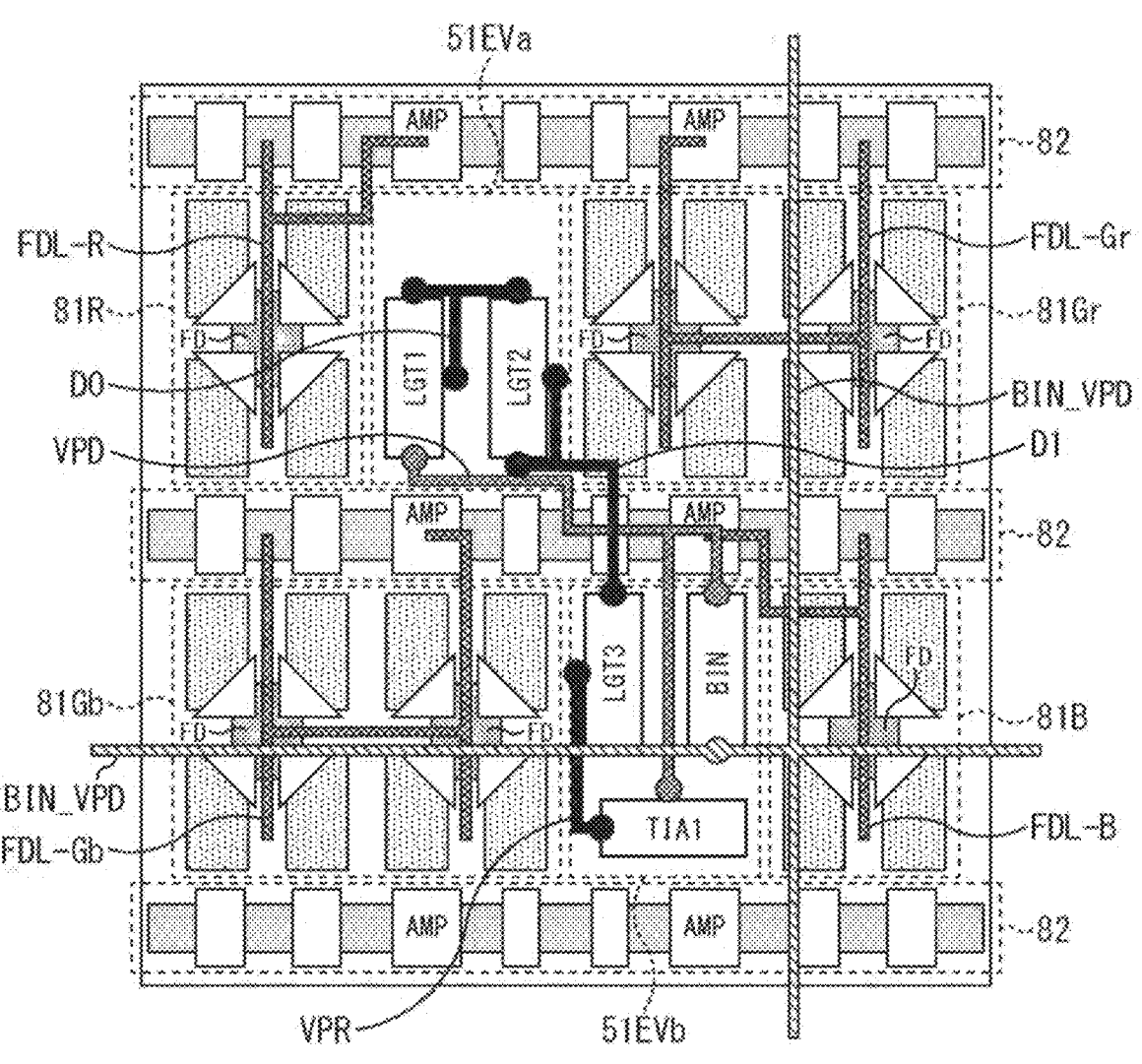
FIG. 96 is a plan view illustrating a second transistor arrangement example of the two-stage diode type event pixel with addition.

FIG. 96 is a plan view illustrating a second transistor arrangement example of the two-stage diode type event pixel with addition.

The transistor arrangement of the two-stage diode type event pixel 51EV with addition illustrated in FIG. 96 has a configuration in which an addition transistor BIN is further disposed in the event pixel 51EVb at the lower right of the transistor arrangement illustrated in FIG. 94. Specifically, the first logarithmic transistor LGT1 and the second logarithmic transistor LGT2 are disposed in the upper left event pixel 51EVa, and the third logarithmic transistor LGT3, the first amplification transistor TIA1, and the addition transistor BIN are disposed in the lower right event pixel 51EVb. The third logarithmic transistor LGT3 is disposed on the left side close to the upper left event pixel 51EVa at the position farthest from the amplification transistor AMP of the shared pixel transistor region 82. In this case, the VPD wiring, the DO wiring, the D1 wiring, and the VPR wiring are wired as illustrated in FIG. 96, for example.

According to the first transistor arrangement example including the addition transistor BIN, it is possible to achieve effects similar to those of the second transistor arrangement example in the case of not including the addition transistor BIN illustrated in FIG. 94. The transistor arrangement of the upper left event pixel 51EVa and the lower right event pixel 51EVb may be interchanged similarly to the second transistor arrangement example in a case where there is no addition transistor BIN illustrated in FIG. 94.

<35. Summary of Two-Stage Diode Type Event Pixels>

Also in the two-stage diode type event pixel 51EV having two diode-connected transistors (a first logarithmic transistor LGT1 and a second logarithmic transistor LGT2) between the photodiode 61 and the second logarithmic transistor LGT2, at least two transistors (a third logarithmic transistor LGT3 and a first amplification transistor TIA1) connected to the VPR wiring that is the output wiring are disposed in any one of two unit regions in the diagonal direction of the event pixel 51EVa and the event pixel 51EVb. As a result, the voltage fluctuation of the floating diffusion region FD due to the coupling capacitance can be suppressed, and the occurrence of artifacts can be reduced. For example, as in the examples of FIGS. 93 and 94, the diode-connected first logarithmic transistor LGT1 and second logarithmic transistor LGT2 are disposed in a unit region (upper left event pixel 51EVa) different from the unit region (lower right event pixel 51EVb) in which the third logarithmic transistor LGT3 and the first amplification transistor TIA1 are disposed. In the case of further including the addition transistor BIN, for example, as in the examples of FIGS. 95 and 96, the addition transistor BIN may be disposed in the same unit region as the unit region (event pixel 51EVb on the lower right) in which the third logarithmic transistor LGT3 and the first amplification transistor TIA1 are disposed, or may be disposed in a different unit region.

<36. Structure Example of Solid-State Imaging Device>

Figure 97:
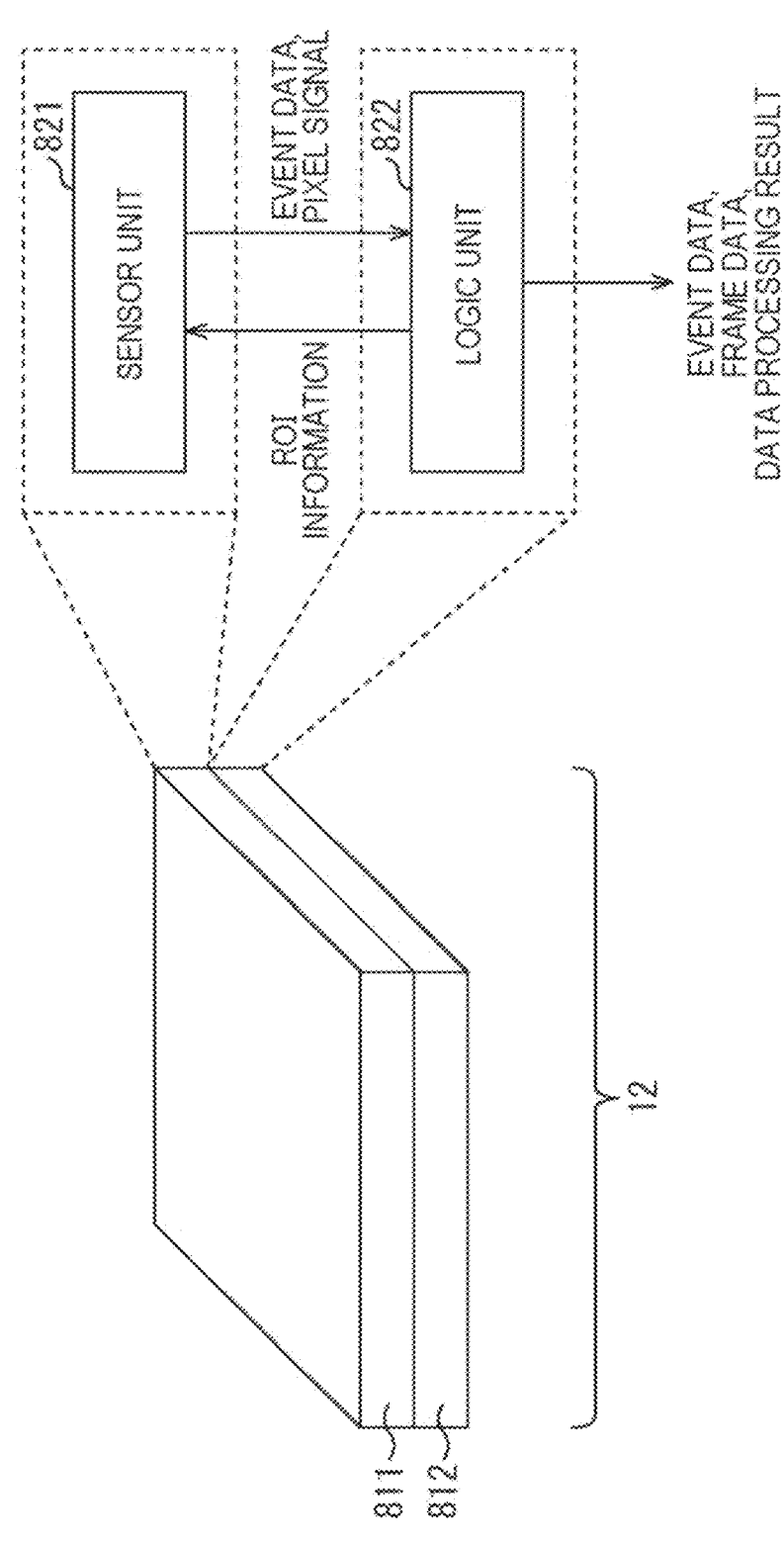
FIG. 97 is a diagram illustrating another structure example of the solid-state imaging device.

FIG. 97 is a diagram illustrating another structure example of the solid-state imaging device.

A solid-state imaging device 12 in FIG. 97 includes one chip in which a sensor die (substrate) 811 as a plurality of dies (substrates) and a logic die 812 are stacked.

(A circuit as) A sensor unit 821 is configured in the sensor die 811, and a logic unit 822 is configured in the logic die 812.

The sensor unit 821 is configured by arranging the pixels 51 including the event pixels 51E (or the event pixels 51EV) or the gradation pixels 51G described above in a two-dimensional lattice pattern. The event pixel 51E of the sensor unit 821 photoelectrically converts incident light to generate an electrical signal, and generates event data indicating occurrence of an event that is a change in the electrical signal of the pixel. The gradation pixel 51G of the sensor unit 821 photoelectrically converts incident light to generate an electric signal, and generates a pixel signal. The gradation pixel 51G of the sensor unit 821 performs imaging in synchronization with a vertical synchronization signal and outputs frame data that is image data in a frame format.

The sensor unit 821 can output the event data or the pixel signal independently, and can also output the pixel signal of the region of interest on the basis of the ROI information input from the logic unit 822 on the basis of the generated event data.

The logic unit 822 controls the sensor unit 821 as necessary. Furthermore, the logic unit 822 performs various types of data processing such as data processing of generating frame data according to the event data from the sensor unit 821 and image processing for frame data from the sensor unit 821 or frame data generated according to the event data from the sensor unit 821, and outputs the event data, the frame data, and a data processing result obtained by performing various types of data processing.

Note that a part of the sensor unit 821 can be configured as the logic die 812. Furthermore, a part of the logic unit 822 can be configured in the sensor die 811.

Figure 98:
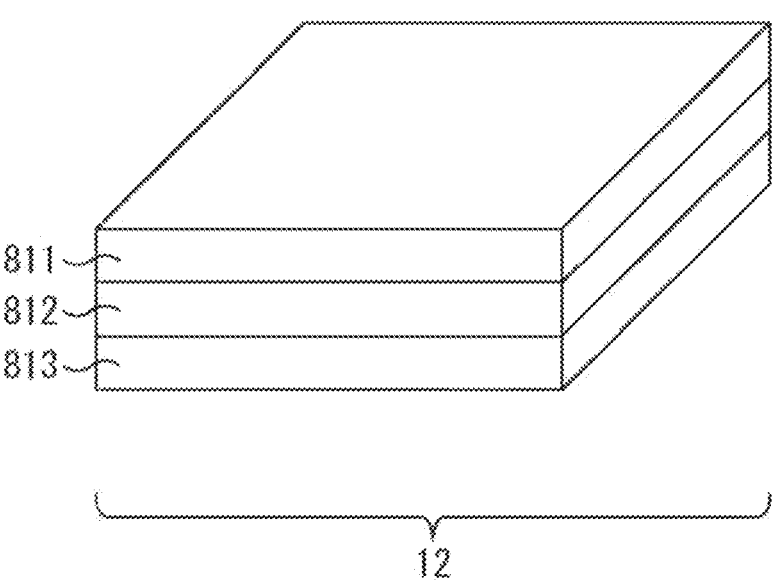
FIG. 98 is a diagram illustrating a structure example of a solid-state imaging device in a case where the solid-state imaging device includes three layers.

Furthermore, for example, as illustrated in FIG. 98, the solid-state imaging device 12 can include three layers in which another logic die 813 is stacked in addition to the sensor die 811 and the logic die 812. Of course, it may be configured by stacking four or more layers of dies (substrates).

Figure 99:
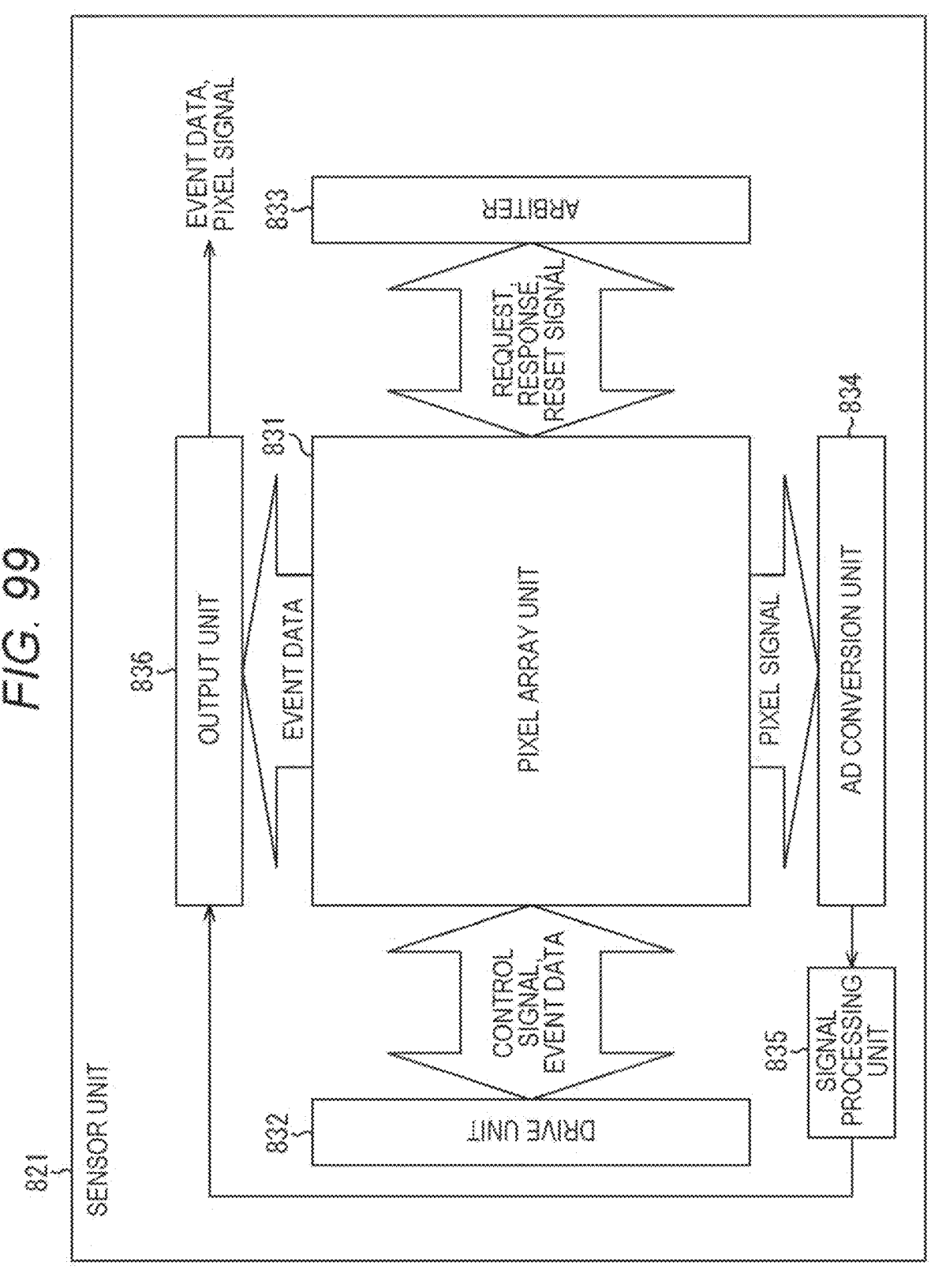
FIG. 99 is a block diagram illustrating a configuration example of a sensor unit in FIG. 97.

FIG. 99 is a block diagram illustrating a configuration example of the sensor unit 821 in FIG. 97.

The sensor unit 821 includes a pixel array unit 831, a drive unit 832, an arbiter 833, an AD conversion unit 834, a signal processing unit 835, and an output unit 836.

The pixel array unit 831 is configured by arranging a plurality of pixels 51 in a two-dimensional lattice pattern. In a case where a change exceeding a predetermined threshold (including a change greater than or equal to the threshold as necessary) occurs in (a voltage corresponding to) a photocurrent as an electric signal generated by photoelectric conversion of the event pixel 51E, the pixel array unit 831 detects the change in the photocurrent as an event. In a case where an event is detected, the pixel array unit 831 outputs a request for requesting the output of event data indicating the occurrence of the event to the arbiter 833. Then, in a case where the pixel array unit 831 receives a response indicating permission for the output of the event data from the arbiter 833, the pixel array unit outputs the event data to the drive unit 832 and the output unit 836. Moreover, the pixel array unit 831 outputs the electric signal of the pixel 51 in which the event is detected to the AD conversion unit 834 as a pixel signal.

The drive unit 832 drives each gradation pixel 51G by supplying a control signal to each gradation pixel 51G of the pixel array unit 831. For example, the drive unit 832 drives each pixel 51 in the region where the event data is output from the pixel array unit 831, and supplies (outputs) the pixel signal of the pixel 51 to the AD conversion unit 834.

The arbiter 833 is configured similarly to the arbiter 43 in FIG. 2. That is, the arbiter 833 arbitrates a request for requesting the output of the event data from the pixel array unit 831, and returns a response indicating permission or non-permission of the output of the event data to the pixel array unit 831. Furthermore, after outputting a response indicating permission for event data output, the arbiter 833 outputs a reset signal for resetting event detection to the pixel array unit 831.

The AD conversion unit 834 is configured similarly to the luminance signal processing unit 45 in FIG. 2. That is, in the ADC of each column, the AD conversion unit 834 performs AD conversion on the pixel signal of the gradation pixel 51G of the column, and supplies the pixel signal to the signal processing unit 835. Note that the AD conversion unit 834 can perform CDS together with AD conversion of the pixel signal.

The signal processing unit 835 performs predetermined signal processing such as black level adjustment processing and gain adjustment processing on the pixel signals sequentially supplied from the AD conversion unit 834, and supplies the pixel signals to the output unit 836.

The output unit 836 performs necessary processing on the pixel signal and the event data, and supplies the processing to the logic unit 822 (FIG. 97).

In the solid-state imaging device 12 configured as described above, the event data output from the event pixel 51E of the sensor unit 821 is accumulated in the memory of the logic unit 822 in a predetermined frame unit and converted into frame data. The memory of the logic unit 822 converts the event data from the sensor unit 821 into frame data by accumulating the event data in units of predetermined frames.

The image processing unit of the logic unit 822 extracts contour information of the object from the event data in units of frames accumulated in the memory, and specifies the object to be detected. Then, the image processing unit of the logic unit 822 determines a region of interest including the specified object. The image processing unit of the logic unit 822 outputs the information specifying the region of interest supplied from the image processing unit 35 to the sensor unit 821 as a region of interest (ROI) information.

The sensor unit 821 acquires the ROI information supplied from the logic unit 822 and supplies the ROI information to the drive unit 832. The drive unit 832 specifies the region of interest according to the ROI information, and drives the gradation pixel 51G of the region of interest. The gradation pixel 51G in the region of interest of the pixel array unit 831 generates a pixel signal and supplies the pixel signal to the AD conversion unit 834. The AD conversion unit 834 converts analog pixel signals sequentially input in units of rows of the pixel array unit 831 into digital signals (AD conversion) and performs CDS, and supplies the result to the signal processing unit 835. The signal processing unit 835 performs predetermined signal processing on the digital pixel signals sequentially supplied from the AD conversion unit 834 as necessary, and supplies the digital pixel signals to the output unit 836. The output unit 836 outputs the digital pixel signal from the signal processing unit 835 to the outside.

As described above, in the solid-state imaging device 12, in a case where occurrence of an event is detected, an object as a detection target is specified and a region of interest is determined, and information for specifying the region of interest is determined as ROI information. Then, (the region corresponding to) the region of interest determined as the ROI information is imaged, and the pixel signal of each pixel of the region of interest is output. As described above, by imaging the region of interest in which the occurrence of the event has been detected, the region of interest can be imaged at high speed. By driving only a partial region of the pixel array unit 831, the power consumption of the solid-state imaging device 12 can also be reduced.

The embodiment of the present disclosure is not limited to the above-described embodiments and various modifications may be made without departing from the gist of the technology of the present disclosure.

For example, a form in which all or some of the plurality of configuration examples described above are combined can be adopted.

Note that, the effects described in the present specification are merely examples and are not limited, and there may be effects other than those described in the present specification.

Note that the technique of the present disclosure can have the following configurations.

(1)

A solid-state imaging device including a pixel array unit in which an event pixel that detects that a luminance change exceeds a predetermined threshold as an event and a gradation pixel that outputs a luminance signal of a gradation level according to a light amount of incident light are mixed, in which a color filter of the same color is formed in units of two or more pixels in the gradation pixel, and the event pixel is disposed with a region size in which at least two of the gradation pixels are disposed in a row direction or a column direction.

(2)

The solid-state imaging device according to (1) described above, in which the pixel array unit includes color filters of a plurality of colors.

(3)

The solid-state imaging device according to (1) or (2) described above, in which the event pixel is a region in which a color filter of the same color is formed in a case where the pixel is assumed to be the gradation pixel.

(4)

The solid-state imaging device according to (3) described above, in which the event pixel is a region where an R or B color filter is formed in a case where the pixel is assumed to be the gradation pixel.

(5)

The solid-state imaging device according to any one of (1) to (4) described above, in which unit regions including a plurality of the gradation pixels each having the color filter of the same color formed thereon are repeatedly arranged in the column direction and the row direction.

(6)

The solid-state imaging device according to (5) described above, in which the pixel array unit includes a shared pixel transistor region in which one or more pixel transistors shared by the plurality of gradation pixels are arranged between the unit regions repeatedly arranged in the column direction.

(7)

The solid-state imaging device according to any one of (1) to (6) described above, in which the event pixel includes a region of at least two of the gradation pixels arranged in a direction perpendicular to a shared pixel transistor region in which one or more pixel transistors shared by a plurality of the gradation pixels are arranged.

(8)

The solid-state imaging device according to any one of (1) to (7) described above, in which the event pixel includes a region of the gradation pixels of four pixels of two pixels in the row direction and two pixels in the column direction.

(9)

The solid-state imaging device according to any one of (1) to (8) described above, in which a region of two of the event pixels is configured to operate as one of the event pixels.

(10)

The solid-state imaging device according to (9) described above, in which the event pixel includes a transistor that turns on and off a connection with another of the adjacent event pixel.

(11)

The solid-state imaging device according to (9) described above, in which photoelectric conversion elements formed in regions of the two event pixels are connected by wiring.

(12)

The solid-state imaging device according to (9) described above, in which one photoelectric conversion element is formed in regions of the two event pixels.

(13)

The solid-state imaging device according to (9) described above, in which regions of the two event pixels are disposed adjacent to each other in a diagonal direction.

(14)

The solid-state imaging device according to (9) described above, in which each of regions of the two event pixels is constituted by a region of at least two of the gradation pixels arranged in a direction perpendicular to a shared pixel transistor region in which one or more pixel transistors shared by a plurality of the gradation pixels are arranged.

(15)

The solid-state imaging device according to (9) described above, in which each of regions of the two event pixels is a region in which an R or B color filter is formed in a case where the event pixels are assumed to be the gradation pixels.

(16)

The solid-state imaging device according to any one of (1) to (15) described above, in which a color filter of R, G, B, or W is formed in the gradation pixel.

(17)

The solid-state imaging device according to any one of (1) to (15) described above, in which a color filter of R, G, B, or IR is formed in the gradation pixel.

(18)

The solid-state imaging device according to any one of (1) to (17) described above, in which an IR color filter is formed in the event pixel, and the event pixel detects that a luminance change of infrared light exceeds a predetermined threshold as an event.

(19)

An electronic device including a solid-state imaging device including a pixel array unit in which an event pixel that detects that a luminance change exceeds a predetermined threshold as an event and a gradation pixel that outputs a luminance signal of a gradation level according to a light amount of incident light are mixed, in which a color filter of the same color is formed in units of two or more pixels in the gradation pixel, and the event pixel is disposed with a region size in which at least two of the gradation pixels are disposed in a row direction or a column direction.

(20)

A distance measurement system including:

a light source device that irradiates a subject with irradiation light; and a solid-state imaging device that receives reflected light of the irradiation light reflected by the subject, in which the solid-state imaging device includes a pixel array unit in which an event pixel that detects that a luminance change exceeds a predetermined threshold as an event and a gradation pixel that outputs a luminance signal of a gradation level according to a light amount of incident light are mixed, a color filter of the same color is formed in units of two or more pixels in the gradation pixel, and the event pixel is disposed with a region size in which at least two of the gradation pixels are disposed in a row direction or a column direction.

(21)

A solid-state imaging device including a pixel array unit in which an event pixel that detects that a luminance change exceeds a predetermined threshold as an event and a gradation pixel that outputs a luminance signal of a gradation level according to a light amount of incident light are mixed, in which the event pixel includes, in two unit regions in a diagonal direction of four unit regions of 2×2, at least:

a photodiode that photoelectrically convert incident light to generate a photocurrent;

a first logarithmic transistor that converts into an optical voltage corresponding to a logarithm of the photocurrent; and a first amplification transistor that amplifies the optical voltage, among first and second diffusion layers connected to a gate of the first amplification transistor, the first diffusion layer is formed in a first unit region of the two unit regions, and the second diffusion layer is formed in a second unit region in the diagonal direction with respect to the first unit region, and the first diffusion layer and the second diffusion layer are disposed nearby.

(22)

The solid-state imaging device according to (21) described above, in which a floating diffusion region is formed in a central portion of the other two unit regions of the four unit regions, and the first diffusion layer and the second diffusion layer are disposed in a region vertically sandwiched by two of the floating diffusion regions of the other two unit regions.

(23)

The solid-state imaging device according to (21) described above, in which a floating diffusion region is formed in a central portion of the other two unit regions of the four unit regions, and the first diffusion layer and the second diffusion layer are disposed in a region sandwiched in a left-right direction by two of the floating diffusion regions of the other two unit regions.

(24)

The solid-state imaging device according to (21) described above, in which a floating diffusion region is formed in a central portion of the other two unit regions of the four unit regions, and the first diffusion layer and the second diffusion layer are disposed in a region sandwiched in vertical and left-right directions by two of the floating diffusion regions of the other two unit regions.

(25)

The solid-state imaging device according to any one of (21) to (24) described above, in which the first amplification transistor is disposed at a position closest to either the first diffusion layer or the second diffusion layer.

(26)

The solid-state imaging device according to any one of (21) to (25) described above, in which the event pixel further includes, in two unit regions in the diagonal direction:

a second logarithmic transistor that converts into an optical voltage corresponding to a logarithmic value of the photocurrent; and a second amplification transistor that amplifies the optical voltage, among third and fourth diffusion layers connected to a gate of the second amplification transistor, the third diffusion layer is formed in a first unit region of the two unit regions, and the fourth diffusion layer is formed in a second unit region in the diagonal direction with respect to the first unit region, and the third diffusion layer, the fourth diffusion layer, and the gate of the second amplification transistor are disposed nearby.

(27)

The solid-state imaging device according to (26) described above, in which the third diffusion layer and the fourth diffusion layer are disposed in a region vertically sandwiched by two of the floating diffusion regions of the other two unit regions.

(28)

The solid-state imaging device according to (26) described above, in which the third diffusion layer and the fourth diffusion layer are disposed in a region sandwiched in a left-right direction by two of the floating diffusion regions of the other two unit regions.

(29)

The solid-state imaging device according to (26) described above, in which the first logarithmic transistor, the second logarithmic transistor, and the second amplification transistor are disposed in any one of the two unit regions in the diagonal direction.

(30)

The solid-state imaging device according to any one of (21) to (29) described above, in which the first diffusion layer is a source of an addition transistor that turns on and off connection with another of the event pixel.

(31)

The solid-state imaging device according to any one of (21) to (30) described above, in which the first diffusion layer is a cathode contact of the photodiode.

(32)

The solid-state imaging device according to any one of (21) to (31) described above, in which the second diffusion layer is a source of the first logarithmic transistor.

(33)

The solid-state imaging device according to any one of (21) to (32) described above, in which the event pixel further includes one or more diode-connected transistors between the first logarithmic transistor and the photodiode.

(34)

An electronic device including a solid-state imaging device including a pixel array unit in which an event pixel that detects that a luminance change exceeds a predetermined threshold as an event and a gradation pixel that outputs a luminance signal of a gradation level according to a light amount of incident light are mixed, in which the event pixel includes, in two unit regions in a diagonal direction of four unit regions of 2×2, at least:

a photodiode that photoelectrically convert incident light to generate a photocurrent;

a first logarithmic transistor that converts into an optical voltage corresponding to a logarithm of the photocurrent; and a first amplification transistor that amplifies the optical voltage, among first and second diffusion layers connected to a gate of the first amplification transistor, the first diffusion layer is formed in a first unit region of the two unit regions, and the second diffusion layer is formed in a second unit region in the diagonal direction with respect to the first unit region, and the first diffusion layer and the second diffusion layer are disposed nearby.

(35)

A distance measurement system including:

a light source device that irradiates a subject with irradiation light; and a solid-state imaging device that receives reflected light of the irradiation light reflected by the subject, in which the solid-state imaging device includes a pixel array unit in which an event pixel that detects that a luminance change exceeds a predetermined threshold as an event and a gradation pixel that outputs a luminance signal of a gradation level according to a light amount of incident light are mixed, the event pixel includes, in two unit regions in a diagonal direction of four unit regions of 2×2, at least:

a photodiode that photoelectrically convert incident light to generate a photocurrent;

a first logarithmic transistor that converts into an optical voltage corresponding to a logarithm of the photocurrent; and a first amplification transistor that amplifies the optical voltage, among first and second diffusion layers connected to a gate of the first amplification transistor, the first diffusion layer is formed in a first unit region of the two unit regions, and the second diffusion layer is formed in a second unit region in the diagonal direction with respect to the first unit region, and the first diffusion layer and the second diffusion layer are disposed nearby.

(36)

A solid-state imaging device including a pixel array unit in which an event pixel that detects that a luminance change exceeds a predetermined threshold as an event and a gradation pixel that outputs a luminance signal of a gradation level according to a light amount of incident light are mixed, in which the event pixel includes a current-voltage conversion circuit that outputs a voltage signal corresponding to a logarithmic value of a photocurrent generated by photoelectrically converting incident light, and at least two transistors connected to an output wiring of the current-voltage conversion circuit are disposed in any one of two unit regions in which the event pixel is disposed.

(37)

The solid-state imaging device according to (36) described above, in which the event pixel is disposed in the two unit regions in a diagonal direction of four unit regions of 2×2.

(38)

The solid-state imaging device according to (36) or (37) described above, in which the current-voltage conversion circuit includes:

a photodiode that photoelectrically converts the incident light to generate the photocurrent;

a logarithmic transistor that converts into an optical voltage corresponding to a logarithmic value of the photocurrent and outputs the optical voltage from a gate; and an amplification transistor that amplifies a voltage between a gate having a potential corresponding to the photocurrent and a source having a predetermined reference potential and outputs the amplified voltage from a drain, and the logarithmic transistor and the amplification transistor connected to the output wiring of the current-voltage conversion circuit are disposed in any one of the two unit regions in which the event pixel is disposed.

(39)

The solid-state imaging device according to (38) described above, in which the logarithmic transistor connected to the output wiring among a plurality of the transistors disposed in the unit region is disposed at a position farthest from an amplification transistor of the gradation pixel.

(40)

The solid-state imaging device according to (38) described above, in which the current-voltage conversion circuit includes a plurality of stages of loop circuits each including the logarithmic transistor and the amplification transistor.

(41)

The solid-state imaging device according to (38) described above, in which two stages of loop circuits each including the logarithmic transistor and the amplification transistor are provided, and two of the logarithmic transistors and one of the amplification transistors are disposed in any one of the two unit regions in which the event pixel is disposed.

(42)

The solid-state imaging device according to (41) described above, in which the logarithmic transistor connected to the output wiring is disposed at a position farthest from an amplification transistor of the gradation pixel among the two logarithmic transistors and the one amplification transistor.

(43)

The solid-state imaging device according to (41) or (42) described above, in which the two logarithmic transistors and two of the amplification transistors are disposed in any one of the two unit regions in which the event pixel is disposed.

(44)

The solid-state imaging device according to any one of (41) to (43) described above, in which the current-voltage conversion circuit further includes an addition transistor connected to another of the event pixel, and the addition transistor is disposed in a unit region different from the unit region in which the two logarithmic transistors and two of the amplification transistors are disposed.

(45)

The solid-state imaging device according to any one of (41) to (43) described above, in which the current-voltage conversion circuit further includes an addition transistor connected to another of the event pixel, and the addition transistor is disposed in a unit region same as the unit region in which the logarithmic transistor and the amplification transistor connected to the output wiring are disposed.

(46)

The solid-state imaging device according to any one of (41) to (43) described above, in which the current-voltage conversion circuit further includes an addition transistor connected to another of the event pixel, and the addition transistor is disposed in a unit region different from the unit region in which the logarithmic transistor and the amplification transistor connected to the output wiring are disposed.

(47)

The solid-state imaging device according to (38) described above, in which the current-voltage conversion circuit further includes at least one diode-connected transistor between the logarithmic transistor and the photodiode.

(48)

The solid-state imaging device according to (47) described above, in which the one diode-connected transistor is disposed in a unit region same as the unit region in which the logarithmic transistor and the amplification transistor connected to the output wiring are disposed.

(49)

The solid-state imaging device according to (47) or (48) described above, in which the logarithmic transistor connected to the output wiring among a plurality of the transistors disposed in the unit region is disposed at a position farthest from an amplification transistor of the gradation pixel.

(50)

The solid-state imaging device according to (47) described above, in which the one diode-connected transistor is disposed in a unit region different from the unit region in which the logarithmic transistor and the amplification transistor connected to the output wiring are disposed.

(51)

The solid-state imaging device according to (47) described above, in which the current-voltage conversion circuit further includes an addition transistor connected to another of the event pixel.

(52)

The solid-state imaging device according to (51) described above, in which the addition transistor is disposed in a unit region different from the unit region in which the logarithmic transistor and the amplification transistor connected to the output wiring are disposed.

(53)

The solid-state imaging device according to (38) described above, in which the current-voltage conversion circuit further includes a plurality of diode-connected transistors between the logarithmic transistor and the photodiode.

(54)

The solid-state imaging device according to (53) described above, in which the plurality of diode-connected transistors is disposed in a unit region different from the unit region in which the logarithmic transistor and the amplification transistor connected to the output wiring are disposed.

(55)

The solid-state imaging device according to (53) or (54) described above, in which the logarithmic transistor connected to the output wiring among a plurality of the transistors disposed in the unit region is disposed at a position farthest from an amplification transistor of the gradation pixel.

(56)

The solid-state imaging device according to (53) described above, in which the current-voltage conversion circuit further includes an addition transistor connected to another of the event pixel.

(57)

The solid-state imaging device according to (56) described above, in which the addition transistor is disposed in a unit region same as the unit region in which the logarithmic transistor and the amplification transistor connected to the output wiring are disposed.

(58)

An electronic device including a solid-state imaging device including a pixel array unit in which an event pixel that detects that a luminance change exceeds a predetermined threshold as an event and a gradation pixel that outputs a luminance signal of a gradation level according to a light amount of incident light are mixed, in which the event pixel includes a current-voltage conversion circuit that outputs a voltage signal corresponding to a logarithmic value of a photocurrent generated by photoelectrically converting incident light, and at least two transistors connected to an output wiring of the current-voltage conversion circuit are disposed in any one of two unit regions in which the event pixel is disposed.

(59)

A distance measurement system including:

a light source device that irradiates a subject with irradiation light; and a solid-state imaging device that receives reflected light of the irradiation light reflected by the subject, in which the solid-state imaging device includes a pixel array unit in which an event pixel that detects that a luminance change exceeds a predetermined threshold as an event and a gradation pixel that outputs a luminance signal of a gradation level according to a light amount of incident light are mixed, the event pixel includes a current-voltage conversion circuit that outputs a voltage signal corresponding to a logarithmic value of a photocurrent generated by photoelectrically converting incident light, and at least two transistors connected to an output wiring of the current-voltage conversion circuit are disposed in any one of two unit regions in which the event pixel is disposed.

REFERENCE SIGNS LIST

1 Imaging device
12 Solid-state imaging device
41 Pixel array unit
42 Drive unit
43 Arbiter
44 Event signal processing unit
45 Luminance signal processing unit
51 Pixel
51E Event pixel
51E' Event pixel
51G Gradation pixel
61 Photodiode
61' Photodiode
AMP Amplification transistor
FD Floating diffusion region
FDG Switching transistor
RST Reset transistor
SEL Selection transistor
TG Transfer transistor
Tr Pixel transistor
VDD Power supply
VLOG Optical voltage
VSL Pixel signal
subFD Additional capacitance
62 Address event detection circuit
63 Readout circuit
81 Same color region
81B B same color region
81Gb Gb same color region
81Gr Gr same color region
81R R same color region
82 Shared pixel transistor region
83 Vertical signal line
121 Current-voltage conversion circuit
122 Buffer
123 Subtractor
124 Quantizer
125 Transfer circuit
141 Transistor
142 Transistor
143 Transistor
145 Transistor
146 Transistor
181 Addition transistor
300 Distance measurement system
301 Subject
302 Application processor
311 Light source device 312 Imaging device
313 System control unit
314 Data processing unit
331 Light source drive unit
332 Light emission source
333 Light source-side optical system
341 Sensor control unit
342 Solid-state imaging device
343 Imaging-side optical system
LGT1 First logarithmic transistor
LGT2 Second logarithmic transistor
LGT3 Third logarithmic transistor
TIA1 First amplification transistor
TIA2 Second amplification transistor
BIN Addition transistor
FDL (FDL-R FDL-Gr FDL-Gb FDL-B) Connection wiring
VPD Wiring
VPR Wiring
D0 Wiring
D1 Wiring
811 Sensor die
812 Logic die
813 Logic die
821 Sensor unit
822 Logic unit
831 Pixel array unit

What is claimed is:

1. A solid-state imaging device, comprising
a pixel array unit in which an event pixel that detects that a luminance change exceeds a predetermined threshold as an event and a gradation pixel that outputs a luminance signal of a gradation level according to a light amount of incident light are mixed,
wherein a color filter of a same color is formed in units of two or more pixels in the gradation pixel,
wherein the event pixel is disposed with a region size in which at least two of the gradation pixels are disposed in a row direction or a column direction,
wherein the event pixel is a region in which a color filter of a same color is formed in a case where the pixel is assumed to be the gradation pixel, and
wherein the event pixel is a region where an R or B color filter is formed in a case where the pixel is assumed to be the gradation pixel.

2. The solid-state imaging device according to claim 1, wherein
the pixel array unit includes color filters of a plurality of colors.

3. The solid-state imaging device according to claim 1, wherein
unit regions including a plurality of the gradation pixels each having the color filter of the same color formed thereon are repeatedly arranged in the column direction and the row direction.

4. The solid-state imaging device according to claim 3, wherein
the pixel array unit includes a shared pixel transistor region in which one or more pixel transistors shared by the plurality of gradation pixels are arranged between the unit regions repeatedly arranged in the column direction.

5. The solid-state imaging device according to claim 1, wherein
the event pixel includes a region of at least two of the gradation pixels arranged in a direction perpendicular to a shared pixel transistor region in which one or more pixel transistors shared by a plurality of the gradation pixels are arranged.

6. The solid-state imaging device according to claim 1, wherein the event pixel includes a region of the gradation pixels of four pixels of two pixels in the row direction and two pixels in the column direction.

7. The solid-state imaging device according to claim 1, wherein a region of two of the event pixels is configured to operate as one of the event pixels.

8. The solid-state imaging device according to claim 7, wherein the event pixel includes a transistor that turns on and off a connection with another of an adjacent event pixel.

9. The solid-state imaging device according to claim 7, wherein photoelectric conversion elements formed in regions of the two event pixels are connected by wiring.

10. The solid-state imaging device according to claim 7, wherein one photoelectric conversion element is formed in regions of the two event pixels.

11. The solid-state imaging device according to claim 7, wherein regions of the two event pixels are disposed adjacent to each other in a diagonal direction.

12. The solid-state imaging device according to claim 7, wherein each of regions of the two event pixels is constituted by a region of at least two of the gradation pixels arranged in a direction perpendicular to a shared pixel transistor region in which one or more pixel transistors shared by a plurality of the gradation pixels are arranged.

13. The solid-state imaging device according to claim 7, wherein each of regions of the two event pixels is a region in which an R or B color filter is formed in a case where the event pixels are assumed to be the gradation pixels.

14. The solid-state imaging device according to claim 1, wherein a color filter of R, G, B, or W is formed in the gradation pixel.

15. The solid-state imaging device according to claim 1, wherein a color filter of R, G, B, or IR is formed in the gradation pixel.

16. The solid-state imaging device according to claim 1, wherein an IR color filter is formed in the event pixel, and the event pixel detects that a luminance change of infrared light exceeds a predetermined threshold as an event.

17. A solid-state imaging device, comprising a pixel array unit in which an event pixel that detects that a luminance change exceeds a predetermined threshold as an event and a gradation pixel that outputs a luminance signal of a gradation level according to a light amount of incident light are mixed, wherein a color filter of a same color is formed in units of two or more pixels in the gradation pixel, wherein the event pixel is disposed with a region size in which at least two of the gradation pixels are disposed in a row direction or a column direction, wherein unit regions including a plurality of the gradation pixels each having the color filter of the same color formed thereon are repeatedly arranged in the column direction and the row direction, and wherein the pixel array unit includes a shared pixel transistor region in which one or more pixel transistors shared by the plurality of gradation pixels are arranged between the unit regions repeatedly arranged in the column direction.

18. The solid-state imaging device according to claim 17, wherein the pixel array unit includes color filters of a plurality of colors.

19. The solid-state imaging device according to claim 17, wherein the event pixel includes a region of at least two of the gradation pixels arranged in a direction perpendicular to a shared pixel transistor region in which one or more pixel transistors shared by a plurality of the gradation pixels are arranged.

20. The solid-state imaging device according to claim 17, wherein the event pixel includes a region of the gradation pixels of four pixels of two pixels in the row direction and two pixels in the column direction.

21. The solid-state imaging device according to claim 17, wherein a region of two of the event pixels is configured to operate as one of the event pixels.

22. The solid-state imaging device according to claim 21, wherein the event pixel includes a transistor that turns on and off a connection with another of an adjacent event pixel.

23. The solid-state imaging device according to claim 21, wherein photoelectric conversion elements formed in regions of the two event pixels are connected by wiring.

24. The solid-state imaging device according to claim 21, wherein one photoelectric conversion element is formed in regions of the two event pixels.

25. The solid-state imaging device according to claim 21, wherein regions of the two event pixels are disposed adjacent to each other in a diagonal direction.

26. The solid-state imaging device according to claim 21, wherein each of regions of the two event pixels is constituted by a region of at least two of the gradation pixels arranged in a direction perpendicular to a shared pixel transistor region in which one or more pixel transistors shared by a plurality of the gradation pixels are arranged.

27. The solid-state imaging device according to claim 21, wherein each of regions of the two event pixels is a region in which an R or B color filter is formed in a case where the event pixels are assumed to be the gradation pixels.

28. The solid-state imaging device according to claim 17, wherein a color filter of R, G, B, or W is formed in the gradation pixel.

29. The solid-state imaging device according to claim 17, wherein a color filter of R, G, B, or IR is formed in the gradation pixel.

30. The solid-state imaging device according to claim 17, wherein an IR color filter is formed in the event pixel, and the event pixel detects that a luminance change of infrared light exceeds a predetermined threshold as an event.

31. A solid-state imaging device, comprising a pixel array unit in which an event pixel that detects that a luminance change exceeds a predetermined threshold as an event and a gradation pixel that outputs a luminance signal of a gradation level according to a light amount of incident light are mixed, wherein a color filter of a same color is formed in units of two or more pixels in the gradation pixel, wherein the event pixel is disposed with a region size in which at least two of the gradation pixels are disposed in a row direction or a column direction, and wherein the event pixel includes a region of at least two of the gradation pixels arranged in a direction perpendicular to a shared pixel transistor region in which one or more pixel transistors shared by a plurality of the gradation pixels are arranged.

32. The solid-state imaging device according to claim 31, wherein the pixel array unit includes color filters of a plurality of colors.

33. The solid-state imaging device according to claim 1, wherein the event pixel includes a region of the gradation pixels of four pixels of two pixels in the row direction and two pixels in the column direction.

34. The solid-state imaging device according to claim 31, wherein a region of two of the event pixels is configured to operate as one of the event pixels.

35. The solid-state imaging device according to claim 34, wherein the event pixel includes a transistor that turns on and off a connection with another of an adjacent event pixel.

36. The solid-state imaging device according to claim 34, wherein photoelectric conversion elements formed in regions of the two event pixels are connected by wiring.

37. The solid-state imaging device according to claim 34, wherein one photoelectric conversion element is formed in regions of the two event pixels.

38. The solid-state imaging device according to claim 34, wherein regions of the two event pixels are disposed adjacent to each other in a diagonal direction.

39. The solid-state imaging device according to claim 34, wherein each of regions of the two event pixels is constituted by a region of at least two of the gradation pixels arranged in a direction perpendicular to a shared pixel transistor region in which one or more pixel transistors shared by a plurality of the gradation pixels are arranged.

40. The solid-state imaging device according to claim 34, wherein each of regions of the two event pixels is a region in which an R or B color filter is formed in a case where the event pixels are assumed to be the gradation pixels.

41. The solid-state imaging device according to claim 31, wherein a color filter of R, G, B, or W is formed in the gradation pixel.

42. The solid-state imaging device according to claim 31, wherein a color filter of R, G, B, or IR is formed in the gradation pixel.

43. The solid-state imaging device according to claim 31, wherein an IR color filter is formed in the event pixel, and the event pixel detects that a luminance change of infrared light exceeds a predetermined threshold as an event.

44. A solid-state imaging device, comprising a pixel array unit in which an event pixel that detects that a luminance change exceeds a predetermined threshold as an event and a gradation pixel that outputs a luminance signal of a gradation level according to a light amount of incident light are mixed, wherein a color filter of a same color is formed in units of two or more pixels in the gradation pixel, wherein the event pixel is disposed with a region size in which at least two of the gradation pixels are disposed in a row direction or a column direction, and wherein the event pixel includes a region of the gradation pixels of four pixels of two pixels in the row direction and two pixels in the column direction.

45. The solid-state imaging device according to claim 44, wherein the pixel array unit includes color filters of a plurality of colors.

46. The solid-state imaging device according to claim 45, wherein a region of two of the event pixels is configured to operate as one of the event pixels.

47. The solid-state imaging device according to claim 46, wherein the event pixel includes a transistor that turns on and off a connection with another of an adjacent event pixel.

48. The solid-state imaging device according to claim 46, wherein photoelectric conversion elements formed in regions of the two event pixels are connected by wiring.

49. The solid-state imaging device according to claim 46, wherein one photoelectric conversion element is formed in regions of the two event pixels.

50. The solid-state imaging device according to claim 46, wherein regions of the two event pixels are disposed adjacent to each other in a diagonal direction.

51. A solid-state imaging device, comprising a pixel array unit in which an event pixel that detects that a luminance change exceeds a predetermined threshold as an event and a gradation pixel that outputs a luminance signal of a gradation level according to a light amount of incident light are mixed, wherein a color filter of a same color is formed in units of two or more pixels in the gradation pixel, wherein the event pixel is disposed with a region size in which at least two of the gradation pixels are disposed in a row direction or a column direction, and wherein a region of two of the event pixels is configured to operate as one of the event pixels.

52. The solid-state imaging device according to claim 51, wherein the pixel array unit includes color filters of a plurality of colors.

53. The solid-state imaging device according to claim 51, wherein the event pixel includes a transistor that turns on and off a connection with another of an adjacent event pixel.

54. The solid-state imaging device according to claim 51, wherein photoelectric conversion elements formed in regions of the two event pixels are connected by wiring.

55. The solid-state imaging device according to claim 51, wherein one photoelectric conversion element is formed in regions of the two event pixels.

56. The solid-state imaging device according to claim 51, wherein regions of the two event pixels are disposed adjacent to each other in a diagonal direction.

57. The solid-state imaging device according to claim 51, wherein each of regions of the two event pixels is constituted by a region of at least two of the gradation pixels arranged in a direction perpendicular to a shared pixel transistor region in which one or more pixel transistors shared by a plurality of the gradation pixels are arranged.

58. The solid-state imaging device according to claim 51, wherein each of the regions of the two event pixels is a region in which an R or B color filter is formed in a case where the event pixels are assumed to be the gradation pixels.

59. The solid-state imaging device according to claim 51, wherein a color filter of R, G, B, or W is formed in the gradation pixel.

\* \* \* \* \*